United States Patent
Bartnik et al.

(10) Patent No.: US 8,947,273 B2
(45) Date of Patent: Feb. 3, 2015

(54) ENTROPY CODING

(71) Applicant: Fraunhofer-Gesellschaft zur Foerderung der angewandten Forschung e.V., Munich (DE)

(72) Inventors: Christian Bartnik, Berlin (DE); Benjamin Bross, Berlin (DE); Valeri George, Berlin (DE); Anastasia Henkel, Berlin (DE); Tobias Hinz, Berlin (DE); Heiner Kirchhoffer, Berlin (DE); Detlev Marpe, Berlin (DE); Tung Nguyen, Berlin (DE); Matthias Preiss, Berlin (DE); Thomas Schierl, Berlin (DE); Heiko Schwarz, Panketal (DE); Mischa Siekmann, Berlin (DE); Jan Stegemann, Berlin (DE); Thomas Wiegand, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 14/230,183

(22) Filed: Mar. 31, 2014

(65) Prior Publication Data
US 2014/0210652 A1 Jul. 31, 2014

Related U.S. Application Data

(63) Continuation of application No. PCT/EP2012/069894, filed on Oct. 8, 2012.

(60) Provisional application No. 61/543,942, filed on Oct. 6, 2011.

(51) Int. Cl.
H03M 7/40 (2006.01)
H03M 7/30 (2006.01)
(Continued)

(52) U.S. Cl.
CPC .............. *H03M 7/40* (2013.01); *H03M 7/4006* (2013.01); *H03M 7/607* (2013.01); *H04N 19/13* (2014.11); *H04N 19/156* (2014.11); *H04N 19/436* (2014.11)
USPC ............................................. 341/67; 341/107

(58) Field of Classification Search
CPC ..... H03M 7/40; H03M 7/4006; H03M 5/145; H03M 7/46; H04N 7/50
USPC ................... 341/67, 107, 59, 63; 375/240.03, 375/240.02, 240.12, 240.18
See application file for complete search history.

(56) References Cited

U.S. PATENT DOCUMENTS 5,717,394 A 2/1998 Schwartz et al.
2014/0198841 A1* 7/2014 George et al. ............ 375/240.03

OTHER PUBLICATIONS

Official Communication issued in International Patent Application No. PCT/EP2012/069894, mailed on Nov. 29, 2012.
(Continued)

*Primary Examiner* — Joseph Lauture
(74) *Attorney, Agent, or Firm* — Keating & Bennett, LLP

(57) ABSTRACT

An encoder for encoding a sequence of symbols is described which has an assigner configured to assign a number of parameters to each symbol of the sequence of symbols based on information contained within previous symbols of the sequence of symbols; a plurality of entropy encoders each of which is configured to convert the symbols forwarded to the respective entropy encoder into a respective bitstream; and a selector configured to forward each symbol to a selected one of the plurality of entropy encoders, the selection depending on the number of parameters assigned to the respective symbol.

45 Claims, 62 Drawing Sheets

(51) Int. Cl.
*H04N 19/13* (2014.01)
*H04N 19/156* (2014.01)
*H04N 19/436* (2014.01)

(56) References Cited

OTHER PUBLICATIONS

He et al.: "Opportunistic parallel V2V decoding"; 3. JCT-VC Meeting; Guangzhou; JCTVC-C279; Oct. 7-15, 2010, 3 pages.

Winken et al.: "Description of Video coding technology proposal by Fraunhofer HHI"; 1. JCT-VC Meeting; Dresden; No. JCTVC-A116; Apr. 15-23, 2010, 44 pages.

He et al.: "Video Coding Technology Proposal by Rim"; Joint Video Tea; No. JCTVC-A120; Apr. 15-23, 2010, 29 pages.

Marpe et al.: "Novel entropy coding concept"; 1. JCT-VC Meeting; Dresden; No. JVTVC-A032; Apr. 15-23, 2010, 17 pages.

Kirchhoffer et al.: "CE1: Report of test results related to PIPE-based Unified Entropy Coding"; 7. JCT-VC Meeting; Geneva; No. JCTVC-G633; Nov. 21-30, 2011, 11 pages.

\* cited by examiner

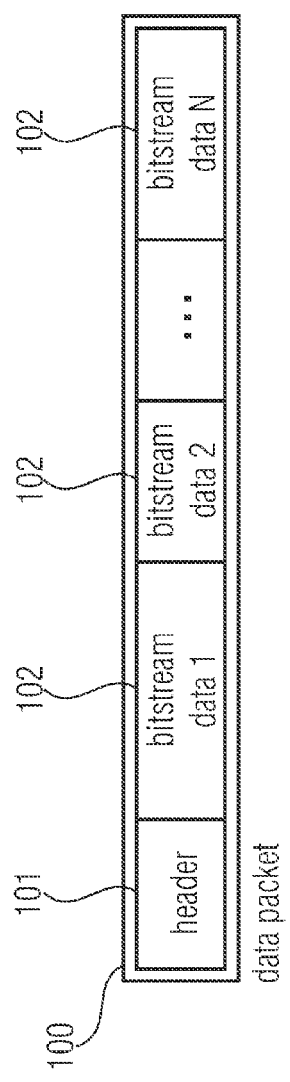
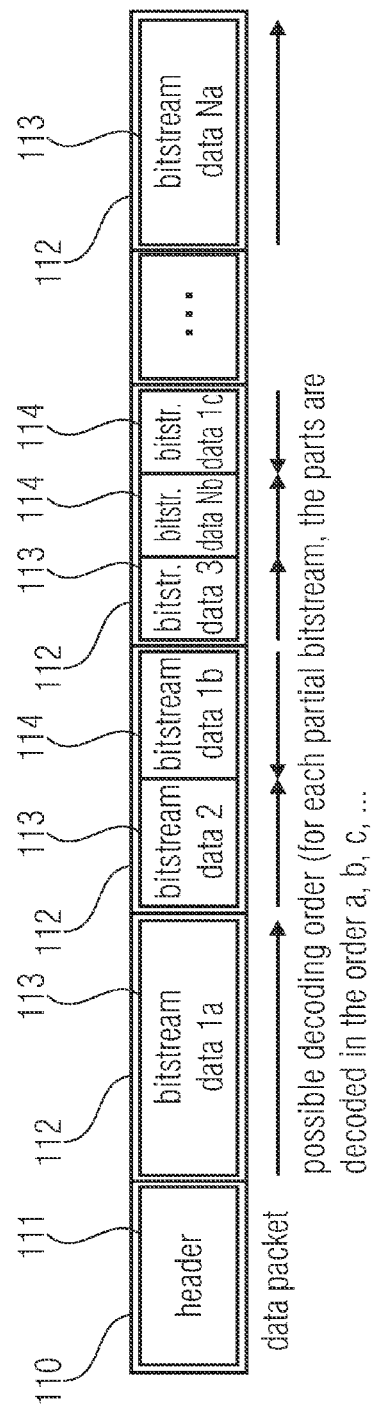

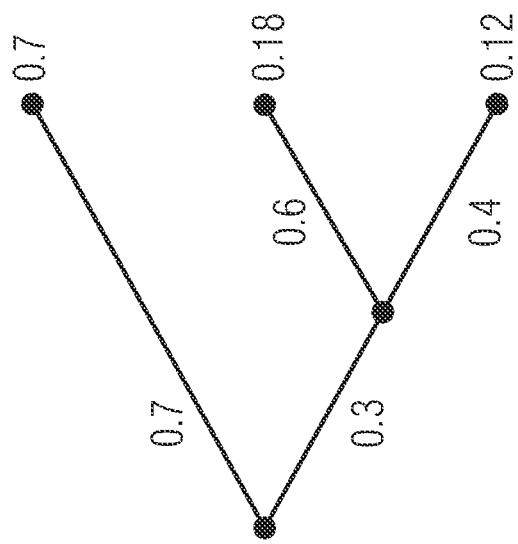
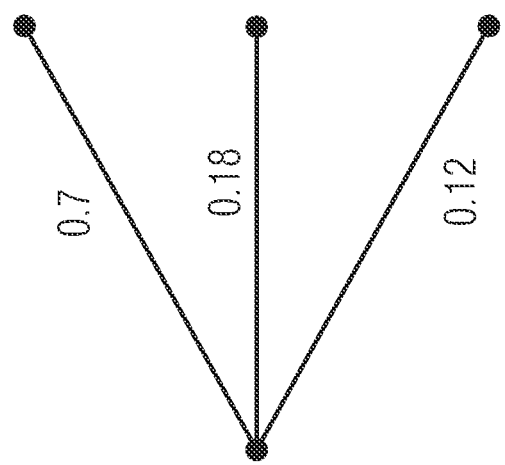
FIGURE 16

| coefficients | 14 | 0 | -5 | 3 | 0 | 0 | 0 | -1 | 0 | 1 | 0 | 0 | 0 | 0 | 0 |
|---|---|---|---|---|---|---|---|---|---|---|---|---|---|---|---|
| SIG | 1 | 0 | 1 | 1 | 0 | 0 | 0 | 1 | 0 | 1 | | | | | |
| LAST | 0 | | 0 | 0 | | | | 0 | | 1 | | | | | |

| coefficients | 18 | -2 | 0 | 0 | 0 | 0 | -5 | 1 | -1 | 0 | 0 | 0 | 0 | 1 | 0 | 1 |
|---|---|---|---|---|---|---|---|---|---|---|---|---|---|---|---|---|
| SIG | 1 | 1 | 0 | 0 | 0 | 0 | 1 | 1 | 1 | 0 | 0 | 0 | 0 | 1 | 0 | (1) |
| LAST | 0 | 0 | | | | | 0 | 0 | 0 | | | | | 0 | | (1) |

FIGURE 19

| ABS | binarization | | bin |
|---|---|---|---|
| | unary part | Exp-Golomb part | |
| 1 | 0 | | 1 |
| 2 | 1 0 | | 2 |
| 3 | 1 1 0 | | 3 |
| 4 | 1 1 1 0 | | 4 |
| 5 | 1 1 1 1 0 | | 5 |
| 6 | 1 1 1 1 1 0 | | 6 |
| 7 | 1 1 1 1 1 1 0 | | 7 |
| 8 | 1 1 1 1 1 1 1 0 | | 8 |
| 9 | 1 1 1 1 1 1 1 1 0 | | 9 |
| 10 | 1 1 1 1 1 1 1 1 1 0 | | 10 |
| 11 | 1 1 1 1 1 1 1 1 1 1 0 | | 11 |
| 12 | 1 1 1 1 1 1 1 1 1 1 1 0 | | 12 |
| 13 | 1 1 1 1 1 1 1 1 1 1 1 1 0 | | 13 |
| 14 | 1 1 1 1 1 1 1 1 1 1 1 1 1 0 | | 14 |
| 15 | 1 1 1 1 1 1 1 1 1 1 1 1 1 1 | 0 | 15 |
| 16 | 1 1 1 1 1 1 1 1 1 1 1 1 1 1 | 1 0 0 | 16 |
| 17 | 1 1 1 1 1 1 1 1 1 1 1 1 1 1 | 1 0 1 | 17 |
| 18 | 1 1 1 1 1 1 1 1 1 1 1 1 1 1 | 1 1 0 0 0 | 18 |
| 19 | 1 1 1 1 1 1 1 1 1 1 1 1 1 1 | 1 1 0 0 1 | 19 |
| 20 | 1 1 1 1 1 1 1 1 1 1 1 1 1 1 | 1 1 0 1 0 | 20 |
| 21 | 1 1 1 1 1 1 1 1 1 1 1 1 1 1 | 1 1 0 1 1 | 21 |

FIGURE 20

| block types | coefficient number | category |
|---|---|---|
| DC luminance block (INTRA 16x16-Mode) | 16 | 0: Luma-Intra 16-DC |
| AC luminance block (INTRA 16x16-Mode) | 15 | 1: Luma-Intra 16-AC |
| luminance block (INTRA 4x4-Mode) | 16 | 2. Luma-4x4 |
| luminance block (INTER-Mode) | 16 | |
| DC-chrominance-U-block (INTRA-Mode) | 4 | 3. Chroma-DC |
| DC-chrominance-V-block (INTRA-Mode) | 4 | |
| DC-chrominance-U-block (INTER-Mode) | 4 | |
| DC-chrominance-V-block (INTER-Mode) | 4 | |
| AC-chrominance-U-block (INTRA-Mode) | 15 | 4: Chroma-AC |
| AC-chrominance-V-block (INTRA-Mode) | 15 | |
| AC-chrominance-U-block (INTER-Mode) | 15 | |
| AC-chrominance-V-block (INTER-Mode) | 15 | |

FIGURE 21

```
preCtxState = max( 1, min( 126, ( ( m * SliceQP ) > > 4 ) + n ) )
if( preCtxState < = 63 ) {
    pStateIdx  = 63 - preCtxState
    valMPS     = 0
} else {
    pStataIdx  = preCtxState - 64
    valMPS     = 1
}
``` preCtxState: auxiliary variable
m, n: $1^{st}$, $2^{nd}$ table indices (initialization variables)
min: minimum function
SliceQP: Slice quantization parameter
pStateIdx: reference to initialization probability information
 table including probability information for
 the least probable symbol (LPS)
valMPS: value of most probable symbol
valLPS: value of least probable symbol

| xN | yN | currMbFrameFlag | mbIsTopMbFlag | mbAddrX | mbAddrXFrameFlag | additional condition | mbAddrN | yM |
|---|---|---|---|---|---|---|---|---|
| <0 | 0...16 | 1 | | mbAddrA | 1 | | mbAddrA | yN |
| | | | | | 0 | yN % 2 == 0 | mbAddrA | yN>>1 |
| | | | | | | yN % 2 != 0 | mbAddrA+1 | yN>>1 |
| | | 0 | 1 | mbAddrA | 1 | | mbAddrA+1 | yN |
| | | | | | 0 | yN % 2 == 0 | mbAddrA | (yN+8)>>1 |
| | | | | | | yN % 2 != 0 | mbAddrA+1 | (yN+8)>>1 |
| | | | 0 | mbAddrA | 1 | yN<8 | mbAddrA | yN<<1 |
| | | | | | | yN>=8 | mbAddrA+1 | (yN<<1)-8 |
| | | | | | 0 | | mbAddrA | yN |
| | | | 0 | mbAddrA | 1 | yN<8 | mbAddrA | (yN<<1)+1 |
| | | | | | | yN>=8 | mbAddrA+1 | (yN<<1)+1-8 |
| | | | | | 0 | | mbAddrA+1 | yN |
| 0...16 | <0 | 1 | 1 | mbAddrB | | | mbAddrB+1 | yN |
| | | | 0 | CurrMbAddr | | | CurrMbAddr-1 | yN |
| | | 0 | 1 | mbAddrB | 1 | | mbAddrB+1 | 2*yN |
| | | | | | 0 | | mbAddrB | yN |
| | | | 0 | mbAddrB | | | mbAddrB+1 | yN |
| 0...16 | 0...16 | | | CurrMbAddr | | | CurrMbAddr | yN |

FIGURE 35

| Abs. value | Bin string | | | | | | | | | | | | | | | | | | | |
|---|---|---|---|---|---|---|---|---|---|---|---|---|---|---|---|---|---|---|---|---|
| | TU prefix | | | | | | | | | | | | | | EG0 suffix | | | | | |
| | bin | 1 | 2 | 3 | 4 | 5 | 6 | 7 | 8 | 9 | 10 | 11 | 12 | 13 | 14 | 15 | 16 | 17 | 18 | 19 |
| 1 | | 0 | | | | | | | | | | | | | | | | | | |
| 2 | | 1 | 0 | | | | | | | | | | | | | | | | | |
| 3 | | 1 | 1 | 0 | | | | | | | | | | | | | | | | |
| 4 | | 1 | 1 | 1 | 0 | | | | | | | | | | | | | | | |
| 5 | | 1 | 1 | 1 | 1 | 0 | | | | | | | | | | | | | | |
| ... | | . | . | . | . | . | . | . | . | . | . | . | . | . | . | | | | | |
| 13 | | 1 | 1 | 1 | 1 | 1 | 1 | 1 | 1 | 1 | 1 | 1 | 1 | 0 | | | | | | |
| 14 | | 1 | 1 | 1 | 1 | 1 | 1 | 1 | 1 | 1 | 1 | 1 | 1 | 1 | 0 | | | | | |
| 15 | | 1 | 1 | 1 | 1 | 1 | 1 | 1 | 1 | 1 | 1 | 1 | 1 | 1 | 1 | 0 | | | | |
| 16 | | 1 | 1 | 1 | 1 | 1 | 1 | 1 | 1 | 1 | 1 | 1 | 1 | 1 | 1 | 1 | 0 | 0 | | |
| 17 | | 1 | 1 | 1 | 1 | 1 | 1 | 1 | 1 | 1 | 1 | 1 | 1 | 1 | 1 | 1 | 0 | 1 | | |
| 18 | | 1 | 1 | 1 | 1 | 1 | 1 | 1 | 1 | 1 | 1 | 1 | 1 | 1 | 1 | 1 | 1 | 0 | 0 | |
| 19 | | 1 | 1 | 1 | 1 | 1 | 1 | 1 | 1 | 1 | 1 | 1 | 1 | 1 | 1 | 1 | 1 | 0 | 1 | |
| 20 | | 1 | 1 | 1 | 1 | 1 | 1 | 1 | 1 | 1 | 1 | 1 | 1 | 1 | 1 | 1 | 1 | 1 | 0 | 0 |

FIGURE 46

| Abs. value | Bin string | |
|---|---|---|
| | TU prefix | EG3 suffix |
| 0 | 0 | |
| 1 | 1 0 | |
| 2 | 1 1 0 | |
| ... | | |
| ... | | |
| 7 | 1 1 1 1 1 1 1 0 | |
| 8 | 1 1 1 1 1 1 1 1 0 | |
| 9 | 1 1 1 1 1 1 1 1 | 0 0 0 0 |
| 10 | 1 1 1 1 1 1 1 1 | 0 0 0 1 |
| 11 | 1 1 1 1 1 1 1 1 | 0 0 1 0 |
| ... | | |
| 16 | 1 1 1 1 1 1 1 1 | 0 1 1 1 |
| 17 | 1 1 1 1 1 1 1 1 | 1 0 0 0 0 0 |

FIGURE 47

| Scanning position | 0 | 1 | 2 | 3 | 4 | 5 | 6 | 7 | 8 |
|---|---|---|---|---|---|---|---|---|---|
| Tranf. coefficient levels | 9 | 0 | -5 | 3 | 0 | 0 | -1 | 0 | 1 |
| significant_coeff_flag | 1 | 0 | 1 | 1 | 0 | 0 | 1 | 0 | 1 |
| last_significant_coeff_flag | 0 | | 0 | 0 | | | 0 | | 1 |

| | |
|---|---|
| 1 | residual_block_cabac( coeffLevel, maxNumCoeff ) { |
| 2 | coded_block_flag |
| 3 | if( coded_block_flag ) { |
| 4 | numCoeff=maxNumCoeff |
| 5 | i=0 |
| 6 | do { |
| 7 | significant_coeff_flag[ i ] |
| 8 | if( significant_coeff_flag[ i ]) { |
| 9 | last_significant_coeff_flag[ i ] |
| 10 | if( last_significant_coeff_flag[ i ]) { |
| 11 | numCoeff=i+1 |
| 12 | for( j = numCoeff; j<maxNumCoeff; j++) |
| 13 | coeffLevel[ j ]=0 |
| 14 | } |
| 15 | } |
| 16 | i++ |
| 17 | } while(i < numCeff-1) |
| 18 | coeff_abs_level_minus1[ numCoeff-1 ] |
| 19 | coeff_sign_flag[ numCoeff-1 ] |
| 20 | coeffLevel[ numCoeff-1 ]=( coeff_abs_level_minus1[numCoeff-1]+1) * ( 1-2*coeff_sign_flag[numCoeff-1] ) |
| 21 | for( i=numCoeff-2; i>=0; i--) { |
| 22 | if( significant_coeff_flag[ i ] ) { |
| 23 | coeff_abs_level_minus1[ i ] |
| 24 | coeff_sign_flag[ i ] |
| 25 | coeffLevel[ i ] =( coeff_abs_level_minus1[ i ] + 1)* (1-2*coeff_sign_flag[ i ] ) |
| 26 | } else |
| 27 | coeffLevel[ i ] =0 |
| 28 | } |
| 29 | } else |
| 30 | for( i=0; i<maxNumCoeff; i++) |
| 31 | coeffLevel[ i ]=0 |
| 32 | } |

FIGURE 59

ENTROPY CODING

CROSS-REFERENCE TO RELATED APPLICATIONS

This application is a continuation of copending International Application No. PCT/EP2012/069894, filed Oct. 8, 2012, which is incorporated herein by reference in its entirety, and additionally claims priority from U.S. Provisional Application No. 61/543,942, filed Oct. 6, 2011, which is also incorporated herein by reference in its entirety.

BACKGROUND OF THE INVENTION

The present invention relates to entropy coding and may be used in applications such as, for example, video and audio compression.

The present invention describes a new method and apparatus for entropy encoding and decoding of discrete data. Entropy coding, in general, can be considered as the most generic form of lossless data compression. Lossless compression aims to represent discrete data with fewer bits than needed for the original data representation but without any loss of information. Discrete data can be given in the form of text, graphics, images, video, audio, speech, facsimile, medical data, meteorological data, financial data, or any other form of digital data.

In entropy coding, the specific high-level characteristics of the underlying discrete data source are often neglected. Consequently, any data source is considered to be given as a sequence of source symbols that takes values in a given m-ary alphabet and that is characterized by a corresponding (discrete) probability distribution $\{p_1, \ldots, p_m\}$. In these abstract settings, the lower bound of any entropy coding method in terms of expected codeword length in bits per symbol is given by the entropy $$H = -\sum_{i=1}^{m} p_i \log_2 p_i. \tag{A1}$$

Huffman codes and arithmetic codes are well-known examples of practical codes capable of approximating the entropy limit (in a certain sense). For a fixed probability distribution, Huffman codes are relatively easy to construct. The most attractive property of Huffman codes is that its implementation can be efficiently realized by the use of variable-length code (VLC) tables. However, when dealing with time-varying source statistics, i.e., changing symbol probabilities, the adaptation of the Huffman code and its corresponding VLC tables is quite demanding, both in terms of algorithmic complexity as well as in terms of implementation costs. Also, in the case of having a dominant alphabet value with $p_k > 0.5$, the redundancy of the corresponding Huffman code (without using any alphabet extension such as run length coding) may be quite substantial. Another shortcoming of Huffman codes is given by the fact that in case of dealing with higher-order probability modeling, multiple sets of VLC tables may be necessitated. Arithmetic coding, on the other hand, while being substantially more complex than VLC, offers the advantage of a more consistent and adequate handling when coping with adaptive and higher-order probability modeling as well as with the case of highly skewed probability distributions. Actually, this characteristic basically results from the fact that arithmetic coding provides a mechanism, at least conceptually, to map any given value of probability estimate in a more or less direct way to a portion of the resulting codeword. Being provided with such an interface, arithmetic coding allows for a clean separation between the tasks of probability modeling and probability estimation, on the one hand, and the actual entropy coding, i.e., mapping of a symbols to codewords, on the other hand.

For the sake of clarity, we will restrict the exposition in the following to the case of a binary alphabet, although conceptually, the very basic methods of this invention also apply to the general case of an m-ary alphabet with m>2. The probability distribution of symbols with values in a binary alphabet can be described by a single parameter $p=p_{LPS}$, where the useful distinction is made between the so-called less probable symbol (LPS) with probability estimates $p_{LPS} \leq 0.5$ and the more probable symbol (MPS) with $p_{MPS}=1-p_{LPS}$. Thus, in the general case we have $0 < p_{LPS} \leq 0.5$, where in practical cases, the probability estimate is often bounded from below by a minimum probability value $p_{min}$ such that $p_{min} \leq p_{LPS}$.

A good compromise between coding efficiency on the one hand and coding complexity on the other hand offers entropy coding a symbol sequence in parallel via partial bitstreams each of which assumes responsibility of coding a respective portion of the symbol sequence which is most suitable for the respective portion such as for example in terms of symbol statistics or probability estimation as it is the case in PIPE coding (PIPE=probability interval partitioning entropy). However, the problem resulting therefrom is the necessity to interleave the partial bitstreams in case a common single bitstream is wanted.

SUMMARY

According to an embodiment, an encoder for encoding a sequence of symbols may have: an assigner configured to assign a number of parameters to each symbol of the sequence of symbols based on information contained within previous symbols of the sequence of symbols; a plurality of entropy encoders each of which is configured to convert the symbols forwarded to the respective entropy encoder into a respective bitstream; and a selector configured to forward each symbol to a selected one of the plurality of entropy encoders, the selection depending on the number of parameters assigned to the respective symbol, wherein each entropy encoder is a variable length coder configured to map symbol sequences to codewords shorter as, or as long as, a respective maximum bit length Lx, wherein the encoder has, for each entropy encoder, an individual buffer for buffering the respective bitstream of the respective entropy encoder, and a global buffer, wherein the global buffer is configured to reserve a sequence of tranche entries of respective bit length Nx for the plurality of entropy encoders in a sequential order depending on an order in which the reservations of the tranche entries for the plurality of entropy encoders are triggered; wherein the plurality of entropy encoders and the respective individual buffers cooperate to trigger a reservation of a tranche entry of bit length Nx for a respective one of the entropy encoders at times where the symbols of the sequence of symbols forwarded by the selector to the plurality of entropy encoders result in a beginning of a new symbol sequence to be mapped to a codeword at the respective entropy encoder, provided that at the respective time a number of bits currently reserved in the global buffer for the respective entropy encoder minus a number Mx of bits currently buffered in the individual buffer of the respective entropy encoder or the global buffer for the respective entropy encoder is not sufficient to accommodate an intended minimum number Cx of further codewords for the respective entropy encoder plus one, times the respective maximum bit length Lx, i.e. (Cx+1)·Lx, wherein the individual buffers of the plurality of entropy encoders are configured to output buffered portions of the bitstreams to fill the respective reserved tranche entries in the global buffer, and the global buffer is configured to remove filled tranche entries of the tranche entries in the sequential order to obtain a single stream of tranches of the bitstreams of the plurality of bitstreams, interspersed into the single stream of tranches in an interleaved manner.

According to another embodiment, a method for encoding a sequence of symbols may have the steps of: assigning a number of parameters to each symbol of the sequence of symbols based on information contained within previous symbols of the sequence of symbols; and forwarding each symbol to a selected one of a plurality of entropy encoders, the selection depending on the number of parameters assigned to the respective symbol, and each of the plurality of entropy encoders being configured to convert symbols forwarded to the respective entropy encoder into a respective bitstream, wherein each entropy encoder is a variable length coder configured to map symbol sequences to codewords shorter as, or as long as, a respective maximum bit length Lx, wherein the method further has for each entropy encoder, buffering the respective bitstream of the respective entropy encoder in a respective individual buffer, reserving a sequence of tranche entries of respective bit length Nx for the plurality of entropy encoders in a global buffer in a sequential order depending on an order in which the reservations of the tranche entries for the plurality of entropy encoders are triggered; triggering a reservation of a tranche entry of bit length Nx for a respective one of the entropy encoders at times where the symbols of the sequence of symbols forwarded by the selector to the plurality of entropy encoders result in a beginning of a new symbol sequence to be mapped to a codeword at the respective entropy encoder, provided that at the respective time a number of bits currently reserved in the global buffer for the respective entropy encoder minus a number Mx of bits currently buffered in the individual buffer of the respective entropy encoder or the global buffer for the respective entropy encoder is not sufficient to accommodate an intended minimum number Cx of further codeword for the respective entropy encoder plus one, times the respective maximum bit length Lx, i.e. (Cx+1)·Lx, outputting buffered portions of the bitstreams from the codeword buffers to fill the respective reserved tranche entries in the global buffer, and removing filled tranche entries of the tranche entries in the sequential order to obtain a single stream of tranches of the bitstreams of the plurality of bitstreams, interspersed into the single stream of tranches in an interleaved manner.

According to still another embodiment, a decoder for reconstructing a sequence of symbols may have: a plurality of entropy decoders, each of which is configured to convert a respective bitstream into symbols; an assigner configured to assign a number of parameters to each symbol of a sequence of symbols to be reconstructed based on information contained within previously reconstructed symbols of the sequence of symbols; and a selector configured to retrieve each symbol of the sequence of symbols to be reconstructed from a selected one of the plurality of entropy decoders, the selection depending on the number of parameters defined to the respective symbol, wherein each entropy decoder is a variable length decoder configured to map codewords shorter as, or as long as, a respective maximum bit length Lx, to symbol sequences, wherein the decoder further has global buffer configured to receive a single stream of tranches of the bitstreams of the plurality of bitstreams, interspersed into the single stream of tranches in an interleaved manner, wherein the global buffer is configured to sequentially distribute the tranches from the global buffer to the plurality of entropy decoders depending on an order in which requests for the tranches occur, wherein each of the plurality of entropy decoders is configured to trigger a respective request for a tranche of respective bit length Nx of the respective bitstream from the global buffer at times where, among the symbols of the sequence of symbols to be reconstructed as retrieved by the selector from the plurality of entropy decoders, a symbol is encountered which forms a beginning of a new symbol sequence to be mapped from a new codeword within the respective bitstream by the respective entropy decoder, provided that at the respective time a number Mx of bits of the respective bitstream having been distributed to the respective entropy decoder by the global buffer, but not yet having been entropy decoded by the entropy decoder so far, including the new codeword, is less than an intended minimum number Cx of further codewords for the respective entropy decoder plus one, times the respective maximum bit length Lx, i.e. (Cx+1)·Lx.

According to another embodiment, a method for reconstructing a sequence of symbols may have the steps of: assigning a number of parameters to each symbol of a sequence of symbols to be reconstructed based on information contained within previously reconstructed symbols of the sequence of symbols; and retrieving each symbol of the sequence of symbols to be reconstructed from a selected one of a plurality of entropy decoders, the selection depending on the number of parameters defined to the respective symbol, and each of the plurality of entropy decoders being configured to convert a respective bitstream into symbols, wherein each entropy decoder is a variable length decoder configured to map codewords shorter as, or as long as, a respective maximum bit length Lx, to symbol sequences, wherein the method further has receiving a single stream of tranches of the bitstreams of the plurality of bitstreams, interspersed into the single stream of tranches in an interleaved manner, in a global buffer; sequentially distributing the tranches from the global buffer to the plurality of entropy decoders depending on an order in which requests for the tranches occur, for each of the plurality of entropy decoders, triggering a respective request for a tranche of respective bit length Nx of the respective bitstream from the global buffer at times where, among the symbols of the sequence of symbols to be reconstructed as retrieved by the selector from the plurality of entropy decoders, a symbol is encountered which forms a beginning of a new symbol sequence to be mapped from a new codeword within the respective bitstream by the respective entropy decoder, provided that at the respective time a number Mx of bits of the respective bitstream having been distributed to the respective entropy decoder by the global buffer, but not yet having been entropy decoded by the entropy decoder so far, including the new codeword is less than an intended minimum number Cx of further codewords for the respective entropy decoder plus one, times the respective maximum bit length Lx, i.e. (Cx+1)·Lx.

According to another embodiment, an encoder for encoding a sequence of symbols may have: an assigner configured to assign a number of parameters to each symbol of the sequence of symbols based on information contained within previous symbols of the sequence of symbols; a plurality of entropy encoders each of which is configured to convert the symbols forwarded to the respective entropy encoder into a respective bitstream; and a selector configured to forward each symbol to a selected one of the plurality of entropy encoders, the selection depending on the number of parameters assigned to the respective symbol, wherein each entropy encoder is a variable length coder configured to map symbol sequences to codewords, wherein the encoder has, for each entropy encoder, an individual buffer for buffering the respective bitstream of the respective entropy encoder, and a global buffer, wherein the global buffer is configured to reserve a sequence of tranche entries for the plurality of entropy encoders in a sequential order depending on an order in which the reservations of the tranche entries for the plurality of entropy encoders are triggered; wherein the plurality of entropy encoders and the respective individual buffers cooperate to trigger a reservation of a tranche entry of bit length Nx for a respective one of the entropy encoders at times where the symbols of the sequence of symbols forwarded by the selector to the plurality of entropy encoders result in a beginning of a new symbol sequence to be mapped to a codeword at the respective entropy encoder, provided that at the respective time a difference between a number of bits currently reserved in the global buffer for the respective entropy encoder and a number Mx of bits currently buffered in the individual buffer of the respective entropy encoder or the global buffer for the respective entropy encoder does not fulfill a predetermined criterion, wherein the individual buffers of the plurality of entropy encoders are configured to output buffered portions of the bitstreams to fill the respective reserved tranche entries in the global buffer, and the global buffer is configured to remove filled tranche entries of the tranche entries in the sequential order to obtain a single stream of tranches of the bitstreams of the plurality of bitstreams, interspersed into the single stream of tranches in an interleaved manner, wherein the individual buffers are configured to output buffered portions of the bitstreams to fill the respective reserved tranche entries in the global buffer in units of tranche entries; the global buffer is configured to, at the times of the triggering of a respective reservation by any of the plurality of entropy encoders and the respective individual buffers, finish the removal of the filled tranche entries of the tranche entries in the sequential order from the least recently reserved, already having been filled tranche entry, inclusively, if any, up to the least recently reserved, not yet filled tranche entry, exclusively, then check as to whether a number of bits in the global buffer covered by the reserved tranche entries plus a bit length Nx of the requested tranche entry for the respective reservation-triggering entropy encoder is greater than a maximum buffer delay D, and, if not reserve a respective new tranche entry of bit length Nx for the respective reservation-triggering entropy encoder, but if so, cause the entropy encoder for which the least recently reserved, not yet filled tranche entry is reserved, to extend symbols forwarded to it by the selector, which have not yet been entropy encoded, if any, to a valid symbol sequence, and map the valid symbol sequence to a codeword so as to be buffered by the corresponding individual buffer, and then check as to whether the number Mx of bits currently buffered in the individual buffer of the entropy encoder for which the least recently reserved, not yet filled tranche entry is reserved, is smaller than the bit length Nx for this entropy encoder, and if so, append Nx-Mx bits to the Mx bits currently buffered, and then output Nx buffered bits out of the individual buffer of the entropy encoder for which the least recently reserved, not yet filled tranche entry is reserved, into the least recently reserved, not yet filled tranche entry in order to fill same, with leaving potentially additionally buffered bits beyond the Nx buffered bits output, in the individual buffer.

According to still another embodiment, a decoder for reconstructing a sequence of symbols may have: a plurality of entropy decoders, each of which is configured to convert a respective bitstream into symbols; an assigner configured to assign a number of parameters to each symbol of a sequence of symbols to be reconstructed based on information contained within previously reconstructed symbols of the sequence of symbols; and a selector configured to retrieve each symbol of the sequence of symbols to be reconstructed from a selected one of the plurality of entropy decoders, the selection depending on the number of parameters defined to the respective symbol, wherein each entropy decoder is a variable length decoder configured to map codewords to symbol sequences, wherein the decoder further has global buffer configured to receive a single stream of tranches of the bitstreams of the plurality of bitstreams, interspersed into the single stream of tranches in an interleaved manner, wherein the global buffer is configured to sequentially distribute the tranches from the global buffer to the plurality of entropy decoders depending on an order in which requests for the tranches occur, wherein each of the plurality of entropy decoders is configured to trigger a respective request for a tranche of the respective bitstream from the global buffer at times where, among the symbols of the sequence of symbols to be reconstructed as retrieved by the selector from the plurality of entropy decoders, a symbol is encountered which forms a beginning of a new symbol sequence to be mapped from a new codeword within the respective bitstream by the respective entropy decoder, provided that at the respective time a number Mx of bits of the respective bitstream having been distributed to the respective entropy decoder by the global buffer, but not yet having been entropy decoded by the entropy decoder so far, including the new codeword, is less than a predetermined number, wherein the decoder is configured to log, for each entropy decoder, a number of bits distributed from the global buffer to the plurality of entropy decoders up to the distribution of a least recently distributed tranche distributed from the global buffer to the respective entropy decoder, determine, each time a respective request for a tranche of a respective bit length Nx is triggered, as to whether a difference between a global number of bits distributed from the global buffer to the plurality of entropy decoders up to the respective request on the one hand, and a minimum logged number of bits on the other hand, is greater than a maximum buffer delay D, and, if so, discard the least recently distributed tranche distributed from the global buffer to the entropy decoder for which the minimum logged number has been logged, and any symbols not yet having been retrieved from the entropy decoder for which the minimum logged number has been logged by the selector.

According to another embodiment, an encoder for encoding a sequence of symbols may have: an assigner configured to assign a number of parameters to each symbol of the sequence of symbols based on information contained within previous symbols of the sequence of symbols; a plurality of entropy encoders each of which is configured to convert the symbols forwarded to the respective entropy encoder into a respective bitstream; and a selector configured to forward each symbol to a selected one of the plurality of entropy encoders, the selection depending on the number of parameters assigned to the respective symbol, wherein each entropy encoder is a variable length coder configured to map symbol sequences to codewords, wherein the encoder has, for each entropy encoder, an individual buffer for buffering the respective bitstream of the respective entropy encoder, and a global buffer, wherein the global buffer is configured to reserve a sequence of tranche entries for the plurality of entropy encoders in a sequential order depending on an order in which the reservations of the tranche entries for the plurality of entropy encoders are triggered; wherein the plurality of entropy encoders and the respective individual buffers cooperate to trigger a reservation of a tranche entry of bit length Nx for a respective one of the entropy encoders at times where the symbols of the sequence of symbols forwarded by the selector to the plurality of entropy encoders result in a beginning of a new symbol sequence to be mapped to a codeword at the respective entropy encoder, provided that at the respective time a difference between a number of bits currently reserved in the global buffer for the respective entropy encoder and a number Mx of bits currently buffered in the individual buffer of the respective entropy encoder or the global buffer for the respective entropy encoder does not fulfill a predetermined criterion, wherein the individual buffers of the plurality of entropy encoders are configured to output buffered portions of the bitstreams to fill the respective reserved tranche entries in the global buffer, and the global buffer is configured to remove filled tranche entries of the tranche entries in the sequential order to obtain a single stream of tranches of the bitstreams of the plurality of bitstreams, interspersed into the single stream of tranches in an interleaved manner, the encoder further having a fragmentizer configured to fragmentize the single stream of tranches into chunks with accompanying each chunk with information as to how the tranches of the plurality of entropy encoders are distributed over the respective chunk so as to obtain a sequence of chunks.

According to another embodiment, a decoder for reconstructing a sequence of symbols may have: a plurality of entropy decoders, each of which is configured to convert a respective bitstream into symbols; an assigner configured to assign a number of parameters to each symbol of a sequence of symbols to be reconstructed based on information contained within previously reconstructed symbols of the sequence of symbols; and a selector configured to retrieve each symbol of the sequence of symbols to be reconstructed from a selected one of the plurality of entropy decoders, the selection depending on the number of parameters defined to the respective symbol, wherein each entropy decoder is a variable length decoder configured to map codewords to symbol sequences, wherein the decoder further has a defragmentizer configured to defragmentize and distribute tranches of the bitstreams to the entropy decoders from a sequence of chunks where each chunk has accompanied therewith information as to how the tranches of the bitstreams for the plurality of entropy decoders are distributed over the respective chunk.

According to still another embodiment, a method for encoding a sequence of symbols may have the steps of: assigning a number of parameters to each symbol of the sequence of symbols based on information contained within previous symbols of the sequence of symbols; forwarding each symbol to a selected one of a plurality of entropy encoders, the selection depending on the number of parameters assigned to the respective symbol, each of the plurality of entropy encoders being configured to convert the symbols forwarded to the respective entropy encoder into a respective bitstream, wherein each entropy encoder is a variable length coder configured to map symbol sequences to codewords, for each entropy encoder, buffering the respective bitstream of the respective entropy encoder in an individual buffer, and reserving a sequence of tranche entries for the plurality of entropy encoders in a global buffer in a sequential order depending on an order in which the reservations of the tranche entries for the plurality of entropy encoders are triggered; triggering a reservation of a tranche entry of bit length Nx for a respective one of the entropy encoders at times where the symbols of the sequence of symbols forwarded by the selector to the plurality of entropy encoders result in a beginning of a new symbol sequence to be mapped to a codeword at the respective entropy encoder, provided that at the respective time a difference between a number of bits currently reserved in the global buffer for the respective entropy encoder and a number Mx of bits currently buffered in the individual buffer of the respective entropy encoder or the global buffer for the respective entropy encoder does not fulfill a predetermined criterion, output buffered portions of the bitstreams from the individual buffers of the plurality of entropy encoders to fill the respective reserved tranche entries in the global buffer, removing filled tranche entries of the tranche entries in the sequential order from the global buffer to obtain a single stream of tranches of the bitstreams of the plurality of bitstreams, interspersed into the single stream of tranches in an interleaved manner, wherein output buffered portions of the bitstreams from the individual buffers to fill the respective reserved tranche entries in the global buffer in units of tranche entries; at the times of the triggering of a respective reservation by any of the plurality of entropy encoders and the respective individual buffers, finishing the removal of the filled tranche entries of the tranche entries in the sequential order from the least recently reserved, already having been filled tranche entry, inclusively, if any, up to the least recently reserved, not yet filled tranche entry, exclusively, then checking as to whether a number of bits in the global buffer covered by the reserved tranche entries plus a bit length Nx of the requested tranche entry for the respective reservation-triggering entropy encoder is greater than a maximum buffer delay D, and, if not reserving a respective new tranche entry of bit length Nx for the respective reservation-triggering entropy encoder, but if so, causing the entropy encoder for which the least recently reserved, not yet filled tranche entry is reserved, to extend symbols forwarded to it by the selector, which have not yet been entropy encoded, if any, to a valid symbol sequence, and map the valid symbol sequence to a codeword so as to be buffered by the corresponding individual buffer, and then checking as to whether the number Mx of bits currently buffered in the individual buffer of the entropy encoder for which the least recently reserved, not yet filled tranche entry is reserved, is smaller than the bit length Nx for this entropy encoder, and if so, appending Nx-Mx bits to the Mx bits currently buffered, and then outputting Nx buffered bits out of the individual buffer of the entropy encoder for which the least recently reserved, not yet filled tranche entry is reserved, into the least recently reserved, not yet filled tranche entry in order to fill same, with leaving potentially additionally buffered bits beyond the Nx buffered bits output, in the individual buffer.

According to another embodiment, a method for reconstructing a sequence of symbols using a plurality of entropy decoders, each of which is configured to convert a respective bitstream into symbols, may have the steps of: assigning a number of parameters to each symbol of a sequence of symbols to be reconstructed based on information contained within previously reconstructed symbols of the sequence of symbols; and retrieving each symbol of the sequence of symbols to be reconstructed from a selected one of the plurality of entropy decoders, the selection depending on the number of parameters defined to the respective symbol, wherein each entropy decoder is a variable length decoder configured to map codewords to symbol sequences, wherein the method further has receiving a single stream of tranches of the bitstreams of the plurality of bitstreams, interspersed into the single stream of tranches in an interleaved manner, in a global buffer, sequentially distributing the tranches from the global buffer to the plurality of entropy decoders depending on an order in which requests for the tranches occur, for each of the plurality of entropy decoders, triggering a respective request for a tranche of the respective bitstream from the global buffer at times where, among the symbols of the sequence of symbols to be reconstructed as retrieved by the selector from the plurality of entropy decoders, a symbol is encountered which forms a beginning of a new symbol sequence to be mapped from a new codeword within the respective bitstream by the respective entropy decoder, provided that at the respective time a number Mx of bits of the respective bitstream having been distributed to the respective entropy decoder by the global buffer, but not yet having been entropy decoded by the entropy decoder so far, including the new codeword, is less than a predetermined number, wherein the method further has logging, for each entropy decoder, a number of bits distributed from the global buffer to the plurality of entropy decoders up to the distribution of a least recently distributed tranche distributed from the global buffer to the respective entropy decoder, determining, each time a respective request for a tranche of a respective bit length Nx is triggered, as to whether a difference between a global number of bits distributed from the global buffer to the plurality of entropy decoders up to the respective request on the one hand, and a minimum logged number of bits on the other hand, is greater than a maximum buffer delay D, and, if so, discarding the least recently distributed tranche distributed from the global buffer to the entropy decoder for which the minimum logged number has been logged, and any symbols not yet having been retrieved from the entropy decoder for which the minimum logged number has been logged by the selector.

According to another embodiment, a method for encoding a sequence of symbols may have the steps of: assigning a number of parameters to each symbol of the sequence of symbols based on information contained within previous symbols of the sequence of symbols; forwarding each symbol to a selected one of a plurality of entropy encoders, the selection depending on the number of parameters assigned to the respective symbol, wherein each of the plurality of entropy encoders is configured to convert the symbols forwarded to the respective entropy encoder into a respective bitstream; wherein each entropy encoder is a variable length coder configured to map symbol sequences to codewords, wherein the method has for each entropy encoder, buffering the respective bitstream of the respective entropy encoder in an individual buffer, and reserving a sequence of tranche entries for the plurality of entropy encoders in a global buffer in a sequential order depending on an order in which the reservations of the tranche entries for the plurality of entropy encoders are triggered; triggering a reservation of a tranche entry of bit length Nx for a respective one of the entropy encoders at times where the symbols of the sequence of symbols forwarded by the selector to the plurality of entropy encoders result in a beginning of a new symbol sequence to be mapped to a codeword at the respective entropy encoder, provided that at the respective time a difference between a number of bits currently reserved in the global buffer for the respective entropy encoder and a number Mx of bits currently buffered in the individual buffer of the respective entropy encoder or the global buffer for the respective entropy encoder does not fulfill a predetermined criterion, outputting buffered portions of the bitstreams from the individual buffers of the plurality of entropy encoders to fill the respective reserved tranche entries in the global buffer, with removing filled tranche entries of the tranche entries in the sequential order from the global buffer to obtain a single stream of tranches of the bitstreams of the plurality of bitstreams, interspersed into the single stream of tranches in an interleaved manner, the method further having fragmentizing the single stream of tranches into chunks with accompanying each chunk with information as to how the tranches of the plurality of entropy encoders are distributed over the respective chunk so as to obtain a sequence of chunks.

According to another embodiment, a method for reconstructing a sequence of symbols by a plurality of entropy decoders, each of which is configured to convert a respective bitstream into symbols, may have the steps of: assigning a number of parameters to each symbol of a sequence of symbols to be reconstructed based on information contained within previously reconstructed symbols of the sequence of symbols; and retrieving each symbol of the sequence of symbols to be reconstructed from a selected one of the plurality of entropy decoders, the selection depending on the number of parameters defined to the respective symbol, wherein each entropy decoder is a variable length decoder configured to map codewords to symbol sequences, wherein the method further has defragmentizing and distributing tranches of the bitstreams to the entropy decoders from a sequence of chunks where each chunk has accompanied therewith information as to how the tranches of the bitstreams for the plurality of entropy decoders are distributed over the respective chunk.

Another embodiment may have a computer readable digital storage medium having stored thereon a computer program having a program code for performing, when running on a computer, the above methods of encoding and decoding.

An encoder for encoding a sequence of symbols according to an embodiment of the present invention comprises an assigner configured to assign a number of parameters to each symbol of the sequence of symbols based on information contained within previous symbols of the sequence of symbols; a plurality of entropy encoders each of which is configured to convert the symbols forwarded to the respective entropy encoder into a respective bitstream; and a selector configured to forward each symbol to a selected one of the plurality of entropy encoders, the selection depending on the number of parameters assigned to the respective symbol.

A decoder for reconstructing a sequence of symbols according to an embodiment of the present invention comprises a plurality of entropy decoders, each of which is configured to convert a respective bitstream into symbols; an assigner configured to assign a number of parameters to each symbol of a sequence of symbols to be reconstructed based on information contained within previously reconstructed symbols of the sequence of symbols; and a selector configured to retrieve each symbol of the sequence of symbols to be reconstructed from a selected one of the plurality of entropy decoders, the selection depending on the number of parameters defined to the respective symbol.

In accordance with one aspect, interleaving is performed such that each entropy coder is of the VLC sort, the interleaving is performed in units of tranches of (quasi) fixed size so that the entropy coding's parsing procedure may be performed in parallel for ach entropy coding path. and so that at least one codeword is available at the decoding side at any time during decoding so that a parallelization and pipelining of the decoding procedure is alleviated.

In accordance with another aspect, interleaving is performed such that each entropy coder is of the VLC sort, the interleaving is performed in units of tranches of (quasi) fixed size so that the entropy coding's parsing procedure may be performed in parallel for ach entropy coding path. and so that a maximum coding delay constraint may be obeyed, by flushing infrequently visited entropy coding pathes whenever the maximum coding delay constraint is going to be not obeyed. However, flushing of the respective entropy coding path is not performed completely, but merely up to an amount necessitated in order to form one further tranche so that the additional bit rate spent for obeying the maximum coding delay constraint is kept minimum.

In accordance with another aspect, interleaving is performed such that each entropy coder is of the VLC sort, the interleaving is performed in units of tranches of (quasi) fixed size so that the entropy coding's parsing procedure may be performed in parallel for ach entropy coding path based on the sequence of tranches with the single bistream, but the sequence of tranches is transmitted in a fragmentized version in so called chunks with information on the distribution of the tranches therein so that the decoder parallelization procedure in further alleviated with, if the optional delay constraint obeying scheme is applied, introducing almost no further delay.

Embodiments of an entropy encoding algorithm are described in which a sequence of arbitrary source symbols is mapped onto two or more partial bitstreams, and a decoding algorithm, in which the original source symbols are decoded from the two or more partial bitstreams. At the encoder side, the source symbols are first binarized (if they don't already represent binary symbols) and each bin of the binarizations is associated with a set of parameters. The associated parameters are then mapped onto a small set of indices and all bins that are associated with a particular index are coded by a particular binary entropy encoder and the corresponding codeword or codewords are written to a particular partial bitstream. At the decoder side, the source symbols are decoded by requests for source symbols. The same binarization scheme as for the encoder is used to convert these request for source symbols into requests for bins, and each request for a bin is associated with the same set of parameters as the corresponding bin at the encoder side. The associated parameters are again mapped onto a small set of indices, where the mapping is the same as at the encoder side. And all bin requests that are associated with a particular index are decoded by a particular binary entropy decoder, which reads a codeword or multiple codewords from the corresponding partial bitstream. The encoders and decoders are configured in a way that different binary entropy encoders and decoders use different coding algorithms (i.e., a different mapping between bin sequences and codewords).

In an embodiment of the invention, the set of associated parameters represents a measure for the probability of one of the two bin values for a particular bin (or a set of equivalent measures). The measure for the probability can for example represent a probability state, which can be represented by a value of a set of N values. The probability estimation is decoupled from the actual coding of the bins. The probability measure is then mapped onto a probability index, by which the encoding and decoding of a bin is assigned to a particular binary entropy encoder and decoder. The mapping of the probability measures to probability indexes (and thus the clustering into groups of probability measures) can also be varied over time, e.g. in dependence of already transmitted symbols. For instance, the assignment can be adapted to the number of bins that have been coded with a certain probability measure or probability index in order to ensure that the created partial bitstreams have similar bit rates. In an embodiment of the invention, the number of binary entropy encoders and decoders is less than the number of possible values for the probability measure. A large number of possible probability measures, which allows an accurate estimation of the associated probability, is mapped onto a small number of probability indices, where each of those is associated with a particular binary entropy encoder and decoder. The small number of binary entropy encoders and decoders provides the advantage that the overhead for transmitting the partial bitstream can be kept small and that the synchronization overhead is of encoding and decoding system can be kept small. When using a probability measure as basis for assigning the bins to particular binary entropy encoders and decoders, the binary encoders and decoders can be particularly optimized for a representative of the group of probability measures, which allows a high coding efficiency (similar to the best known entropy coding schemes). In addition, simple encoding and decoding algorithms, which may consist of a simple mapping of bin sequences to codewords and vice versa, can be designed for the representatives of the groups of probability measure. This reduces the complexity of the encoding and decoding system, while still providing a high coding efficiency. At this point, it should be noted that a high granularity of probability measure is necessitated for an accurate estimation of the bin probabilities; any inaccuracy would have a negative impact on the coding efficiency. But for coding the bins, a relatively small number (significantly smaller than the number of possible probability measure values for the probability estimation) of probability groups is sufficient, since the rate increase that results from encoding a bin with a particular associated probability measure by using an entropy coding algorithm that was designed for a probability that is different than but close to the particular probability is very small. And using a small number of binary entropy encoders and decoders provides the above mentioned advantages. In further embodiments of the invention, the set of parameters that is associated with a bin consists of a measure for the probability of one of the two bin values and one or more additional parameters.

The subject matter of the independent claims achieve the just-outlined and in the following further specified advantages.

BRIEF DESCRIPTION OF THE DRAWINGS

In the following, embodiments of the invention is described in more detail referring to the figures and various embodiments of the invention, which provide advantages in respect to several design aspects, are highlighted. Among the figures.

FIG. 3 shows a schematic diagram illustrating a data packet with multiplexed partial bitstreams according to a comparison embodiment;

FIG. 4: shows a schematic diagram illustrating a data packet with an alternative segmentation using fixed-size segments according to a further comparison embodiment;

FIG. 16 shows a schematic diagram illustrating an example for conversion of a ternary choice tree into a full binary choice tree;

FIG. 19 shows two examples for coding the significance mapping (the marked symbols are not transferred), FIG. 20 shows binarization for the magnitudes of the transform coefficients (ABS), FIG. 21 shows block types and their classification for the H.264/AVC standard.

FIG. 26 shows a sequence of steps for calculating a reference index to reference an initialization probability information table including probability information for the least probable symbol (LPS) and a value of the corresponding most probable symbol (MPS) as initialization probability information;

FIG. 31a shows a schematic diagram illustrating the frame mode, in accordance with an embodiment of the present invention;

FIG. 34 shows a schematic diagram illustrating the addressing scheme of the macroblocks in accordance with an embodiment of the present invention;

FIG. 35 shows a table illustrating how to obtain the macroblock address mbAddrN indicating the macroblock containing a sample having coordinates xN and yN relative to the upper-left sample of a current macroblock and, additionally, the y coordinate yM for the sample in the macroblock mbAddrN for that sample, dependent on the sample being arranged beyond the top or the left border of the current macroblock, the current macroblock being frame or field coded, and the current macroblock being the top or the bottom macroblock of the current macroblock pair, and, eventually, the macroblock mbAddrA being frame or field coded and the line in which the sample lies having an odd or even line number yN;

FIG. 46 table showing bin strings into which an absolute value is binarized;

FIG. 47 table showing bin strings into which an absolute value is binarized;

FIG. 59 shows a pseudo C-code illustrating the parsing process on decoder side.

DETAILED DESCRIPTION OF THE INVENTION

It is noted that during the description of the figures, elements occurring in several of these Figures are indicated with the same reference sign in each of these Figures and a repeated description of these elements as far as the functionality is concerned is avoided in order to avoid unnecessary repetitions. Nevertheless, the functionalities and descriptions provided with respect to one figure shall also apply to other Figures unless the opposite is explicitly indicated.

Figure 1:
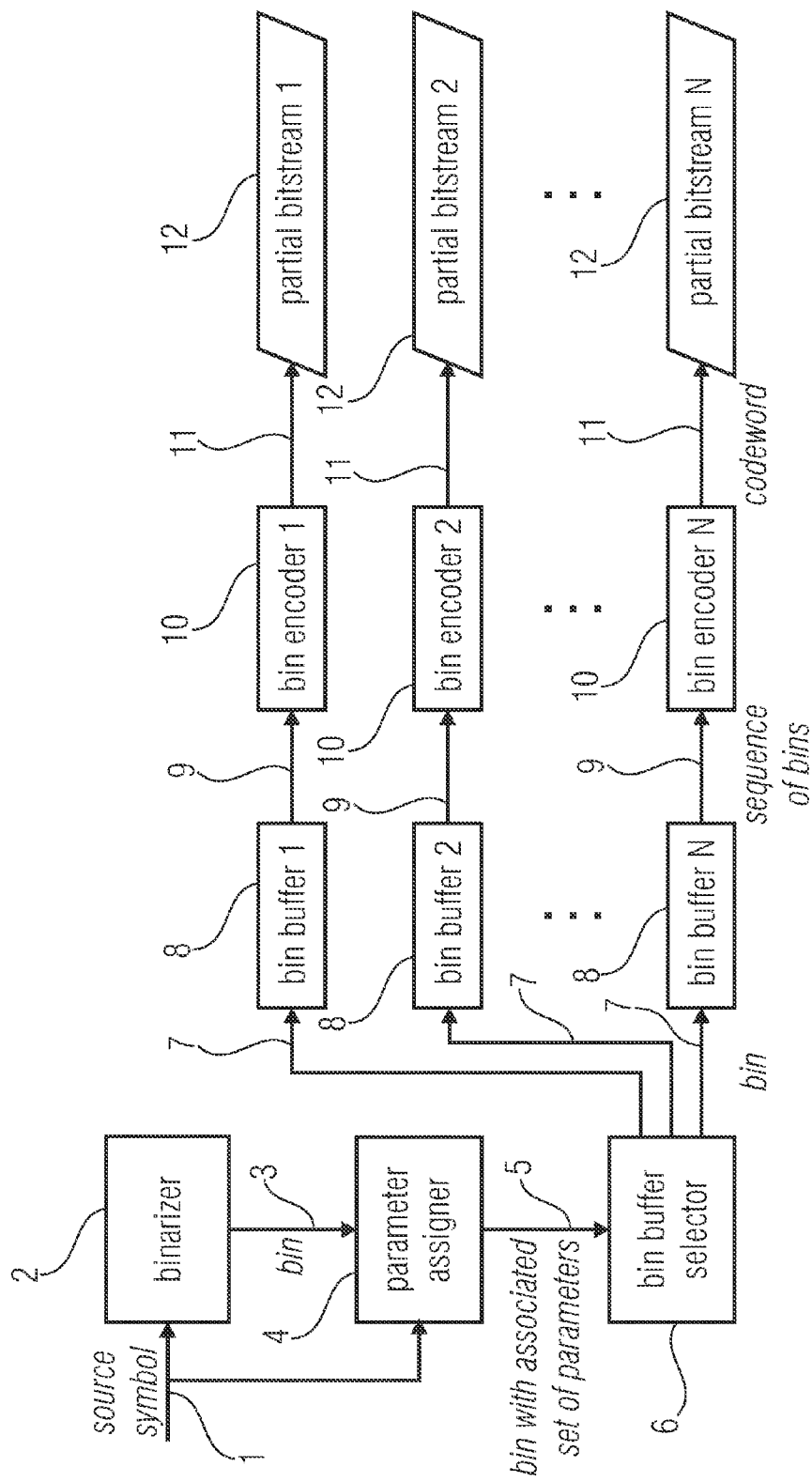
FIG. 1 shows a bock diagram of an encoder according to an embodiment.

An encoder according to an embodiment of the invention is illustrated in FIG. 1. The encoder losslessly converts a stream of source symbols 1 into a set of two or more partial bitstreams 12. In an embodiment of the invention, each source symbol 1 is associated with a category of a set of one or more categories. As an example, the categories can specify the type of the source symbol. In the context of hybrid video coding, a separate category may be associated with macroblock coding modes, block coding modes, reference picture indices, motion vector differences, subdivision flags, coded block flags, quantization parameters, transform coefficient levels, etc. In other application areas such as audio, speech, text, document, or general data coding, different categorizations of source symbols are possible.

In general, each source symbol can take a value of a finite or countable infinite set of values, where the set of possible source symbol values can differ for different source symbol categories. For reducing the complexity of the encoding and decoding algorithm and for allowing a general encoding and decoding design for different source symbols and source symbol categories, the source symbols 1 are converted into ordered sets of binary decisions and these binary decisions are then processed by simple binary coding algorithms. Therefore, the binarizer 2 bijectively maps the value of each source symbol 1 onto a sequence (or string) of bins 3. The sequence of bins 3 represents a set of ordered binary decisions. Each bin 3 or binary decision can take one value of a set of two values, e.g. one of the values 0 and 1. The binarization scheme can be different for different source symbol categories. The binarization scheme for a particular source symbol category can depend on the set of possible source symbol values and/or other properties of the source symbols for the particular category. Table 1 illustrates three example binarization schemes for countable infinite sets. Binarization schemes for countable infinite sets can also be applied for finite sets of symbol values. In particular for large finite sets of symbols values, the inefficiency (resulting from unused sequences of bins) can be negligible, but the universality of such binarization schemes provides an advantage in terms of complexity and memory requirements. For small finite sets of symbol values, it is often of advantage (in terms of coding efficiency) to adapt the binarization scheme to the number of possible symbol values. Table 2 illustrates three example binarization schemes for finite sets of 8 values. Binarization schemes for finite sets can be derived from the universal binarization schemes for countable infinite sets by modifying some sequences of bins in a way that the finite sets of bin sequences represent a redundancy-free code (and potentially reordering the bin sequences). As an example, the truncated unary binarization scheme in Table 2 was created by modifying the bin sequence for the source symbol 7 of the universal unary binarization (see Table 1). The truncated and reordered Exp-Golomb binarization of order 0 in Table 2 was created by modifying the bin sequence for the source symbol 7 of the universal Exp-Golomb order 0 binarization (see Table 1) and by reordering the bin sequences (the truncated bin sequence for symbol 7 was assigned to symbol 1). For finite sets of symbols, it is also possible to use non-systematic/non-universal binarization schemes, as exemplified in the last column of Table 2.

TABLE 1

Binarization examples for countable infinite sets (or large finite sets).

| symbol value | unary binarization | Exp-Golomb order 0 binarization | Exp-Golomb order 1 binarization |
|---|---|---|---|
| 0 | 1 | 1 | 10 |
| 1 | 01 | 010 | 11 |
| 2 | 001 | 011 | 0100 |
| 3 | 0001 | 0010 0 | 0101 |
| 4 | 0000 1 | 0010 1 | 0110 |
| 5 | 0000 01 | 0011 0 | 0111 |
| 6 | 0000 001 | 0011 1 | 0010 00 |
| 7 | 0000 0001 | 0001 000 | 0010 01 |
| ... | ... | ... | ... |

TABLE 2

Binarization examples for finite sets.

| symbol value | truncated unary binarization | truncated and reordered Exp-Golomb order 0 binarization | non-systematic binarization |
|---|---|---|---|
| 0 | 1 | 1 | 000 |
| 1 | 01 | 000 | 001 |
| 2 | 001 | 010 | 01 |
| 3 | 0001 | 011 | 1000 |
| 4 | 0000 1 | 0010 0 | 1001 |
| 5 | 0000 01 | 0010 1 | 1010 |
| 6 | 0000 001 | 0011 0 | 1011 0 |
| 7 | 0000 000 | 0011 1 | 1011 1 |

Each bin 3 of the sequence of bins created by the binarizer 2 is fed into the parameter assigner 4 in sequential order. The parameter assigner assigns a set of one or more parameters to each bin 3 and outputs the bin with the associated set of parameters 5. The set of parameters is determined in exactly the same way at encoder and decoder. The set of parameters may consist of one or more of the following parameters:

a measure for an estimate of the probability for one of the two possible bin values for the current bin, a measure for an estimate of the probability for the less probable or more probable bin value for the current bin, an identifier specifying an estimate for which of the two possible bin values represents the less probable or more probable bin value for the current bin, the category of the associated source symbol, a measure for the importance of the associated source symbol, a measure for the location of the associated symbol (e.g. in temporal, spatial, or volumetric data sets), an identifier specifying the channel code protection for the bin or the associated source symbol, an identifier specifying the encryption scheme for the bin or the associated source symbol, an identifier specifying a class for the associated symbol, the bin number in the sequence of bins for the associated source symbol.

In an embodiment of the invention, the parameter assigner 4 associates each bin 3,5 with a measure for an estimate of the probability for one of the two possible bin values for the current bin. In a further embodiment of the invention, the parameter assigner 4 associates each bin 3,5 with a measure for an estimate of the probability for the less probable or more probable bin value for the current bin and an identifier specifying an estimate for which of the two possible bin values represents the less probable or more probable bin value for the current bin. It should be noted that the probability for the less probable or more probable bin value and the identifier specifying which of the two possible bin values represents the less probable or more probable bin value are equivalent measures for the probability of one of the two possible bin values.

In a further embodiment of the invention, the parameter assigner 4 associates each bin 3,5 with a measure for an estimate of the probability for one of the two possible bin values for the current bin and one or more further parameters (which may be one or more of the above listed parameters). In a further embodiment of the invention, the parameter assigner 4 associates each bin 3,5 with a measure for an estimate of the probability for the less probable or more probable bin value for the current bin, an identifier specifying an estimate for which of the two possible bin values represents the less probable or more probable bin value for the current bin, and one or more further parameters (which may be one or more of the above listed parameters).

In an embodiment of the invention, the parameter assigner 4 determines one or more of the above mentioned probability measures (measure for an estimate of the probability for one of the two possible bin values for the current bin, measure for an estimate of the probability for the less probable or more probable bin value for the current bin, identifier specifying an estimate for which of the two possible bin values represents the less probable or more probable bin value for the current bin) based on a set of one or more already encoded symbols. The encoded symbols that are used for determining the probability measures can include one or more already encoded symbols of the same symbol category, one or more already encoded symbols of the same symbol category that correspond to data sets (such as blocks or groups of samples) of neighboring spatial and/or temporal locations (in relation to the data set associated with the current source symbol), or one or more already encoded symbols of different symbol categories that correspond to data sets of the same and/or neighboring spatial and/or temporal locations (in relation to the data set associated with the current source symbol).

Each bin with an associated set of parameters 5 that is output of the parameter assigner 4 is fed into a bin buffer selector 6. The bin buffer selector 6 potentially modifies the value of the input bin 5 based on the input bin value and the associated parameters 5 and feds the output bin 7—with a potentially modified value—into one of two or more bin buffers 8. The bin buffer 8 to which the output bin 7 is sent is determined based on the value of the input bin 5 and/or the value of the associated parameters 5.

In an embodiment of the invention, the bin buffer selector 6 does not modify the value of the bin, i.e., the output bin 7 has the same value as the input bin 5.

In a further embodiment of the invention, the bin buffer selector 6 determines the output bin value 7 based on the input bin value 5 and the associated measure for an estimate of the probability for one of the two possible bin values for the current bin. In an embodiment of the invention, the output bin value 7 is set equal to the input bin value 5 if the measure for the probability for one of the two possible bin values for the current bin is less than (or less than or equal to) a particular threshold; if the measure for the probability for one of the two possible bin values for the current bin is greater than or equal to (or greater than) a particular threshold, the output bin value 7 is modified (i.e., it is set to the opposite of the input bin value). In a further embodiment of the invention, the output bin value 7 is set equal to the input bin value 5 if the measure for the probability for one of the two possible bin values for the current bin is greater than (or greater than or equal to) a particular threshold; if the measure for the probability for one of the two possible bin values for the current bin is less than or equal to (or less than) a particular threshold, the output bin value 7 is modified (i.e., it is set to the opposite of the input bin value). In an embodiment of the invention, the value of the threshold corresponds to a value of 0.5 for the estimated probability for both possible bin values.

In a further embodiment of the invention, the bin buffer selector 6 determines the output bin value 7 based on the input bin value 5 and the associated identifier specifying an estimate for which of the two possible bin values represents the less probable or more probable bin value for the current bin. In an embodiment of the invention, the output bin value 7 is set equal to the input bin value 5 if the identifier specifies that the first of the two possible bin values represents the less probable (or more probable) bin value for the current bin, and the output bin value 7 is modified (i.e., it is set to the opposite of the input bin value) if identifier specifies that the second of the two possible bin values represents the less probable (or more probable) bin value for the current bin.

In an embodiment of the invention, the bin buffer selector 6 determines the bin buffer 8 to which the output bin 7 is sent based on the associated measure for an estimate of the probability for one of the two possible bin values for the current bin. In an embodiment of the invention, the set of possible values for the measure for an estimate of the probability for one of the two possible bin values is finite and the bin buffer selector 6 contains a table that associates exactly one bin buffer 8 with each possible value for the estimate of the probability for one of the two possible bin values, where different values for the measure for an estimate of the probability for one of the two possible bin values can be associated with the same bin buffer 8. In a further embodiment of the invention, the range of possible values for the measure for an estimate of the probability for one of the two possible bin values is partitioned into a number of intervals, the bin buffer selector 6 determines the interval index for the current measure for an estimate of the probability for one of the two possible bin values, and the bin buffer selector 6 contains a table that associates exactly one bin buffer 8 with each possible value for the interval index, where different values for the interval index can be associated with the same bin buffer 8. In an embodiment of the invention, input bins 5 with opposite measures for an estimate of the probability for one of the two possible bin values (opposite measure are those which represent probability estimates p and 1−P) are fed into the same bin buffer 8. In a further embodiment of the invention, the association of the measure for an estimate of the probability for one of the two possible bin values for the current bin with a particular bin buffer is adapted over time, e.g. in order to ensure that the created partial bitstreams have similar bit rates.

In a further embodiment of the invention, the bin buffer selector 6 determines the bin buffer 8 to which the output bin 7 is sent based on the associated measure for an estimate of the probability for the less probable or more probable bin value for the current bin. In an embodiment of the invention, the set of possible values for the measure for an estimate of the probability for the less probable or more probable bin value is finite and the bin buffer selector 6 contains a table that associates exactly one bin buffer 8 with each possible value of the estimate of the probability for the less probable or more probable bin value, where different values for the measure for an estimate of the probability for the less probable or more probable bin value can be associated with the same bin buffer 8. In a further embodiment of the invention, the range of possible values for the measure for an estimate of the probability for the less probable or more probable bin value is partitioned into a number of intervals, the bin buffer selector 6 determines the interval index for the current measure for an estimate of the probability for the less probable or more probable bin value, and the bin buffer selector 6 contains a table that associates exactly one bin buffer 8 with each possible value for the interval index, where different values for the interval index can be associated with the same bin buffer 8. In a further embodiment of the invention, the association of the measure for an estimate of the probability for the less probable or more probable bin value for the current bin with a particular bin buffer is adapted over time, e.g. in order to ensure that the created partial bitstreams have similar bit rates.

Each of the two or more bin buffers 8 is connected with exactly one bin encoder 10 and each bin encoder is only connected with one bin buffer 8. Each bin encoder 10 reads bins from the associated bin buffer 8 and converts a sequence of bins 9 into a codeword 11, which represents a sequence of bits. The bin buffers 8 represent first-in-first-out buffers; bins that are fed later (in sequential order) into a bin buffer 8 are not encoded before bins that are fed earlier (in sequential order) into the bin buffer. The codewords 11 that are output of a particular bin encoder 10 are written to a particular partial bitstream 12. The overall encoding algorithm converts source symbols 1 into two or more partial bitstreams 12, where the number of partial bitstreams is equal to the number of bin buffers and bin encoders. In an embodiment of the invention, a bin encoder 10 converts a variable number of bins 9 into a codeword 11 of a variable number of bits. One advantage of the above- and below-outlined embodiments of the invention is that the encoding of bins can be done in parallel (e.g. for different groups of probability measures), which reduces the processing time for several implementations.

Another advantage of embodiments of the invention is that the bin encoding, which is done by the bin encoders 10, can be specifically designed for different sets of parameters 5. In particular, the bin encoding and encoding can be optimized (in terms of coding efficiency and/or complexity) for different groups of estimated probabilities. On the one hand side, this allows a reduction of the encoding/decoding complexity relative to state-of-the-art entropy coding algorithms with similar coding efficiency. On the other hand side, it allows an improvement of the coding efficiency relative to state-of-the-art entropy coding algorithms with similar encoding/decoding complexity. In an embodiment of the invention, the bin encoders 10 implement different encoding algorithms (i.e. mapping of bin sequences onto codewords) for different groups of measures for an estimate of the probability for one of the two possible bin values 5 for the current bin. In a further embodiment of the invention, the bin encoders 10 implement different encoding algorithms for different groups of measures for an estimate of the probability for the less probable or more probable bin value for the current bin. In a further embodiment, the bin encoders 10 implement different encoding algorithms for different channel protection codes. In a further embodiment, the bin encoders 10 implement different encoding algorithms for different encryption schemes. In a further embodiment, the bin encoders 10 implement different encoding algorithms for different combinations of channel protection codes and groups of measures for an estimate of the probability for one of the two possible bin values 5 for the current bin. In a further embodiment, the bin encoders 10 implement different encoding algorithms for different combinations of channel protection codes and groups of measures for an estimate of the probability for the less probable or more probable bin value 5 for the current bin. In a further embodiment, the bin encoders 10 implement different encoding algorithms for different combinations of encryption schemes and groups of measures for an estimate of the probability for one of the two possible bin values 5 for the current bin. In a further embodiment, the bin encoders 10 implement different encoding algorithms for different combinations of encryption schemes and groups of measures for an estimate of the probability for the less probable or more probable bin value 5 for the current bin.

In an embodiment of the invention, the bin encoders 10—or one or more of the bin encoders—represent binary arithmetic encoding engines. In a further embodiment of the invention, one or more of the bin encoders represent a binary arithmetic coding engine, wherein the mapping from the representative LPS/LPB probability $p_{LPS}$ of a given bin buffer to a corresponding code interval width $R_{LPS}$—i.e. the interval subdivision of the internal state of the binary arithmetic coding engine, which is defined by the current interval width R and the current interval offset L, identifying, for example, the lower bound of the code interval—is realized by using a table lookup. In a further embodiment, for each table-based binary arithmetic coding engine associated to a given bin buffer, K representative interval width values $\{Q_0, \ldots, Q_{K-1}\}$ are used for representing $R_{LPS}$ with the choice of K and the representative interval width values $\{Q_0, \ldots, Q_{K-1}\}$ being dependent on the bin buffer. For a choice of K>1, arithmetic encoding of a bin may involve the substeps of mapping the current interval width R to a quantization index q with values in $\{0, \ldots, K-1\}$ and performing the interval subdivision by accessing the corresponding partial interval width value $Q_q$ from a lookup table with using q as an index. For a choice of K=1, i.e., for the case where only one representative interval width value $Q_0$ is given, this value $Q_0$ may be chosen as a power of two in order to allow decoding of multiple MPS/MPB values entering the corresponding bin buffer within a single renormalization cycle. The resulting codewords of each arithmetic coding engine may be separately transmitted, packetized, or stored, or they may be interleaved for the purpose of transmission or storage as described hereinafter.

That is, a binary arithmetic coding engine 10 could perform the following steps in coding the bins in its bin buffer 8:

1. Receiving valLPS, bin from bin buffer (recall: the respective binary arithmetic coding engine 10 considered here had been chosen to receive "bin" because (or, in other words, "bin" was associated with the respective binary arithmetic coding engine 10) the probability distribution estimate, such as p_state[bin], was associated with that binary arithmetic coding engine 10)
2. Quantization of R:
   q_index = Qtab[R>>q] (or some other form of quantization)
3. Determination of $R_{LPS}$ and R:
   $R_{LPS}$ = Rtab [q_index] (note that p_state is not mentioned here, as it is fixed for the binary arithmetic coding engine 10 considered, i.e. p_state[encoder], and Rtab has stored therein pre-calculated values for p[p_state[encoder]].Q[q_index]
   R = R − $R_{LPS}$ [that is, R is preliminarily pre-updated as if "bin" was MPS]
4. Calculation of the new partial interval:
   if (bin = 1 − valMPS) then
     L ← L + R
     R ← $R_{LPS}$
5. Renormalization of L and R, writing bits, wherein
q_index describes the index of a quantization value read out of Qtab,
p_state describes the current state (fixed for the binary arithmetic coding engine 10),
$R_{LPS}$ describes the interval width corresponding to the LPS and
valMPS describes the value of the bit corresponding to the MPS.

Accordingly, a binary arithmetic decoding engine 22 could perform the following steps in decoding the bins output into bin buffer 20:

1. Receiving request for a bin (recall: the respective binary arithmetic decoding engine 22 considered here had been chosen to decode "bin" because (or, in other words, "bin" was associated with the respective binary arithmetic decoding engine 22) the probability distribution estimate, such as p_state[bin], was associated with that binary arithmetic decoding engine 22)
2. Quantization of R:
   q_index = Qtab[R>>q]  (or some other form of quantization)
3. Determination of $R_{LPS}$ and R:
   $R_{LPS}$ = Rtab [q_index] (note that p_state is not mentioned here, as it is fixed for the binary arithmetic decoding engine 22 considered, i.e. p_state[encoder], and Rtab has stored therein pre-calculated values for p[p_state[encoder]].Q[q_index]
   R = R − $R_{LPS}$ [that is, R is preliminarily pre-updated as if "bin" was MPS]
4. Determination of bin depending on the position of the partial interval:
   if (V ≥ R) then
     bin ← 1 − valMPS    (bin is decoded as LPS; bin buffer selector 18 will obtain the actual bin value by use of this bin information and valMPS)
     V ← V − R
     R ← $R_{LPS}$
   else
     bin ← V valMPS   (bin is decoded as MPS; bin buffer selector 18 will obtain the actual bin value by use of this bin information and valMPS)
5. Renormalization of R, reading out one bit and updating V, wherein
q_index describes the index of a quantization value read out of Qtab,
p_state describes the current state (fixed for the binary arithmetic decoding engine 22),
$R_{LPS}$ describes the interval width corresponding to the LPS,
valMPS describes the value of the bit corresponding to the MPS, and
V describes a value from the interior of the current partial interval.

In a further embodiment of the invention, the bin encoders 10—or one or more of the bin encoders—represent entropy encoders that directly map sequences of input bins 9 onto codewords 10. Such mappings can be efficiently implemented and don't require a complex arithmetic coding engine. The inverse mapping of codewords onto sequences of bins (as done in the decoder) have to be unique in order to guarantee perfect decoding of the input sequence, but the mapping of bin sequences 9 onto codewords 10 doesn't necessarily need to be unique, i.e., it is possible that a particular sequence of bins can be mapped onto more than one sequence of codewords. In an embodiment of the invention, the mapping of sequences of input bins 9 onto codewords 10 is bijective. In a further embodiment of the invention, the bin encoders 10—or one or more of the bin encoders—represent entropy encoders that directly map variable-length sequences of input bins 9 onto variable-length codewords 10. In an embodiment of the invention, the output codewords represent redundancy-free codes such as general huffman codes or canonical huffman codes.

Two examples for the bijective mapping of bin sequences to redundancy-free codes are illustrated in Table 3. In a further embodiment of the invention, the output codewords represent redundant codes suitable for error detection and error recovery. In a further embodiment of the invention, the output codewords represent encryption codes suitable for encrypting the source symbols.

TABLE 3

Examples for mappings between bin sequences and codewords.

| sequence of bins (bin order is from left to right) | codewords (bits order is from left to right) |
| --- | --- |
| 0000 0000 | 1 |
| 0000 0001 | 0000 |
| 0000 001 | 0001 |
| 0000 01 | 0010 |
| 0000 1 | 0011 |

TABLE 3-continued

Examples for mappings between bin sequences and codewords.

| sequence of bins (bin order is from left to right) | codewords (bits order is from left to right) |
| --- | --- |
| 0001 | 0100 |
| 001 | 0101 |
| 01 | 0110 |
| 1 | 0111 |
| 000 | 10 |
| 01 | 11 |
| 001 | 010 |
| 11 | 011 |

TABLE 3-continued

Examples for mappings between bin sequences and codewords.

| sequence of bins (bin order is from left to right) | codewords (bits order is from left to right) |
|---|---|
| 1000 0 | 0001 |
| 1001 | 0010 |
| 1010 | 0011 |
| 1000 1 | 0000 0 |
| 1011 | 0000 1 |

In a further embodiment of the invention, the bin encoders 10—or one or more of the bin encoders—represent entropy encoders that directly map variable-length sequences of input bins 9 onto fixed-length codewords 10. In a further embodiment of the invention, the bin encoders 10—or one or more of the bin encoders—represent entropy encoders that directly map fixed-length sequences of input bins 9 onto variable-length codewords 10.

Figure 2:
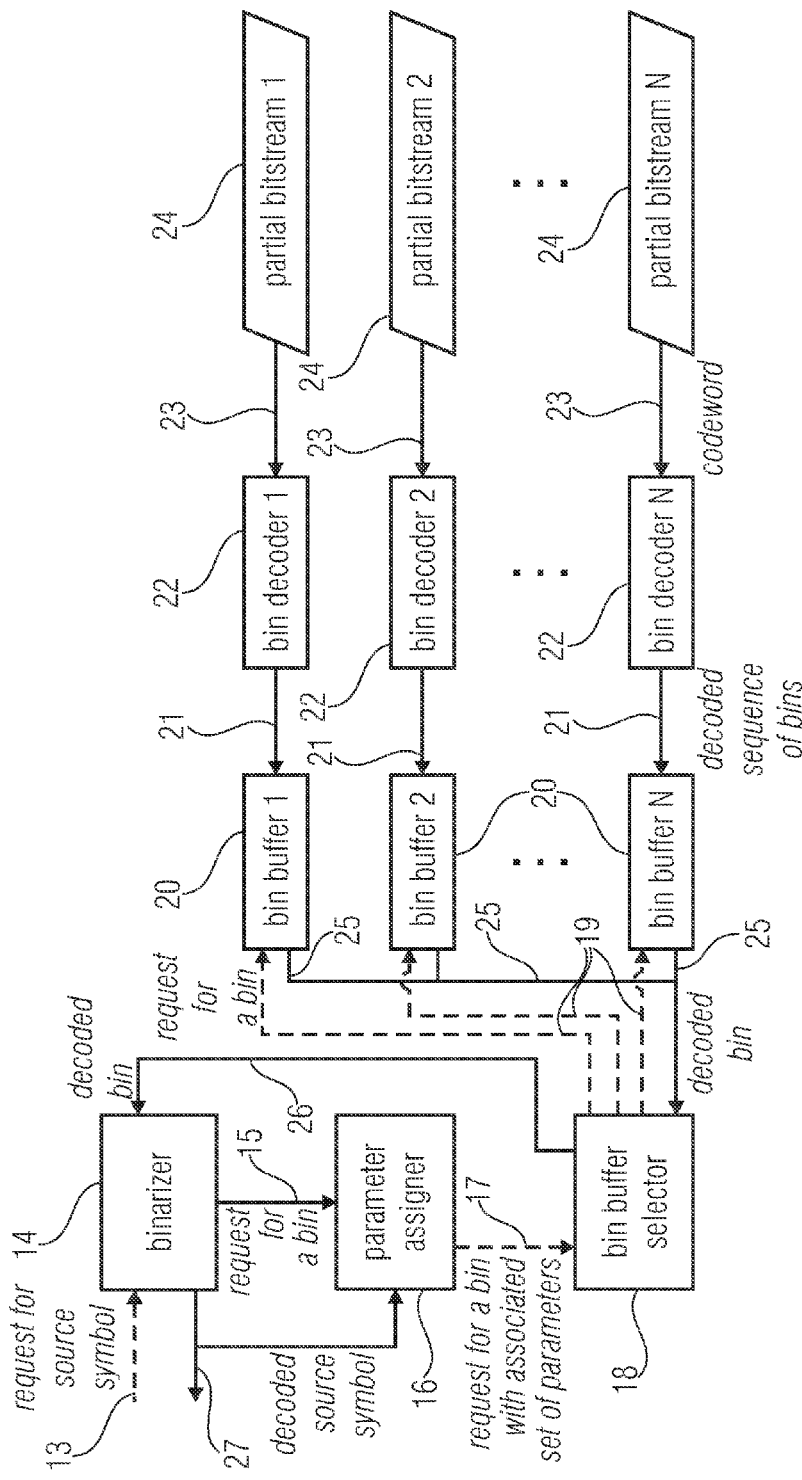
FIG. 2 shows a bock diagram of a decoder suitable for decoding bitstream generated by the encoder of FIG. 1, according to an embodiment.

The decoder according an embodiment of the invention is illustrated in FIG. 2. The decoder performs basically the inverse operations of the encoder, so that the (previously encoded) sequence of source symbols 27 is decoded from a set of two or more partial bitstreams 24. The decoder includes two different process flows: A flow for data requests, which replicates the data flow of the encoder, and a data flow, which represents the inverse of the encoder data flow. In the illustration in FIG. 2, the dashed arrows represent the data request flow, while the solid arrows represent the data flow. The building blocks of the decoder basically replicate the building blocks of the encoder, but implement the inverse operations.

The decoding of a source symbol is triggered by a request for a new decoded source symbol 13 that is sent to the binarizer 14. In an embodiment of the invention, each request for a new decoded source symbol 13 is associated with a category of a set of one or more categories. The category that is associated with a request for a source symbol is the same as the category that was associated with the corresponding source symbol during encoding.

The binarizer 14 maps the request for a source symbol 13 into one or more requests for a bin that are sent to the parameter assigner 16. As final response to a request for a bin that is sent to the parameter assigner 16 by the binarizer 14, the binarizer 14 receives a decoded bin 26 from the bin buffer selector 18. The binarizer 14 compares the received sequence of decoded bins 26 with the bin sequences of a particular binarization scheme for the requested source symbol and, if the received sequence of decoded bins 26 matches the binarization of a source symbol, the binarizer empties its bin buffer and outputs the decoded source symbol as final response to the request for a new decoded symbol. If the already received sequence of decoded bins does not match any of the bin sequences for the binarization scheme for the requested source symbol, the binarizer sends another request for a bin to the parameter assigner until the sequence of decoded bins matches one of the bin sequences of the binarization scheme for the requested source symbol. For each request for a source symbol, the decoder uses the same binarization scheme that was used for encoding the corresponding source symbol. The binarization scheme can be different for different source symbol categories. The binarization scheme for a particular source symbol category can depend on the set of possible source symbol values and/or other properties of the source symbols for the particular category.

The parameter assigner assigns a set of one or more parameters to each request for a bin and sends the request for a bin with the associated set of parameters to the bin buffer selector. The set of parameters that are assigned to a requested bin by the parameter assigner is the same that was assigned to the corresponding bin during encoding. The set of parameters may consist of one or more of the parameters that are mentioned in the encoder description.

In an embodiment of the invention, the parameter assigner 16 associates each request for a bin with a measure for an estimate of the probability for one of the two possible bin values for the current requested bin. In a further embodiment of the invention, the parameter assigner 16 associates each request for a bin with a measure for an estimate of the probability for the less probable or more probable bin value for the current requested bin and an identifier specifying an estimate for which of the two possible bin values represents the less probable or more probable bin value for the current requested bin.

In a further embodiment of the invention, the parameter assigner 16 associates each request for a bin 15,17 with a measure for an estimate of the probability for one of the two possible bin values for the current requested bin and one or more further parameters. In a further embodiment of the invention, the parameter assigner 16 associates each request for a bin 15,17 with a measure for an estimate of the probability for the less probable or more probable bin value for the current requested bin, an identifier specifying an estimate for which of the two possible bin values represents the less probable or more probable bin value for the current requested bin, and one or more further parameters (which may one or more of the above listed parameters).

In an embodiment of the invention, the parameter assigner 16 determines one or more of the above mentioned probability measures (measure for an estimate of the probability for one of the two possible bin values for the current requested bin, measure for an estimate of the probability for the less probable or more probable bin value for the current requested bin, identifier specifying an estimate for which of the two possible bin values represents the less probable or more probable bin value for the current requested bin) based on a set of one or more already decoded symbols. The determination of the probability measures for a particular request for a bin replicates the process at the encoder for the corresponding bin. The decoded symbols that are used for determining the probability measures can include one or more already decoded symbols of the same symbol category, one or more already decoded symbols of the same symbol category that correspond to data sets (such as blocks or groups of samples) of neighboring spatial and/or temporal locations (in relation to the data set associated with the current request for a source symbol), or one or more already decoded symbols of different symbol categories that correspond to data sets of the same and/or neighboring spatial and/or temporal locations (in relation to the data set associated with the current request for a source symbol).

Each request for a bin with an associated set of parameters 17 that is output of the parameter assigner 16 is fed into a bin buffer selector 18. Based on the associated set of parameters 17, the bin buffer selector 18 sends a request for a bin 19 to one of two or more bin buffers 20 and receives a decoded bin 25 from the selected bin buffer 20. The decoded input bin 25 is potentially modified and the decoded output bin 26—with a potentially modified value—is send to the binarizer 14 as final response to the request for a bin with an associated set of parameters 17.

The bin buffer 20 to which the request for a bin is forwarded is selected in the same way as the bin buffer to which the output bin of the bin buffer selector at the encoder side was sent.

In an embodiment of the invention, the bin buffer selector 18 determines the bin buffer 20 to which the request for a bin 19 is sent based on the associated measure for an estimate of the probability for one of the two possible bin values for the current requested bin. In an embodiment of the invention, the set of possible values for the measure for an estimate of the probability for one of the two possible bin values is finite and the bin buffer selector 18 contains a table that associates exactly one bin buffer 20 with each possible value of the estimate of the probability for one of the two possible bin values, where different values for the measure for an estimate of the probability for one of the two possible bin values can be associated with the same bin buffer 20. In a further embodiment of the invention, the range of possible values for the measure for an estimate of the probability for one of the two possible bin values is partitioned into a number of intervals, the bin buffer selector 18 determines the interval index for the current measure for an estimate of the probability for one of the two possible bin values, and the bin buffer selector 18 contains a table that associates exactly one bin buffer 20 with each possible value for the interval index, where different values for the interval index can be associated with the same bin buffer 20. In an embodiment of the invention, requests for bins 17 with opposite measures for an estimate of the probability for one of the two possible bin values (opposite measure are those which represent probability estimates P and 1−P) are forwarded to the same bin buffer 20. In a further embodiment of the invention, the association of the measure for an estimate of the probability for one of the two possible bin values for the current bin request with a particular bin buffer is adapted over time.

In a further embodiment of the invention, the bin buffer selector 18 determines the bin buffer 20 to which the request for a bin 19 is sent based on the associated measure for an estimate of the probability for the less probable or more probable bin value for the current requested bin. In an embodiment of the invention, the set of possible values for the measure for an estimate of the probability for the less probable or more probable bin value is finite and the bin buffer selector 18 contains a table that associates exactly one bin buffer 20 with each possible value of the estimate of the probability for the less probable or more probable bin value, where different values for the measure for an estimate of the probability for the less probable or more probable bin value can be associated with the same bin buffer 20. In a further embodiment of the invention, the range of possible values for the measure for an estimate of the probability for the less probable or more probable bin value is partitioned into a number of intervals, the bin buffer selector 18 determines the interval index for the current measure for an estimate of the probability for the less probable or more probable bin value, and the bin buffer selector 18 contains a table that associates exactly one bin buffer 20 with each possible value for the interval index, where different values for the interval index can be associated with the same bin buffer 20. In a further embodiment of the invention, the association of the measure for an estimate of the probability for the less probable or more probable bin value for the current bin request with a particular bin buffer is adapted over time.

After receiving a decoded bin 25 from the selected bin buffer 20, the bin buffer selector 18 potentially modifies the input bin 25 and sends the output bin 26—with a potentially modified value—to the binarizer 14. The input/output bin mapping of the bin buffer selector 18 is the inverse of the input/output bin mapping of the bin buffer selector at the encoder side.

In an embodiment of the invention, the bin buffer selector 18 does not modify the value of the bin, i.e., the output bin 26 has the same value as the input bin 25.

In a further embodiment of the invention, the bin buffer selector 18 determines the output bin value 26 based on the input bin value 25 and the measure for an estimate of the probability for one of the two possible bin values for the current requested bin that is associated with the request for a bin 17. In an embodiment of the invention, the output bin value 26 is set equal to the input bin value 25 if the measure for the probability for one of the two possible bin values for the current bin request is less than (or less than or equal to) a particular threshold; if the measure for the probability for one of the two possible bin values for the current bin request is greater than or equal to (or greater than) a particular threshold, the output bin value 26 is modified (i.e., it is set to the opposite of the input bin value). In a further embodiment of the invention, the output bin value 26 is set equal to the input bin value 25 if the measure for the probability for one of the two possible bin values for the current bin request is greater than (or greater than or equal to) a particular threshold; if the measure for the probability for one of the two possible bin values for the current bin request is less than or equal to (or less than) a particular threshold, the output bin value 26 is modified (i.e., it is set to the opposite of the input bin value). In an embodiment of the invention, the value of the threshold corresponds to a value of 0.5 for the estimated probability for both possible bin values.

In a further embodiment of the invention, the bin buffer selector 18 determines the output bin value 26 based on the input bin value 25 and the identifier, specifying an estimate for which of the two possible bin values represents the less probable or more probable bin value for the current bin request, that is associated with the request for a bin 17. In an embodiment of the invention, the output bin value 26 is set equal to the input bin value 25 if the identifier specifies that the first of the two possible bin values represents the less probable (or more probable) bin value for the current bin request, and the output bin value 26 is modified (i.e., it is set to the opposite of the input bin value) if identifier specifies that the second of the two possible bin values represents the less probable (or more probable) bin value for the current bin request.

As described above, the bin buffer selector sends a request for a bin 19 to one of the two or more bin buffers 20. The bin buffers 20 represent first-in-first-out buffers, which are fed with sequences of decoded bins 21 from the connected bin decoders 22. As response to a request for a bin 19 that is sent to a bin buffer 20 from the bin buffer selector 18, the bin buffer 20 removes the bin of its content that was first fed into the bin buffer 20 and sends it to the bin buffer selector 18. Bins that are earlier sent to the bin buffer 20 are earlier removed and sent to the bin buffer selector 18.

Each of the two or more bin buffers 20 is connected with exactly one bin decoder 22 and each bin decoder is only connected with one bin buffer 20. Each bin decoder 22 reads codewords 23, which represent sequences of bits, from a separate partial bitstream 24. The bin decoder converts a codeword 23 into a sequence of bins 21 that is sent to the connected bin buffer 20. The overall decoding algorithm converts two or more partial bitstreams 24 into a number of decoded source symbols, where the number of partial bitstreams is equal to the number of bin buffers and bin decoders and the decoding of source symbols is triggered by requests for new source symbols. In an embodiment of the invention, a bin decoder 22 converts codewords 23 of a variable number of bits into a sequence of a variable number of bins 21. One advantage of embodiments of the invention is that the decoding of bins from the two or more partial bitstreams can be done in parallel (e.g. for different groups of probability measures), which reduces the processing time for several implementations.

Another advantage of embodiments of the invention is that the bin decoding, which is done by the bin decoders 22, can be specifically designed for different sets of parameters 17. In particular, the bin encoding and decoding can be optimized (in terms of coding efficiency and/or complexity) for different groups of estimated probabilities. On the one hand side, this allows a reduction of the encoding/decoding complexity relative to state-of-the-art entropy coding algorithms with similar coding efficiency. On the other hand side, it allows an improvement of the coding efficiency relative to state-of-the-art entropy coding algorithms with similar encoding/decoding complexity. In an embodiment of the invention, the bin decoders 22 implement different decoding algorithms (i.e. mapping of bin sequences onto codewords) for different groups of measures for an estimate of the probability for one of the two possible bin values 17 for the current bin request. In a further embodiment of the invention, the bin decoders 22 implement different decoding algorithms for different groups of measures for an estimate of the probability for the less probable or more probable bin value for the current requested bin. In a further embodiment, the bin decoders 22 implement different decoding algorithms for different channel protection codes. In a further embodiment, the bin decoders 22 implement different decoding algorithms for different encryption schemes. In a further embodiment, the bin decoders 22 implement different decoding algorithms for different combinations of channel protection codes and groups of measures for an estimate of the probability for one of the two possible bin values 17 for the current requested bin. In a further embodiment, the bin decoders 22 implement different decoding algorithms for different combinations of channel protection codes and groups of measures for an estimate of the probability for the less probable or more probable bin value 17 for the current requested bin. In a further embodiment, the bin decoders 22 implement different decoding algorithms for different combinations of encryption schemes and groups of measures for an estimate of the probability for one of the two possible bin values 17 for the current requested bin. In a further embodiment, the bin decoders 22 implement different decoding algorithms for different combinations of encryption schemes and groups of measures for an estimate of the probability for the less probable or more probable bin value 17 for the current requested bin.

The bin decoders 22 do the inverse mapping of the corresponding bin encoders at the encoder side.

In an embodiment of the invention, the bin decoders 22—or one or more of the bin decoders—represent binary arithmetic decoding engines.

In a further embodiment of the invention, the bin decoders 22—or one or more of the bin decoders—represent entropy decoders that directly map codewords 23 onto sequences of bins 21. Such mappings can be efficiently implemented and don't require a complex arithmetic coding engine. The mapping of codewords onto sequences of bins has to be unique. In an embodiment of the invention, the mapping of codewords 23 onto sequences of bins 21 is bijective. In a further embodiment of the invention, the bin decoders 10—or one or more of the bin decoders—represent entropy decoders that directly map variable-length codewords 23 into variable-length sequences of bins 21. In an embodiment of the invention, the input codewords represent redundancy-free codes such as general huffman codes or canonical huffman codes. Two examples for the bijective mapping of redundancy-free codes to bin sequences are illustrated in Table 3. In a further embodiment of the invention, the input codewords represent redundant codes suitable for error detection and error recovery. In a further embodiment of the invention, the input codewords represent encryption codes.

In a further embodiment of the invention, the bin decoders 22—or one or more of the bin decoders—represent entropy decoders that directly map fixed-length codewords 23 onto variable-length sequences of bins 21. In a further embodiment of the invention, the bin decoders 22—or one or more of the bin decoders—represent entropy decoders that directly map variable-length codewords 23 onto fixed-length sequences of bins 21.

Thus, FIGS. 1 and 2 showed an embodiment for an encoder for encoding a sequence of symbols 3 and a decoder for reconstructing same. The encoder comprises an assigner 4 configured to assign a number of parameters 5 to each symbol of the sequence of symbols. The assignment is based on information contained within previous symbols of the sequence of symbols such as the category of the syntax element 1 to the representation—such as binarization—of which the current symbol belongs and which, according to the syntax structure of the syntax elements 1, is currently be expected which expectation, in turn, is deducible from the history of previous syntax elements 1 and symbols 3. Further, the encoder comprises a plurality of entropy encoders 10 each of which is configured to convert the symbols 3 forwarded to the respective entropy encoder into a respective bitstream 12, and a selector 6 configured to forward each symbol 3 to a selected one of the plurality of entropy encoders 10, the selection depending on the number of parameters 5 assigned to the respective symbol 3. The decoder for reconstructing a sequence of symbols comprises a plurality of entropy decoders 22, each of which is configured to convert a respective bitstream 23 into symbols 21; an assigner 16 configured to assign a number of parameters 17 to each symbol 15 of a sequence of symbols to be reconstructed based on information contained within previously reconstructed symbols of the sequence of symbols (see 26 and 27 in FIG. 2); and a selector 18 configured to retrieve each symbol of the sequence of symbols to be reconstructed from a selected one of the plurality of entropy decoders 22, the selection depending on the number of parameters defined to the respective symbol. The assigner 16 may be configured such that the number of parameters assigned to each symbol comprises, or is, a measure for an estimate of a probability of distribution among the possible symbol values a respective symbol may assume. The sequence of symbols to be reconstructed may be of a binary alphabet and the assigner 16 may be configured such that the estimate of the probability distribution consists of a measure for an estimate of a probability of a less probable or more probable bin value of the two possible bin values of the binary alphabet and an identifier specifying an estimate for which of the two possible bin values represents the less probable or more probable bin value. The assigner 16 may further be configured to internally assign a context to each symbol of the sequence of symbols 15 to be reconstructed based on the information contained within previously reconstructed symbols of the sequence of symbols to be reconstructed with each context having a respective probability distribution estimate associated therewith, and to adapt the probability distribution estimate for each context to an actual symbol statistic based on symbol values of previously reconstructed symbols to which the respective context is assigned. The context may take into account a spatial relationship or neighbourhood of positions to which the syntax elements belong such as in video or picture coding, or even in tables in case of financial applications. Then, the measure for the estimate of the probability distribution for each symbol may be determined based on the probability distribution estimate associated with the context assigned to the respective symbol such as by quantizing the probability distribution estimate associated with the context assigned with the respective symbol to one of a plurality of probability distribution estimate representatives in order to obtain the measure for the estimate of the probability distribution. The selector may be configured such that a bijective association is defined between the plurality of entropy encoders and the plurality of probability distribution estimate representatives. The selector 18 may be configured to change a quantization mapping from a range of the probability distribution estimates to the plurality of probability distribution estimate representatives in a predetermined deterministic way depending on previously reconstructed symbols of the sequence of symbols, over time. That is, selector 18 may change the quantization step sizes, i.e. the intervals of probability distributions mapped onto the individual probability indices bijectively associated with the individual entropy decoders. The plurality of entropy decoders 22, in turn, may be configured to adapt their way of converting symbols into bit streams responsive to a change in the quantization mapping. For example, each entropy decoder 22 may be optimised for, i.e may have an optimal compression rate for, a certain probability distribution estimate within the respective probability distribution estimate quantization interval, and may change its codeword/symbol sequence mapping so as to adapt the position of this certain probability distribution estimate within the respective probability distribution estimate quantization interval upon a change of the latter so as to be optimised. The selector may be configured to change the quantization mapping such that rates by which the symbols are retrieved from the plurality of entropy decoders, are made less dispersed. As to the binarizer 14 it is noted that same me be left away if the syntax elements are already binary. Further, depending on the type of decoder 22, the existence of the buffers 20 is not necessary. Further, the buffers may be integrated within the decoders.

Termination of Finite Source Symbol Sequences

In an embodiment of the invention, the encoding and decoding is done for a finite set of source symbols. Often a certain quantity of data such as a still image, a frame or field of a video sequence, a slice of an image, a slice of a frame or a field of a video sequence, or a set of successive audio samples, etc. is coded. For finite sets of source symbols, in general, the partial bitstreams that are created at the encoder side have to be terminated, i.e., it has to be ensured that all source symbols can be decoded from the transmitted or stored partial bitstreams. After the last bin is inserted into the corresponding bin buffer 8, the bin encoder 10 has to ensure that a complete codeword is written to the partial bitstream 12. If the bin encoder 10 represents a binary arithmetic coding engine, the arithmetic codeword has to be terminated. If the bin encoder 10 represents an entropy encoder that implements a direct mapping of bin sequences onto codewords, the bin sequence that is stored in the bin buffer after writing the last bin to the bin buffer might not represent a bin sequence that is associated with a codeword (i.e., it might represent a prefix of two or more bin sequences that are associated with codewords). In such a case, any of the codewords associated with a bin sequence that contains the bin sequence in the bin buffer as prefix has to be written to the partial bitstream (the bin buffer has to be flushed). This could be done by inserting bins with a particular or an arbitrary value into the bin buffer until a codeword is written. In an embodiment of the invention, the bin encoder selects one of the codewords with minimum length (in addition to the property that the associated bin sequence must contain the bin sequence in the bin buffer as prefix). At the decoder side, the bin decoder 22 may decode more bins than necessitated for the last codeword in a partial bitstream; these bins are not requested by the bin buffer selector 18 and are discarded and ignored. The decoding of the finite set of symbols is controlled by requests for decoded source symbols; if no further source symbol is requested for a quantity of data, the decoding is terminated.

Transmission and Multiplexing of the Partial Bitstreams

The partial bitstreams 12 that are created by the encoder can be transmitted separately, or they can be multiplexed into a single bitstream, or the codewords of the partial bitstreams can be interleaved in a single bitstream.

In a comparison embodiment, each partial bitstream for a quantity of data is written to one data packet. The quantity of data can be an arbitrary set of source symbols such as a still picture, a field or frame of a video sequence, a slice of a still picture, a slice of a field or frame of a video sequence, or a frame of audio samples, etc.

In another comparison embodiment, two or more of the partial bitstreams for a quantity of data or all partial bitstreams for a quantity of data are multiplexed into one data packet. The structure of a data packet that contains multiplexed partial bitstreams is illustrated in FIG. 3.

The data packet 100 consists of a header and one partition for the data of each partial bitstream (for the considered quantity of data). The header 100 of the data packet contains indications for the partitioning of the (remainder of the) data packet into segments of bitstream data 102. Beside the indications for the partitioning, the header may contain additional information. In a comparison embodiment, the indications for the partitioning of the data packet are the locations of the beginning of the data segments in units of bits or bytes or multiples of bits or multiples of bytes. In a further comparison embodiment, the locations of the beginning of the data segments are coded as absolute values in the header of the data packet, either relative to the beginning of the data packet or relative to the end of the header or relative to the beginning of the previous data packet. In a further comparison embodiment, the locations of the beginning of the data segments are differentially coded, i.e., only the difference between the actual beginning of a data segment and a prediction for the beginning of the data segment is coded. The prediction can be derived based on already known or transmitted information such as the overall size of the data packet, the size of the header, the number of data segments in the data packet, the location of the beginning of preceding data segments. In a comparison embodiment, the location of the beginning of the first data packet is not coded, but inferred based on the size of the data packet header. At the decoder side, the transmitted partition indications are used for deriving the beginning of the data segments. The data segments are then used as partial bitstreams and the data contained in the data segments are fed into the corresponding bin decoders in sequential order.

There are several alternatives for multiplexing the partial bitstreams into a data packet. One alternative, which can reduce the necessitated side information, in particular for cases in which the sizes of the partial bitstreams are very similar, is illustrated in FIG. 4. The payload of the data packet, i.e., the data packet 110 without its header 111, is partitioned into segments 112 a predefined way. As an example, the data packet payload can be partitioned into segments of the same size. Then each segment is associated with a partial bitstream or with the first part of a partial bitstream 113. If a partial bitstream is greater than the associated data segment, its remainder 114 is placed into the unused space at the end of other data segments. This can be done in a way that the remaining part of a bitstream is inserted in reverse order (starting from the end of the data segment), which reduces the side information. The association of the remainders of the partial bitstreams to data segments and, when more than one remainder is added to a data segment, the start point for one or more of the remainders have to be signaled inside the bitstream, e.g. in the data packet header.

Interleaving of Variable-Length Codewords

For some applications, the above described multiplexing of the partial bitstreams (for a quantity of source symbols) in one data packet can have the following disadvantages: On the one hand side, for small data packets, the number of bits for the side information that is necessitated for signaling the partitioning can become significant relative to the actual data in the partial bitstreams, which finally reduces the coding efficiency. On the other hand, the multiplexing may not suitable for applications that necessitate a low delay (e.g. for video conferencing applications). With the described multiplexing, the encoder cannot start the transmission of a data packet before the partial bitstreams have been completely created, since the locations of the beginning of the partitions are not known before. Furthermore, in general, the decoder has to wait until it receives the beginning of the last data segment before it can start the decoding of a data packet. For applications as video conferencing systems, these delays can add-up to an additional overall delay of the system of several video pictures (in particular for bit rates that are close to the transmission bit rate and for encoders/decoders that necessitate nearly the time interval between two pictures for encoding/decoding a picture), which is critical for such applications. In order to overcome the disadvantages for certain applications, the encoder of a comparison embodiment can be configured in a way that the codewords that are generated by the two or more bin encoders are interlaved into a single bitstream. The bitstream with the interleaved codewords can be directly send to the decoder (when neglecting a small buffer delay, see below). At the decoder side, the two or more bin decoders read the codewords directly from the bitstream in decoding order; the decoding can be started with the first received bit. In addition, no side information is necessitated for signaling the multiplexing (or interleaving) of the partial bitstreams.

Figure 5:
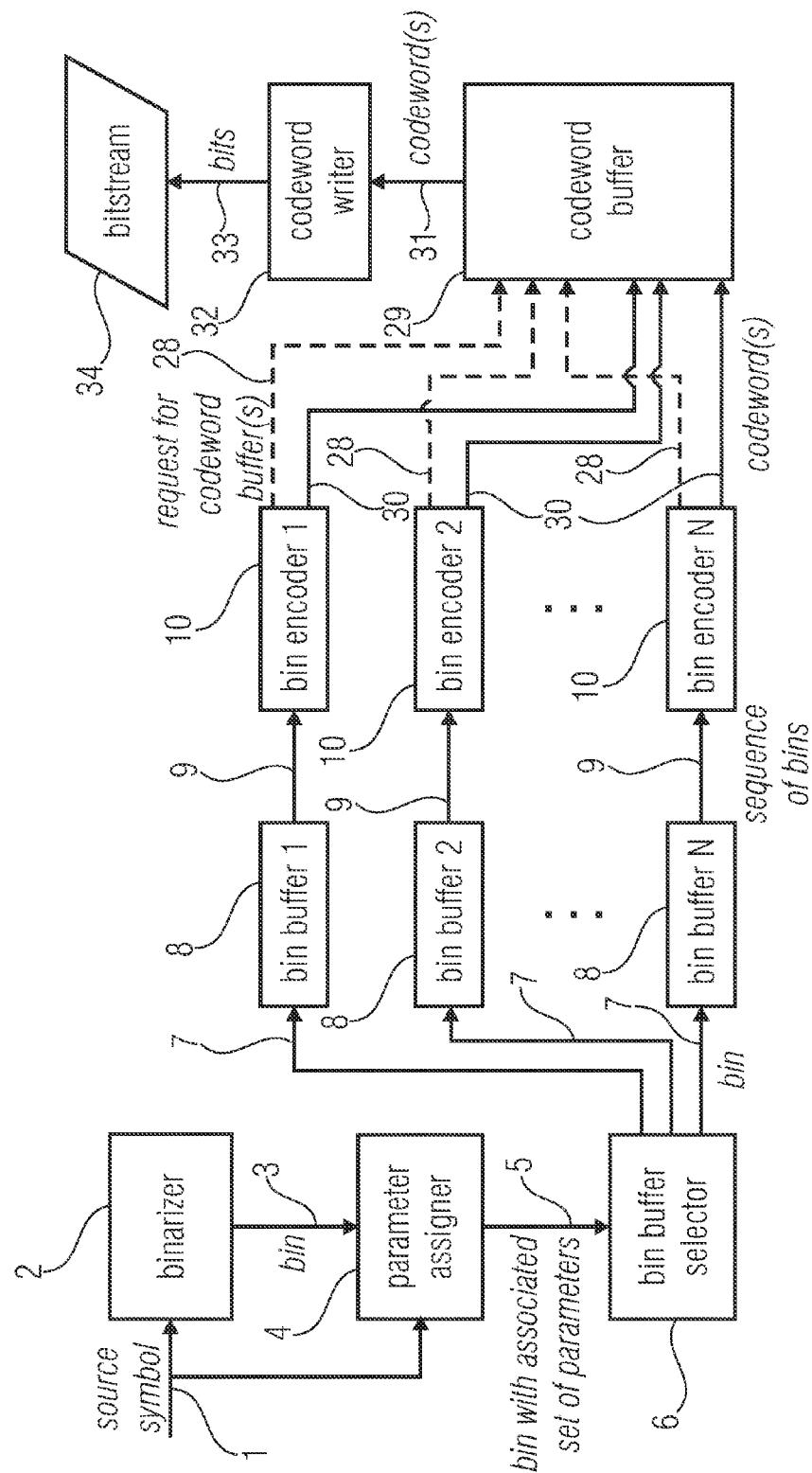
FIG. 5 shows a bock diagram of an encoder according to a comparison embodiment using partial bitstream interleaving.

The basic structure of an encoder with codeword interleaving is shown in FIG. 5. The bin encoders 10 don't write the codewords directly to the partial bitstreams, but are connected with a single codeword buffer 29, from which codewords are written to the bitstream 34 in coding order. The bin encoders 10 send requests for one or more new codeword buffer entries 28 to the codeword buffer 29 and later send the codewords 30 to the codeword buffer 29, which are stored in the reserved buffer entries. The (in general variable-length) codewords 31 of the codeword buffer 29 are accessed by a codeword writer 32, which writes the corresponding bits 33 to the produced bitstream 34. The codeword buffer 29 operates as a first-in-first-out buffer; codeword entries that are reserved earlier are earlier written to the bitstream.

In a further generalization, multiple codeword buffers and partial bitstreams are possible, where the number of codeword buffers is less than the number of bin encoders. A bin encoder 10 reserves one or more codewords in the codeword buffer 29, whereby the reservation of the one or more codewords in the codeword buffer is triggered by certain events in the connected bin buffer 8. In a comparison embodiment, the codeword buffer 29 is operated in a way that the decoder can instantaneously decode the bitstream. The coding order in which the codewords are written to the bitstream is the same as the order in which the corresponding codewords are reserved in the codeword buffer. In an embodiment of the invention, each bin encoder 10 reserves one codeword, with the reservation being triggered by a certain event in the connected bin buffer. In another embodiment of the invention, each bin encoder 10 reserves more than one codeword, with the reservation being triggered by a certain event in the connected bin buffer. In a further comparison embodiment, the bin encoders 10 reserve a different amount of codewords, where the amount of codewords that are reserved by a particular bin encoder can be dependent on the particular bin encoder and/or other properties of the particular bin encoder/bin buffer (such as the associated probability measure, the number of already written bits, etc.).

In a further comparison embodiment, the codeword buffer is operated as follows. If a new bin 7 is sent to a particular bin buffer 8 and the number of already stored bins in the bin buffer is zero and there is currently no codeword reserved in the codeword buffer for the bin encoder that is connected with the particular bin buffer, the connected bin encoder 10 sends a request to the codeword buffer, by which one or more codeword entries are reserved in the codeword buffer 29 for the particular bin encoder. The codeword entries can have a variable number of bits; an upper threshold for the number of bits in a buffer entry is usually given by the maximum codeword size for the corresponding bin encoder. The next codeword or the next codewords that are produced by the bin encoder (for which the codeword entry or codeword entries have been reserved) are stored in the reserved entry or entries of the codeword buffer. If all reserved buffer entries in the codeword buffer for a particular bin encoder are filled with codewords and the next bin is sent to the bin buffer that is connected with the particular bin encoder, one or more new codewords are reserved in the codeword buffer for the particular bin encoder, etc. The codeword buffer 29 represents a first-in-first-out buffer in a certain way. Buffer entries are reserved in sequential order. Codewords for which the corresponding buffer entries have been reserved earlier are earlier written to the bitstream. The codeword writer 32 checks the status of the codeword buffer 29, either continuously or after a codeword 30 is written to the codeword buffer 29. If the first buffer entry contains a complete codeword (i.e., the buffer entry is not reserved, but includes a codeword), the corresponding codeword 31 and the corresponding buffer entry are removed from the codeword buffer 20 and the bits of the codeword 33 are written to the bitstream. This process is repeated until the first buffer entry does not contain a codeword (i.e., it is reserved or free). At the end of the decoding process, i.e., if all source symbols of the considered quantity of data have been processed, the codeword buffer must be flushed. For that flushing process, the following is applied for each bin buffer/bin encoder as first step: If the bin buffer does contain bins, a bin with a particular or an arbitrary value is added until the resulting bin sequence represents a bin sequence that is associated with a codeword (as noted above, one advantageous way of adding bins is to add such bin values that produce the shortest possible codeword—or one of those—that is associated with a bin sequence that contains the for the original content of the bin buffer as prefix), then the codeword is written to the next reserved buffer entry for the corresponding bin encoder (and the corresponding) bin buffer is emptied. If more than one buffer entry has been reserved for one or more bin encoders, the codeword buffer may still contain reserved codeword entries. In that case, these codeword entries are filled with arbitrary, but valid codewords for the corresponding bin encoders. In a further comparison embodiment, the shortest valid codeword or one of the shortest valid codewords (if there are multiple) is inserted. Finally, all remaining codewords in the codeword buffer are written to the bitstream.

Figure 6:
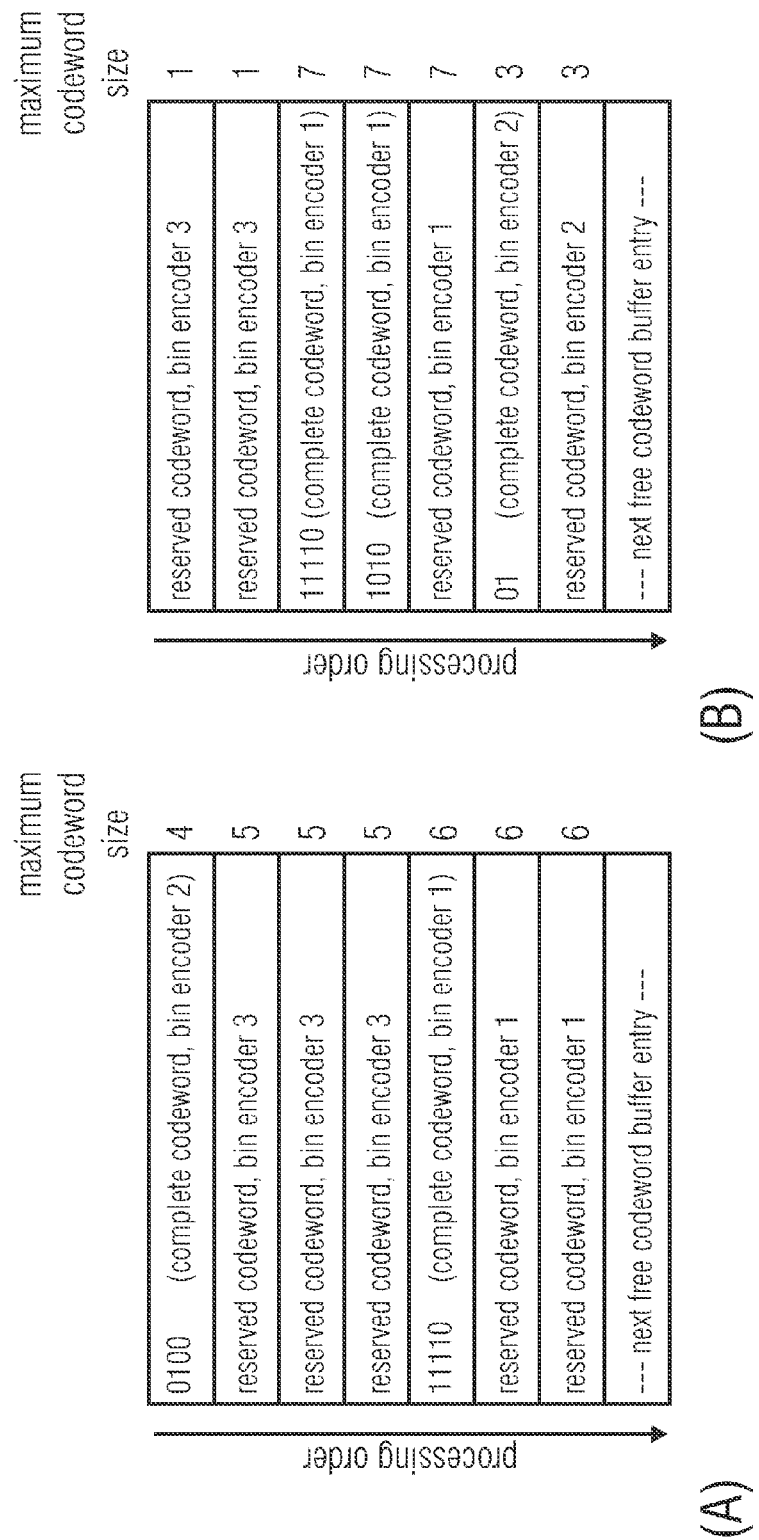
FIG. 6 shows a schematic illustrating examples for the status of a codeword buffer at the encoder side of FIG. 5 according to a comparison embodiment.

Two examples for the status of the codeword buffer are illustrated in FIG. 6. In example (a), the codeword buffer contains 2 entries that are filled with a codeword and 5 reserved entries. In addition, the next free buffer entry is marked. The first entry is filled with a codeword (i.e., the bin encoder 2 just wrote a codeword to a previously reserved entry). In the next step, this codeword will be removed from the codeword buffer and written to the bitstream. Then, the first reserved codeword for bin encoder 3 is the first buffer entry, but this entry cannot be removed from the codeword buffer, since it is only reserved, but no codeword has been written to this entry. In the example (b), the codeword buffer contains 3 entries that are filled with a codeword and 4 reserved entries. The first entry is marked as reserved and hence the codeword writer cannot write a codeword to the bitstream. Although 3 codewords are contained in the codeword buffer, the codeword writer has to wait until a codeword is written to the first reserved buffer entry for bin encoder 3. Note that the codewords must be written in the order in which they were reserved, in order to be able to invert the process at the decoder side (see below).

Figure 7:
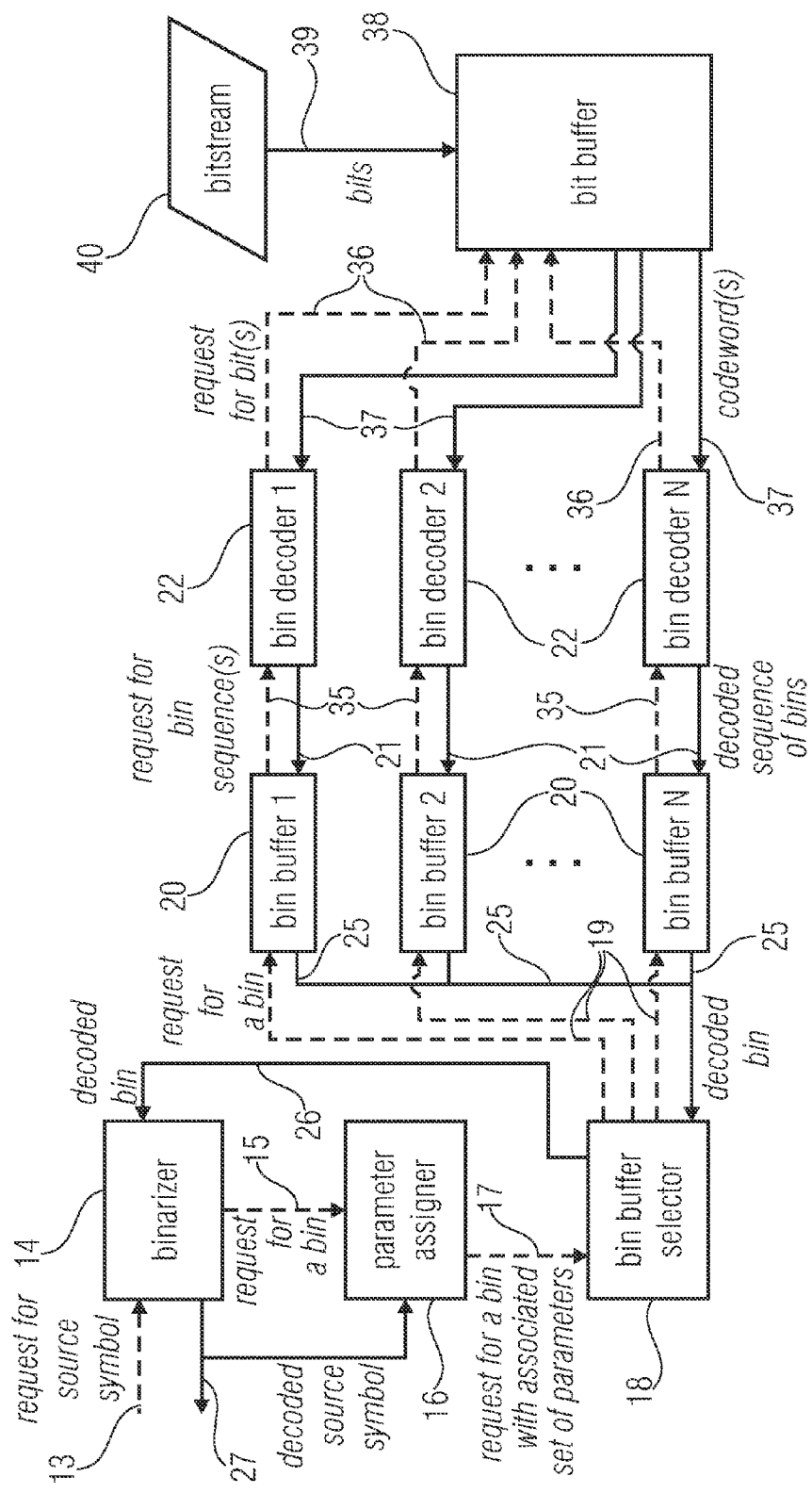
FIG. 7 shows a bock diagram of a decoder according to a comparison embodiment using partial bitstream interleaving.

The basic structure of a decoder with codeword interleaving is shown in FIG. 7. The bin decoders 10 don't read the codewords directly from separate partial bitstreams, but are connected to a bit buffer 38, from which the codewords 37 are read in coding order. It should be noted that the bit buffer 38 is not necessarily required, since the codewords could also be directly read from the bitstream. The bit buffer 38 is mainly included in the illustration for clearly separate different aspects of the processing chain. The bits 39 of the bitstream 40 with interleaved codewords are sequentially inserted into the bit buffer 38, which represents a first-in-first-out buffer. If a particular bin decoder 22 receives a request for one or more bin sequences 35, the bin decoder 22 reads one or more codewords 37 from the bit buffer 38 via requests for bits 36. The decoder can instantaneously decode the source symbols. Note that the encoder (as described above) must ensure by suitably operating the codeword buffer that the codewords are written in the same order to the bitstream in which they are requested by the bin decoders. At the decoder, the entire decoding process is triggered by requests for source symbols. Parameters as the number of codewords that are reserved at the encoder side by a particular bin encoder and the number of codewords that are read by the corresponding bin decoder must be the same.

In a further generalization, multiple codeword buffers and partial bitstreams are possible, where the number of bit buffers is less than the number of bin decoders. A bin decoder 22 reads one or more codewords from the bit buffer 38 at one time instant, whereby the reading of the one or more codewords from the bit buffer is triggered by certain events in the connected bin buffer 20. In a further comparison embodiment, the decoder is operated in a way that one or more codewords are read when a request for a bin 19 is sent to a particular bin buffer 20 and the bin buffer doesn't contain any bins. But it is also possible to trigger the reading of codewords by other events, e.g. if the number of bins in the bin buffer is below a predefined threshold. In a further comparison embodiment, each bin decoder 22 reads one codeword, with the reading being triggered by a certain event in the connected bin buffer. In another comparison embodiment, each bin decoder 22 reads more than one codeword, with the reading being triggered by a certain event in the connected bin buffer. In further comparison embodiment, the bin decoders 22 read a different amount of codewords, where the amount of codewords that are read by a particular bin decoder can be dependent on the particular bin decoder and/or other properties of the particular bin decoder/bin buffer (such as the associated probability measure, the number of already read bits, etc.).

In a, the reading of codewords from the bit buffer is operated as follows. If a new bin request 19 is sent from the bin buffer selector 18 to a particular bin buffer 20 and the number of bins in the bin buffer is zero, the connected bin decoder 22 reads one or more codewords 37 from the bit buffer 38, via bit request 36 to the bit buffer 38. The bin decoder 22 converts the read codewords 37 into sequences of bins 21 and stores these bin sequences in the connected bin buffer 20. As final response to the request for a bin 19, the first inserted bin is removed from the bin buffer 20 and sent to the bin buffer selector 18. As response the further bin requests, the remaining bins in the bin buffer are removed until the bin buffer is empty. An additional bin request triggers the bin decoder to read one or more new codewords from the bit buffer, etc. The bit buffer 38 represents a first-in-first-out buffer of a predefined size and is continuously filled with bits 39 from the bitstream 40. In order to ensure that the codewords are written to the bitstream in the same way as they are requested by the decoding process, the codeword buffer at the encoder side can be operated in the way described above.

Thus, each of the plurality of entropy decoders may be a variable length decoder configured to map codewords of fixed lengths to symbol sequences of variable lengths, and a codeword entry such as the output of the codeword buffer 43 may be provided for receiving a single stream of interleaved codewords. The plurality of entropy decoders 22 may be configured to retrieve the codewords from the codeword entry in a sequential order depending on an order in which the symbols of the sequence of symbols to be reconstructed as retrieved by the selector 18 from the plurality of entropy decoders result in a new symbol sequence to be mapped from a new codeword at the respective entropy decoders.

Interleaving of Variable-Length Codewords with a Low-Delay Constraint

The described codeword interleaving does not require that any partitioning information is sent as side information. And since the codewords are interleaved in the bitstream, the delay is in general small. However, it is not guaranteed that a particular delay constraint (e.g. specified by a maximum number of bits that are stored in the codeword buffer) is obeyed. Furthermore, the necessitated buffer size for the codeword buffer can theoretically become very large. When considering the example in FIG. 6(*b*), it might be possible that no further bins are send to bin buffer 3 and hence the bin encoder 3 will not send any new codeword to the codeword buffer until the flushing process at the end of the data packet is applied. Then all codewords for bin encoders 1 and 2 would have to wait until the end of the data packet, before they can be written to the bitstream. This drawback can be circumvented by adding a further mechanism to the encoding process (and also to the decoding process as described later). The basic concept of that additional mechanism is that if a measure related to the delay or an upper bound of the delay (see below) exceeds a specified threshold, the first reserved buffer entry is filled by flushing the corresponding bin buffer (using a similar mechanism as at the end of a data packet). By such a mechanism, the number of waiting buffer entries is reduced until the associated delay measure is less than the specified threshold. At the decoder side, the bins that have been inserted at the encoder side in order to obey the delay constraint must be discarded.

For this discarding of bins basically the same mechanism as at the encoder side can be used. In the following two comparison embodiments for such a delay control are described.

In one comparison embodiment, the measure for the delay (or an upper bound of the delay) is the number of active buffer entries in the codeword buffer, where the number of active buffer entries is the number of reserved buffer entries plus the number of buffer entries that contain codewords. Note that the first buffer entry is a reserved buffer entry or a free buffer entry, since if the first buffer entry contains a codeword, this codeword is written to the bitstream. If for example, the maximum allowed buffer delay (as determined by the application) is D bits and the maximum codeword size for all bin encoders is L, a lower bound for the maximum number of codewords that can be contained in the codeword buffer without violating the delay constraint can be calculated by N=D/L. The delay measure D in bits is not required by the system, but the maximum number of codewords N must be known to both encoder and decoder. In a further comparison embodiment, the maximum number of codeword buffer entries N is fixed by the application. In another comparison embodiment, the maximum number of codeword buffer entries N is signaled inside the bitstream, e.g., in the header of the data packet (or slice header) or in a parameter set, which is included in the bitstream. If a bin encoder 10 sends a request for the reservation of one or more new buffer entries to the codeword buffer 29, the following process is executed before a new codeword buffer entry is reserved (i.e., it is executed multiple times if multiple codeword buffer entries are reserved by one request): If the number of currently active buffer entries plus 1 (taking into account the buffer entry that will be reserved next) is greater than the maximum number of codeword buffer entries N, the first buffer entry (which is reserved) is flushed by the process described in the following until the number of currently active buffer entries plus 1 is less than or equal to the maximum number of codeword buffer entries N. The flushing of a reserved buffer entry is similar to the flushing at the end of a data packet: The bin encoder 10 that has reserved the corresponding first buffer entry is flushed by adding bins with particular or arbitrary values to the connected bin buffer 8 until the resulting bin sequence represents a bin sequence that is associated with a codeword, the codeword is then written to the reserved buffer entry and it is finally added to the bitstream (while emptying the bin buffer and removing the previously reserved buffer entry). As mentioned above, one advantageous way for adding bins to the bin buffer is to add those bins that produce the shortest possible codeword. At the decoder side, a similar process is executed for discarding the bins that have been added to obey the delay constraint. Therefore, the decoder maintains a counter C that counts the codewords that have been read from the bit buffer (this counter can be maintained in the bit buffer). This counter C is initialized (e.g. with zero) at the beginning of the decoding of a data packet and is increased by one after a codeword is read. In addition, each bin decoder 22 contains a counter Cx, which stores the value of the codeword counter C before the last codeword was read by the corresponding bin decoder 22. I.e., when a particular bin decoder 22 reads a new codeword, its counter Cx is set equal to C as a first step and then the codeword is read from the bit buffer. When a request for a bin 19 is sent to a particular bin buffer 20 and the difference (C−Cx) between the overall codeword counter C and the counter Cx of the connected bin decoder 22 is greater than the maximum number of codeword buffer entries N, all bins that are currently stored in the particular bin buffer 20 are discarded and ignored. Beside that additional step, the decoding is operated as described above. If the bin buffer 20 to which a request for a bin 19 is sent is empty (either because all bins have already been removed or because the low-delay mechanism did discard all bins in the first step after the bin request has been received), the connected bin decoder 22 reads one or more new codewords from the bit buffer 38 etc.

In another comparison embodiment, the measure for the delay (or an upper bound of the delay) is the sum of the maximum codeword lengths for the active buffer entries in the codeword buffer, where the maximum codeword length for a particular buffer entry depends on the bin decoded that is associated with that buffer entry. As illustration, the maximum codeword lengths for the buffer entries are indicated in the examples in 6. Note again that the first buffer entry is a reserved buffer entry or a free buffer entry, since if the first buffer entry contains a codeword, this codeword is written to the bitstream. Let the maximum allowed buffer delay (as determined by the application) be D bits. This maximum buffer delay D must be known to both encoder and decoder. In a further comparison embodiment, the maximum buffer delay D is fixed by the application. In another comparison embodiment, the maximum buffer delay D is signaled inside the bitstream, e.g., in the header of the data packet (or slice header) or in a parameter set, which is included in the bitstream. It can be signaled in units of bits, or bytes, or a multiple of bits, or a multiple of bytes. If a bin encoder 10 sends a request for the reservation of one or more new buffer entries to the codeword buffer 29, the following process is executed before a new codeword buffer entry is reserved (i.e., it is executed multiple times if multiple codeword buffer entries are reserved by one request).

If the sum of the maximum codeword lengths for all currently active buffer entries plus the maximum codeword length for the buffer entry that will be reserved is greater than the maximum buffer delay D, the first buffer entry (which is reserved) is flushed by the process described above until the sum of the maximum codeword lengths for all active buffer entries plus the maximum codeword length for the buffer entry that will be reserved is less than or equal to the maximum buffer delay D. As an example, let's consider the example in FIG. 6(b). The sum of the maximum codeword lengths for all currently active buffer entries is 29. Let's assume that the maximum buffer delay D is set equal to 32. If the next buffer entry is reserved by bin encoder 2 for which the maximum codeword length is equal to 3, the first buffer entry is not flushed, since 29+3 is not greater than 32. But if the next buffer entry is reserved by bin encoder 1 for which the maximum codeword length is equal to 7, the first buffer entry is flushed, since 29+7 is greater than 32. The flushing of the reserved buffer entry is done as described above (by adding bin with particular or arbitrary values to the corresponding bin buffer).

At the decoder side, a similar process is executed for discarding the bins that have been added to obey the delay constraint. Therefore, the decoder maintains a counter C that counts the maximum codeword length for the codewords that have been read from the bit buffer (this counter can be maintained in the bit buffer). Note that the maximum codeword lengths that are associated with different bin decoders can be different. The counter C is initialized (e.g. with zero) at the beginning of the decoding of a data packet and it is increased after a codeword is read. This counter is not increased by the actual length of the read codewords, but by its maximum length. I.e., if a codeword is read by a particular bin decoder and the maximum codeword length that is associated with the codeword table used by the particular bin decoder is Lx (a different bin decoder can be associated with a different maximum codeword length), the counter C is increased by Lx. In addition to the overall counter C, each bin decoder 22 contains a counter Cx, which stores the value of the codeword counter C before the last codeword was read by the corresponding bin decoder 22. I.e., when a particular bin decoder 22 reads a new codeword, its counter Cx is set equal to C as a first step and then the codeword is read from the bit buffer. When a request for a bin 19 is sent to a particular bin buffer 20 and the difference (C−Cx) between the overall counter C and the counter Cx of the connected bin decoder 22 is greater than the maximum buffer delay D, all bins that are currently stored in the particular bin buffer 20 are discarded and ignored. Beside that additional step, the decoding is operated as described above. If the bin buffer 20 to which a request for a bin 19 is sent is empty (either because all bins have already been removed or because the low-delay mechanism did discard all bins in the first step after the bin request has been received), the connected bin decoder 22 reads one or more new codewords from the bit buffer 38 etc.

Thus, the plurality of entropy decoders 22 and the selector 18 may be configured to intermittently discard suffixes of symbol sequences so as to not participate in forming the sequence of symbols to be reconstructed. 29. The intermittently discarding may be performed at events where a number of codewords having been retrieved from the codeword entry by the plurality of entropy decoders between two consecutive codeword retrievals of a respective entropy decoder from the codeword entry, fulfils a predetermined criterion. The plurality of entropy encoders and the codeword buffer may, in turn, be configured to intermittently extend currently forwarded but not yet mapped symbols to valid symbol sequences by don't-care symbols having the currently forwarded but not yet mapped symbols as prefix, map the thus extended symbol sequences into codewords, enter the thus obtained codewords into the reserved codeword entries and flush the codeword entries. The intermittently extending, entering and flushing may take place at events where a number of reserved codeword entries plus a number of codeword entries having codewords entered therein fulfils a predetermined criterion. The predetermined criteria may take the maximum lengths of codewords of the plurality of encoder/decoder pairs into account.

Figure 8:
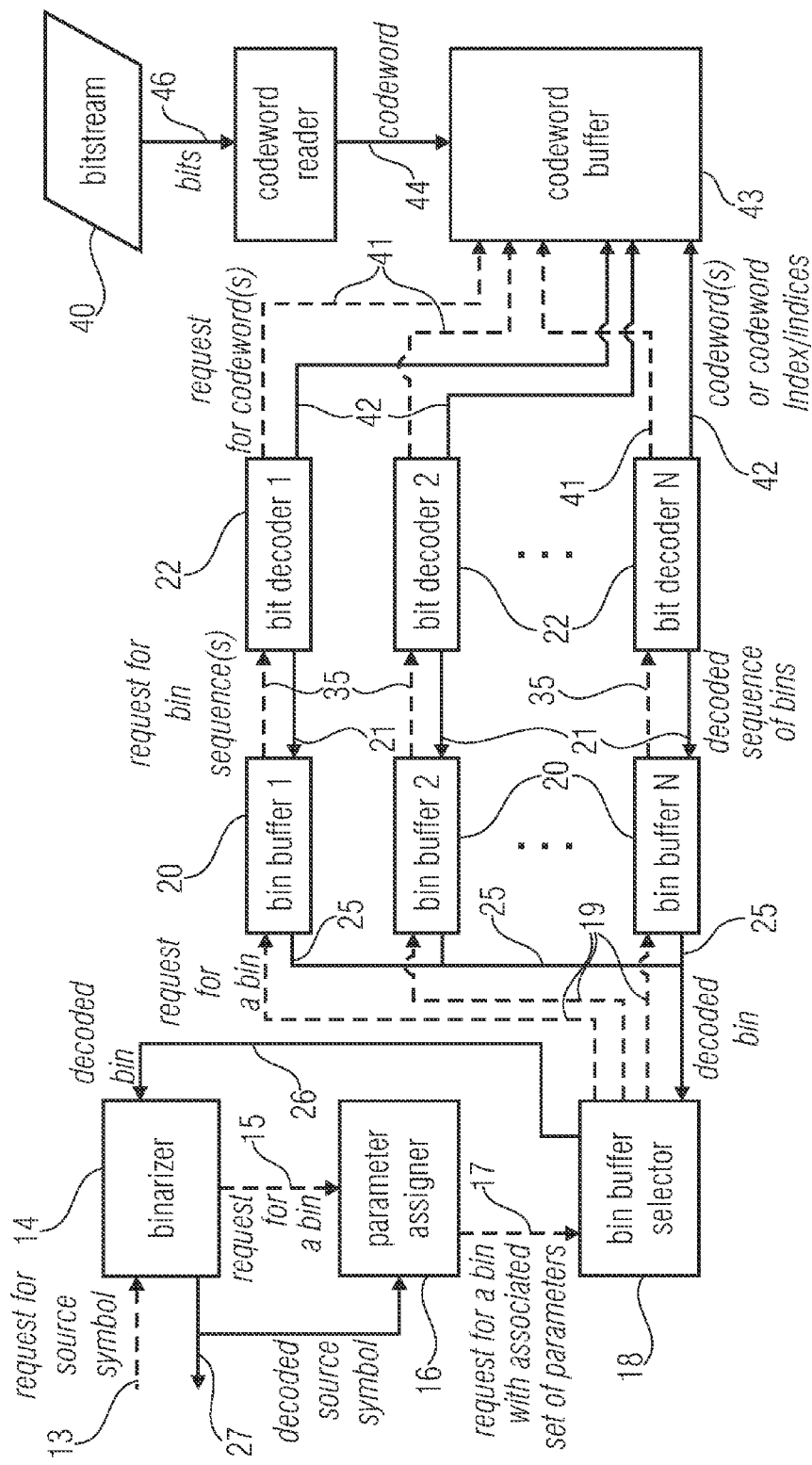
FIG. 8 shows a bock diagram of a decoder according to a comparison embodiment using codeword interleaving using a single set of codewords.

For some architectures, the above described comparison embodiment for the codeword interleaving might result in a drawback in terms of the decoding complexity. As illustrated in FIG. 7, all bin decoders 22 read codewords (in the general case, variable-length codewords) from a single bit buffer 38. The reading of the codewords cannot be done in parallel, since the codeword must be read in the correct order. That means, a particular bin decoder must wait until other bin decoders finish the reading of codewords. And when the complexity of the reading of the variable-length codewords is significant in relation to the remainder of the (partially parallelized) decoding process, this access of the variable-length codewords can be a bottleneck for the entire decoding process. There are some variations of the described comparison embodiments that can be employed for reducing the complexity of the access from the single bit buffer, a few of them will be described in the following. In one comparison embodiment, there exists a single set of codewords (representing for instance a redundancy-free prefix code) and the set of codewords that is used for each bin decoder 22 is a subset of the single codeword set. Note that different bin decoders 22 can use different subsets of the single codeword set. Even if the codeword sets that are used by some of the bin decoders 22 are the same, their association with bin sequences is different for different bin decoders 22. In a particular comparison embodiment, the same set of codewords is used for all bin decoders 22. If we have a single codeword set that includes the codeword sets for all bin decoders as subsets, the parsing of the codewords can be done outside the bin decoders, which can reduce the complexity of the codeword access. The encoding process is not changed in relation to the above described process. The modified decoding process is illustrated in FIG. 8. A single codeword reader is fed with bits 46 from the bitstream 40 and parses the—in general variable-length—codewords. The read codewords 44 are inserted into a codeword buffer 43, which represents a first-in-first-out buffer. A bin decoder 22 sends a request for one or more codewords 41 to the codeword buffer 43 and as response to this request, the one or more codewords are removed from the codeword buffer (in sequential order) and send to the corresponding bin decoder 22. Note that with this comparison embodiment, the potentially complex codeword parsing can be done in a background process and it doesn't need to wait for the bin decoders. The bin decoders access already parsed codewords, the potentially complex codeword parsing is no more part of a request to the overall buffer. Instead already parsed codewords are sent to the bin decoders, which can also be implemented in a way that only codeword indices are send to the bin decoders.

Interleaving of Fixed-Length Bit Sequences

A further way of reducing the decoder complexity can be achieved when the bin decoders 22 don't read variable-length codewords from the global bit buffer 38, but instead they read fixed-length sequences of bits from the global bit buffer 38 and add these fixed-length sequences of bits to a local bit buffer, where each bin decoder 22 is connected with a separate local bit buffer. The variable-length codewords are then read from the local bit buffer. Hence, the parsing of variable-length codewords can be done in parallel, only the access of fixed-length sequences of bits has to be done in a synchronized way, but such an access of fixed-length sequences of bits is usually very fast, so that the overall decoding complexity can be reduced for some architectures.

The fixed number of bins that are sent to a particular local bit buffer can be different for different local bit buffer and it can also vary over time, depending on certain parameters as events in the bin decoder, bin buffer, or bit buffer. However, the number of bits that are read by a particular access does not depend on the actual bits that are read during the particular access, which is the important difference to the reading of variable-length codewords. The reading of the fixed-length sequences of bits is triggered by certain events in the bin buffers, bin decoders, or local bit buffers. As an example, it is possible to request the reading of a new fixed-length sequence of bits when the number of bits that are present in a connected bit buffer falls below a predefined threshold, where different threshold values can be used for different bit buffers. At the encoder, it has to be insured that the fixed-length sequences of bins are inserted in the same order into the bitstream, in which they are read from the bitstream at the decoder side. It is also possible to combine this interleaving of fixed-length sequences with a low-delay control similar to the ones explained above. In the following, an embodiment for the interleaving of fixed-length sequences of bits is described.

Figure 9:
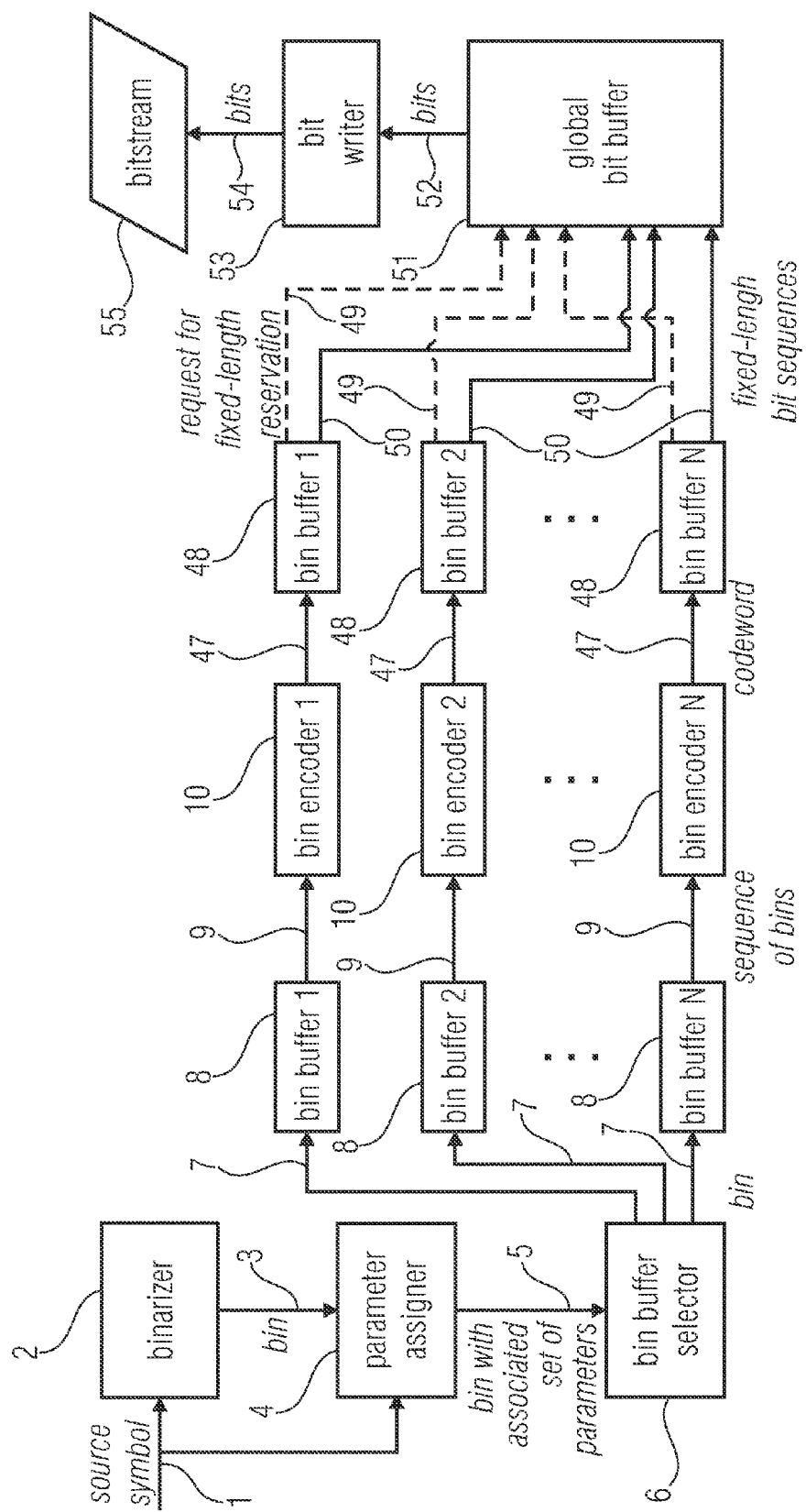
FIG. 9 shows a bock diagram of an encoder according to an embodiment using interleaving of fixed-length bit sequences.

FIG. 9 shows an illustration of the basic encoder structure for the embodiment of the invention that interleaves fixed-length sequences of bits for two or more bin encoders. In contrast to the embodiment depicted in FIG. 5, the bin encoders 10 are not connected with a single codeword buffer. Instead, each bin encoder 10 is connected with a separate bit buffer 48, which stores bits for the corresponding partial bitstream. All bit buffers 48 are connected to a global bit buffer 51. The global bit buffer 51 is connected to a bit writer 53, which removes the bits 52 in coding/decoding order from the global bit buffer and writes the removed bits 54 to the bitstream 55. On a certain events in a particular bit buffer 48 or the connected bin encoder 10 or bin buffer 8, the bit buffer 48 sends a request 49 to the global bit buffer 51 by which a certain number of bits is reserved in the global bit buffer 51. The requests for the reservation of fixed-length bit sequences 49 are processed in sequential order. The global bit buffer 51 represents a first-in-first-out buffer in a certain way; bits that are reserved earlier are earlier written to the bitstream. It should be noted that different bit buffers 48 can reserved a different amount of bits, which can also vary over time based on already coded symbols; but the number of bits that are reserved by a particular request is known at the time at which the request is sent to the global bit buffer.

In a particular embodiment of the invention, the bit buffers 48 and the global bit buffer 51 are operated as described in the following. As described above, in accordance with the embodiment of FIG. 9, the entropy encoders are variable length coders configured to map symbol sequences to codewords shorter as, or as long as, a respective maximum bit length Lx. Which VLC code is used, is not critical.

The amount of bits that is reserved by a particular bit buffer 48 is denoted as Nx. This number of bits Nx can be different for different bit buffers 48 and it can also vary over time. In an embodiment of the invention, the number of bits Nx that are reserved by a particular bit buffer 48 is fixed over time.

The reservations for a fixed number Nx of bits 49 are triggered based on the number of bits Mx in the bit buffers 48, the number of bits Nx for the reservation requests, the intended minimum number of codewords Cx stored in the bit buffers and the associated maximum codeword length Lx.

Note that Cx=0 enables the highest coding efficiency since it uses the latest possibility to reserve a new fixed-length sequence which reduces the probability of unnecessary reservations which would cause flushes in further consequence. Nevertheless a higher value can be desirable for hardware-based decoder implementations. In case of Cx=1 at least one full codeword is available in the bit buffer and single-bin requests can be answered without stalling the pipeline to refill the bit buffer. Note also that each bin encoder 10 can be associated with a different maximum codeword length Lx and that Nx≥max((Cx+1)*Lx−1, Lx) should be fulfilled.

If a bin 7 is sent to a particular bin buffer 8, and the particular bin buffer 8 is empty, and no sequence of Nx bits is reserved in the global bit buffer for the bit buffer 48 that is connected with the particular bin buffer (via a bin encoder), the connected bit buffer 49 sends a request 49 for the reservation of Nx bits to the global bit buffer 51. Otherwise if a bin 7 is sent to a particular bin buffer 8, and the particular bin buffer 8 is empty, and only one sequence of Nx bits is reserved in the global bit buffer for the bit buffer 48 that is connected with the particular bin buffer (via a bin encoder), and the difference Nx−Mx between the number Nx of bits that are reserved by a reservation request of the bit buffer 48 that is connected (via a bin encoder) with the particular bin buffer 8 and the number of bits Mx that are currently present in this bit buffer 48 is less than the maximum codeword length Lx that is associated with the corresponding bin encoder 10 multiplied by the intended number of codewords Cx incremented by one (Nx−Mx<(Cx+1)*Lx), the connected bit buffer 49 sends a request 49 for the reservation of Nx bits to the global bit buffer 51. The global bit buffer 51 reserves Nx bits for the particular bit buffer 48 and increases its pointer for the next reservation. After the Nx bits have been reserved in the global bit buffer, the bin 7 is stored in bin buffer 8. If this single bin does already represent a bin sequence that is associated with a codeword, the bin encoder 10 removes this bin from the bin buffer 8 and writes the corresponding codeword 47 to the connected bit buffer 48. Otherwise (this single bin does already represent a bin sequence that is associated with a codeword), further bins 7 are accepted by the particular bin buffer 8 until the bin buffer 8 contains a bin sequence that is associated with a codeword. In this case, the connected bin encoder 10 removes the bin sequence 9 from the bin buffer 8 and writes the corresponding codeword 47 to the connected bit buffer 48. If the resulting number of bits Mx in the bit buffer 48 is greater than or equal to the number of reserved bits Nx, the Nx bits that were first written to the bit buffer 48 are inserted into the previously reserved space in the global bit buffer 51. For the next bin 7 that is sent to the particular bin buffer 8, the same process as specified above is executed; i.e., it is checked first whether a new number of Nx bits must be reserved in the global bit buffer (if Nx−Mx is less than (Cx+1)*Lx) and then the bin is inserted into the bin buffer 8, etc.

In other words, generally, the global buffer 51 is configured to reserve a sequence of tranche entries, i.e. bit sequences of length Nx, for the plurality of entropy encoders in a sequential order depending on an order in which the reservations for these tranche entries for the plurality of entropy encoders are triggered. The triggering, in turn, is done as described above. That is, the plurality of entropy encoders 10 and the respective individual buffers 48 cooperate to trigger a reservation 49 of a tranche entry of bit length Nx for a respective one of the entropy encoders at times where the symbols of the sequence of symbols forwarded by the selector 6 to the plurality of entropy encoders 10 result in a beginning of a new symbol sequence to be mapped to a codeword at the respective entropy encoder 10, provided that at the respective time (of the beginning of a new symbol) a number of bits currently reserved in the global buffer 51 for the respective entropy encoder 10, i.e. Nx in case of having selected Nx appropriately as described above, minus a number Mx of bits currently buffered in the individual buffer 48 of the respective entropy encoder 10- or the global buffer for the respective entropy encoder in case of an intermediate partial filling of the reserved Nx bits—is not sufficient to accommodate the intended minimum number Cx of further codewords for the respective entropy encoder plus one, times the respective maximum bit length Lx, i.e. (Cx+1)·Lx.

The bit writer 53 writes the fixed-length bit sequences of the global bit buffer in the order in which they have been reserved. If the first fixed-length entry in the global bit buffer 51 contains a fixed-length bit sequence that has been actually inserted in the global bit buffer (i.e., it is not only reserved), the bit writer 53 removes the bits for this bit sequence 52 from the global bit buffer 51 and writes the bits 54 to the bitstream. This process is repeated until the first fixed-length entry in the global bit buffer represents a reserved or a free entry. If the first fixed-length entry in the global bit buffer represents a reserved entry, the bit writer 53 waits until this entry is filled with actual bits before it writes further bits 54 to the bitstream 55.

That is, the individual buffers 48 of the plurality of entropy encoders 10 output buffered portions of their bitstreams 47 to fill the respective reserved tranche entries in the global buffer 51, and the global buffer 51, in turn, is configured to remove filled tranche entries in the sequential order to obtain a single stream 52 of tranches of the bitstreams of the plurality of bitstreams, interspersed into the single stream of tranches in an interleaved. 10. That is, the functionality of the bit writer 53 may be viewed as being included within global buffer 51.

At the end of a data packet, the bin buffers are flushed as described above. In addition, the bit buffers must be flushed by adding bits with a particular or an arbitrary value until all reserved buffer entries in the global bit buffer are filled and written to the bitstream.

Figure 10:
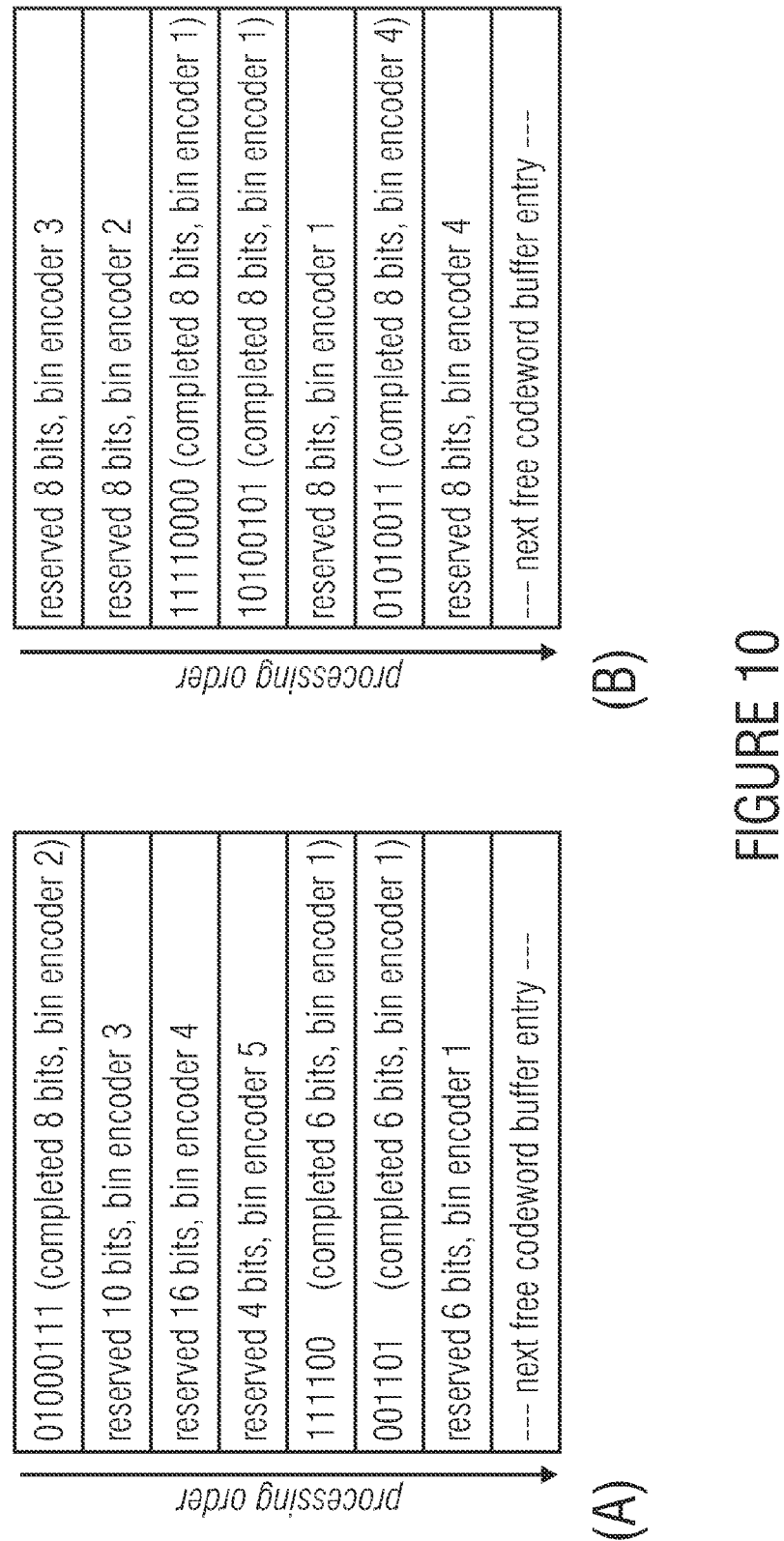
FIG. 10 shows a schematic illustrating examples for the status of a global bit buffer at the encoder side of FIG. 9 according to an embodiment.

In FIG. 10, two examples for the possible status of the global bit buffer 51 are illustrated. In example (a), a case is illustrated in which different bit buffers/bin encoders reserve a different number of bits. The global bit buffer contains 3 entries with actually written fixed-length bit sequences and 4 entries with reserved fixed-length bit sequences. The first fixed-length entry already contains actual bits (which must have been just inserted by bit buffer/bin encoder 2); this entry (i.e., the corresponding 8 bits) can be removed and written to the bitstream. The next entry reserves 10 bits for bin encoder 3, but actual bits haven't been inserted yet. This entry cannot be written to the bitstream; it must be waited until the actual bits are inserted. In the second example (b), all bit buffers/bin encoders reserved the same number of bits (8 bits). The global bit buffer contains 4 reservations for 8 bit sequences and 3 actually written 8 bit sequences. The first entry contains a reservation for 8 bits for bin encoder 3. Before any new bits can be written to the bitstream, the bit writer has to wait until bit buffer/bin encoder 3 writes the actual values of the 8 bits into this reserved entry.

Figure 11:
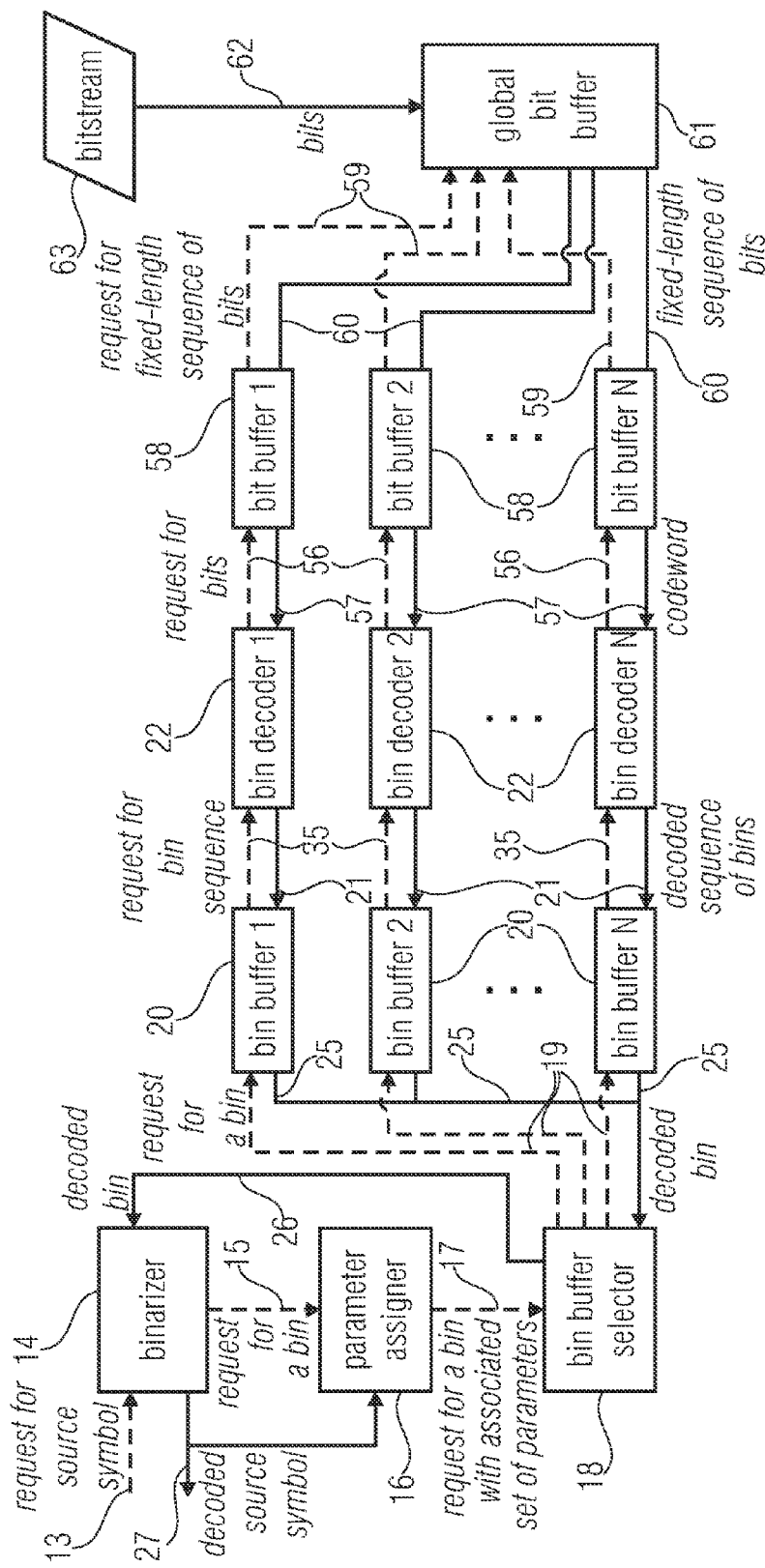
FIG. 11 shows a bock diagram of a decoder according to an embodiment using interleaving of fixed-length bit sequences.

FIG. 11 shows an illustration of the basic decoder structure for the embodiment of the invention that interleaves fixed-length sequences of bits. In contrast to the embodiment depicted in FIG. 7, the bin decoders 22 are not connected with a single bit buffer. Instead, each bin decoder 22 is connected with a separate bit buffer 58, which stores bits from the corresponding partial bitstream. All bit buffers 58 are connected to a global bit buffer 61. The bits 62 from the bitstream 63 are inserted into the global bit buffer 61. On a certain events in a particular bit buffer 58 or the connected bin decoder 22 or bin buffer 20, the bit buffer 58 sends a request 59 to the global bit buffer 61 by which a fixed-length sequence of bits 60 is removed from the global bit buffer 61 and inserted into the particular bit buffer 58. The requests for the fixed-length bit sequences 59 are processed in sequential order. The global bit buffer 61 represents a first-in-first-out buffer; bits that are earlier inserted into the global bit buffer are earlier removed. It should be noted that different bit buffers 58 can request a different amount of bits, which can also vary over time based on already decoded symbols; but the number of bits that are requested by a particular request is known at the time at which the request is sent to the global bit buffer. It should be noted that the global bit buffer 61 is not necessarily required, since the codewords could also be directly read from the bitstream. The global bit buffer 61 is mainly included in the illustration for clearly separate different aspects of the processing chain. The bit buffers 58, in turn, may be viewed as being comprised by the entropy decoders 22.

In a particular embodiment of the invention, the bit buffers 58 and the global bit buffer 61 are operated as described in the following. The amount of bits that is requested and read by a particular bit buffer 58 is denoted as Nx, it is equal to the amount of bits that is written to the global bit buffer by the corresponding bit buffer at the encoder side. This number of bits Nx can be different for different bit buffers 58 and it can also vary over time. In an embodiment of the invention, the number of bits Nx that are requested and read by a particular bit buffer 58 is fixed over time.

The reading of a fixed number Nx of bits 60 is triggered based on the number of bits Mx in the bit buffer 58, the intended minimum number of codewords Cx stored in the bit buffers, and the associated maximum codeword length Lx. Note that each bin decoder 22 can be associated with a different maximum codeword length Lx and that Nx max$((Cx+1)*Lx-1, Lx)$ should be fulfilled.

If a request for a bin 19 is sent to a particular bin buffer 20, and the particular bin buffer 20 is empty, and the number Mx of bits in the bit buffer 58 that is connected (via a bin decoder) with the particular bin buffer 20 is less than the maximum codeword length Lx that is associated with the corresponding bin decoder 22 multiplied by the intended number of codewords Cx incremented by one $(Mx<(Cx+1)*Lx)$, the connected bit buffer 58 sends a request 59 for a new sequences of Nx bits to the global bit buffer 61. As response to this request, the first Nx bits are removed from to global bit buffer 61 and this sequence of Nx bits 60 is sent to the bit buffer 58 from which the request was sent. Finally, this sequence of Nx bits is added to the corresponding bit buffer 58. Then the next codeword 57 is read from this bit buffer, and the connected bin decoder 22 inserts the associated bin sequence 21 into the connected bin buffer 20. As final response to the original request for a bin 19, the first bin is removed from the bin buffer 20 and this decoded bin 25 is sent to the bin buffer selector 18. When the next bin request 19 is sent to the particular bin buffer 20 and the bin buffer is not empty, the next bit is removed from the bin buffer 20. If the bin buffer is empty but the number Mx of bits in the connected bit buffer 58 is greater than or equal to the associated maximum codeword length Lx multiplied by the intended number of codewords Cx incremented by one $(Mx \geq (Cx+1)*Lx)$, the next codeword is read from the bit buffer and a new bin sequence is inserted in the bin buffer, from which the first bit is removed and sent to the bin buffer selector. If the bin buffer is empty and the number Mx of bits in the connected bit buffer 58 is less than the associated maximum codeword length Lx multiplied by the intended number of codewords Cx incremented by one $(Mx<(Cx+1)*Lx)$, the next sequence of Nx bits is read from the global bit buffer 61 and inserted into the connected local bit buffer 58, the next codeword is read from the bit buffer, a new bin sequence is inserted in the bin buffer, and the first bin of the sequence is removed and sent to the bin buffer selector. This process is repeated until all source symbols are decoded.

In other words, the global buffer 61 is generally configured to receive a single stream 62 of tranches of the bitstreams 60 of the plurality of bitstreams, interspersed into the single stream 62 of tranches in an interleaved manner, wherein the global buffer 61 is configured to sequentially distribute the tranches from the global buffer to the plurality of entropy decoders depending on an order in which requests 59 for the tranches occur. In particular, each of the plurality of entropy decoders 22 is configured to trigger a respective request 56, 59 for a tranche of respective bit length Nx of the respective bitstream from the global buffer 61 at times where, among the symbols of the sequence 25 of symbols to be reconstructed as retrieved by the selector 18 from the plurality of entropy decoders, a symbol is encountered which forms a beginning of a new symbol sequence to be mapped from a new codeword within the respective bitstream 57 by the respective entropy decoder 22, provided that at the respective time a number Mx of bits of the respective bitstream 57 having been distributed to the respective entropy decoder 22 by the global buffer 61, but not yet having been entropy decoded by the entropy decoder 22 so far, including the new codeword, is less than an intended minimum number Cx of further codewords for the respective entropy decoder plus one, times the respective maximum bit length Lx, i.e. $(Cx+1) \cdot Lx$.

At the end of a data packet, more bins and/or bits than necessitated for decoding the requested source symbols might be inserted into the bin buffer and/or bit buffer. The remaining bins in the bin buffer and the remaining bits in the bit buffer are discarded and ignored.

Interleaving of Fixed-Length Bit Sequences with a Low-Delay Constraint

The described embodiment for an entropy encoder and decoder with interleaving of fixed-length bit sequences can also be combined with the scheme for controlling the encoder buffer delay, which is described above. The basic concept is the same as in the embodiment with delay control described above. If a measure related to the delay or an upper bound of the delay (see below) exceeds a specified threshold, the first reserved buffer entry is filled by flushing the corresponding bin buffer (using a similar mechanism as at the end of a data packet) and potentially writing additional bits for filling all bits of the reserved fixed-length buffer entry. By such a mechanism, the number of waiting buffer entries is reduced until the associated delay measure is less than the specified threshold. At the decoder side, the bins and bits that have been inserted at the encoder side in order to obey the delay constraint must be discarded. For this discarding of bins and bits basically the same mechanism as at the encoder side can be used.

In an embodiment of the invention, the measure for the delay (or an upper bound of the delay) is the number of bits in the active buffer entries in the global bit buffer, where the number of active buffer entries is the number of reserved fixed-length buffer entries plus the number of fixed-length buffer entries that contain already written bits. Note that a further restriction applies to the bit writer 53. In contrast to the case without low-delay constraint where the bit writer 53 starts writing bits whenever the first fixed-length entry in the global bit buffer 51 contains a fixed-length bit sequence (i.e., it is not only reserved), this process is delayed until the next request for fixed-length reservation 49 is triggered and then executed immediately before the request 49. The reason is as follows: if the bit writer 53 would be allowed to read out the global buffer 51 at any time, then encoder and decoder would have to check the low-delay constraint at bin level, i.e. for each bin of the common bin sequence. This is, however, a cumbersome task which may be avoided with almost no penalty regarding delay and so forth.

Let the maximum allowed buffer delay (as determined by the application) be D bits. This maximum buffer delay D must be known to both encoder and decoder. In an embodiment of the invention, the maximum buffer delay D is fixed by the application. In another embodiment of the invention, the maximum buffer delay D is signaled inside the bitstream, e.g., in the header of the data packet (or slice header) or in a parameter set, which is included in the bitstream. It can be signaled in units of bits, or bytes, or a multiple of bits, or a multiple of bytes. If a bin encoder 10 sends a request for the reservation of a new fixed-length bit sequence to the global bit buffer 51, the following process is executed before a new fixed-length buffer entry is reserved.

If the number of bits in the active buffer entries in the global bit buffer plus the number of bits that will be reserved by the current reservation request is greater than the maximum buffer delay D, the first buffer entry (which is reserved) is flushed by the process described in the following until the number of bits in the active buffer entries in the global bit buffer plus the number of bits that will be reserved by the current reservation request is less than or equal to the maximum buffer delay D. The flushing of a reserved fixed-length buffer entry is similar to the flushing at the end of a data packet: The bin encoder 10 that is connected with the bit buffer 48 that has reserved the corresponding first buffer entry is flushed. This means, if the corresponding bin buffer 8 is not empty, bins with particular or arbitrary values are added to the connected bin buffer 8 until the resulting bin sequence represents a bin sequence that is associated with a codeword and the codeword is then inserted into the corresponding bit buffer 48. As mentioned above, one advantageous way for adding bins to the bin buffer is to add those bins that produce the shortest possible codeword. For the case where the bit buffer to be flushed is the same that requested a fixed-length bit sequence from the global bit buffer 61, the bin buffer only stores the single bin that triggered the request 59 and this is not flushed. If the resulting number of bits Mx in the corresponding bit buffer 48 is smaller than the number of bits of a fixed-length sequence Nx, as many particular or arbitrary bits are added until Mx equals Nx. Afterwards (if bins were added or not), Mx is greater than or equal to Nx and one fixed-length sequence of bits is written to the corresponding reserved slots in the global bit buffer 51 (and will be written to the bitstream 55 during the next processing of the bit writer 53, immediately before a request for fixed-length reservation 49 or by the flushing process at the end of the bit stream). That is, the respective bit buffer 48 does not have to be completely flushed in cases where the number of bits exceeds Nx due to, for example, the enforcement of the generation of a new codeword by stuffing existing bins in th respective bin buffer. Rather, these bits remain in the respective bit buffer 48, and no bit stuffing is needed which would otherwise put additionally strain onto the bit rate.

That is, in other words, the global buffer 51 may be configured to perform the removal of the filled tranche entries in the sequential order in units of tranche entries at the times of the triggering 49 of a respective reservation by any of the plurality of entropy encoders 10 and the respective individual buffers 48, from the lest recently reserved, already having been filled tranche entry, inclusively, if any, up to the least recently reserved, not yet filled tranche entry, exclusively.

The global buffer 51 may be configured to, at the times of the triggering 49 of a respective reservation by any of the plurality of entropy encoders and the respective individual buffers, do the following.

Firstly, the global buffer 51 finishes the removal of the filled tranche entries of the tranche entries in the sequential order from the least recently reserved, already having been filled tranche entry, inclusively, if any, up to the least recently reserved, not yet filled tranche entry, exclusively.

Secondly, the global buffer 51 checks as to whether a number of bits in the global buffer 51 covered by the reserved tranche entries plus the bit length Nx for the respective reservation-triggering entropy encoder 10 is greater than a maximum buffer delay D.

Third, if the check result is negative, the global buffer 51 just reserves a respective new tranche entry of bit length Nx for the respective reservation-triggering entropy encoder 22.

However, if the check result is positive, the entropy encoder 10 for which the least recently reserved, not yet filled tranche entry is reserved, is caused by the global buffer 51 to extend symbols forwarded to it by the selector 6, which have not yet been entropy encoded—if there are any—to a valid symbol sequence, and map the valid symbol sequence thus obtained to a codeword so as to be buffered by the corresponding individual buffer. It is then checked as to whether the number Mx of bits currently buffered in the individual buffer 48 of the entropy encoder 22 for which the least recently reserved, not yet filled tranche entry is reserved, is smaller than the bit length Nx for this entropy encoder 22, and if so, Nx-Mx bits are appended to the Mx bits currently buffered. Irrespective of any extension to a valid symbol sequence or any appending being necessitated or not, Nx buffered bits out of the individual buffer 48 of the entropy encoder 22 for which the least recently reserved, not yet filled tranche entry is reserved, are output into the least recently reserved, not yet filled tranche entry in order to fill same, with leaving potentially additionally buffered bits beyond the Nx buffered bits output, in the individual buffer.

Then, before checking the low-delay criterion again in order to finally process the request for a tranche entry, the at least one meanwhile filled least recently tranche entries (at least including the least recently one filled by flushing) are output from the global bit buffer 51, and then the low-delay criterion is checked again and so forth.

At the decoder side, a similar process is executed for discarding the bins and bits that have been added to obey the delay constraint. Therefore, the decoder maintains a counter C that counts the bits that have been read from the global bit buffer (this counter can be maintained in the global bit buffer). The counter C is initialized (e.g. with zero) at the beginning of the decoding of a data packet and it is increased after a fixed-length sequence of is read. If a fixed-length sequence of Nx bits is read from the global bit buffer 61, the counter C is increased by Nx. In addition to the overall counter C, each bit buffer 58 contains two counters Cx, and $Cx_2$, which store the values of the bit counter C before the last two fixed-length bit sequence that were read into the corresponding bit buffer 58. It is ensured that bits of no more than two fixed-length bit sequences are inside a particular bit buffer 58 and Cx, stores the overall counter value corresponding to the fixed-length bit sequence read earlier. This implies that when bits are removed from a bit buffer 58, Cx2 can become Cx1 and Cx2 is then undefined. When a particular bit buffer 58 reads a new fixed-length bit sequence, its counter $Cx_1$ or $Cx_2$ is set equal to C as a first step depending on whether the bit buffer 58 was empty (Cx1) or not (Cx2) and then the fixed-length bit sequence is read from the global bit buffer 61. When a request for a fixed-length sequence of bits 59 is sent to the global bit buffer 61 and the difference (C−Cx1) between the overall counter C and the counter Cx1 of that bit buffer 58 that has the smallest value of Cx1 of all bit buffers is greater than the maximum buffer delay D, all bins that are currently stored in the corresponding bin buffer 20 and all bits that are stored in the connected bit buffer 58 that stem from the fixed-length sequence associated with Cx1 are discarded and ignored. Beside that additional step, the decoding is operated as described above. If the bin buffer 20 to which a request for a bin 19 is sent is empty (either because all bins have already been removed or because the low-delay mechanism did discard all bins in the first step after the bin request has been received), the connected bin decoder 22 attempts to read a new codeword from the connected bit buffer 58. If the number of bits in the bit buffer 58 is less than the maximum codeword length, a new fixed-length bit sequence is read from the global bit buffer 61, before the codeword is read, etc.

In other words, the decoder is configured to log, for each entropy decoder 22, a number of bits distributed from the global buffer 61 to the plurality of entropy decoders 22 up to the distribution of a least recently distributed tranche distributed from the global buffer 61 to the respective entropy decoder 22. Further, the decoder determines, each time a respective request for a tranche of a respective bit length Nx is triggered, as to whether a difference between a global number C of bits distributed from the global buffer 61 to the plurality of entropy decoders up to the respective request on the one hand, and a minimum logged number Cx1 of bits on the other hand, is greater than the maximum buffer delay D. If so, the least recently distributed tranche distributed from the global buffer 61 to the entropy decoder 22 for which the minimum logged number has been logged, and any symbols 21 not yet having been retrieved from the entropy decoder 22 for which the minimum logged number has been logged by the selector 18, are discarded.

It goes without saying that the just described low-delay embodiment would also be favorable and advantageous if performed with Cx=0.

Interleaving of Fixed-Length Bit Sequences with a Low-Delay Constraint and Reduced Bit Rate Overhead The previously described scheme can be further optimized in order to reduce the bit rate overhead introduced by the low delay handling. Assume that a particular bin encoder 10 exists that is suitable for equiprobable bins and which produces a codeword 47 of 1 bit length from each bin 7 and further assume, it is more frequently used than other bin encoders 10. More precisely, such a more frequently used bin encoder 10 may be provided with bins 7 by the bin buffer selector 6 more frequently. Furthermore, such a more frequently used bin encoder 10 may produce more codewords 47 and thus may also produce more fixed-length bit sequences 50 which are forwarded to the global bit buffer 51. In a codec setup that has such a more frequently used bin encoder 10 for equiprobable bins, a modification to the interleaving scheme as described in the previous section can reduce the bit rate overhead stemming from the flushing operation resulting from the low-delay constraint. The necessitated changes to the above scheme are described in the following.

If a bin encoder 10 sends a request for the reservation of a new fixed-length bit sequence to the global bit buffer 51, the low-delay criterion is checked and as long as it is violated, the flushing operation is carried out. The new invention uses exactly the same procedure as the scheme in the previous section, but adds a further processing step in the case where the more frequently used bin encoder 10 for equiprobable bins sends a request for the reservation of a new fixed-length bit sequence to the global bit buffer 51. Instead of checking the low-delay criterion, it is checked if the number of bits in the active buffer entries in the global bit buffer plus the number of bits that will be reserved by the current reservation request is greater than a predefined threshold D2 (with D2<D).

If so, the following processing step is carried out.

The bin encoder 10 belonging to the least recently reserved and not yet filled tranche entry in the global bit buffer 51 is determined (note that this bin encoder 10 cannot be the more frequently used bin encoder 10 for equiprobable bins because it only produces 1 bit codewords 47 and thus, the belonging bit buffer 48 needs to be empty). Bins in the bin buffer 8 belonging to the least recently reserved and not yet filled tranche entry in the global bit buffer 51 are completed until a codeword 47 can be generated (by adding arbitrary or particular bins in order to yield a code word, advantageously a short code word) and this code word is added to the corresponding bit buffer 48. In the next step, the content of this bit buffer is moved to the empty bit buffer 48 of the more frequently used bin encoder 10 for equiprobable bins and the ownership of the least recently reserved tranche entry in the global bit buffer 51 is moved to the more frequently used bin encoder 10 for equiprobable bins. Afterwards, it is checked whether it is still necessitated to reserve a new fixed-length bit sequence and if so, the procedure continues exactly as in the scheme described in the previous section (check of low-delay criterion, potential buffer flushing, code word reservation).

Else, i.e. if the number of bits in the active buffer entries in the global bit buffer plus the number of bits that will be reserved by the current reservation request turned out to be not greater than the predefined threshold D2 (with D2<D).

the procedure continues exactly as in the scheme described in the previous section (check of low-delay criterion, potential buffer flushing, code word reservation).

FIGS. 64 to 68 illustrate the above procedure using an examplary setup of 4 bin coders with examplary buffer fillings, with exemplarily Lx=8 for all bin encoder and all reservations. Bin encoder 10 with index 1 shall be the more frequently used bin encoder.

Figure 64:
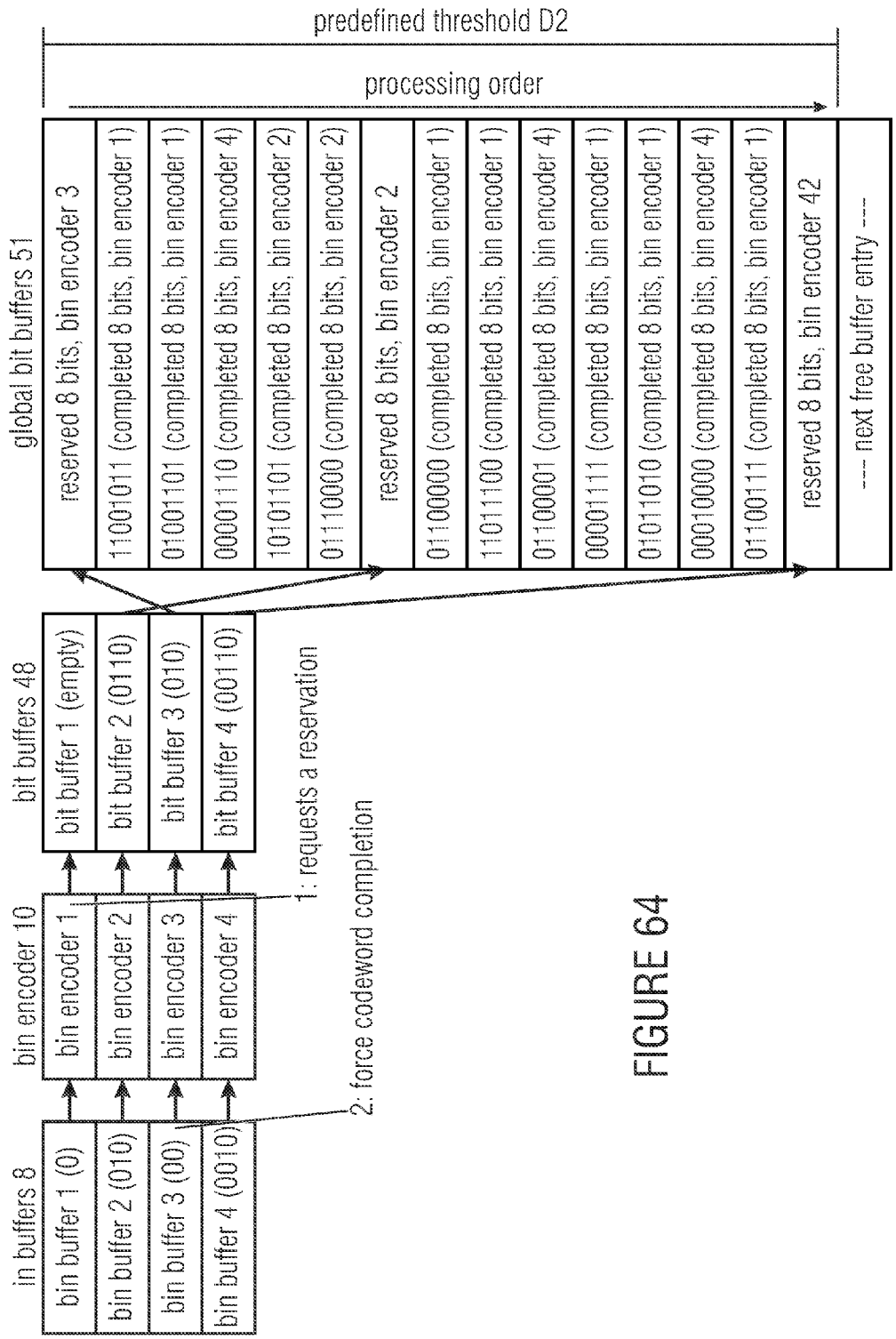
FIG. 64-68 schematically show a sequence of buffer states of the buffers of the encoder of FIG. 9.
Figure 65:
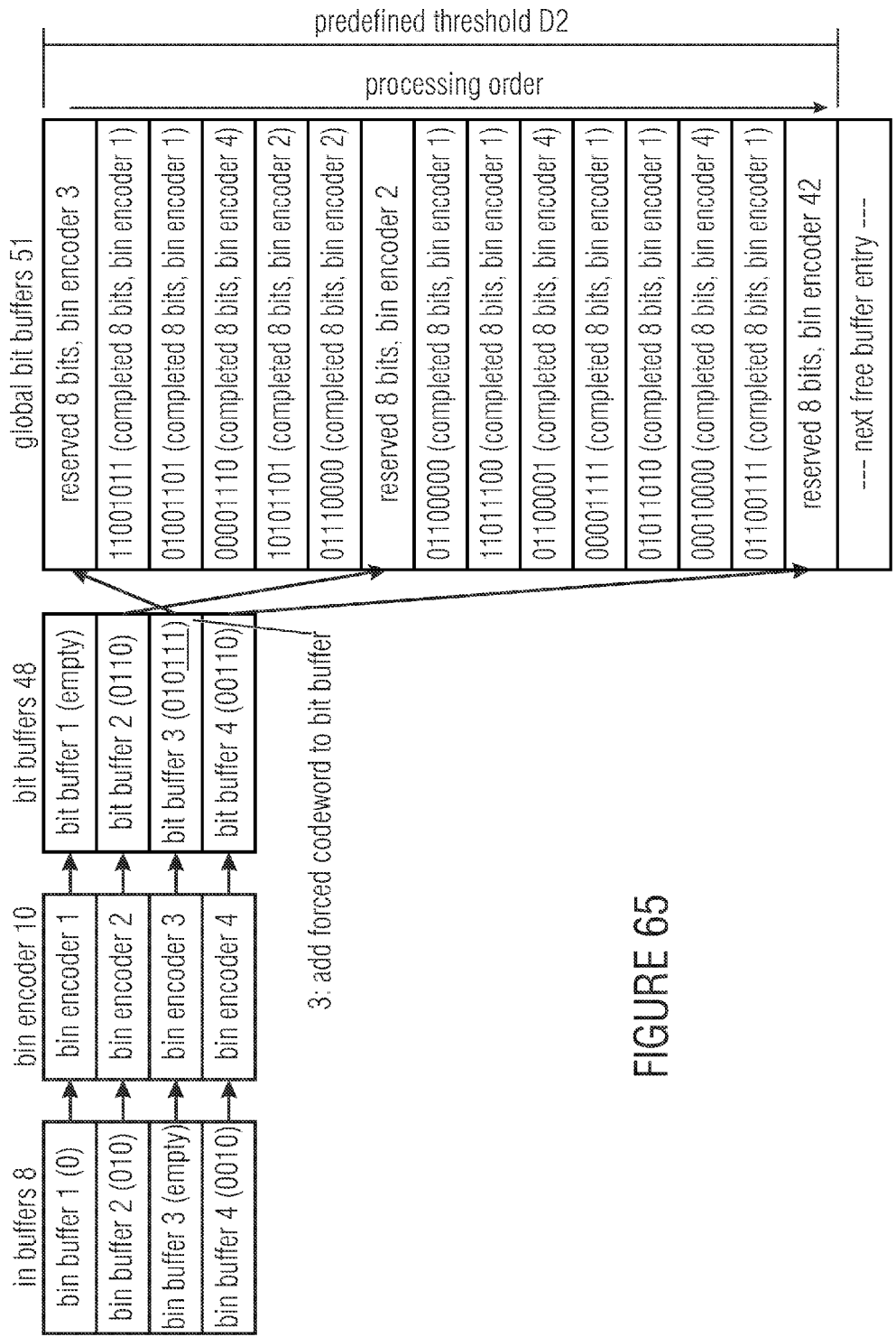
Figure 66:
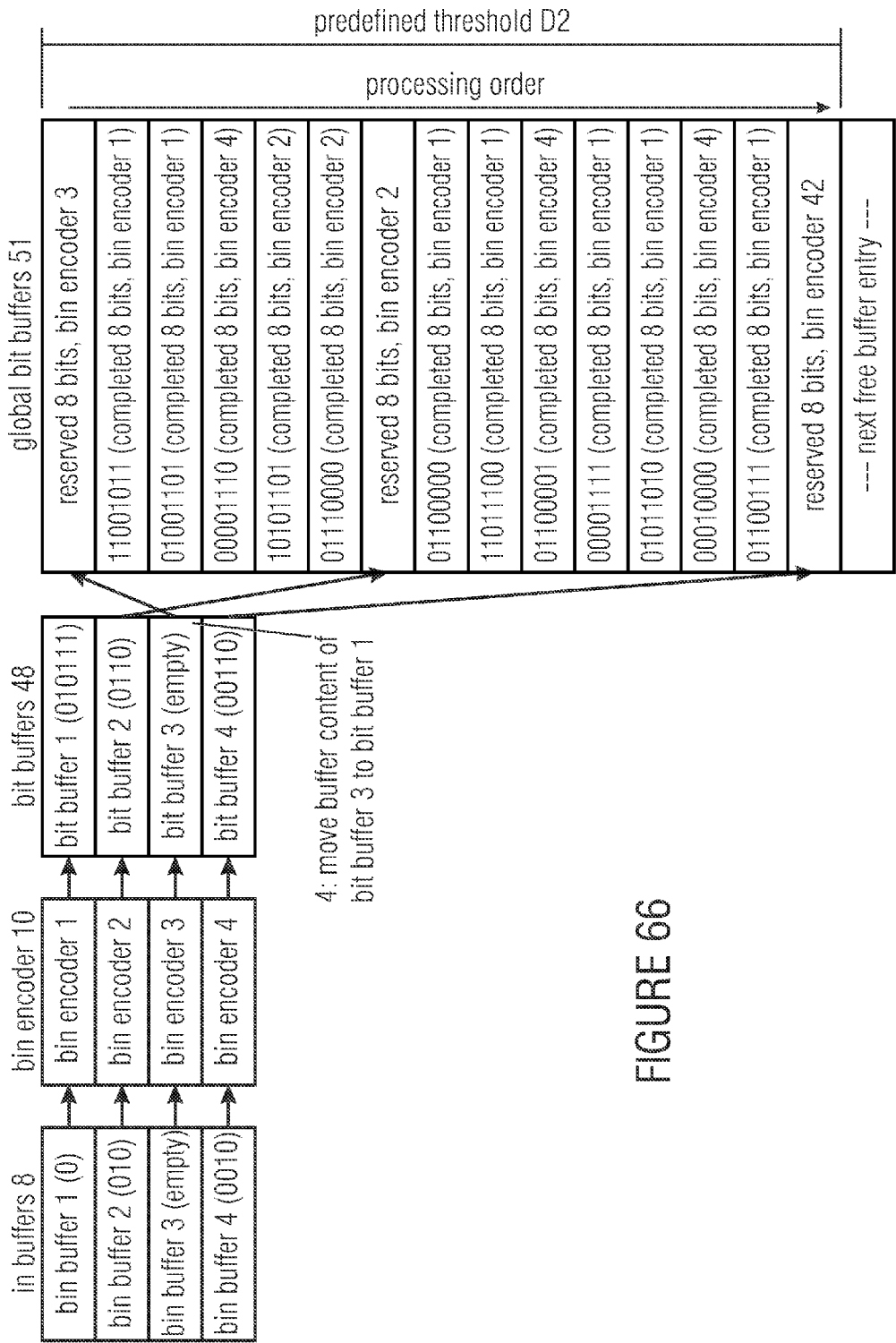
Figure 67:
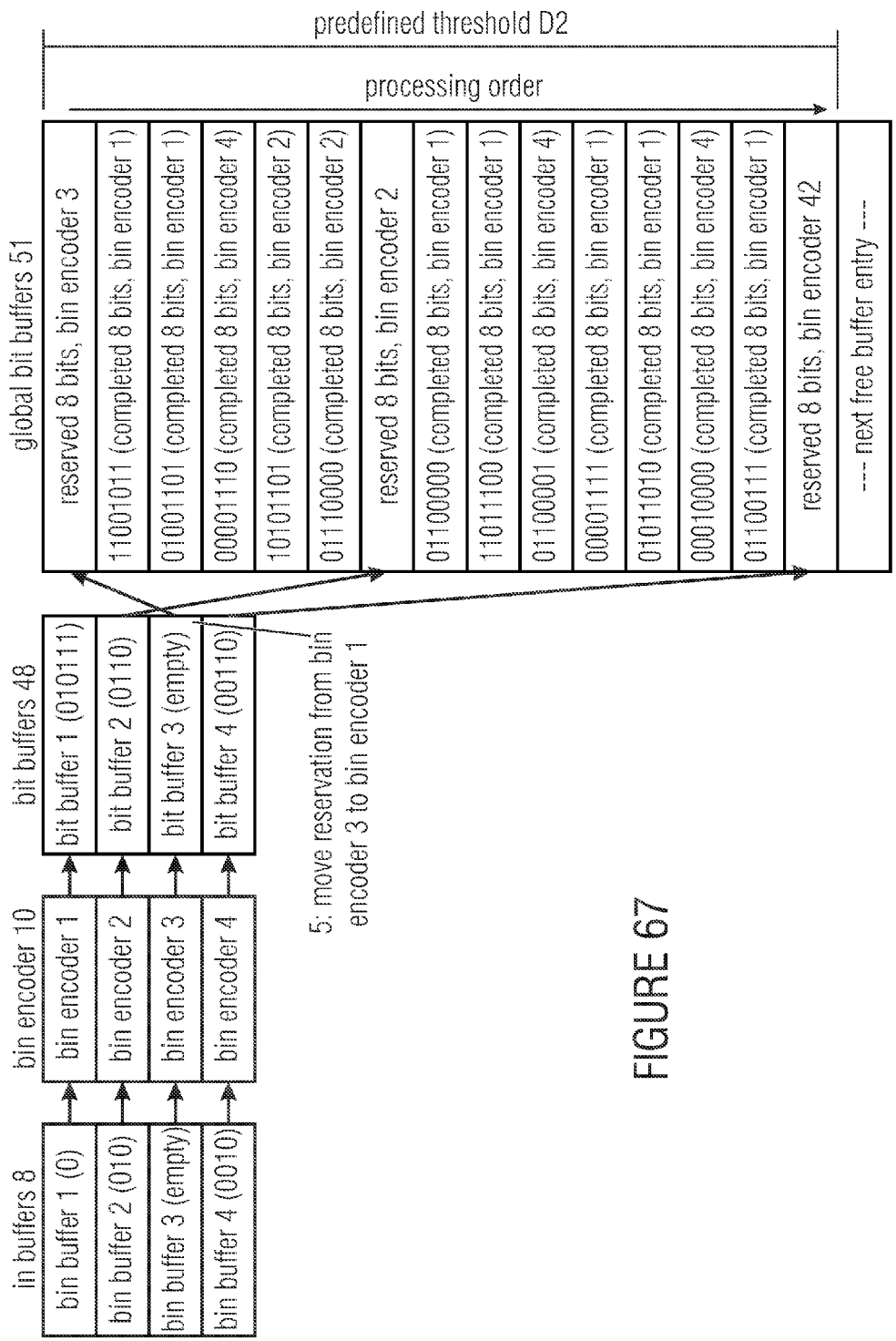
Figure 68:
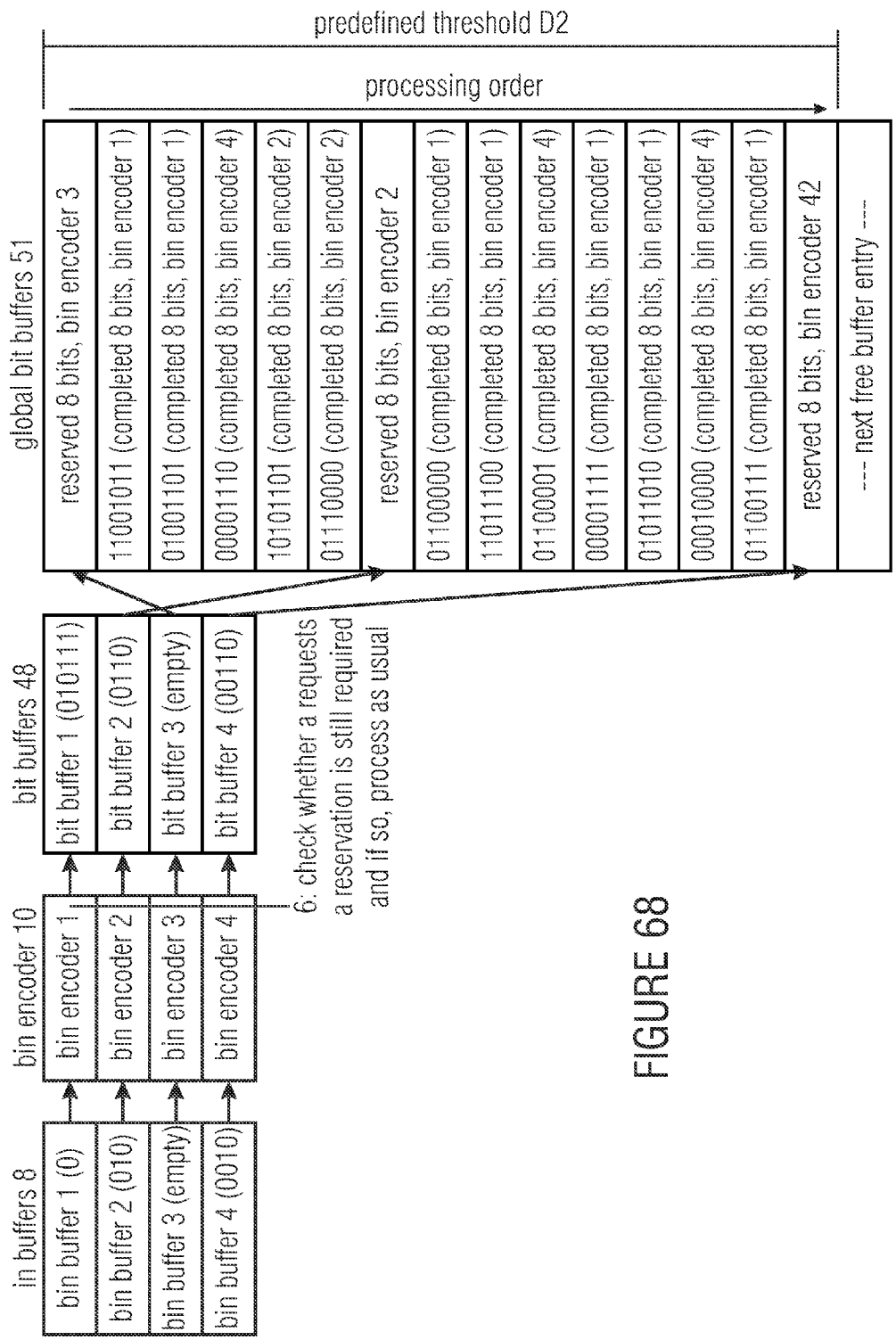

First, a request for the reservation of a fixed-length bit sequence is raised by bin encoder with index 1 (see FIG. 64). Consequently, it is checked whether the number of bits in the active buffer entries in the global bit buffer 51 plus the number of bits that will be reserved by the current reservation request is greater than the predefined threshold D2. In the example, this is the case and therefore, the bin encoder belonging to the least recently reserved, not yet completed global bit buffer reservation is flushed. In the example, this is bin encoder 3 (see FIG. 64). The codeword generated by the flushing process is forwarded to bit buffer with index 3 as can be seen in FIG. 65. Followed by this, the content of bit buffer 3 is moved to bit buffer 1 (which is empty in such a situation, see FIG. 66) and the reservation of bin encoder with index 3 is switched to bin encoder with index 1 (see FIG. 67). As a last step, the initial check of whether a request for reservation is necessitated is repeated (see FIG. 68). I.e. it is checked whether the newly filled bit buffer 1 got so much bits while merely Lx reserved bits have been shifted to the respective entropy encoder that a new request has been necessitated, meaning that Lx-Mx for that entropy encoder 1 fulfills the above-mentioned criterion depending on Cx and Lx. If so, the processing continues as described in the previous section (check of low-delay criterion, potential flushing, reservation of fixed-length bit sequence). If not, a new request for a reservation may not be caused until a next codeword gets ready in any of the bin encoders 1 to 4.

With the above modification, the number of forced code word completions is increased, but the number of subsequnt tranche entry completions may be reduced, if the threshold D2 is properly selected (depending on D, the properties of the bin encoders 10, and the statistics of how the bin buffer selector 6 distributes the bins to the bin encoders 10) and thus, the overall bit rate overhead may be reduced.

A corresponding modification to the decoder implementation is also necessitated as follows. When a request for a fixed-length sequence of bits 59 is sent to the global bit buffer 61 by the more frequently used bin decoder 22 for equiprobable bins, the difference (C−Cx1) between the overall counter C and the counter Cx1 of that bit buffer 58 that has the smallest value of Cx1 of all bit buffers is evaluated:

If its value is greater than the predefined threshold D2,
all bins that are currently stored in the corresponding bin buffer 20 are discarded, but all not yet consumed bits that are stored in the connected bit buffer 58 that stem from the fixed-length sequence associated with Cx1 are moved to the bit buffer 58 of the more frequently used bin decoder 22 for equiprobable bits. Afterwards, the initial check of whether a fixed-length bit sequence must be read is repeated. I.e. it is checked whether the bit buffer 58 of the more frequently used bin decoder 22 now contains enough unconsumed bits to decode a codeword according to the above-mentioned criterion depending on Cx and Lx. If so, the processing continues as described in the previous section (check of low-delay criterion, potential discarding of bins and bits, reading of fixed-length bit sequence). Else, if its value is greater than the maximum buffer delay D, the same handling is carried out as in the scheme of the previous section (check of low-delay criterion, potential discarding of bins and bits, reading of fixed-length bit sequence).

Processing Optimization for Interleaved Fixed-Length Bit Sequences

The described embodiments of FIGS. 9 to 11 for an entropy encoder and decoder with interleaving of fixed-length bit sequences, with and without low-delay constraint, and/or with minimum codeword guaranty for the decoder, can also be extended in the following way so that the decoder parallelization processing is alleviated. Particularly advantageous is the embodiment described below when combined with the scheme for controlling the encoder buffer delay, which is described above for the low-delay constraint.

The embodiment described now defines a scheme for optimized processing at the decoder, which is applicable to the low-delay case but also to any other case in the presence of a "fixed interval" or "chunk" size to be processed by the decoder). The process allows a simplified processing at the decoder which is based on a processing scheme for "chunks", which may best described as a special in-bit stream signaling or an out-of-band explicit or implicit signaling. The "tranche processing scheme" indicates the decoder, how many tranches of a specific "pipe" will follow in the "chunk". This specific scheme may be used to "fill" the "pipe decoders" in a, for example, round-robin fashion. The scheme will be applied until the end of the "chunk". This allows the decoder for straight processing of the code words without detection of the next pipe to be processed. This simplifies the decoder implementation, since detection for the next pipe to be processed is no longer required.

Figure 61:
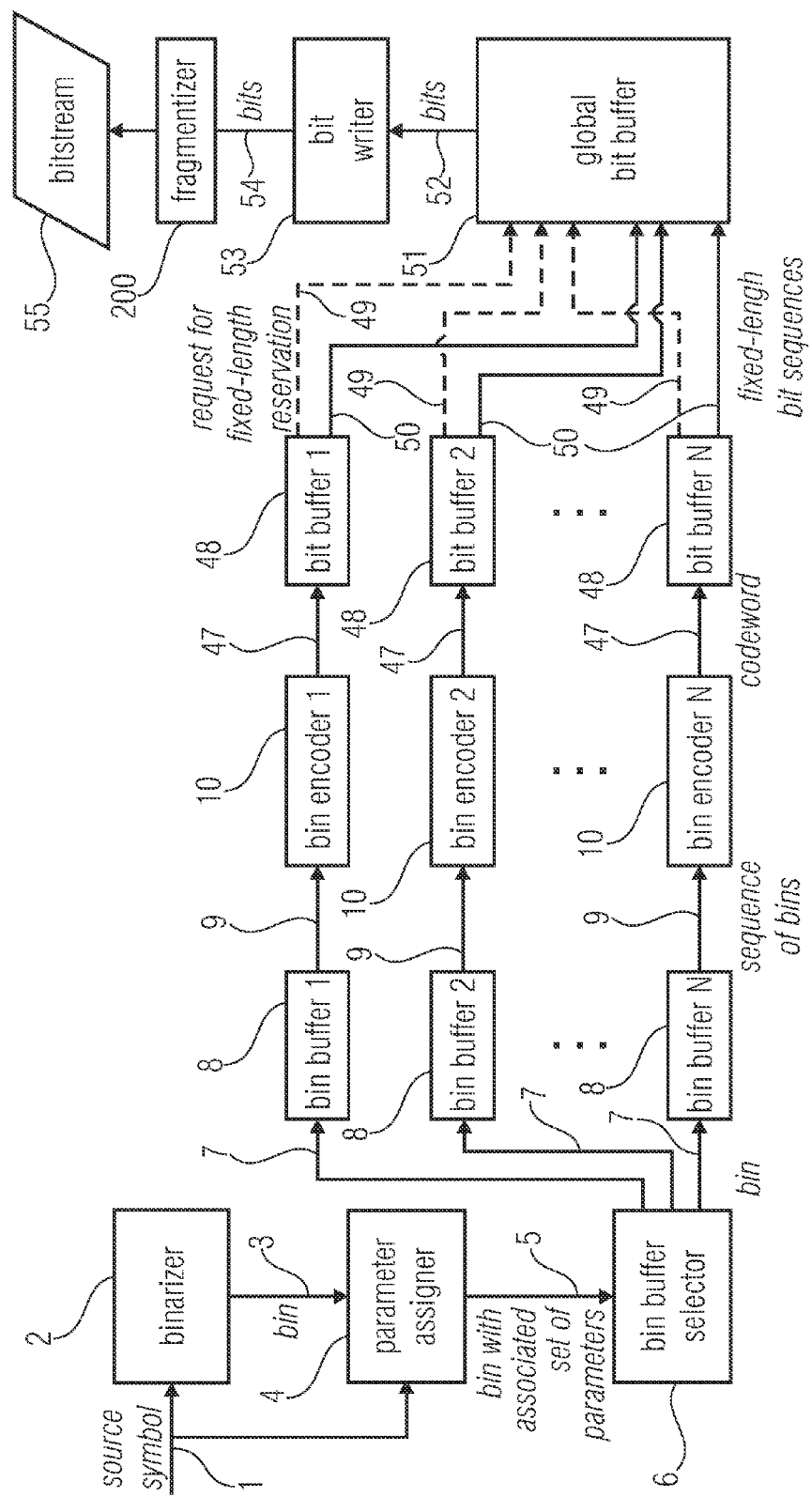
FIG. 61 shows a bock diagram of an encoder according to an embodiment using interleaving of fixed-length bit sequences.
Figure 62:
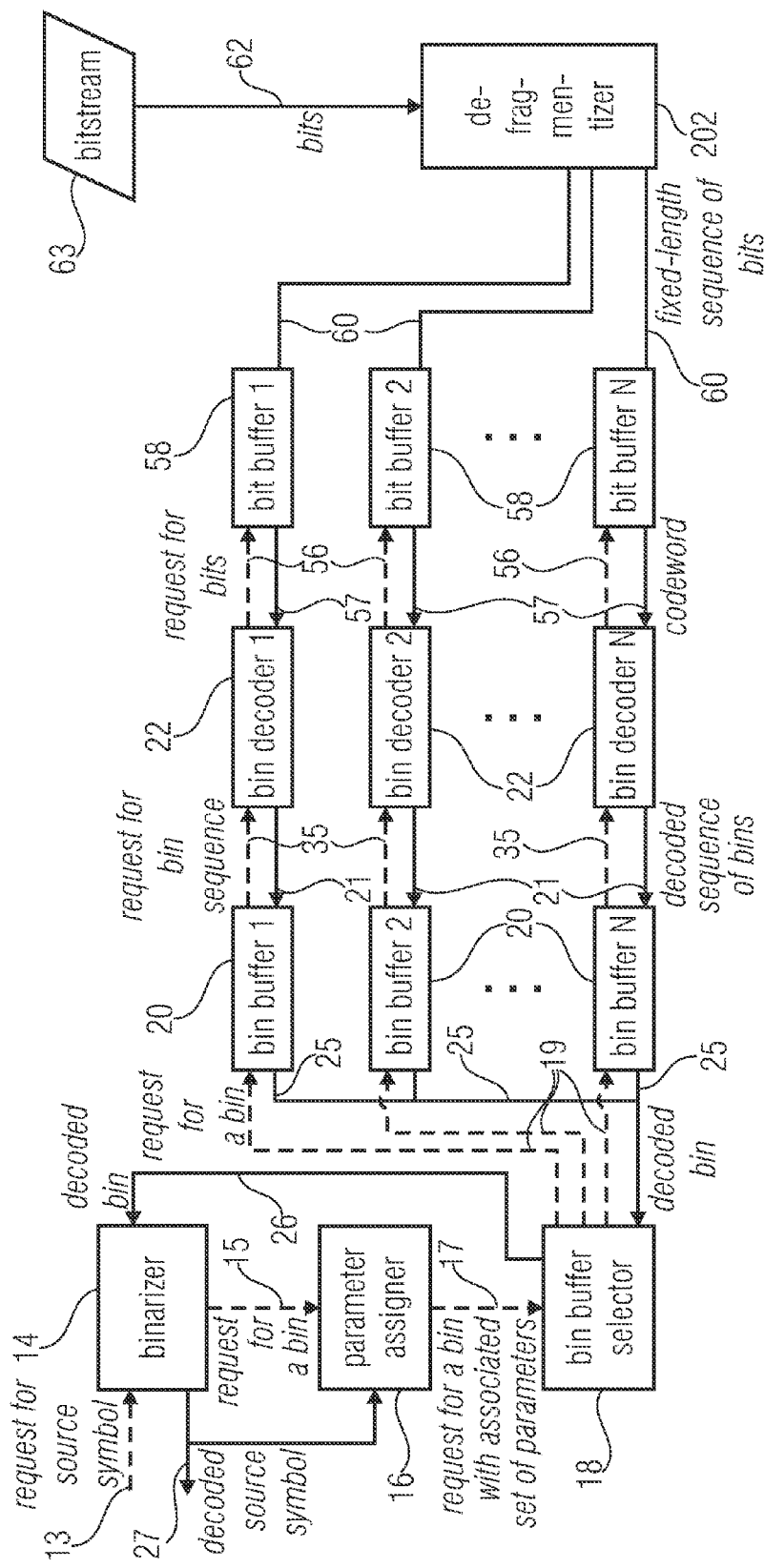
FIG. 62 shows a bock diagram of a decoder according to an embodiment using interleaving of fixed-length bit sequences.

An embodiment of the encoder is shown in FIG. 61, and an embodiment of the decoder is shown in FIG. 62. Almost all elements are the same as shown in FIGS. 9 and 11, and accordingly, reference is made to the above description of embodiments, which were described with respect to these Figures. However, a fragmentizer 200 is positioned between bit writer 53 and the output where the bitstream 55 to be finally transmitted is applied, and a defragmentizer 202 is positioned between the corresponding input where the bitstream 63 having been transmitted enters, and the individual buffers 58 instead of the global bit buffer 61.

Figure 63:
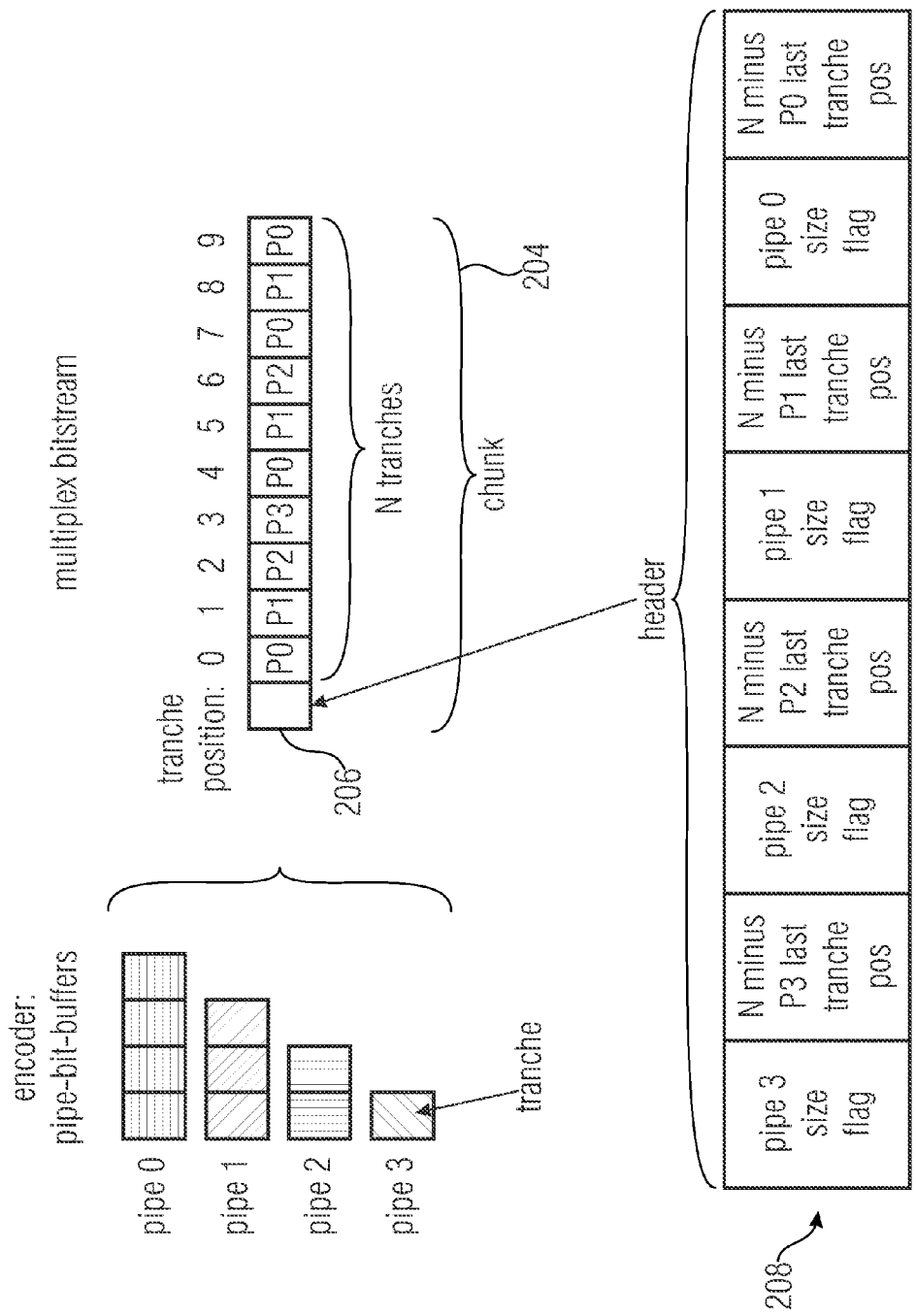
FIG. 63 schematically shows a multiplexing example of chunks coming from four partial bitstreams using an exemplary constant multiplexing scheme for the embodiments of FIGS. 61 and 62.

The fragmentizer 200 is configured to fragmentize the single stream of tranches which bitstream 62 represents, into chunks. One such chunk 204 is shown in FIG. 63. Each chunk 204 is accompanied by defragmentizer 202 with a header 206 comprising information as to how the tranches of the plurality of entropy encoders #, i,e, of the respective partial bitstream P#, are distributed over the respective chunk 204 so as to obtain a sequence of chunks forming bitstream 63. An exemplary form for the header information is discussed below and exemplarily shown at 208. In particular, as discussed below, the fragmentizer may be configured to, in fragmentizing the single stream of tranches into chunks, permute an original order of the tranches of the respective chunk within the single stream of tranches into an wanted order which is indicated by the information accompanying the respective chunk.

The decoder, in turn, comprises the defragmentizer 202 which is configured to distribute the tranches within the chunks of the sequence of chunks which bitstream 63 represents, using the information in the chunks' headers 206. As the encoding side did maintain the order among the tranches with respect to each individual partial bitstream 60 when forming the individual chunks, the defragmentizer 202 just has to distribute the tranches within the chunks according to the trenches' association to the entropy decoders and the partial bitstreams 60 respectively to the bit buffers 58 from which the VLC codewords are fetched by way of requests 56 by bin decoders 22.

Thus, three types of information have to be known to the defragmentizer: the positions of the tranches within the respective chunk, the association of the tranches to the entropy decoders, and the correct order among the tranches s far as each partial bitstream is concerned individually. The first information type may be known to the decoder by default such as, for example, by using equal Nx for all entropy decoders and setting the size of the chunks to a predetermined multiple of Nx, while the association of the tranches to the entropy decoders and the partial bitstreams' individual permutation relative to the correct order, is indicated in the header—or as out-of-stream side information. Of course, fragmentizer may have restricted the permutation to such permutations where the partial bitstreams' individual permutation relative to the correct order is maintained for each partial bitstream.

If permutation had been applied at encoder side, defragmentizer acts accordingly, as the information indicated the position of the tranches belonging to the respective entropy decoders in the permuted order.

An example scheme may describe the tranche scheme of the "chunk" as follows for an assumed number of 4 pipes:

| Pipe# | Number of chunks |
|---|---|
| 0 | 4 |
| 1 | 3 |
| 2 | 2 |
| 3 | 1 |

The decoder is in the example processing the data as follows until all data of the "chunk" are consumed: The decoder consumes the tranches, e.g., in a round robin manner, processing 4 tranches of P0, 3 chunks of P1, 2 chunks of P2 and 1 chunk of P3.

FIG. 63 shows at 208 an example including an example in-bit stream signaling scheme, including a header 206 in front of each "chunk".

The header in this example indicates the difference in number of tranches for each "partial bitstream" from the last absolute tranche position of the chunk N.

At the encoder side, the bit writing process is delayed for the time until the size of the "chunk" is reached. I.e. all code words are cached per "partial bitstream" until the "chunk" size limit.

The size of the chunks may equal D, i.e. the delay constraint, including or excluding the header size. A "processing scheme" evaluator within the fragmentizer 200 may define the selected "processing scheme", i.e. the number of tranches which are processed in the "chunks" in the round-robin manner.

Then a writing process may be applied in the fragmentizer 200, arranging the "tranches" of the "chunk" in the bitstream in the selected "tranche processing scheme". The writing process may further include the signaling for the selected "tranche processing scheme".

At the decoder, the signaling, as available in bit-stream or—alternatively out-of-bit stream—, implicit or explicit needs to be identified. In the simplest case, a header 206 which may precede the "chunk" is read and based on the signaled processing scheme, the bit-stream reader is filling the partial bitstream tranche-wise in a round robin manner, until the number of tranches per each partial bitstream, as identified by the signaled "tranche processing scheme" has been reached.

"Tranche processing scheme" in-bit stream signaling. In order to reduce the overhead, necessitated for signaling the "tranche processing scheme", a signaling header may indicate for each pipe the presence of a tranche value for a specific pipe in the signaled "chunk". If the tranche of the respective partial bitstream is present, a flag is set followed by the position signaling. The position signaling may work as follows. For each flag-indicated "partial bitstream", the header indicates the position of the last tranche of the respective partial bitstream as distance from the last tranche position N-1, where N is equal to the number of all tranches in the "chunk".

Another position signaling may be based on the number of round-robin intervals, where for the flag-indicated "partial bitstream" the number of round robin intervals from the beginning of the "chunk", as a difference for each "partial bitstream" from a specific pipe, i.e. the difference in terms of round-robin intervals relative to the last pipe which has been finished in the "chunk" processing.

Alternatively, to the description of FIG. 62, defragmenter could be positioned between between the corresponding input where the bitstream 63 having been transmitted enters, and the global bit buffer 61. The defragmentizer 202 may be configured to defragmentize again the original single stream of tranches which the bitstream 62 entering global buffer 61 in FIG. 11 represents, from a sequence of chunks which bitstream 63 of FIG. 11 represents, using the information in the chunks' headers 206.

Thus, the above embodiments each represent a novel approach to entropy coding that provides the efficiency and simple modeling capability of arithmetic coding at the complexity level of Huffman coding. The event space of the input sequence of discrete symbols is mapped onto a small set of binary probability intervals. The probability models for the source symbols can be fixed or adaptive while entropy coding using the probability intervals remains fixed and is decoupled from the modeling stage. Each of the probability intervals is coded using a very simple entropy code that has the complexity level of Huffman codes. The excess rate of the event space projection entropy code (ESPEC) is similar to that of arithmetic coding.

Thus, the above embodiments enable a possible way to increase the efficiency of entropy encoding. Entropy coding, in general, can be considered as the most generic form of lossless data compression. Lossless compression aims to represent discrete data with fewer bits than needed for the original data representation but without any loss of information. Discrete data can be given in the form of text, graphics, images, video, audio, speech, facsimile, medical data, meteorological data, financial data, or any other form of digital data. In many coding applications, the original source data are first mapped onto so-called coding symbols and these coding symbols are then entropy coded. The mapping onto coding symbols can include quantization, in which case the overall coding scheme is lossy. A coding symbol S can take any value of an M-ary (M≥2) alphabet $A=\{a_0, \ldots, a_{M-1}\}$. For the purpose of coding the symbol s, the alphabet is associated with an estimated probability mass function (pmf) $\{p_s(a_0), \ldots, p_s(a_{M-1})\}$ and all dependencies between coding symbols that are not considered in this pmf are neglected. For these abstract settings, the entropy $$H_s = -\sum_{i=0}^{M-1} p_s(a_i) \log_2 p_s(a_i) \tag{B1}$$

is the greatest lower bound for the expected codeword length in bits per symbol, for coding the symbols s, that can be achieved with entropy coding techniques. For decades, Huffman coding and arithmetic coding have dominated practical entropy coding. They are well-known examples of practical codes capable of approximating the entropy limit (in a certain sense).

For a fixed probability distribution, Huffman codes are relatively easy to construct. The most attractive property of Huffman codes is that their implementation can be efficiently realized by the use of variable-length code (VLC) tables. However, when dealing with time-varying source statistics, i.e., changing symbol probabilities, the adaptation of the Huffman code and its corresponding VLC tables is quite demanding, both in terms of algorithmic complexity as well as in terms of implementation costs. Also, in the case of having a dominant alphabet value with $p_s(a_i)>0.5$, the redundancy of the corresponding Huffman code (without using any alphabet extension such as run length coding) may be quite substantial. Another shortcoming of Huffman codes is given by the fact that in case of dealing with higher-order probability modeling, multiple sets of VLC tables may be necessitated.

Arithmetic coding, on the other hand, while being substantially more complex than VLC, offers the advantage of a more consistent and adequate handling when coping with adaptive and higher-order probability modeling as well as with the case of highly skewed probability distributions. Actually, this characteristic basically results from the fact that arithmetic coding provides a mechanism, at least conceptually, to map any given value of probability estimate in a more or less direct way to a portion of the resulting codeword. Being provided with such an interface, arithmetic coding allows for a clean separation between the tasks of probability modeling and probability estimation, on the one hand, and the actual entropy coding, i.e., mapping of symbols to codewords, on the other hand.

Differing from the just-discussed conventional entropy coding schemes, some of the above-described embodiments of the present invention use a kind of event space projection described the mathematical background is described in more detail below.

Consider the sequence of coding symbols $\{s_0, \ldots, s_{N-1}\}$. Each symbol is drawn from an alphabet $s_i \in A_i$. The alphabets $A_i = \{a_0^i, a_1^i, \ldots\}$ contain two or more letters each being associated with a probability estimate $p_s(a_m^i)$. The probability estimates $p_s(a_m^i)$ are known to encoder and decoder and may be fixed or variable. It is assumed that variable probabilities are simultaneously estimated at encoder and decoder. The alphabets $A_i$ may either be identical for the sequence of symbols or different symbol types are associated with different alphabets. In the latter case, it is assumed that the decoder knows the alphabet of each symbol in the sequence. This assumption is justified as practical source codec descriptions contain a syntax that stipulates the order of symbols and their alphabets.

The sequence of symbols $\{s_0, \ldots, s_{N-1}\}$ is converted into a sequence of binary symbols, which are also referred to as bins. For each symbol $s_i$, the binarization $$^i = \{b_0^i \ldots\} = \gamma_b^i(s_i) \tag{B2}$$

represents a bijective mapping of the alphabet letters $a_m^i$ onto ordered sets of bins $_m^i$. The binarization mapping $\gamma_b^i$ can be different for different symbols $s_i$ or symbol categories. Each bin sequence $^i$ for a particular symbol $s_i$ consists of one or more bins $b_k^i$. At the decoder side, a symbols $s_i$ can be reconstructed by the inverse mapping $s_i = (\gamma_b^i)^{-1}(^i)$ given the sequence of bins $^i$. As a result of the binarization, a sequence of bins $\{b_0, \ldots, b_{b-1}\}$ is obtained that represents the sequence of source symbols $\{s_0, \ldots, s_{N-1}\}$.

All bins $b_j$ are associated with the same binary alphabet $B = \{0,1\}$, but the corresponding binary pmfs, $\{p_0^j, p_1^j\}$, with $p_1^j = p_0^j$, are usually different. A binary pmf $\{p_0^j, p_1^j\}$ can be described by the less probable bin (LPB) value $b_{LPB}^j$ and its probability $p_{LPB}^j$ (with $p_{LPB}^j \leq 0.5$). This binary probability description $\{b_{LPB}^j, p_{LPB}^j\}$ can be directly derived from the probability estimates $p_s(a_m^i)$ for the symbol alphabets given the binarization mappings $\gamma_b^i$. It is also possible (and often of advantage) to directly estimate $\{b_{LPB}^j, p_{LPB}^j\}$ simultaneously at encoder and decoder side. Therefore, the bins can be associated with a probability model (which is also referred to as context) based on the syntax and previously coded symbols or bins. And for each probability model, the probability description $\{b_{LPB}^j, p_{LPB}^j\}$ can be estimated based on the values of the bins that are coded with the probability model. An example for such a binary probability modeling is described in [Ed: add reference to CABAC].

Since the binary entropy function $$H(p) = -p \log_2(p) - (1-p) \log_2(1-p) \tag{B3}$$

is symmetric around $p = 0.5$, the same binary coder can be used for coding all bins that are associated with the same LPB probability $p_{LPB}^j$, independent of the value of $b_{LPB}^j$. Therefore, the sequence of bins $\{b_0, \ldots, b_{B-1}\}$ is converted into a sequence of coding bins $\{b_0^c, \ldots, b_{B-1}^c\}$. For each bin $b_j$, the corresponding bijective mapping $\gamma_c^j$ is specified by $$b_j^c = \gamma_c^j(b_j) = b_j \oplus b_{LPB}^j \tag{B4}$$

where $\oplus$ denotes the exclusive or operator. At the decoder side, the bins $b_j$ can be reconstructed given the coding bins $b_j^c$ and the corresponding LPB value $b_{LPB}^j$ by the inverse mapping $b_j = (\gamma_c^j)^{-1}(b_j^c) = b_j^c \oplus b_{LPB}^j$. A coding bin $b_j^c = 0$ specifies that the value of corresponding bin $b_j$ is equal to the LPB value $b_{LPB}^j$ and a coding bin $b_j^c = 1$ specifies that the value of the corresponding bin $b_j$ is equal to the more probable bin (MPB) value $1 - b_{LPB}^j$.

The sequence of coding bins $\{b_0^c, \ldots, b_{B-1}^c\}$ does uniquely represent the sequence of source symbols $\{s_0, \ldots, s_{N-1}\}$ and the corresponding probability estimates, which can be employed for entropy coding, are completely described by the LPB probabilities PLPB $p_{LPB}^j$ (with $p_{LPB}^j \leq 0.5$). Hence, only probabilities in the half-open interval $(0, 0.5]$ need to be considered for designing the binary entropy coder for the coding bins $b_i^c$.

For the actual binary entropy coding, the sequence of coding bins $\{b_0^c, \ldots, b_{B-1}^c\}$ is projected onto a small number of probability intervals $I_k$. The LPB probability interval $(0, 0.5]$ is partitioned into K intervals $I_k = (p_k, p_{k+1}]$ $$\bigcup_{k=0}^{K-1} I_k = (0, 0.5) \tag{B5}$$

and $$I_k \cap I_j = \emptyset$$

for $$k \neq j$$

The set of K intervals is characterized by K−1 intervals borders $p_k$ with $k = 1, \ldots, K-1$. Without loss of generality we assume $p_k<p_{k+1}$ for $k=0, \ldots, K$. The outer interval borders are fixed and given by $p_0=0$ and $p_K=0.5$. A simple non-adaptive binary entropy coder is designed for each interval $I_k$. All coding bin $b_j^c$ with associated LPB probabilities $P^j{}_{LPB} \in I_k$ are assigned to the interval $I_k$ and are coded with the corresponding fixed entropy coder.

In the following description, all bins represent coding bins $b_j^c$ and all probabilities p are LPB probabilities $p^j{}_{LPB}$.

For investigating the impact of the probability interval discretization on the coding efficiency, we assume that we can design an optimal entropy coder for a fixed probability that achieves the entropy bound. Each probability interval $I_k=(p_k, p_{k+1}]$ is associated with a representative probability $p_{I_k} \in I_k$ and the corresponding optimal entropy coder shall achieve the entropy limit for this representative probability. Under these assumption, the rate for coding a bin with probability p using the optimal entropy coder for the interval representative $p_{I_k}$ is given by $$R(p, p_{I_k}) = -p\log_2(p_{I_k}) - (1-p)\log_2(1-p_{I_k}) \quad (B6)$$
$$= H(p_{I_k}) + (p - p_{I_k})H'(p_{I_k})$$

where H(p) represents the binary entropy function 3 and $$H'(p) = \log_2\left(\frac{1-p}{p}\right) \quad (B7)$$

is its first derivative. We further assume that the distribution of the probabilities in the interval (0, 0.5] is given by f(p), with $\int_0^{0.5} f(p)dp=1$. Then, the expected rate, in bits per bin, for a given set of K intervals $\{I_k\}$ with corresponding representative probabilities $\{p_{I_k}\}$ can be written as $$R = R(\{I_k\}, \{p_{I_k}\}) \quad (B8)$$
$$= \sum_{k=0}^{K-1} \left( \int_{p_k}^{p_{k+1}} R(p, p_{I_k})f(p)dp \right)$$

The first partial derivative with respect to any representative probability $p_{I_k}$, with $k=0, \ldots, K-1$, is given by $$\frac{\partial}{\partial p_{I_k}}R = \frac{p_{I_k}\int_{p_k}^{p_{k+1}} f(p)dp - \int_{p_k}^{p_{k+1}} pf(p)dp}{p_{I_k}(1-p_{I_k})\ln 2} \quad (B9)$$

The equation $$\frac{\partial}{\partial p_{I_k}}R = 0$$

has a single solution $$p_{I_k}^* = \frac{\int_{p_k}^{p_{k+1}} pf(p)dp}{\int_{p_k}^{p_{k+1}} f(p)dp} \quad (B10)$$

for the representative probability $p_{I_k}$ inside the domain of definition $I_k$. The second partial derivative for this solution $$\frac{\partial^2}{\partial p_{I_k}^2} R(p_{I_k}^*) = \frac{\int_{p_k}^{p_{k+1}} f(p)dp}{p_{I_k}^*(1-p_{I_k}^*)\ln 2} \quad (B11)$$

is greater than zero if $$\int_{p_k}^{p_{k+1}} f(p)dp > 0 \quad (B12)$$

Hence, if condition B12 is fulfilled, the value $p_{I_k}^*$ given in eq. B10 is the representative probability for an interval $I_k$ that minimizes the expected overall rate R given the interval boundaries $p_k$ and $p_{k+1}$. Otherwise, no bin is projected to the interval $I_k$ and the representative probability $p_{I_k} \in I_k$ can be arbitrarily chosen without any impact on the overall rate R; but such a configuration should be avoided, since the interval $I_k$ would not be employed for entropy coding.

For finding a condition for optimal interval borders, we investigate the first derivitives of the expected overall rate R with respect to the interval borders $p_k$ with $k=1, \ldots, K-1$. If $f(p)>0$ for all $p \in [p_{I_{k-1}}, p_{I_k})$, the equation $$\frac{\partial}{\partial p_k}R = 0$$

has a single solution $$p_k^* = \frac{H(p_{I_k}) - p_{I_k}H'(p_{I_k}) - H(p_{I_{k-1}}) + p_{I_{k-1}}H'(p_{I_{k-1}})}{H'(p_{I_{k-1}}) - H'(p_{I_k})} \quad (B13)$$

for the interval border $p_k$ inside the domain of definition $[p_{I_{k-1}}, p_{I_k})$ and the second partial derivative for this solution $$\frac{\partial^2}{\partial p_k^2}R(p_k^*) = f(p_k^*)(H'(p_{I_{k-1}}) - H'(p_{I_k})) \quad (B14)$$

is greater than zero, so that $p_k^*$ is the interval border $p_k \in [p_{I_{k-1}}, p_{I_k})$ that minimizes the expected overall rate R given the interval representatives $p_{I_{k-1}}$ and $p_{I_k}$. If there exist probabilities $p \in [I_{k-1}, p_{I_k})$ with f(p)=0, the equation $$\frac{\partial}{\partial p_k}R = 0$$

has multiple solutions, but $p_k^*$ as given in eq. B13 is still optimal even though further optimal solutions may exist.

Given the number of intervals K and the probability distribution f(p), the interval borders $p_k$, with $k=1, \ldots, K-1$, and the interval representatives $p_{I_k}$ with $k=0, \ldots, K-1$, that minimize the expected overall rate R can be obtained by solving the equation system given by eqs. B10 and B13 subject to the conditions B12 for $k=0, \ldots, K-1$. This can be achieved with the following iterative algorithm.

Algorithm 1:

1) Partition the interval (0,0.5] into K arbitrary intervals $I_k = (p_k, p_{k+1}]$ with $p_0 = 0$, $p_K = 0.5$, and $p_k < p_{k+1}$ for all $k = 0, \ldots, K-1$ in a way that the conditions B12 are obeyed for all $k = 0, \ldots, K-1$.

-continued

Figure 12:
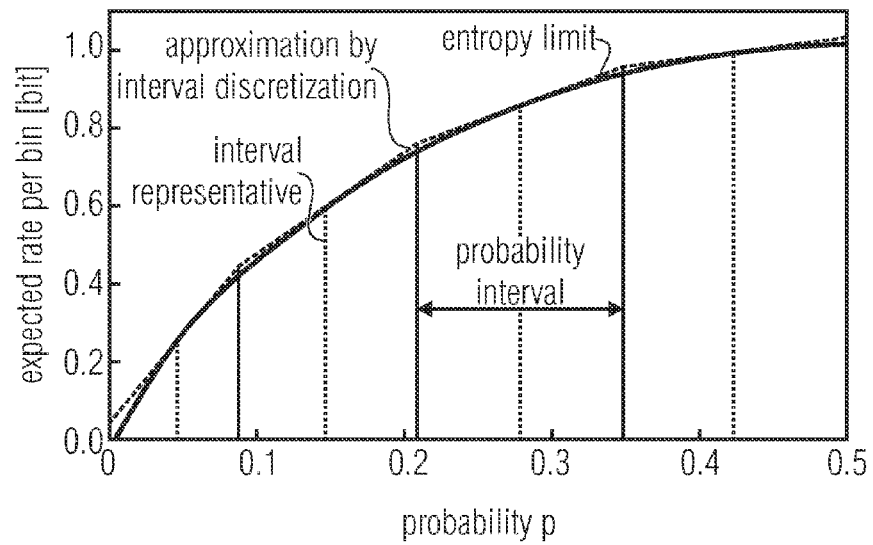
FIG. 12 shows a graph for illustrating an optimal probability interval discretization into K=4 intervals assuming a uniform probability distribution in (0, 0.5]

Algorithm 1:

2) Update the representatives $p_{I_k}$ with k = 0,...,K −1 according to eq. B10
3) Update the interval borders $p_k$ with k = 1,...,K −1 according to eq. B13
4) Repeat the previous two steps until convergence FIG. 12 shows an example for the optimal interval discretization using the described algorithm. For this example, we assumed a uniform probability distribution f(p)=2 for 0<p≤0.5 and partitioned the probability interval (0, 0.5] into K=4 intervals. It can be seen that the probability interval discretization leads to a piecewise linear approximation A(p) of the binary entropy function H(p) with A(p)≥H(p) for all p∈(0, 0.5].

As measure for the impact of the interval discretization on the coding efficiency the expected overall rate increase relative to the entropy limit $$\bar{\rho} = \frac{R}{\int_0^{0.5} H(p)f(p)\,dp} - 1 \quad (B15)$$

can be used. For the particular example of FIG. 12, the expectation value of the entropy $\bar{H} = \int_0^{0.5} H(p)f(p)\,dp$ is equal to 1/(2 ln 2) bit per bin and the rate overhead $\bar{\rho}$ is equal to 1.01%. Table 4 lists rate overheads $\bar{\rho}_{uni}$ and $\bar{\rho}_{lin}$ for the uniform probability distribution and a linear increasing probability distribution f(p)=8p with p∈(0, 0.5], respectively, for selected numbers of intervals K.

TABLE 4

Rate overhead vs. the number of probability intervals for the uniform and a linear increasing probability distribution

| | K | | | | | |
|---|---|---|---|---|---|---|
| | 1 | 2 | 4 | 8 | 12 | 16 |
| $\bar{\rho}_{uni}$ [%] | 12.47 | 3.67 | 1.01 | 0.27 | 0.12 | 0.07 |
| $\bar{\rho}_{lin}$ [%] | 5.68 | 1.77 | 0.50 | 0.14 | 0.06 | 0.04 |

The investigations in this section showed that the discretization of the LPB probability interval (0, 0.5] into a small number of intervals with a fixed probability (e.g., 8 to 10 intervals) has a very small impact on the coding efficiency.

The above discussed entropy coding for probability intervals, enables thus of individual coders using fixed probabilities.

In the following, we first show how a simple code can be designed for fixed probabilities. Given these results, we develop an algorithms that jointly optimizes the code design and the partitioning of the LPB probability interval (0, 0.5].

The entropy coding for fixed probabilities $p = p_{I_k}$ can be done using arithmetic coding or variable length coding. For the latter case, the following approach appears to be simple and very efficient.

Figure 13:
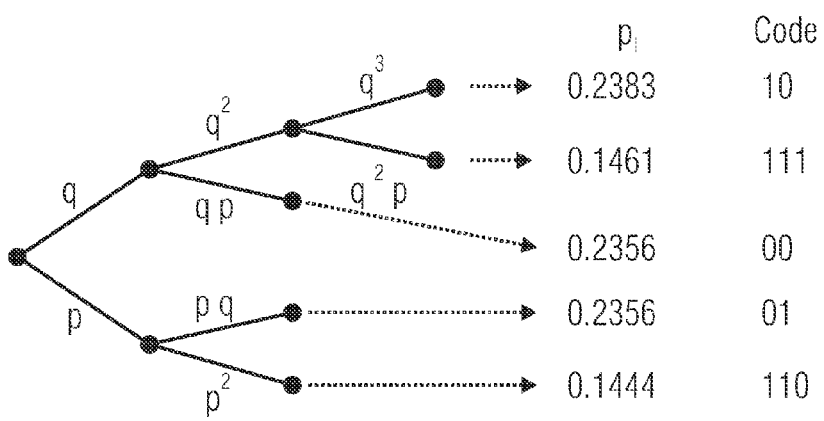
FIG. 13 shows a schematic diagram illustrating a tree of binary events for an LPB probability of p=0.38 and an associated variable length code obtained by the Huffman algorithm.

We consider a binary entropy coding scheme by which a variable number of bins is mapped onto variable length codewords. For unique decodability, the inverse mapping of a codeword to a bin sequence must be unique. And since we want to design a code that approaches the entropy limit as close as possible, we constrain our considerations to bijective mappings. Such a bijective mapping can be represented by a binary tree where all leaf nodes are associated with codewords, as depicted in FIG. 13. The tree edges represent binary events. In the example of FIG. 13, the lower edges represent the LPB bin value and the upper edges represent the MPB bin value. The binary tree represents a prefix code for the bins if it is a full binary tree, i.e., if every node is either a leaf or has two descendants. Each leaf node is associated with a probability based on the given LPB probability p. The root node has the probability $p_{root} = 1$. The probability for all other nodes is obtained by multiplying the probability of the corresponding ancestor with p for the LPB descendants and q=1−p for the MPB descendants. Each leaf node is characterized by the number of LPB edges $a_l$ and the number MPB edges $b_l$ from the root node to the leaf node. For a particular LPB probability p, the probability $p_l$ for a leaf node $L_l = \{a_l, b_l\}$ is equal to $$p_l = p^{a_l}(1-p)^{b_l} \quad (B16)$$

The binary tree T is fully characterized by the number of leaf nodes L and the associated pairs $\{a_l, b_l\}$ with l=0, ..., L−1.

Given a full binary tree T and a LPB probability p, the optimal assignment of codewords to the leaf nodes can be obtained by the Huffmann algorithm. The resulting variable number of bits to variable length codewords (VNB2VLC) mapping C is characterized by the number of codewords L, which is identical to the number of leaf nodes, and the tuples $\{a_l, b_l, l_l\}$ for l=0, ..., L−1, where $l_l$ represents the codeword length that is associated with the corresponding leaf node $L_l = \{a_l, b_l\}$. It should be noted that there are multiple possibilities for the codeword assignment given the codeword lengths $\{l_l\}$ and the actual codeword assignment is not important as long as the codewords represent a uniquely decodable prefix code. The expected rate R(p,C) in bits per bin for a given code C and an LPB probability p is the ratio of the expected codeword length and the expected number of bins per codeword $$R(p, C) = \frac{\sum_{l=0}^{L-1} p_l l_l}{\sum_{l=0}^{L-1} p_l(a_l+b_l)} = \frac{\sum_{l=0}^{L-1} p^{a_l}(1-p)^{b_l}l_l}{\sum_{l=0}^{L-1} p^{a_l}(1-p)^{b_l}(a_l+b_l)} \quad (B17)$$

The code design is often limited by factors as the maximum number of codewords L, the maximum number of bins per codeword, or the maximum codeword length, or it is restricted to codes of particular structures (e.g., for allowing optimized parsing). If we assume that the set $S_C$ of usuable codes for a particular application is given, the optimum code $C^* \in S_C$ for a particular LPB probability p can be found by minimizing the expected rate R(p,C)

$$C^*(p) = \arg\min_{\forall C \in S_C} R(p, C) \quad (B18)$$

Figure 14:
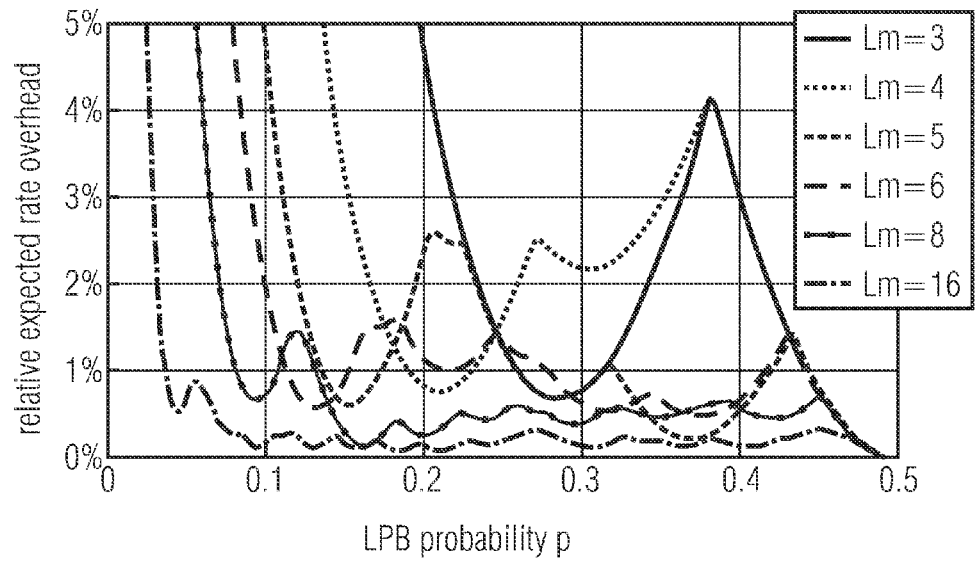
FIG. 14 shows a graph from which the relative bit rate increase ρ(p,C) for optimal codes C given a maximum number of table entries $L_m$ may be gathered.

As faster alternative, the minimization can also proceed over a given set of binary trees $S_T$ and for each tree only one VNB2VLC code C that is obtained by the Huffmann algorithm is considered. As an example, we designed VNB2VLC codes for various LPB probabilities p by considering all binary trees T for which the number of leaf nodes L is less than or equal to a given maximum $L_m$. In FIG. 14, the relative rate increase $\rho(p, C^*(p)) = R(p, C^*(p))/H(p)$ is plotted over the LPB probability p for selected maximum table sizes $L_m$. The rate increase ρ(p) can usually be reduced by allowing larger table sizes. For larger LPB probabilities, a small table size L of 8 to 16 codewords is usually sufficient for keeping the rate increase ρ(p) reasonably small, but for smaller LPB probabilities (e.g., p<0.1), larger table sizes L are necessitated.

In the previous sections, we considered the optimal probability discretization assuming optimal codes and the code design for fixed LPB probabilities. But since, in general, we cannot achieve the entropy limit with real VNB2VLC codes of limited table sizes, the code design and the partitioning of the LPB probability interval (0, 0.5] must be jointly considered for optaining an optimized entropy coding design.

For a given interval $I_k = (p_k, p_{k+1}]$, a code $C_k$ of a given set $S_C$ in an optimal code $C_k^*$ if it minimizes the expected rate $R = \int_{p_k}^{p_{k+1}} R(p, C_k) f(p) dp$ for the given interval.

$$C_k^* = \arg\min_{\forall C_k \in S_C} \int_{p_k}^{p_{k+1}} R(p, C_k) f(p) dp \quad (B19)$$

For practical designs, the minimization of the integral in eq. B19 can be simplified, with a minor impact on the coding efficiency, by first determining an optimal representative probability $p_{I_k}$ for the interval $I_k$ according to eq. B10 and then choosing the optimal code $C_k^*$ of the given set $S_C$ for the representative probability $P_{I_k}^*$ according to eq. B18.

Optimal interval borders $p_k$, with $k=1, \ldots, K-1$ given the set of codes $C_k$, with $k=0, \ldots, K-1$, can be derived by minimizing the expected overall rate $$R = R(\{p_k\}, \{C_k\}) = \sum_{k=0}^{K-1} \left( \int_{p_k}^{p_{k+1}} R(p, C_k) f(p) dp \right) \quad (B20)$$

Setting the first derivatives with respect to the interval borders equal to zero, $$\frac{\partial}{\partial p_k} R = 0,$$

for $k=1, \ldots, K-1$, yields $$p_k^* = p_k \text{ with } R(p_k, C_{k-1}) = R(p_k, C_k) \quad (B21)$$

Similarly as for eq. B13, it can be shown that $p_k^*$ is an optimal solution, but depending on the probability distribution f(p) further optimal solutions might exist. Hence, an optimal interval border $p_k^*$ between two intervals $I_{k-1}$ and $I_k$ with given associated codes $C_{k-1}$ and $C_k$, respectively, is the intersection point of the functions $R(p, C_{k-1})$ and $R(p, C_k)$.

Consequently, the following interative algorithm can be used for jointly deriving the probability interval partitioning and the associated codes given the number K of probability intervals, the set of possible codes $S_C$, and the probability distribution f(p), with p∈(0, 0.5].

Algorithm 2:

1) Derive initial probability interval boundaries $p_k$, with k = 0,...,K, using algorithm 1 specified in sec. 3
2) Derive representatives $p_{I_k}$ for the probability intervals $I_k$, with k = 0,...,K −1, according to eq. B10
3) Derive codes $C_k \in S_C$ for the interval representatives $p_{I_k}$, with k = 0,...,K −1, according to eq. B18

Algorithm 2:

4) Update the interval borders $p_k$, with k = 1,..., K −1, according to eq. B21
5) Repeat the previous three steps until convergence The steps 2 and 3 in algorithm 2 could also be replaced by a direct derivation of the codes $C_k \in S_C$, with $k=0, \ldots, K-1$, based on the interval borders $p_k$, with $k=0, \ldots, K$, according to eq. B19. And, as mentioned in sec. 4.1, the minimization in step 3 can also proceed over a given set of binary trees $S_T$ where for each binary tree T only one VNB2VLC code $C_k$ obtained by the Huffmann algorithm is considered.

As an example, we jointly derived the partitioning into K=12 probability intervals and corresponding VNB2VLC codes using algorithm 2. At this, the minimization in step 3 of the algorithm was replaced with an equivalent minimization over a given set of binary trees $S_T$ where the evaluated code C for each tree T was obtained by the Huffmann algorithm. We considered trees T with a maximum number of $L_m$=65 leaf nodes and hence codes C with up to 65 table entries. All binary trees T with up to 16 leaf nodes have been evaluated in the minimization; for trees with more than 16 leaf nodes, we employed a suboptimal search given the best results for trees with a smaller number of leaf nodes.

Figure 15:
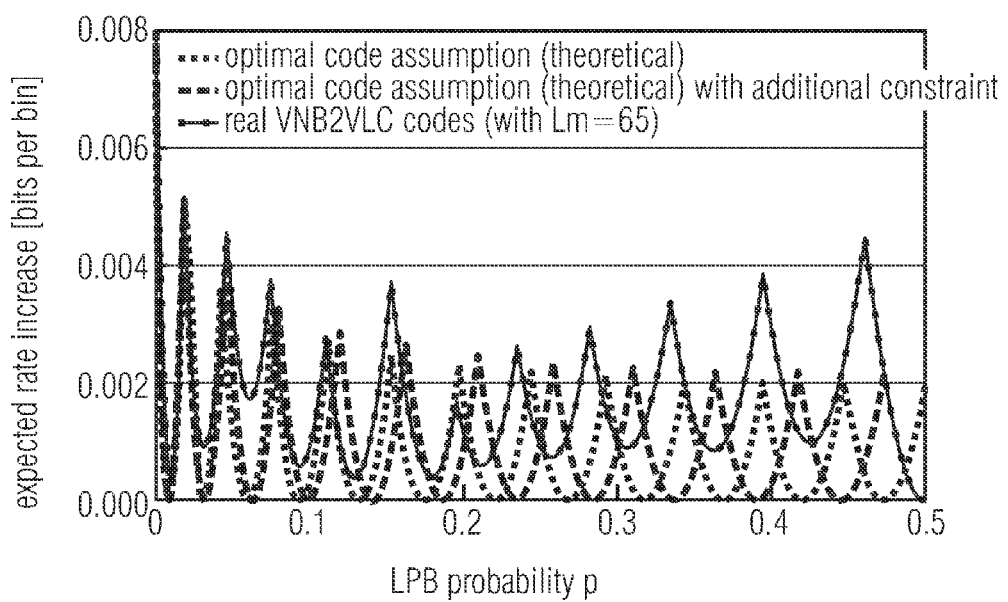
FIG. 15 shows a graph illustrating the rate increase for the theorectically optimal probability interval partitioning into K=12 intervals (cp. sec. 3) and a real design with VNB2VLC codes with a maximum number of $L_m$=65 table entries.

In FIG. 15 the expected rate increase relative to the entropy limit ΔR(p)=R(P)−H(p) for the code design example is plotted over the LPB probability p. As comparison, we also plotted the expected rate increase ΔR for the theoretically optimal probability interval discretization (as developed in sec. 3) and the theoretically optimal probability discretization with the additional constraint $p_{I_{K-1}}$=0.5 inside the diagram. It can be seen that the joint probability interval discretization and VNB2VLC code design leads to a shifting of the interval borders (the interval borders $p_k$, with $k=1, \ldots, K-1$, are given by the local maxima of the ΔR(p)curves). The relative expected overall rate increase relative to the entropy limit for the design example with real VNB2VLC codes is $\bar{\rho}$=0.24%, when assuming a uniform probability distribution f(p). The corresponding relative rate increases for the theoretically optimal probability interval discretization and the theoretically optimal probability discretization with the additional constraint $p_{I_{K-1}}$=0.5 are $\bar{\rho}$=0.12% and $\bar{\rho}$=0.13%, respectively.

Codeword termination can be done as follows. When coding a finite sequence of symbols $\{s_0, \ldots, s_{N-1}\}$, each of the K binary encoders processes a finite sequence of coding bins $_k^c = \{b_0^c, \ldots, b_{B_k-1}^c\}_k$, with $k=0, \ldots, K-1$. And it has been to be ensured that, for each of the K binary encoders, all coding bins of the sequence $_k^c = \{b_0^c, \ldots, b_{B_k-1}^c\}_k$ can be reconstructed given the codeword or sequence of codewords $_k(_k^c)$.

When employing arithmetic coding, the arithmetic codeword for the sequence of coding bins has to be terminated in a way that all coding bins can be decoded given the codeword. For the VNB2VLC codes described above, the bins at the end of the sequence $_k^c$ may not represent a bin sequence that is associated with a codeword. In such a case, any codeword that contains the remaining bin sequence as prefix can be written. The overhead can be minimized, if the corresponding codeword that has the minimum length (or one of these codewords) is chosen. At the decoder side, the additionally read bins at the end of the bin sequence, which can be identified given the bitstream syntax and binarization schemes, are discarded.

A simple code design example is presented below. For illustration purposes, we consider the simple example of a source {s} with three letters and fixed associated probabilities of $p_s(a_0)=0.7$, $p_s(a_1)=0.18$, and $p_s(a_2)=0.12$. The corresponding ternary choice tree can be converted into a full binary tree as shown in FIG. 15.

A binarization for the full binary tree in FIG. 15 is given in Tab. 5. The ternary symbol pmf $p_s$ is converted into two binary pmfs $P_{b_0}=(0.7, 0.3)$ and $p_{b_1}=(0.6, 0.4)$. For each symbol s in the bit stream, the bin $b_0$ is present. When $b_0$ is equal to 0, also $b_1$ is present. Note that the binarization given in Tab. 2 is identical to an optimal single-letter Huffman code for the source s.

TABLE 5

Binarization of a three letter source. The LPB probabilities $p_{LPB}$ are 0.3 for the first bin and 0.4 for the second bin

| Symbol $a_i$ | Probability $p(a_i)$ | Bin $b_0$ | Bin $b_1$ |
|---|---|---|---|
| $a_0$ | 0.7 | 1 | |
| $a_1$ | 0.18 | 0 | 1 |
| $a_2$ | 0.12 | 0 | 0 |
| LPB Prob. | $p_{LPB} = p(b_j = 0)$ | 0.3 | 0.4 |

The entropy for the source s is $$H(0.7, 0.18, 0.12) = H(0.7, 0.3) + 0.3H(0.6, 0.4) \quad \text{(B22)}$$
$$= 1.1726 \text{ bit/symbol}$$

The average code word length of the single-letter Huffman code is given as $$\bar{\ell}_{HC} = \sum_{i=0}^{M-1} p_i \ell_i^{HC} = 1.3 \text{ bit/symbol} \quad \text{(B23)}$$

corresponding to a redundancy of $\rho_{HC}=0.1274$ bit/symbol or 10.87% expected rate overhead.

For the particular binarization example with fixed pmfs, the bins $b_0$ and $b_1$ already represent coding bins, since for both bins the LPB value $b'_{LPB}$ is equal to 0. The distribution f(s) of the LPB probabilities is discrete, with f(p)=0 except for p=0.3 and p=0.4. Consequently, the optimal probability discretization leads to K=2 intervals with the representatives $p_{I_0}=0.3$ and $p_{I_1}=0.4$. The interval border $p_1$ between these intervals can be arbitarily chosen in [0.3, 0.4).

For encoding the source, the sequence of source symbols is binarized into a sequence of bins. The bin $b_0$ is transmitted for every source symbol. The bin $b_1$ is only transmitted when $b_0=0$. The bins $b_0$ and $b_1$ are coded separately with constant LPB probabilities of $p_{I_0}=0.3$ and $p_{I_1}=0.4$, respectively.

An efficient coding of a binary alphabet with fixed probability can be achieved by a simple VNB2VLC mapping. Examples for VNB2VLC mappings with small coding tables for the LPB probabilities $p_{LPB}=0.3$ and $p_{LPB}=0.4$ are given in Tab. 6 and Tab. 7, respectively. The VNB2VLC mapping for $p_{LPB}=0.3$ yields a redundancy of 0.0069 bit/bin or 0.788%. For the LPB probability of $p_{LPB}=0.4$, the redundancy is 0.0053 bit/bin or 0.548%.

TABLE 6

Bin tree and codes for an LPB probability of $p_{LPB} = 0.3$. The redundancy of this code is 0.788%

| Bin Tree | Probability | Codes |
|---|---|---|
| '11' | $0.7^2 = 0.49$ | '1' |
| '01' | $0.7 \cdot 0.3 = 0.21$ | '01' |
| '0' | 0.3 | '00' |

TABLE 7

Bin tree and codes for an LPB probability of $p_{LPB} = 0.4$. The redundancy of this code is 0.548%

| Bin Tree | Probability | Code Tree |
|---|---|---|
| '111' | $0.6^3 = 0.216$ | '11' |
| '110' | $0.6^2 \cdot 0.4 = 0.144$ | '001' |
| '10' | $0.6 \cdot 0.4 = 0.24$ | '11' |
| '01' | $0.4 \cdot 0.6 = 0.24$ | '01' |
| '00' | $0.4^2 = 0.16$ | '000' |

The overall expected rate incurred by the new coding method is $$\bar{\ell}_{NC} = \bar{\ell}_{b_0} + 0.3 \cdot \bar{\ell}_{b_1} = 1.181 \text{ bit/symbol} \quad \text{(B24)}$$

The overall redundancy is 0.73% relative to the entropy limit, which represents a significant improvement in comparison to the single-letter Huffman code.

It could be argued that a similar coding efficiency improvement could be obtained by creating a run-length code. For the above example, we could construct a run-length code for the most probable symbol by considering runs of up to two symbols. Each of the events $\{a_0 a_0, a_0 a_1, a_0 a_2, a_1, a_2\}$ would be associated with a separate codeword. Such a code yields a redundancy of 1.34% relative to the entropy limit. Actually, the VNB2VLC codes can be considered as a generalization of run-length codes for binary symbols (the VNB2VLC code in Tab. 3 does effectively represent a run-length code). For a single symbol alphabet with fixed probabilities, a similar coding efficiency as for the presented approach can also be achieved by creating a code that maps a variable number of source symbols to variable length codewords. The main advantage of the presented approach is its flexibility in mapping arbitrary source symbol sequences with fixed or adaptive probability estimates to a small number of simple binary coders that are operated with fixed LPB probabilities.

How to achieve a unique decidability is considered next.

With the presented entropy coding scheme, the coding of a sequence of source symbols=$\{s_0, \ldots, s_{N-1}\}$ consists of the following three basic steps:

symbol binarization=$\{b_0, \ldots, b_{B-1}\}\gamma_b(\ )$ yielding a sequence of bins=$\{b_0, \ldots, b_{B-1}\}$ conversion of the sequence of bins into a sequence of coding bins $^c=\{b_0^c, \ldots, b_{B-1}^c\}=\gamma_c(\ )$.

binary entropy coding of the sequence of coding bins $^c=\{b_0^c, \ldots, b_{B-1}^c\}$ using probability interval discretization and K fixed binary coders The symbol sequence=$\{s_0, \ldots, s_{N-1}\}$ is uniquely decodable, if the sequence of coding bins $^c=\{b_0^c, \ldots, b_{B-1}^c\}$ is uniquely decodable and the mappings $\gamma_b$ and $\gamma_c$ are invertible.

Let $\gamma_e$ notify the encoder mapping of a sequence of one or more coding bins $^c=\{b_0^c, \ldots\}$ onto a sequence of one or more codewords $(^c)=\{c_0, \ldots\}$ $$(^c)=\gamma_e(^c) \quad \text{(B25)}$$

For unique decodability of a sequence of coding bins $^c$ given the sequence of codewords ($^c$), the encoder mapping $\gamma_e$ must have the property that a unique codeword ($^c$) is assigned to each possible sequence of coding bins $^c$:

$$\forall_i{}^c,_j{}^c{}^c \neq_j{}^c \Rightarrow (_i{}^c) \neq (_j{}^c) \tag{B26}$$

This property is fulfilled when arithmetic codes or prefix codes are used. It is particularly fulfilled for the VNB2VLC codes described in sec. 4.1 (including the codeword termination described in sec. 4.3), since the VNB2VLC codes represent prefix codes for variable numbers of bins.

However, in the presented entropy coding approach, the sequence of coding bins $^c$ is partitioned into K sub-sequences $_k{}^c$, with $k = 0, \ldots, K-1$, $$\{_0{}^c, \ldots, _{K-1}{}^c\} = \gamma_p(^c) \tag{B27}$$

and to each of the sub-sequences $_k{}^c$, a sequence of codewords $_k(_k{}^c)$ is assigned using a particular encoder mapping $\gamma_e{}^k$. Consequently, the condition on unique decodability has to be extended. A sequence of coding bins $^c$ is uniquely decodable given K sequences of codewords $_k(_k{}^c)$, with $k = 0, \ldots, K-1$, if each sub-sequence of coding bins $_k{}^c$ is uniquely decodable given the corresponding codeword $_k(_k{}^c)$ and the partitioning rule $\gamma_p$ is known to the decoder. The partitioning rule $\gamma_p$ is given by the LPB probability interval discretization $\{I_k\}$ and the LPB probabilities $p^j{}_{LPB}$ that are associated with the coding bins $b_j{}^c$, with $j = 0, \ldots, B-1$. Hence, the LPB probability interval discretization $\{I_k\}$ has to be know at the decoder side and the LPB probability $p^j{}_{LPB}$ for each coding bin $b_j{}^c$, with $j = 0, \ldots, B-1$, has to derived in the same way at encoder and decoder side.

For the mapping $\gamma_c$ of a sequence of bins onto a sequence of coding bins $^c$, each single $b_j$, with $j = 0, \ldots, B-1$, is converted by the binary mapping $b_j{}^c = \gamma_c{}^j(b_j) = b_j \oplus b^j{}_{LPB}$. At the decoder side, the bin sequence can be derived by the binary mappings $$b_j = (\gamma_c{}^j)^{-1}(b_j{}^c) = b_j{}^c \oplus b^j{}_{LPB} \tag{B28}$$

with $j = 0, \ldots, B-1$. If the LPB value $b^j{}_{LPB}$ for each bin $b_j$ is derived in the same way at encoder and decoder side, these mappings $(\gamma_c{}^j)^{-1}$ represent the inverses of the corresponding encoder mappings $\gamma_c{}^j$, since $$b_j{}^c \oplus b^j{}_{LPB} = b_j \oplus b^j{}_{LPB} \oplus b^j{}_{LPB} = b_j \oplus 0 = b_j \tag{B29}$$

and hence, the conversion $\gamma_b$ of a sequence of bins into a sequence of coding bins $^c$ is invertible.

Finally, we investigate the invertibility of the binarization $= \gamma_b()$ by which each symbol $s_i$, with $i = 0, \ldots, N-1$, is mapped onto a bin sequence $^i = \gamma_b{}^i(s_i)$. A symbol $s_i$ can be uniquely decoded given the corresponding bin sequence $^i$ if the binarization mapping $\gamma_b{}^i$ assigns a different bin sequence $_m{}^j$ to each letter $a_m{}^i$ of the alphabet $A_i$ for the symbol $s_i$. However, this condition is not sufficient, since the partitioning of the bin sequence $= \{b_0, \ldots, b_{B-1}\}$ into bin sequences $^i$ that correspond to the symbols $s_i$, with $i = 0, \ldots, N-1$, is not known to the decoder. A sufficient condition is given, when for each symbol $s_i$, the bin sequences $_m{}^j$ that are associated with the letters $a_m{}^i$ of the corresponding alphabet $A_i$ form a prefix code and the binarization mappings $\gamma_b{}^i$ for each symbol $s_i$, with $i = 0, \ldots, N-1$, are known at the decoder side.

The conditions of unique decodability for the presented entropy coding approach can be summarized as follows:
- the binarization mappings $\gamma_b{}^i$ represent prefix codes and are known to the decoder (in symbol coding order)
- the probability models ($b^j{}_{LPB}$, $p^j{}_{LPB}$ for all bins $b_j$ are derived in the same way at encoder and decoder side
- the partitioning of the LPB probability interval (0, 0.5] into K intervals $I_k$, with $k = 0, \ldots, K-1$, is known to the decoder
- the mapping $\gamma_e{}^k$ for each probability interval $I_k$, with $k = 0, \ldots, K-1$, represents a uniquely decodable code In the following, we describe examples for the overall encoder and decoder design in more detail. We concentrate on coding schemes, in which the probability models $\{b_{LPB}, p_{LPB}\}$ for the bins are directly estimated at encoder and decoder side and the K binary coders use VNB2VLC mappings described in sec. 4.1. Each source symbol s shall be associated with a symbol category $c_s$, which determines the type of the symbol including its range of values. The order of symbols and associated symbol categories shall be given by the syntax, which is presumed to be known at encoder and decoder side.

Figure 17:
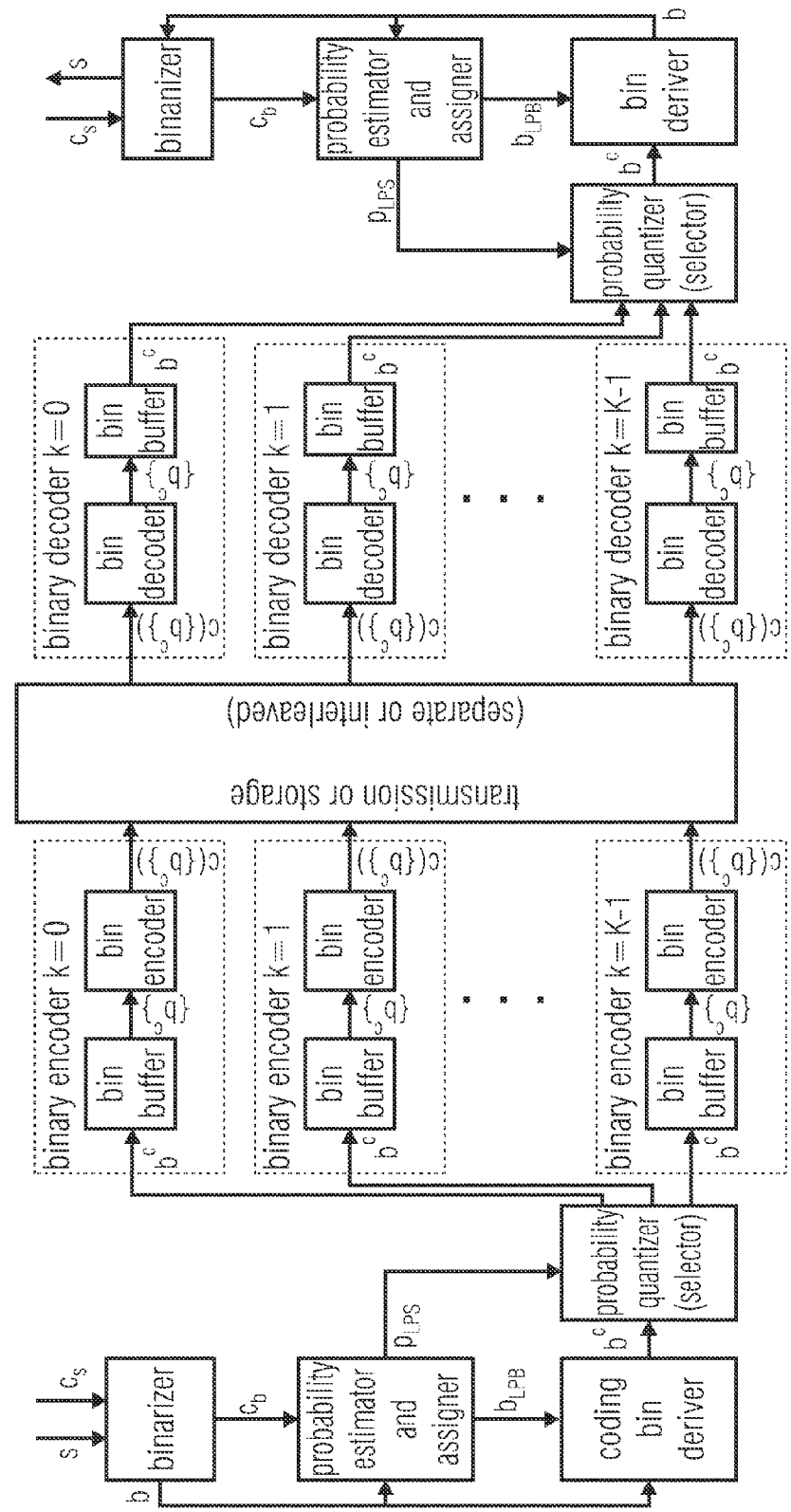
FIG. 17 shows a block diagram of a system comprising an encoder (left part) and decoder (right part) according to an embodiment.

The block diagram for an example encoder and decoder design is illustrated in FIG. 17. At the encoder side, the symbols s with associated symbol categories $c_s$ are fed into the binarizer, which converts each symbol s into a sequence of bins $_s = \gamma_b{}^{c_s}(s)$.

The used binarization scheme $\gamma_b{}^{c_s}$ is determined based on the symbol category $c_s$. In addition, the binarizer associates each bin b of a bin sequence $_s$ with a probability model indication $c_b$, which specifies the probability model that is used for coding the bin b. The probability model indication $c_b$ can be derived based on the symbol category $c_s$, the bin number of the current bin inside the bin sequence $_s$, and/or the values of already coded bins and symbols.

The probability estimator and assigner maintains multiple probability models, which are characterized by pairs of values $\{b_{LPB}, p_{LPB}\}$. It received bins b and associated probability model indications $c_b$ from the binarizer, and forwards the LPB value $b_{LPB}$ and the LPB probability $p_{LPB}$ of the indicated probability model to the coding bin deriver and the probability quantizer, respectively. Thereafter, the corresponding probability model $\{b_{LPB}, p_{LPB}\}$ is updated using the value of the received bin b.

The coding bin deriver receives bins b and associated LPB values $b_{LPB}$ from the binarizer and the probability estimator and assigner, respectively, and sends coding bins $b^c$, which are derived by $b^c = b \oplus b_{LPB}$, to the probability quantizer. The probability quantizer forwards each coding bin $b^c$ to one of the K binary encoders. It contains information about the LPB probability interval quantization $\{I_k\}$. The LPB probability $p_{LPB}$, which is associated with a coding bin $b_c$ and received from the probability estimator and assigner, is compared to the interval borders $\{p_k\}$ and probability interval index k, for which $p_{LPB} \in I_k$, is derived. Then, the coding bin $b^c$ is forwarded to the associated binary encoder.

Each of the K binary encoders consists of a bin buffer and a bin encoder. The bin buffer receives coding bins $b^c$ from the probability quantizer and stores them in coding order. The bin encoder implements a particular VNB2VLC mapping and compares the bin sequence in the bin buffer with the bin sequences that are associated with codewords. If the bin sequence in the bin buffer is equal to one of those bin sequences, the bin encoder removes the bin sequence $\{b^c\}$ from the bin buffer and writes the associated codeword ($\{b^c\}$) to the corresponding codeword stream. At the end of the encoding process for a symbol sequence, for all binary encoders for which the bin buffers are not empty, a terminating codeword is written as described in sec. 4.3.

The K resulting codeword streams can be separately transmitted, packetized, or stored, or they can be interleaved (cp. sec. 6.2) for the purpose of transmission or storage.

At the decoder side, each of the K binary decoders consisting of a bin decoder and a bin buffer receives one codeword stream. The bin decoder reads codewords ($\{b^c\}$) from the codeword stream and inserts the associated bin sequence {b$^c$}, in coding order, into the bin buffer.

The decoding of the symbol sequence is driven by the underlying syntax. Requests for a symbol s are sent together with the symbol category $c_s$ to the binarizer. The binarizer converts these symbol requests into request for bins. A request for a bin is associated with a probability model indication $c_b$, which is derived in the same way as in the encoder, and sent to the probability estimator and assigner. The probability estimator and assigner is operated similar to its counterpart at the encoder side. Based on the probability model indication $c_b$, it identifies a probability model and forwards its LPB value $b_{LPB}$ and LPB probability $p_{LPB}$ to the bin deriver and the probability quantizer, respectively.

The probability quantizer determines one of the K binary decoders based on the LPB probability $p_{LPB}$, in the same way as the binary encoder is determined at the encoder side, removes the first coding bin $b^c$, in coding order, from the corresponding bin buffer, and forwards it to the bin deriver. The bin deriver receives coding bins $b_c$ and associated LPB values $b_{LPB}$ from the probability quantizer and probability estimator and assigner, respectively, and determines the bin values $b = b^c \oplus b_{LPB}$. As final response to a bin request sent by the bin deriver, the bin deriver send the decoded bin value b to the binarizer and the probability estimator and assigner.

In the probability estimator and assigner, the value of the decoded bin b is used to update the probability model {$b_{LPB}$, $p_{LPB}$}, which was chosen by the associated value $c_b$, in the same way as at the encoder side. Finally, the binarizer adds the received bin b to the bin sequence $_s$ which has been already received for a symbol request and compares this bin sequence $_s$ with the bin sequences that are associated with symbol values by the binarization scheme $\gamma_b^{c_s}$. If the bin sequence $_s$ matches one of those bin sequences, the corresponding decoded symbol s is output as final response to the symbol request. Otherwise, the binarizer sends further bin requests until the symbol s is decoded.

The decoding of a symbol sequence is terminated if no further symbol requests, which are driven by the syntax, are received. The coding bins $b^c$ that may be contained in the bin buffers at the end of the entropy decoding process (as a result of termination codewords) are discarded.

Summarizing the above embodiments, same represent a novel approach to entropy coding. The mapping of a sequence of symbols to a bit stream and the inverse mapping are described. Each symbol carries associated parameter(s) with it that are simultaneously known at encoder and decoder. The entropy codec contains multiple first-in first-out (FIFO) buffers with each of them assigned to subsets of parameter(s) that are associated to the symbols. For given parameter(s) of a symbol, the encoder assigns the symbol to the corresponding FIFO buffer. Since the encoder assignment rule is known at the decoder side, the decoder reads from the FIFO buffer to which the encoder has assigned the symbol.

One example for a parameter assignment to a symbol is an estimate of its probability. The probability estimate may be given or derived from a measurement that can be conducted simultaneously at encoder and decoder. A particular FIFO buffer contains symbols with estimated probability values falling into a subset of probabilities that is chosen, so that the entropy coding can be improved. The improvement may relate to bit rate reduction, complexity reduction, delay reduction or error resilience.

Another example of a parameter assignment to symbols could be an estimate of the symbol probability and another parameter including one or more of the following: semantic of the symbol, its importance, its location (temporal, spatial, volumetric, etc), its channel code protection. A particular FIFO buffer contains symbols related to a subset of probabilities that is chosen, so that the entropy coding can be improved and a benefit can be achieved with regard to the other parameters.

After having described some embodiments rather generally with respect to the data compressed, embodiments are described according to which the above-mentioned coding is used for compressing video data, i.e. is employed in video and/or picture coding.

Example 1

The first embodiment is concerned with Coding Transform Coefficients in Picture and/or Video Coders and Decoders and describes a coding of transform coefficients which can particularly be employed as a novel efficient method for coding transform coefficients in the field of video coding, replacing the corresponding part of CABAC in H.264/AVC, for example.

In earlier hybrid block-based standards for video coding, such as, for example, MPEG-2, H.263 and MPEG-4, the blocks of quantized transform coefficients (levels) are mapped by a defined scan process to a vector which is coded to code words having a variable length by using a run-length coding and subsequent mapping.

In MPEG-2, the code words having a variable length are associated to two-dimensional events (RUN, LEVEL), wherein LEVEL represents the quantized value of a (significant) transform coefficient not quantized to zero; the run-length RUN indicates the number of subsequent (non-significant) transform coefficients quantized to zero, which, in the vector of transform coefficients, are immediately in front of the present significant transform coefficients. In addition, code words having a variable length are defined for the two special events EOB and ESCAPE. While the EOB event indicates that there are no further significant transform coefficients in the block, the ESCAPE event signals that the existing event (RUN, LEVEL) cannot be represented by the defined alphabet of code words having a variable length. In this case, the symbols RUN and LEVEL are coded by code words of a fixed length.

In the newer coding standards H.263 and MPEG-4, the association of code words having a variable length takes place on the basis of three-dimensional events (LAST, RUN, LEVEL), wherein the binary symbol LAST indicates whether the present significant transform coefficient is the last significant coefficient within the block or whether further significant transform coefficients follow. By using these three-dimensional events, no additional EOB event is required; an ESCAPE event is used in analogy to MPEG-2, wherein the binary symbol LAST is coded additionally to RUN and LEVEL.

The coding of the transform coefficients realized in MPEG-2, H.263 and MPEG-4 has the following disadvantages:

To each coding event only a code word having an integer length can be associated, an efficient coding of events with probabilities larger than 0.5 cannot take place.

The usage of a fixed table for mapping the coding events to the code word having a variable length for all the transform coefficients within a block does not consider symbol statistics depending on position or frequency.

Adaptation to the actually existing symbol statistics is not possible.

No usage is made of inter-symbol redundancies present.

Annex E of the H.263 standard specifies an optional non-adaptive arithmetic coding in which different predetermined model probability distributions are used, one each for the first, second and third event (LAST, RUN, LEVEL)/ESCAPE another one for all the following events (LAST, RUN, LEVEL)/ESCAPE of a block of transform coefficients, as well as one each for the symbols LAST, RUN and LEVEL, which are coded after an ESCAPE event.

For the following reasons no appreciable increase of the coding efficiency is, however, possible by this optional arithmetic coding:

The advantage of arithmetic coding that a code word having a non-integer length can be associated to a coding event hardly has any effect on the coding efficiency by using combined events of the form (LAST, RUN, LEVEL).

The advantage of using different probability distributions is eliminated by the fact that adaptation to the actually present symbol statistics is not possible.

In H.264/AVC, a context-adaptive method on the basis of code words having a variable length for coding transform coefficients is specified as the standard method for entropy coding. Here, the coding of a block of transform coefficients is determined by the following characteristics:

Both the number of the significant coefficients within a block and the number of subsequent coefficients quantized to one at the end of the vector of transform coefficients are determined by a symbol COEFF_TOKEN. Depending on the block type and the symbols COEFF_TOKEN already coded/decoded for neighboring blocks, one of five defined code word tables is chosen for coding.

While for the transform coefficients quantized to one at the end of the coefficient vector only a single bit is transferred for specifying the sign, the coding of the values (levels) of the remaining significant transform coefficients takes place in a reverse scan order by means of a combined prefix suffix code word.

If the number of significant transform coefficients is smaller than the number of transform coefficients for the corresponding block, a symbol TOTAL_ZEROS will be coded, which indicates the number of transform coefficients quantized to zero which, in the coefficient vector, are in front of the last significant coefficient. For this, 18 code word tables have been specified, which are switched depending on the number of significant coefficients and the block type.

The run-length of the (non-significant) coefficients quantized to zero (RUN) in front of a significant coefficient is coded for each significant transform coefficient in a reverse scan order as long as the sum of RUNs already coded is smaller than TOTAL_ZEROS. Depending on TOTAL_ZEROS and the RUNs already coded/decoded, switching between seven code word tables takes place.

Although this so-called CAVLC method (CAVLC: context-adaptive variable length coding), by context based switching the code word tables, allows a considerably more efficient coding of the transform coefficients than the methods specified in MPEG-2, H.263 and MPEG-4, it basically has the following disadvantages:

Switching between different code word tables takes place depending on symbols already coded/decoded, the code word tables, however, cannot be adjusted to the actual symbol statistics.

By using code words having a variable length, events having symbol probabilities larger than 0.5 cannot be coded efficiently. This limitation especially prevents coding symbols having a smaller value range, by means of which a construction of suitable contexts might be possible for switching between different model probability distributions.

A possible solution for avoiding the disadvantages illustrated of well-known methods for coding transform coefficients in block-based picture and video coders is a combination of an adaptive entropy coding and a suitable context generation for using the inter-symbol redundancies.

Compared to the above-mentioned coding schemes, the application example described next represents scheme for coding transform coefficients in picture and/or video coders and decoders, which eliminates the deficiencies mentioned above and, in particular, keep the amount of calculating necessitated for coding small. By combining this coding with the entropy coding schemes described in the embodiments with respect to FIGS. 1 to 17, a very effective coding efficiency results.

In accordance with a first aspect, the coding scheme described below provides a method for coding transform coefficients in picture and/or video coders and decoders, wherein for blocks of (video) pictures containing significant transform coefficients, the coding of transform coefficients takes place in such a way that, for each block, in a scan process, the positions of significant transform coefficients in the block and subsequently, in a reverse scan order—starting with the last significant transform coefficients within the block—the values (levels) of the significant transform coefficients are determined and coded.

One embodiment is characterized by each significant transform coefficient of the block other than the last transform coefficient of the block being characterized by a one-bit symbol.

It is also of advantage if the sign for each significant transform coefficient is indicated by a one-bit symbol (SIGN) and the magnitude is indicated by a binary coded symbol (ABS).

In one embodiment, blocks containing significant transform coefficients are characterized by a one-bit symbol CBP4 in connection with other syntax elements, such as, for example, CBP or macro block mode.

It is a special advantage of the method that, by transferring a one-bit symbol SIG for each coefficient of a block and of a one-bit symbol LAST for each significant coefficient of a block, a significance mapping is coded, wherein the transfer takes place in the scan order, SIG serves for identifying significant coefficients and LAST indicates whether there are further significant transform coefficients in the block.

In another embodiment, modeling for the one-bit symbol CBP4, for coding the significance mapping and/or for coding the coefficient magnitudes takes place in a context-dependent way. Thus, block types of transform coefficients having comparable statistics are summarized to block categories.

It is also of advantage that, in a special embodiment of the inventive method, no significance information (SIG, LAST) is transferred for the last scan position of a block.

In an embodiment, the magnitude (ABS) is indicated by a symbol in unary binarization or by a symbol having a prefix part and a suffix part, wherein the prefix part consists of ones and the suffix part is coded in a 0th order exp-golomb code.

In accordance with a second aspect, the current embodiment provides an arrangement having at least one processor and/or chip formed such that method for coding transform coefficients in picture and/or video coders and decoders can be performed, wherein for blocks of (video) pictures containing significant transform coefficients, the coding of transform coefficients takes place in the just-mentioned way.

In accordance with a third aspect, the current application example provides a computer program enabling a computer, after having been loaded into the memory of the computer, to perform a method for coding transform coefficients in picture and/or video coders and decoders, wherein for blocks of (video) pictures containing significant transform coefficients, the coding of transform coefficients takes place in the way described above.

Such computer programs can, for example, (for a fee or free of charge, freely accessible or protected by a password) be provided in a data or communication network for downloading. The computer programs provided in this way can then be utilized by a method in which a computer program according to claim 11 is downloaded from a network for transfer, such as, for example, from the Internet, to data processing means connected to the network.

In accordance with a fourth aspect, the current embodiment provides a computer-readable storage medium on which a program is stored, enabling a computer, after having been loaded into the memory of the computer, to perform a method for coding transform coefficients in picture and/or video coders and decoders, wherein for blocks of (video) pictures containing significant transform coefficients, the coding of transform coefficients takes place in the described way.

The method for coding transform coefficients is especially characterized by the following characteristics:

- A two-dimensional block of transform coefficients is mapped to a one-dimensional vector by a scan process.
- The syntax elements of the EOB symbol, the LAST symbol or the coefficient counter (number of significant coefficients) as well as RUN (number of non-significant coefficients in the scan order) used in well-known methods are replaced by a one-bit symbol CBP4 and a significance mapping.
- The levels (magnitudes of the significant coefficients) are coded in a reverse scan order.
- Context modeling takes place in a novel manner.

Figure 18:
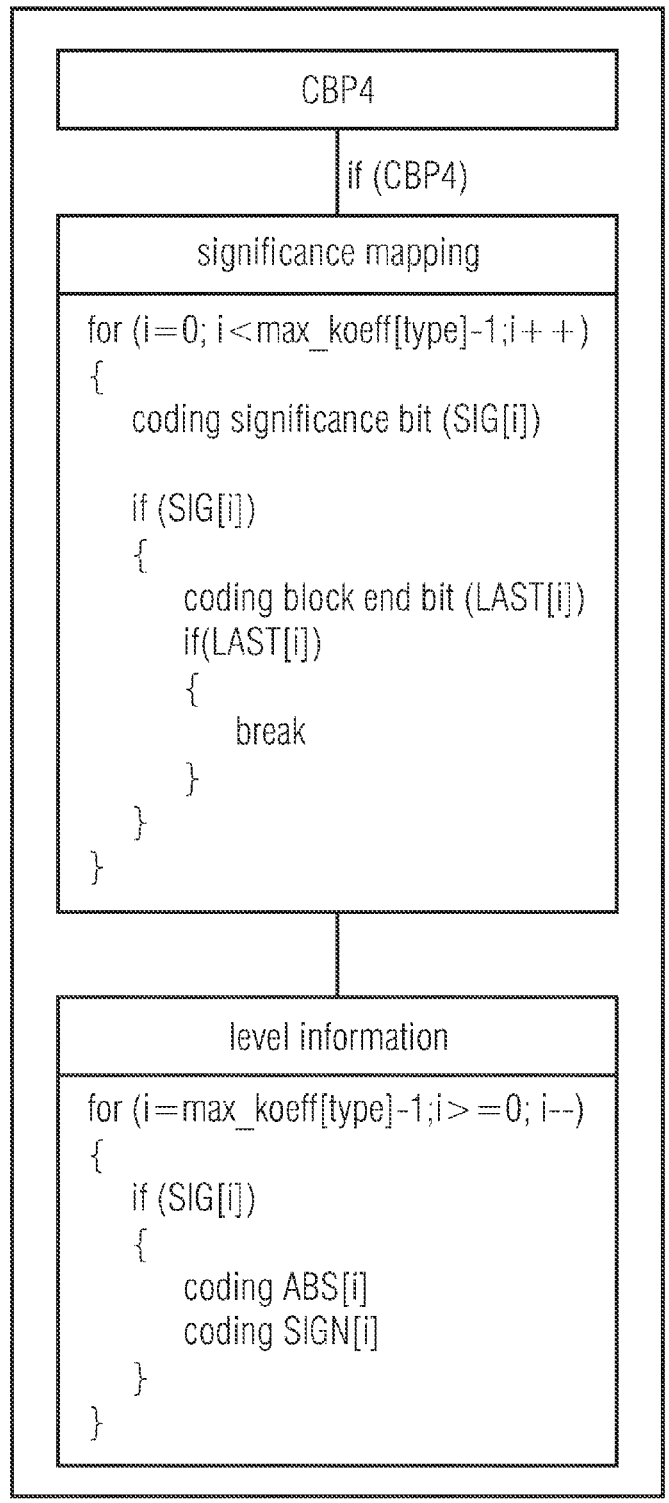
FIG. 18 is an illustration of the basic principle of coding transform coefficients according to an embodiment using the entropy coding according to any of the embodiments of FIG. 1 to 17.

FIG. 18 illustrates the coding method. For each block of transform coefficients, a one-bit symbol CBP4 is transferred at first, unless higher order syntax elements (CBP or macro block mode) already indicate that the block considered does not contain any significant transform coefficients. The CBP4 symbol will be zero if there are no significant coefficients in the block. If it is one, a significance mapping specifying the position (in scan order) of the significant transform coefficients will be coded. Subsequently, the magnitude and the signs of the significant coefficients are transferred in a reverse scan order. A detailed description of the coding process will be given below in 1. Afterwards, context modeling for the binary entropy coding will be described in 2, with the entropy coding of the bins being performed with any of the above-outlined embodiments for entropy coding.

1. Description of the Coding of the Transform Coefficients
1.1 Scanning Transform Coefficients The transform coefficients of each block are mapped to a vector by means of a scan process (such as, for example, a zig zag scan).

1.2 CBP4 Symbol

CBP4 is a one-bit symbol indicating whether there are significant transform coefficients (transform coefficients unequal to zero) in a block. If the CBP4 symbol is zero, no further information for the corresponding block will be transferred.

1.3 Significance Mapping

If the CBP4 symbol indicates that the corresponding block contains significant coefficients, a significance mapping will be coded. This takes place by transferring a one-bit symbol (SIG) for each coefficient in the scan order. If a corresponding significance symbol is one (significant coefficient), another one-bit symbol (LAST) will be transferred. This symbol indicates whether the present significant coefficient is the last significant coefficient within a block or whether further significant coefficients follow. FIG. 19 shows two examples of the method described for coding the significance mapping. Significance information (SIG, LAST) will never be transferred for the last scan position of a block. If the transfer of the significance mapping has not already been terminated by a LAST symbol of one, it is obvious that the coefficient at the last scan position is significant (see yellow marked position in FIG. 19).

1.4 Level Information

The positions of the significant transform coefficients within a block are clearly specified by the significance mapping. The coding of the precise values of the coefficients (levels) takes place by two coding symbols: ABS (magnitude of the coefficients) and SIGN (sign of the coefficients). While SIGN represents a one-bit symbol, binarization according to FIG. 20 is used for coding the magnitudes of the coefficients (ABS). For coefficient magnitudes in the interval [1; 14], this binarization corresponds to a unary binarization. The binarization for coefficient magnitudes larger than 14 consists of a prefix part consisting of 14 ones and a suffix part representing a 0th order exp-golomb code for the symbol (ABS-15). Binarization does not include a representation for coefficient magnitudes (ABS) equaling 0, since significant coefficients (coefficients unequal to zero) will have a magnitude (ABS) larger than or equal to one.

The binarization formed of a prefix part and a suffix part consisting of a 0th order exp-golomb code for coefficient magnitudes larger than 14 has the advantage that a special non-adaptive context with symbol probabilities 0.5 can be used without sacrificing in coding efficiency for all the binary decisions of the suffix part, whereby the amount of calculating for encoding and decoding can be reduced.

The levels are coded in a reverse scan order—beginning with the last significant coefficient within the block; this enables forming suitable contexts for the binary entropycoding.

2. Context Modeling

The above coding of the significance map and the value binarizations results in a sequence of symbols which is de/encoded by any of the above embodiments wherein the assigner assigns the parameter for partial bitstream selection based on the probabilities associated with the contexts which, in turn, are determined as outlined below.

In general, different types of transform coefficient blocks are differentiated when considering a picture and/or video coding system. Thus, there are, for example, twelve types of transform coefficient blocks, having different statistics (the left column of table in FIG. 21) in the present Final Draft International Standard of the H.264/AVC standard. For most picture sequences and coding conditions, some of the statistics are, however, very similar. In order to keep the number of contexts used small and thus to ensure a quick adaptation to the statistic of the picture sequence to be coded, the block types, in the H.264/AVC standard, can, for example, be classified into five categories (see right column of table in FIG. 21). Similar classifications are possible for other picture and/ or video coding systems. For each of the—in the case of the H.264/AVC standard—five categories, an individual quantity of contexts is used for the symbols CBP4, SIG, LAST and ABS.

2.1 Context Modeling for the CBP4 Symbol

For coding the one-bit symbol CBP4, four different contexts are used for each individual category of transform blocks (see FIG. 21). The context number for block C to be coded is determined by $$ctx\_number\_cbp4(C)=CBP4(A)+2\times CBP4(B)$$

wherein those neighboring blocks (left and top) of block C considered to be associated to the same block type are designated by A and B. Regarding the H.264/AVC standard, the following 6 block types are differentiated for this conditioning: Luma-DC, Luma-AC, Chroma-U-DC, Chroma-U-AC, Chroma-V-DC and Chroma-V-AC. If the concerning block X (A or B) of transform coefficients does not exist in a neighboring macro block (this is, for example, the case if the present block is coded in the INTRA16×16 mode, but the neighboring block has been transferred in an INTER mode), CBP4 (X) is set to zero for the neighboring block X. If a neighboring block X (A or B) is outside the picture area or belongs to another slice, the corresponding value CBP4 (X) is replaced by a default value. A default value of one is used for INTRA-coded blocks and a default value of zero is used for INTER-coded blocks.

2.2 Context Modeling for Coding the Significance Mapping

For coding the significance mapping, max_koeff-1 different contexts are each used per block category (see FIG. 21) for coding the symbols SIG and LAST. max_koeff thus designates the number of transform coefficients for the corresponding block category (for H.264/AVC, see FIG. 21). The context number is indicated by the corresponding scan position of the coefficient considered. The context numbers of a coefficient koeff[i], which has been scanned as an i-th coefficient, thus result in:

$$ctx\_number\_sig(koeff[i])=ctx\_number\_last(koeff[i])=i.$$

2*max_koeff-2 contexts are used for each category of block types for coding the significance mapping.

2.3 Context Modeling for Coding Coefficient Magnitudes

The binarization illustrated in FIG. 20 is used for coding the magnitudes of the significant transform coefficients. Two different context quantities are used per block category, namely one for coding the first binary decision bin=1 (marked orange in FIG. 20) and another one for coding the binary decisions bin=2.14 (marked green in FIG. 20) of the binarization.

The context numbers are thus associated as follows:

$$ctx\_number\_abs\_1bin=(koeff \text{ with } ABS>1 \text{ coded}?4: \max(3,\text{number of coded coefficients with } ABS=1)),$$

$$ctx\_number\_abs\_rbins=\max(4,\text{number of coded coefficients with } ABS>1)).$$

The magnitudes of the transform coefficients are transferred in a reverse scan order. The context for the first binary decision is determined by the number of coefficients already transferred (in reverse scan order) having a magnitude of ABS=1. If more than three coefficients with a magnitude ABS=1 have already been transferred, context number 3 will be chosen. As soon as a coefficient having a magnitude ABS>1 has been transferred, context 4 will be used for all the remaining significant coefficients within the block.

Figures 22, 23:
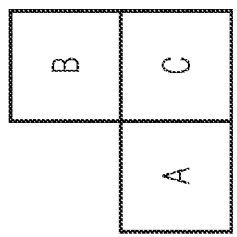
FIG. 22 shows context modeling for the one-bit symbol CBP4.
FIG. 23 shows examples of the context modeling for coding the magnitudes of the significant transform coefficients.

All binary decisions with bin=2.14 are coded using one and the same context. Thus, the context number is determined by the number of coefficients already coded (in a reverse scan order) having a magnitude of ABS>1, wherein the maximum context number is limited to 4. For illustration, two examples for the context selection, when coding the magnitudes ABS of the significant transform coefficients, are illustrated in FIG. 23. For coding the binary decision bin>14 for the coefficient magnitudes and for the signs SIGN, an individual non-adaptive context with the symbol probabilities $P_0=P_1=0.5$ is used.

Thus, the application embodiment described with respect to FIGS. 18 to 23 related to coding transform coefficients in picture and/or video coders and decoders wherein for blocks of (video) pictures containing significant transform coefficients, the coding of transform coefficients takes place in such a way that, for each block, in a scan process, the positions of significant transform coefficients in the block and subsequently, in a reverse scan order—starting with the last significant transform coefficients within the block—the values (levels) of the significant transform coefficients are determined and coded. Each significant transform coefficient of the block other than the last transform coefficient of the block may be characterized by a one-bit symbol. Further, for each significant transform coefficient, the sign may be indicated by a one-bit symbol (SIGN) and the magnitude is indicated by a binary-coded symbol (ABS). The magnitude may be indicated by a symbol (ABS) in unary binarization or by a symbol (ABS) having a prefix part and a suffix part, wherein the prefix part consists of ones and the suffix part is coded in a 0th order exp-golomb code. Blocks containing significant transform coefficients may be characterized by a one-bit symbol CBP4 in connection with further syntax elements, such as, for example, CBP or macro block mode. Further, by transferring a one-bit symbol (SIG) for each coefficient of a block and a one-bit symbol (LAST) for each significant coefficient of a block, a significance mapping may be coded, wherein the transfer takes place in a scan order, (SIG) serves for identifying significant coefficients and (LAST) indicates whether there are further significant transform coefficients in the block. Modeling, for the one-bit symbol CBP4, for coding the significance mapping and/or for coding the coefficient magnitudes may take place in a context-dependent way. No significance information (SIG, LAST) might be transferred for the last scan position of a block. Block types of transform coefficients having comparable statistics may be summarized to block categories.

Differently stated, the coding of transform coefficient levels may be split into three steps. In the first step, a binary syntax element coded_block_flag is transmitted for each transform block, which signals whether the transform block contains significant transform coefficient levels (i.e., transform coefficients that are non-zero). If this syntax element indicates that significant transform coefficient levels are present, a binary-valued significance map is coded, which specifies which of the transform coefficient levels have non-zero values. And then, in a reverse scan order, the values of the non-zero transform coefficient levels are coded. The significance map is coded as follows. For each coefficient in the scan order, a binary syntax element significant_coeff_flag is coded, which specifies whether the corresponding transform coefficient level is not equal to zero. If the significant_coeff_flag bin is equal to one, i.e., if a non-zero transform coefficient level exists at this scanning position, a further binary syntax element last_significant_coeff_flag is coded. This bin indicates if the current significant transform coefficient level is the last significant transform coefficient level inside the block or if further significant transform coefficient levels follow in scanning order. If last_significant_coeff_flag indicates that no further significant transform coefficients follow, no further syntax elements are coded for specifying the significance map for the block. In the next step, the values of the significant transform coefficient levels are coded, whose locations inside the block are already determined by the significance map. The values of significant transform coefficient levels are coded in reverse scanning order by using the following three syntax elements. The binary syntax element coeff_abs_greater_one indicates if the absolute value of the significant transform coefficient level is greater than one. If the binary syntax element coeff_abs_greater_one indicates that the absolute value is greater than one, a further syntax element coeff_abs_level_minus_one is sent, which specifies the absolute value of the transform coefficient level minus one. Finally, the binary syntax element coeff_sign_flag, which specifies the sign of the transform coefficient value, is coded for each significant transform coefficient level. It should be noted again that the syntax elements that are related to the significance map are coded in scanning order, whereas the syntax elements that are related to the actual values of the transform coefficients levels are coded in reverse scanning order allowing the usage of more suitable context models.

In the CABAC entropy coding in H.264, all syntax elements for the transform coefficient levels are coded using a binary probability modelling. The non-binary syntax element coeff_abs_level_minus_one is first binarized, i.e., it is mapped onto a sequence of binary decisions (bins), and these bins are sequentially coded. The binary syntax elements significant_coeff_flag, last_significant_coeff_flag, coeff_abs_greater_one, and coeff_sign_flag are directly coded. Each coded bin (including the binary syntax elements) is associated with a context. A context represents a probability model for a class of coded bins. A measure related to the probability for one of the two possible bin values is estimated for each context based on the values of the bins that have been already coded with the corresponding context. For several bins related to the transform coding, the context that is used for coding is selected based on already transmitted syntax elements or based on the position inside a block.

The significance map specifies information about the significance (transform coefficient level is different from zero) for the scan positions. In the CABAC entropy coding of H.264, for a block size of 4×4, a separate context is used for each scan position for coding the binary syntax elements significant_coeff_flag and the last_significant_coeff_flag, where different contexts are used for the significant_coeff_flag and the last_significant_coeff_flag of a scan position. For 8×8 blocks, the same context model is used for four successive scan positions, resulting in 16 context models for the significant_coeff_flag and additional 16 context models for the last_significant_coeff_flag.

After coding the significance map, the block is processed in reverse scan order. If a scan position is significant, i.e., the coefficient is different from zero, the binary syntax element coeff_abs_greater_one is transmitted. Initially, the second context model of the corresponding context model set is selected for the coeff_abs_greater_one syntax element. If the coded value of any coeff_abs_greater_one syntax element inside the block is equal to one (i.e., the absolute coefficient is greater than 2), the context modelling switches back to the first context model of the set and uses this context model up to the end of the block. Otherwise (all coded values of coeff_abs_greater_one inside the block are zero and the corresponding absolute coefficient levels are equal to one), the context model is chosen depending on the number of the coeff_abs_greater_one syntax elements equal to zero that have already been coded/decoded in the reverse scan of the considered block. The context model selection for the syntax element coeff_abs_greater_one can be summarized by the following equation, where the current context model index $C_{t+1}$, is selected based on the previous context model index $C_t$ and the value of the previously coded syntax element coeff_abs_greater_one, which is represented by bin in the equation. For the first syntax element coeff_abs_greater_one inside a block, the context model index is set equal to $C_t=1$.

$$C_{t+1}(C_t, bin_t) = \begin{cases} 0, & \text{for } bin_t = 1 \\ \min(C_t + 1, 4) & \text{for } bin_t = 0 \end{cases}$$

The second syntax element for coding the absolute transform coefficient levels, coeff_abs_level_minus_one is only coded, when the coeff_abs_greater_one syntax element for the same scan position is equal to one. The non-binary syntax element coeff_abs_level_minus_one is binarized into a sequence of bins and for the first bin of this binarization; a context model index is selected as described in the following. The remaining bins of the binarization are coded with fixed contexts. The context for the first bin of the binarization is selected as follows. For the first coeff_abs_level_minus_one syntax element, the first context model of the set of context models for the first bin of the coeff_abs_level_minus_one syntax element is selected, the corresponding context model index is set equal to $C_t=0$. For each further first bin of the coeff_abs_level_minus_one syntax element, the context modelling switches to the next context model in the set, where the number of context models in set is limited to 5. The context model selection can be expressed by the following formula, where the current context model index $C_{t+1}$ is selected based on the previous context model index $C_t$. As mentioned above, for the first syntax element coeff_abs_level_minus_one inside a block, the context model index is set equal to $C_t=0$. Note, that different sets of context models are used for the syntax elements coeff_abs_greater_one and coeff_abs_level_minus_one.

$$C_{t+1}(C_t) = \min(C_t+1, 4)$$

When combining the just-described application embodiment with the entropy coding embodiments described earlier, the probability assigned to the individual contexts would, for example, be used as, or at least one of the parameters used for selecting the entropy encoder (entropy decoder among the plurality of partial bitstream paths, such as, described above, after having quantized the probability to a smaller set of probability partial bitstreams. In other words, the reconstruct of the sequence of symbols sequentially defining the significance mapping and the subsequent coding of the values of transform coefficients being unequal to zero in reverse scan order may be performed using a decoder according to any of the previously described embodiments.

Example 2

According to example 2 for an application of the above-outlined entropy coding embodiments, an improved entropy encoding design with higher compression efficiency may be achieved.

An apparatus for entropy-encoding a symbol sequence of information symbols to obtain entropy-encoded information symbols, the symbol sequence having a start symbol, comprises: an entropy encoder for entropy encoding a symbol of the symbol sequence based on probability information for the symbol, the symbol being part of a symbol set, to produce the entropy-encoded information symbols; a context modeler for deriving the probability information for the symbol based on a context of the symbol, the context including one or more context symbols processed by the entropy encoder prior to processing the symbol, the context modeler including an initializer for initializing the context modeler by determining and providing initialization probability information to the entropy encoder, the initialization probability information to be used by the entropy encoder for processing the start symbol, wherein the initializer is operative to determine the initialization probability information based on an estimation of symbol statistics relating to the start symbol such that an initialization probability distribution is different from an equi-probable distribution for all symbols of the symbol set. The entropy encoder may be embodied in accordance with any of the above-mentioned embodiments.

A decoder for entropy decoding entropy-encoded information symbols, the entropy-encoded information symbols being produced by entropyally encoding a symbol of the symbol sequence based on probability information for the symbol, the symbol being part of a symbol set, wherein the probability information for the symbol is derived based on a context of the symbol, the context including one or more context symbols processed earlier, and wherein, for entropyally encoding the start symbol, an initialization probability information was used, the initialization probability information being based on an estimation of a symbol statistics relating to a start symbol and being determined such that an initialization probability distribution is different from an equi-probable distribution for all symbols of the symbol set, comprises: an entropy decoder for entropy decoding the entropy-encoded information symbols to obtain the symbol sequence of information symbols having the start symbol; and a context modeler for obtaining the probability information used when entropy encoding the sequence of information symbols, context modeler including an initializer for obtaining the initialization probability information used when entropy encoding the start symbol. The entropy decoder may be embodied in accordance with any of the above-mentioned embodiments.

An improved compression efficiency can be obtained by initializing the context modeler so that the initialization probability information is different from an equi-probable distribution for all symbols of the symbol set in question. Particularly, the initializer is operative to determine the initialization probability information to be used at least for the start symbol of the symbol sequence based on an estimation of a symbol statistics relating to the start symbol so that the initialization probability information is different from an equi-probable distribution for all symbols of the symbol set.

In particular, this "intelligent" initialization is advantageous for coding of video material with widely varying content from different video sources. It has been found out that, in an embodiment of the present invention, the initializing probability information can be derived based on the quantization parameter used for quantizing the to be encoded information. In video coding applications, and, in particular, in video encoding applications in connection with the H.264/AVC video compression standard, the symbol sequence of information symbols to be entropy-encoded is derived from transformed residual values, which are obtained by a time/spatial inter/intra frame prediction mode for example.

Additionally, the intelligent initialization can advantageously be based on prior knowledge on the video source material. In particular, it has been found out that the compression efficiency can be enhanced by defining several sets of initialization values. For so-called I- or SI-slices, for example, a single set of initialization values is sufficient. For temporally predictive-coded slices such as the so-called P-, SP- or B-slices, more than one and, advantageously, three different sets of initialization values may be defined. For these slices, the selected set of initialization values is to be specified by a certain syntax element in the encoder output bit stream so that a decoder processing an encoded output bit stream is able to correctly initialize itself. Advantageously, this syntax element is transmitted as part of the slice header. Now, the encoder has the freedom to select the set of initialization values that is the most suitable one for the symbol statistics for each slice.

Advantageously, the initialization values are further diversified by detecting, to which data type or sub-data type, the symbol sequence to be processed by the entropy encoder belongs to. This certain type is indicated by a context index variable. This context index variable may be designed so that it can signal one out of up to 399 different context models from which a corresponding number of initialization probability information can be derived so that an optimally adapted initialization for a large number of different symbol sequences, each of which having a start symbol, can be determined.

It has to be noted, that the symbols to be entropy coded have attributed thereto different context models. Advantageously, several symbols or bits are to be encoded using one context model out of the plurality of context models. These several symbols or bits form the symbol sequence, wherein the first to be encoded symbol of the symbol sequence, the symbol sequence having attributed thereto a context model, is the start symbol. A context model can include one or even more than one probability models. In case of a context model having more than one probability models, for each change of probability models, a new initialization will take place.

Figure 24:
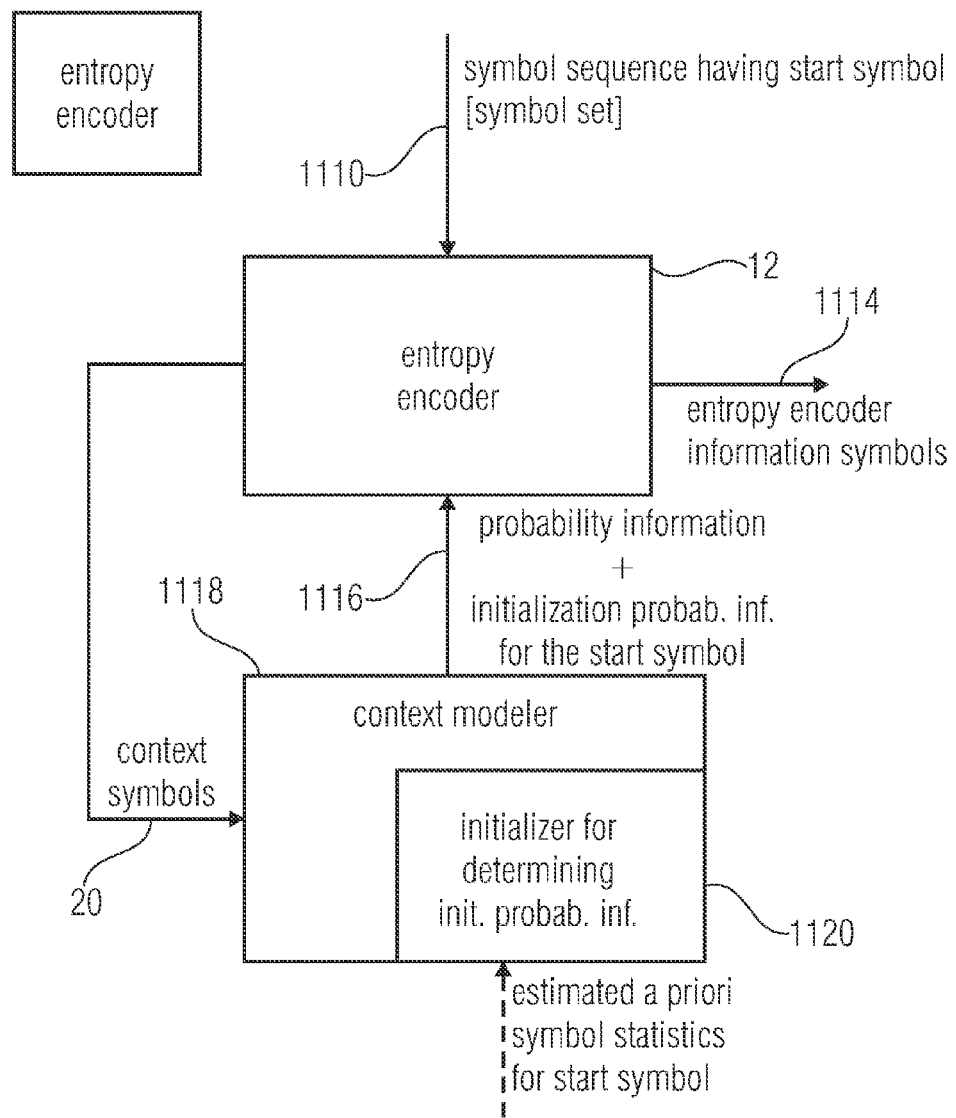
FIG. 24 shows a block diagram of an entropy encoder arrangement according to an application example.

In the following, reference is made to FIG. 24 for illustrating the structure and functionality of an entropy-encoding apparatus or an entropy-encoding method. In particular, FIG. 24 shows an apparatus for entropy-encoding symbol sequences of information symbols to obtain entropy-encoded information symbols, wherein the symbol sequence has a start symbol. The symbol sequence is input into a symbol sequence input of an entropy encoder 1112. The entropy-encoded information symbols are output at an entropy-encoder output 1114, which is also connected to the entropy encoder 1112. The entropy encoder is operative for entropy encoding a symbol of the symbol sequence based on probability information for the symbol. The probability information is input into the entropy encoder 1112 via a probability information input 16. Since the symbol is part of a specified symbol set, which, in the binary case, only includes two different symbols, i.e., a binary "0" and the binary "1", it is sufficient to provide probability information only for one symbol of the symbol set. In accordance with the present invention, it is of advantage to provide the probability information of the least probable symbol (LPS), since this number is naturally smaller than the probability for the most probable symbol. Additionally, the probability information provided to the entropy encoder via the probability information input 1116 includes the value of the most probable symbol, from which the value of the least probable symbol and vice versa can be easily derived.

The encoder further includes the context modeler 1118 for deriving the probability information for the symbol based on a context of the symbol, the context including one or more context symbols input into the context modeler by a context input 1120, which have been processed by the entropy encoder 1112 prior to processing the actual symbol.

The context modeler 1118 includes an initializer 1120 for initializing the context modeler by determining and providing initialization probability information to the entropy encoder 1112, when the initialization probability information is to be used by the entropy encoder 1112 for processing the start symbol, i.e., the symbol of the symbol sequence, for which no context symbols exist, i.e. symbols which have been processed by the entropy encoder 1112 prior to the start symbol. This means that, since the entropy encoding scheme is a serial scheme, the start symbol is the first symbol of the symbol sequence.

The initializer is operative to determine the initialization probability information based on an estimation of symbol statistics relating to the start symbol such that the initialization probability is different from an equi-probable distribution for all symbols of the symbol set, to which the start symbol belongs to.

Since the context modeler, and, therefore, the entropy encoder is initialized in an intelligent way based on an estimation of the symbol statistics that are expected for the symbol sequence to be encoded by the entropy encoder, the entropy-encoding apparatus shows an improved start-up performance. Stated in other words, the entropy-encoding apparatus behaves, for the start symbol, as if the start symbol is not the first symbol of a sequence but is an intermediate symbol of a sequence. Therefore, the initialization results in a pre-adaptation of the entropy-encoding apparatus already for the start symbol. Contrary to the straightforward approach, in which the initialization probability information is set to an equi-probable distribution, the entropy encoder is immediately context-pre-adapted. In the straightforward case, the context-adaptation would need several steps corresponding to the number of prior encoded symbols forming the context symbols.

It has been found out that the inventive initialization of the context modeler and the entropy encoder results, without any further actions, in bit-rate savings of up to 3% simply by providing an intelligent initialization probability information compared to a straightforward equi-probable distribution.

Figure 25:
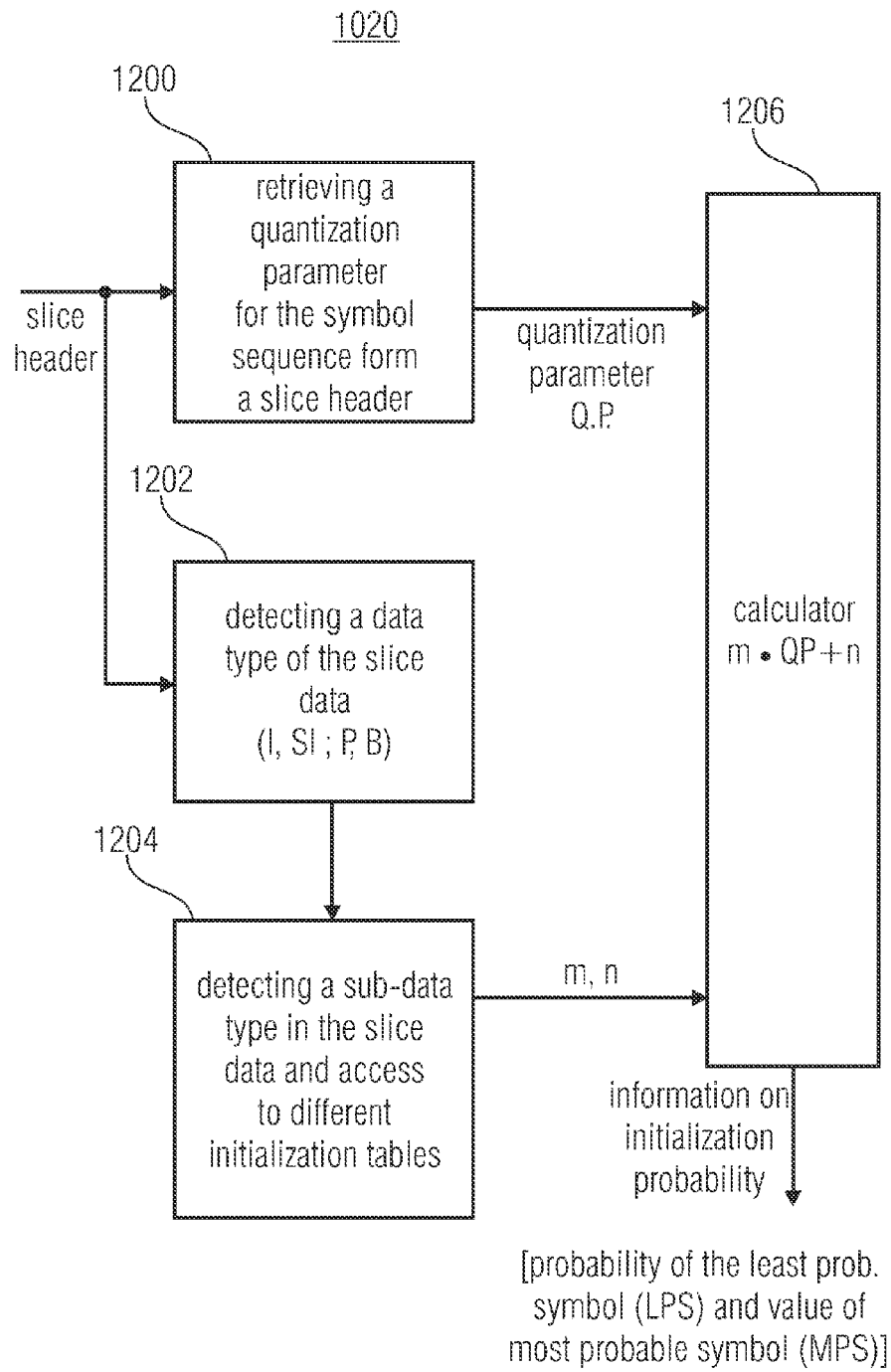
FIG. 25 shows a detailed diagram of the initializer from FIG. 24.

FIG. 25 shows an embodiment of the initializer 1020 from FIG. 24. The initializer 1120 includes a retriever for retrieving a quantization parameter for the symbol sequence from a slice header. Additionally, the slice header is also input into a detector for detecting a data type of the slice data. Additionally, a detector 1204 for detecting a sub-data type in the slice data is provided. The detector 1204 is further operative to access different initialization tables based on the detected sub-data type. As it will be described later on, the access to different initialization tables is controlled by means of a context index on the one hand and, advantageously, by means of an initialization index on the other hand. Depending on the slice data, there only exists one initialization table with certain context indices for I- and SI-slices. For P- and B-slices, there exist at least two and advantageously three initialization tables which are, once again, addressed by the context index, wherein the table of the at least two tables which is actually used is addressed by the initialization index.

Connected to the retriever 1200 on the one hand and the detector 1204 on the other hand, is a calculator 1206, which is operative to calculate the information on the initialization probability which can be the actual initialization probability or, in accordance with the embodiment, a probability state index, i.e., a reference to an initialization probability information table including probability information for the least probable symbol. It has been found out by the inventors that a linear dependence of the initialization probability from the quantization parameter used for quantizing the slice data results in an improved compression efficiency, i.e., in an near to optimum initialization. Therefore, the calculator 1206 in FIG. 25 is operative to apply a linear calculation, wherein the parameter m indicates a gradient of the linear dependence, while the other initialization parameter, i.e., n indicates a y-axis offset. The basic equation processed by the calculator 1206 in FIG. 25 is indicated in block 206 as $$m \times QP + n,$$

wherein QP is the quantization parameter while m and n are the initialization parameters taken out from different initialization tables addressed by a certain context index.

In an embodiment, the calculator 1206 in FIG. 25 performs the sequence of steps as indicated in FIG. 26. In a first step, the equation m×sliceQP+n is calculated. It is to be noted here that in the embodiment of FIG. 26, the value F of m×sliceQP is shifted to the right by four digits. It is to be noted here that, naturally, all values are binary strings. The shift by four digits relates to a representation of the product m×sliceQP in a two-complementary presentation. Then, the result after the shift is added to the other initialization parameter n. Then, the minimum of this result on one hand and the integer value 1126 on the other hand is selected. In case this minimum is larger than 1, this minimum is selected and assigned to the auxiliary variable preCtxState. Then, a determination is made, if this auxiliary variable is lower than or equal to 63. In case this determination results in a yes answer, the probability state index variable pStateIdx is calculated as the difference between 63 and the auxiliary variable. Additionally, it is determined that the value of the most probable symbol (vaIMPS) is equal to zero. In the other case, i.e., in which the auxiliary variable is greater than 63, the probability state index pStateIdx is calculated as the difference between the auxiliary variable on the one hand and the value of 64. Additionally, the value of the most probable symbol is set to one.

It is to be noted that the probability state index is a reference to an initialization probability information table including probability information for the least probable symbol. The value of the probability state index can address 64 different probability information values in the probability information table. The reason for firstly calculating a probability state index and then addressing a table using the probability state index is in an improved design of the actual entropy encoder core. Naturally, by an appropriate mapping, the sequence of the steps shown in FIG. 26 could also directly calculate the initialization probability information.

The quantization parameter SliceQP is used for determining the quantization of transform coefficients. The parameter may take 52 values. Theses values may be arranged so that an increase of 1 in quantization parameter means an increase of quantization step size by approximately 12% (an increase of 6 means an increase of quantization step size by exactly a factor of 2). It can be noticed that a change of step size by approximately 12% also means roughly a reduction of bit rate by approximately 12%.

Figure 27:
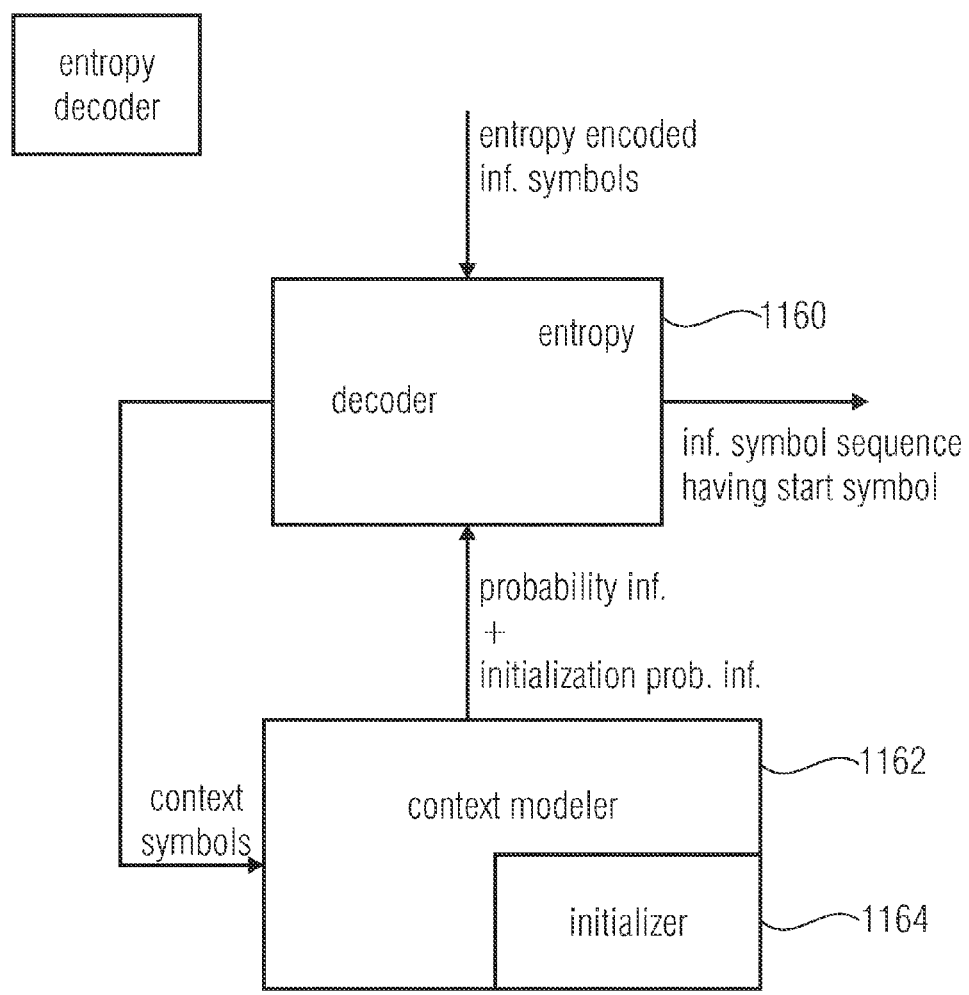
FIG. 27 shows a schematic block diagram of an entropy decoder arrangement according to an application example.

In the following, reference is made to FIG. 27 showing an inventive entropy decoder. As it is known in the art of entropy coding/decoding, the entropy decoder needs the same probability distribution used by the encoder for a respective encoding step to resolve the transmitted interval (which is naturally represented in binary form) into the decoded bits, i.e., the information symbol sequence having the start symbol. To this end, the inventive entropy decoder includes an entropy decoder 1160 and a context modeler 1162, which also includes an initializer 1164. It is to be seen here that the decoder shown in FIG. 27 is analogously constructed as the encoder in FIG. 24. Again, the context modeler 1162 provides probability information or, when the start symbol of the sequence is concerned, the initialization probability information. This information is produced in the same way as has been described with respect to FIG. 24, i.e., by determining a respective slice quantization parameter, by determining a certain context index and, by determining the corresponding initialization parameters m, n, for calculating the initialization probability information, when the entropy decoder is operative to process the start symbol. It is to be noted here that the entropy encoding/decoding chain is a kind of first-in-first-out pipeline, since the start symbol of the symbol sequence in the encoder is the first symbol to be encoded and is also the first symbol to be decoded. Therefore, the same initialization process for the entropy decoder shown in FIG. 27 can be used, which has been described in connection with the entropy encoder shown in FIG. 24.

Regarding the regular context adaptation mode, the context modeler also performs the same operational steps as have been described with respect to FIG. 24.

In both FIGS. 24 and 27, the entropy en/decoder may be implemented as indicated in any of the previous FIGS. 1 to 17.

Example 3

In example 3, several extensions of the above described embodiments are described.

It is particularly advantageous when the probability estimation underlying the symbol to be encoded or decoded is associated to a probability state $P_n$ using an index p_state.

For example, there are N different representative probability states. For same, transition rules may be given, wherein the transition rules indicate which new state is used based on the currently encoded or decoded symbol for the next symbol to be encoded or decoded. It is hereby of an advantage when a table Next_State_LPS is created which contains the index m of the new probability state $P_m$ when a least probable symbol (LPS) occurs in addition to the index n of the currently given probability state $P_n$, and/or when a table Next_State_MPS is created which contains the index m of the new probability state $P_m$ when a most probable symbol (MPS) occurs in addition to the index n of the currently given probability state $P_n$.

One special implementation of the encoding includes the following steps:

```
1.  Determination of the LPS
2.  Quantization
    p = quantize[p_state]
3.  En/decoding
    En/decode bit using p as parameter for partial bitstream selection
4.  Adaptation of p_state:
    if (bit = 1 − valMPS) then
        p_state ← Next_State_LPS [p_state]
        if (p_state = 0) then valMPS ← 1 − valMPS
    else
        p_state ← Next_State_MPS [p_state]
bit      current bit to be decoded/encoded
p_state  describes the current probability state of the context assigned
         to bit,
valMPS   describes the value of the bit corresponding to the MPS.
```

It further turns out to be advantageous when the initialization of the probability models is performed depending on a quantization parameter SliceQP and preset model parameters m and n, wherein SliceQP describes the quantization parameter preset at the beginning of a slice and m and n describe the model parameters.

It is also advantageous when the initialization of the probability models includes the following steps:

```
1. preState = min(max(1, ((m * SliceQP) >>4)+n), 2*(N−1))
2. if (preState <=N−1) then
        p_state = N−1 − preState
        valMPS = 0
   else
        p_state = preState − N
        valMPS = 1,
``` wherein valMPS describes the value of the bit corresponding to the MPS, SliceQP describes the quantization parameter preset at the beginning of a slice and m and n describe the model parameters.

The theoretical background is to be explained in more detail:

Table-Aided Probability Estimation

As it was already mentioned above, the estimation of the occurrence probability of the symbols to be coded should be as good as possible. In order to enable an adaptation to non-stationary source statistics, this estimation needs to be updated in the course of the coding process. Generally, usually methods are used for this which operate using scaled frequency counters of the coded results. If $C_{LPS}$ and $C_{MPS}$ designates counters for the occurrence frequencies of LPS and MPS, then using these counters the estimation $$P_{LPS} = \frac{C_{LPS}}{C_{LPS} + C_{MPS}} \quad \text{(C1)}$$

may be performed and then the entropy en/decoding may be carried out using this probability. For practical purposes the division necessitated in equation (C1) is disadvantageous. It is often convenient and necessitated, however, to perform a rescaling of the counter readings when a predetermined threshold value $C_{max}$ of the overall counter $C_{Total} = C_{MPS} + C_{LPS}$ is exceeded. With a suitable selection of $C_{max}$ the reciprocal values of $C_{Total}$ may be tabulated, so that the division necessitated in equation (C1) may be replaced by a table access and by a multiplication and shift operation. In order to prevent also these arithmetic operations, however, in the present invention a completely table-aided method is used for the probability estimation.

For this purpose in a training phase representative probability states $\{P_K | 0 \le k < N_{max}\}$ are preselected, wherein the selection of the states is on the one hand dependent on the statistics of the data to be coded and on the other hand on the side conditions of the default maximum number $N_{max}$ of states. Additionally, transition rules are defined which indicate which new state is to be used for the next symbol to be coded based on the currently coded symbol. These transition rules are provided in the form of two tables: $\{Next\_State\_LPS_k | 0 \le k < N_{max}\}$ and $\{Next\_State\_MPS_k | 0 \le k < N_{max}\}$, wherein the tables provide the index m of the new probability state $P_m$ when an LPS or MPS occurs, respectively, for the index n of the currently given probability state. It is to be noted here, that for a probability estimation in the entropy encoder or decoder, respectively, as it is proposed herein, no explicit tabulation of the probability states is necessitated. Rather, the states are only implicitly addressed using their respective indices, as it is described in the following section. In addition to the transition rules it needs to be specified at which probability states the value of the LPS and MPS needs to be exchanged. Generally, there will only be one such excellent state which may be identified using its index p_state.

Next, it is described, how the updating of the probability state p_state is performed depending on the value of the coded bit:

```
if (bit = 1 - valMPS) then
    p_state ← Next_State_LPS [p_state]
    if (p_state = 0) then valMPS ← 1 - valMPS
else
    p_state ← Next_State_MPS [p_state]
```

Transition tables Next_State_LPS and Next_State_MPS are used which were already mentioned above in the section "table-aided probability estimation".

Coding with Uniform Probability Distribution

In applications in which e.g. signed values are to be coded whose probability distribution is arranged symmetrically around zero, for coding the sign information generally an equal distribution may be assumed. As this information is one the one hand to be embedded in the entropy coded bit stream, while it is on the other hand not sensible to use a relatively compact apparatus of the table-aided probability estimation and interval separation for the case of a probability of p 0.5, it is for this special case proposed to optionally use a special encoder/decoder procedure which may be illustrated as follows.

In this special case the entropy coding of the bin is performed using a probability distribution according to which all symbol values are equally probable.

Addressing and initializing the probability models

Every probability model, as it is used, is indicated using two parameters: 1) The index p_state that characterizes the probability state of the LPS, and 2) the value valMPS of the MPS. Each of these two variables needs to be initialized at the beginning of the encoding or decoding, respectively, of a completed coding unit (in applications of video coding about one slice). The initialization values may thereby be derived from control information, like e.g. the quantization parameter (of a slice), as it is illustrated by:

```
1. preState = min(max(1, ((m * SliceQP) >>4)+n), 2*(N-1))
2. if (preState <=N-1) then
        p_state = N-1 - preState
        valMPS = 0
   else
        p_state = preState - N
        valMPS = 1,
```

Forward-Controlled Initialization Process

A further possibility of adaptation of the starting distributions of the models is provided by the following method. In order to guarantee a better adaptation of the initializations of the models, in the encoder a selection of predetermined starting values of the models may be provided. These models may be combined into groups of starting distributions and may be addressed using indices, so that in the encoder the adaptive selection of a group of starting values is performed and is transmitted to the decoder in the form of an index as page information. This method is referred to as a forward-controlled initialization process.

Example 4

The next example is related to video frame coding and, in particular, to a coding scheme using context assignment based on neighboring syntax elements. The following application example provides a video coding scheme using the above embodiments, which enables a higher compression effectiveness.

This advantage is achieved by encoding a video signal representing at least one video frame, with at least one video frame being composed of picture samples, the picture samples belonging either to a first or a second field being captured at different time instants, the video frame being spatially divided up into macroblock pair regions, each macroblock pair region being associated with a top and bottom macroblock, the encoding comprising the steps of deciding, for each macroblock pair region, as to whether same is of a first or a second distribution type; assigning, for each macroblock pair region, each of the pixel samples in the respective macroblock pair region to a respective one of the top and bottom macroblock of the respective macroblock pair region, in accordance with the distribution type of the respective macroblock pair region, and pre-coding the video signal into a pre-coded video signal, the pre-coding comprising the substep of pre-coding a current macroblock of the top and bottom macroblock associated with a current macroblock pair region of the macroblock pair regions to obtain a current syntax element. Thereafter, it is determined, for the current syntax element, a neighboring macroblock at least based upon as to whether the current macroblock pair region is of a first or second distribution type. One of at least two context models is assigned to the current syntax element based on a pre-determined attribute of the neighboring macroblock, wherein each context model is associated with a different probability estimation. Finally, an encoding of a sequence of symbols takes place in accordance with any of the above embodiments, with at least one symbol relating to a representation of the syntax element. The assigner is configured to determine the measure for the estimate of the probability distribution for the respective symbol based on the probability distribution estimate associated with the context assigned to the respective symbol. The selector selects the respective entropy coder and the respective partial bit stream accordingly.

Decoding a syntax element from a coded bit stream is also described. The coded bit stream is an entropy encoded version of a pre-coded video signal, the pre-coded video signal being a pre-coded version of a video signal, the video signal representing at least one video frame being composed of picture samples, the picture samples belonging either to a first or a second field being captured at a different time instants, the video frame being spatially divided up into macroblock pair regions, each macroblock pair region being associated with a top and a bottom macroblock, each macroblock pair region being either of a first or a second distribution type, wherein, for each macroblock pair region, each of the pixel samples in the respective macroblock pair region is assigned to a respective one of the top and bottom macroblock of the respective macroblock pair region in accordance with the distribution type of the respective macroblock pair region, wherein the syntax element relates to a current macroblock of the top and bottom macroblock of a current macroblock pair region of the macroblock pair regions. The method comprises determining, for the current syntax element, a neighboring macroblock at least based upon as to whether the current macroblock pair region is of a first or a second distribution type; assigning one of at least two context models to the current syntax element based on a predetermined attribute of the neighboring macroblock, wherein each context model is associated with a different probability estimation; and reconstructing a sequence of symbols among which at least one symbol relates to a representation of the syntax element in accordance with any of the above embodiment is performed. The assigner is configured to determine the measure for the estimate of the probability distribution for the respective symbol based on the probability distribution estimate associated with the context assigned to the respective symbol. The selector selects the respective entropy decoder and the respective partial bit stream, respectively, accordingly.

The below-outlined application example exploits the finding that when, for whatever reason, such as the better effectiveness when coding video frames having non-moving regions and moving regions, macroblock pair regions of a first and a second distribution type, i.e., field and frame coded macroblock pairs, are used concurrently in a video frame, i.e. MBAFF coding is used, the neighborhood between contiguous blocks of pixel samples has to be defined in a way different from considering each macroblock pair as frame macroblock pair for the purpose of context modeling and that the distance of areas covered by a neighboring and a current block could be very large when considering each macroblock pair as a frame macroblock pair. This in turn, could degrade the coding efficiency, since choosing neighboring blocks that are not arranged nearby the current block affects the adaption of the conditional probability models.

Further, the below-outlined application example exploits, that, for sake of a better definition of neighborhood between blocks of picture samples, i.e. the neighboring block which the syntax element to be coded or decoded relates to and the current block based on the attribute of which the assignment of a context model is conducted, and when the neighboring block lies beyond the borders or circumference of the current macroblock containing the current block, it is important to make the determination of the macroblock containing the neighboring block dependent upon as to whether the current macroblock pair region containing the current block is of a first or a second distribution type, i.e., frame or field coded.

The blocks may be a macroblock or some sub-part thereof. In both cases, the determination of a neighboring block comprises at least the determination of a neighboring macroblock a s long as the neighboring block lies beyond the borders of the current macroblock.

Figure 28:
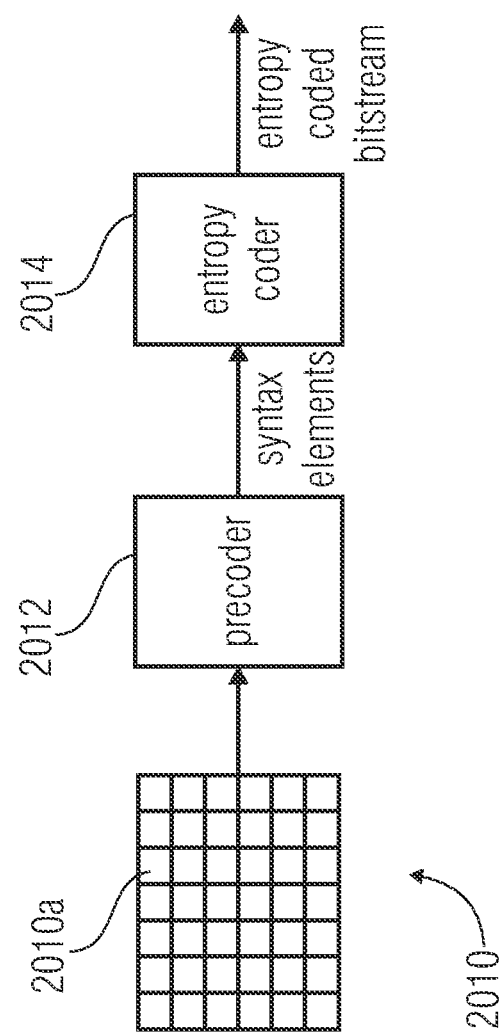
FIG. 28 shows a high-level block diagram of a coding environment.

FIG. 28 shows a general view of a video encoder environment to which the present invention could be applied. A picture of video frame 2010 is fed to a video precoder 2012. The video precoder treats the picture 2010 in units of so-called macroblocks 10a. Each macroblock contains several picture samples of picture 2010. On each macroblock a transformation into transformation coefficients is performed followed by a quantization into transform coefficient levels. Moreover, intra-frame prediction or motion compensation is used in order not to perform the afore mentioned steps directly on the pixel data but on the differences of same to predicted pixel values, thereby achieving small values which are more easily compressed.

Precoder 2012 outputs the result, i.e., the precoded video signal. All residual data elements in the precoded video signal, which are related to the coding of transform coefficients, such as the transform coefficient levels or a significance map indicating transform coefficient levels skipped, are called residual data syntax elements. Besides these residual data syntax elements, the precoded video signal output by precoder 2012 contains control information syntax elements containing control information as to how each macroblock has been coded and has to be decoded, respectively. In other words, the syntax elements are dividable into two categories. The first category, the control information syntax elements, contains the elements related to a macroblock type, sub-macroblock type, and information on prediction modes both of a spatial and of temporal types as well as slice-based and macroblock-based control information, for example. In the second category, all residual data elements such as a significance map indicating the locations of all significant coefficients inside a block of quantized transform coefficients, and the values of the significant coefficients, which are indicated in units of levels corresponding to the quantizations steps, are combined, i.e., the residual data syntax elements.

Figure 43:
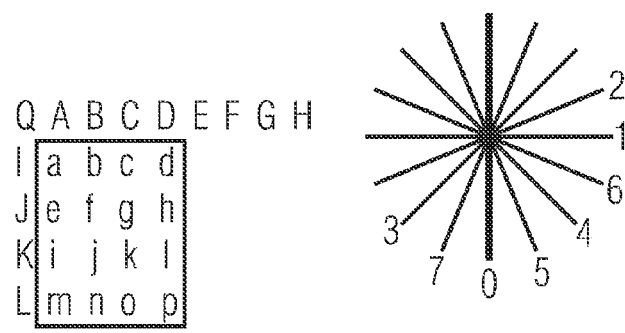
FIG. 43 shows, to the left, intra 4×4 prediction conducted for samples a-p of a block using samples A_Q, and to the right, "prediction directions for intra__4×4 prediction.

The macroblocks into which the picture 2010 is partitioned are grouped into several slices. In other words, the picture 2010 is subdivided into slices. An example for such a subdivision is shown in FIG. 43, in which each block or rectangle represents a macroblock. For each slice, a number of syntax elements are generated by precoder 2012, which form a coded version of the macro blocks of the respective slice.

Figure 29:
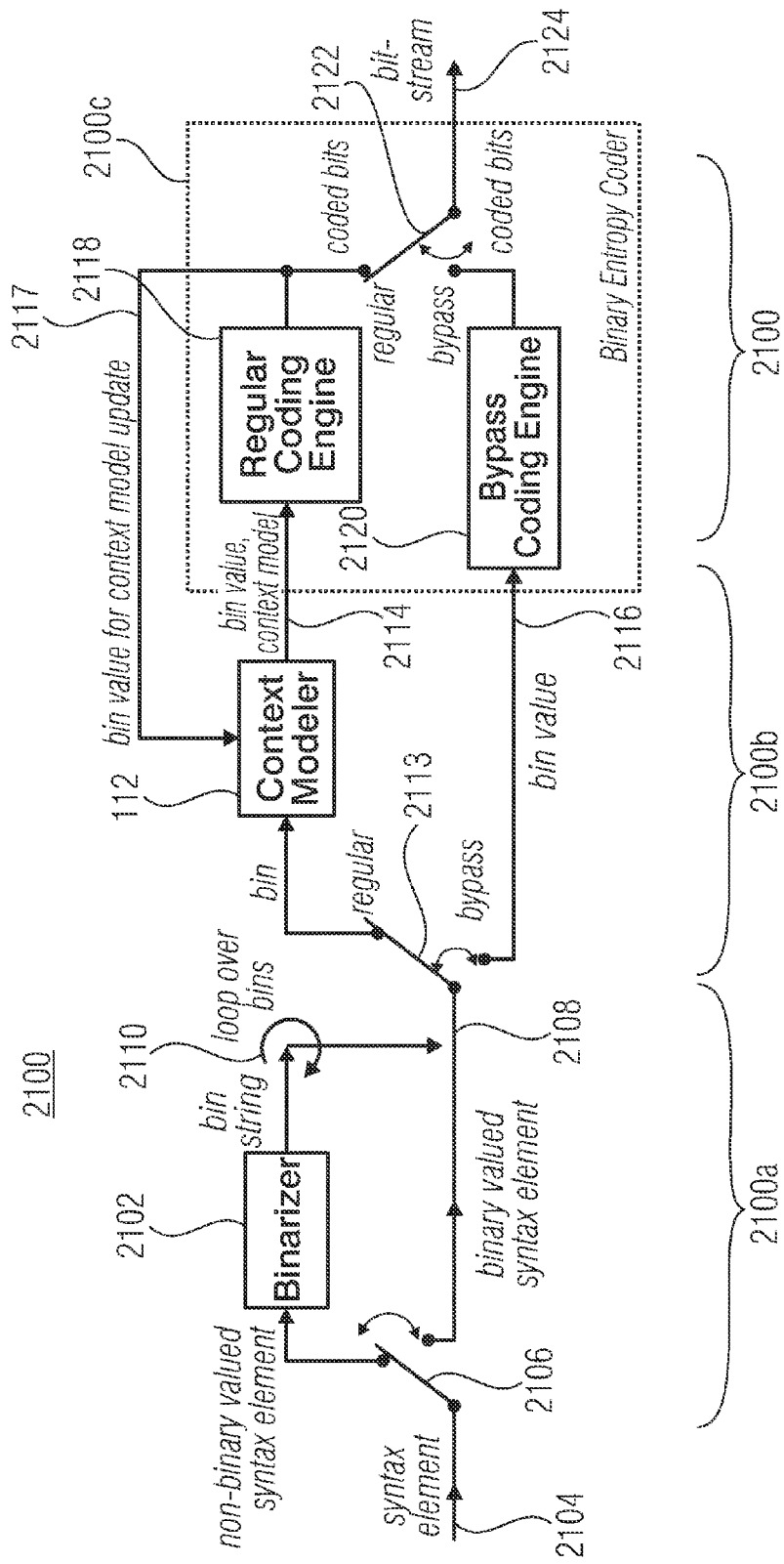
FIG. 29 shows a block diagram of the entropy coding part of the coding environment of FIG. 28.

The precoder 2012 transfers the syntax elements to a final coder stage 2014, which comprises an entropy coder according to any of the embodiments described above with respect to any of FIGS. 1 to 17 and explained in more detail with respect to FIG. 29. The final coder stage 2014 generates a codeword stream for each slice. When generating the codeword stream for a slice, the final coding stage 2014 exploits the fact that each syntax element is a data value having a certain meaning in the video signal bit stream that is passed to the entropy coder 2014. The entropy coder 2014 outputs a final compressed coded video bit stream comprising codewords for the slices of picture 2010.

FIG. 29 shows the arrangement for coding the syntax elements into the final code bit stream, the arrangement generally indicated by reference number 2100. The coding arrangement 2100 is divided into three stages, 2100a, 2100b, and 2100c.

The first stage 2100a is the binarization stage and comprises a binarizer 2102. An input of the binarizer 2102 is connected to an input 2104 of stage 2100a via a switch 2106. At the same time, input 2104 forms the input of coding arrangement 2100. The output of binarizer 2102 is connected to an output 2108 of stage 2100a, which, at the same time, forms the input of stage 2100b. Switch 2106 is able to pass syntax elements arriving at input 2104 to either binarizer 2102 or binarization stage output 2108, thereby bypassing binarizer 2102.

The function of switch 2106 is to directly pass the actual syntax element at input 2104 to the binarization stage output 2108 if the syntax element is already in a wanted binarized form. Examples for syntax elements that are not in the correct binarization form, called non-binary valued syntax elements, are motion vector differences and transform coefficient levels. Examples for a syntax element that has not to be binarized since it is already a binary value comprise the MBAFF (MBAFF=Macroblock Adaptive Frame/Field) Coding mode flag or mb_field_decoding_flag, the mb_skip_flag and coded_block_flag to be described later in more detail. Examples for a syntax element that has to be binarized since it is not a binary value comprise syntax elements mb_type, coded_block_pattern, ref_idx_I0, ref_idx_I1, mvd_I0, mvd_I1, and intro_chroma pred_mode.

Different binarization schemes are used for the syntax elements to be binarized. For example, a fixed-length binarization process is constructed by using an L-bit unsigned integer bin string of the syntax element value, where L is equal to $\log_2(cMax+1)$ rounded up to the nearest integer greater than or equal to the sum, with cMax being the maximum possible value of the syntax element. The indexing of the bins for the fl binarization is such that the bin index of zero relates to the least significant bit with increasing values of the bin index towards the most significant bit. Another binarization scheme is a truncated unary binarization scheme where syntax element values C smaller than the largest possible value cMax are mapped to a bit or bin string of length C+1 with the bins having a bin index smaller than C being equal to 1 and the bin having the bin index of C being equal to 0, whereas for syntax elements equal to the largest possible value cMax, the corresponding bin string is a bit string of length cMax with all bits equal to one not followed by a zero. Another binarization scheme is a k-th order exponential Golomb binarization scheme, where a syntax element is mapped to a bin string consisting of a prefix bit string and, eventually, a suffix bit string.

The non-binary valued syntax elements are passed via switch 2106 to binarizer 2102. Binarizer 2102 maps the non-binary valued syntax elements to a codeword, or a so-called bin string, so that they are now in a binary form. The term "bin" means the binary decision that have to be made at a node of a coding tree defining the binarization mapping of a non-binary value to a bit string or codeword, when transitioning from the route node of the coding tree to the leaf of the coding tree corresponding to the non-binary value of the non-binary syntax element to be binarized. Thus, a bin string is a sequence of bins or binary decisions and corresponds to a codeword having the same number of bits, each bit being the result of a binary decision.

The bin strings output by binarizer 2102 may not be passed directly to binarization stage output 108 but controllably passed to output 2108 by a bin loop over means 2110 arranged between the output of binarizer 2102 and output 2108 in order to merge the bin strings output by binarizer 2102 and the already binary valued syntax elements bypassing binarizer 2102 to a single bit stream at binarization stage output 2108.

Thus, the binarization stage 2108 is for transferring the syntax elements into a suitable binarized representation. The binarization procedure in binarizer 2102 may yield a binarized representation which is adapted to the probability distribution of the syntax elements so as to enable very efficient binary entropy coding.

Stage 2100*b* is a context modeling stage and comprises a context modeler 2112 as well as a switch 2113. The context modeler 2112 comprises an input, an output, and an optional feedback input. The input of context modeler 2112 is connected to the binarization stage output 2108 via switch 2113. The output of context modeler 2112 is connected to a regular coding input terminal 2114 of stage 2100*c*. The function of switch 2113 is to pass the bits or bins of the bin sequence at binarization stage output 2108 to either the context modeler 2112 or to a bypass coding input terminal 2116 of stage 2100*c*, thereby bypassing context modeler 2112.

The aim of switch 2113 is to ease the subsequent binary entropy coding performed in stage 100*c*. To be more precise, some of the bins in the bin string output by binarizer 2102 show heuristically nearly an equi-probable distribution. This means, the corresponding bits are, with a probability of nearly 50%, 1 and, with a probability of nearly 50%, 0, or, in other words, the bits corresponding to this bin in a bin string have a 50/50 chance to be 1 or 0. These bins are fed to the bypass-coding input terminal 2116 and are binary entropy coded by use of an equi-probable probability estimation, which is constant and, therefore, needs no adaption or updating overhead. For all other bins, it has been heuristically determined that the probability distribution of these bins depends on other bins as output by stage 2100*a* so that it is worthwhile to adapt or update the probability estimation used for binary entropy coding of the respective bin as it will be described in more detail below exemplarily with respect to exemplary syntax elements. The latter bins are thus fed by switch 2113 to the input terminal of context modeler 2112.

Context modeler 2112 manages a set of context models. For each context model, the context modeler 2112 has stored an actual bit or bin value probability distribution estimation. For each bin that arrives at the input of context modeler 2112, the context modeler 2112 selects one of the sets of context models. In other words, the context modeler 2112 assigns the bin to one of the set of context models. The assignment of bins to a context model is such that the actual probability distribution of bins belonging to the same context model show the same or likewise behavior so that the actual bit or bin value probability distribution estimation stored in the context modeler 2112 for a certain context model is a good approximation of the actual probability distribution for all bins that are assigned to this context model. The assignment process in accordance with the present invention exploits the spatial relationship between syntax element of neighboring blocks. This assignment process will be described in more detail below.

When having assigned the context model to an incoming bin the context modeler 2112 passes the bin further to entropy coding stage 2100*c* together with the probability distribution estimation of the context model, which the bin is assigned to. By this measure, the context modeler 2112 drives the entropy coding stage 2100*c* to generate a sequence of bits as a coded representation of the bins input in context modeler 2112 by switch 2113 according to the switched bit value probability distribution estimations as indicated by the context modeler 2112.

Moreover, the context modeler 2112 continuously updates the probability distribution estimations for each context model in order to adapt the probability distribution estimation for each context model to the property or attributes of the picture or video frame from which the syntax elements and bins have been derived. The estimation adaptation or estimation update is based on past or prior bits or bin values which the context modeler 2112 receives at the feedback input over a feedback line 2117 from stage 2100*c* or may temporarily store. Thus, in other words, the context modeler 2112 updates the probability estimations in response to the bin values passed to entropy coding stage 2100*c*. To be more precise, the context modeler 2112 uses a bin value assigned to a certain context model merely for adaptation or update of the probability estimation that is associated with the context model of this bin value.

Some of the syntax elements, when the same bin or same syntax element occurs several times in the bins passed from stage 2100*a* may be assigned to different of the context models each time they occur, depending on previously incoming or previously entropy coded bins, and/or depending on other circumstances, such as previously coded syntax elements of neighboring blocks, as is described in more detail below with respect to exemplary syntax elements.

It is clear from the above, that the probability estimation used for binary entropy coding determines the code and its efficiency in the first place, and that it is of paramount importance to have an adequate model that exploits the statistical dependencies of the syntax elements and bins to a large degree so that the probability estimation is approximating very effectively the actual probability distribution during encoding.

The third stage 2100*c* of coding arrangement 100 is the entropy coding stage. It comprises a regular coding engine 2118, a bypass-coding engine 2120, and a switch 2122. The regular coding engine 2118 comprises an input and an output terminal. The input terminal of regular coding engine 2118 is connected to the regular coding input terminal 2114. The regular coding engine 2118 binary entropy codes the bin values passed from context modeler 2112 by use of the context model also passed from context modeler 2112 and outputs coded bits. Further, the regular coding engine 2118 passes bin values for context model updates to the feedback input of context modeler 2112 over feedback line 2117. The regular coding engine corresponds to any of the above-mentioned embodiments of FIGS. 1 to 17 with however, the assigner of the above embodiments partially integrate within the context modeler as far as the setting of the context for the respective bin and the corresponding probability index is concerned. As mentioned above, assigner, may quantize the probability index before forwarding the thus obtained parameter to the selector 18 which, in turn, selects the respective entropy encoder.

The bypass-coding engine 2112 has also an input and an output terminal, the input terminal being connected to the bypass coding input terminal 2116. The bypass-coding engine 2120 is for binary entropy coding the bin values passed directly from binarization stage output 2108 via switch 2113 by use of a static predetermined probability distribution estimation and also outputs coded bits. The bypass-coding engine may use a 1:1 mapping in units of any number of symbols.

The coded bits output from regular coding engine 2118 and bypass coding engine 2120 are merged to a single bit stream at an output 2124 of coding arrangement 2100 by switch 2122, the bit stream representing a binary entropy coded bit stream of the syntax elements as input in input terminal 2104. Thus, regular coding engine 2118 and bypass coding 2120 cooperate in order to bit wise perform entropy coding based on either an adaptive or a static probability distribution model.

After having described with respect to FIGS. 28 and 29 rather generally the operation of coding arrangement 2100, in the following its functioning is described in more detail with respect to the handling of exemplary syntax elements for which an context assignment process based on syntax elements of neighboring blocks is used, in accordance with embodiments. In order to do so, firstly, with regard to FIGS. 30 to 31*b*, the meaning of MBAFF coding is described, in order to enable a better understanding of the definition of neighborhood between a current block and a neighboring block used during assignment of a context model to a syntax element concerning the current block in case of MBAFF.

Figure 30:
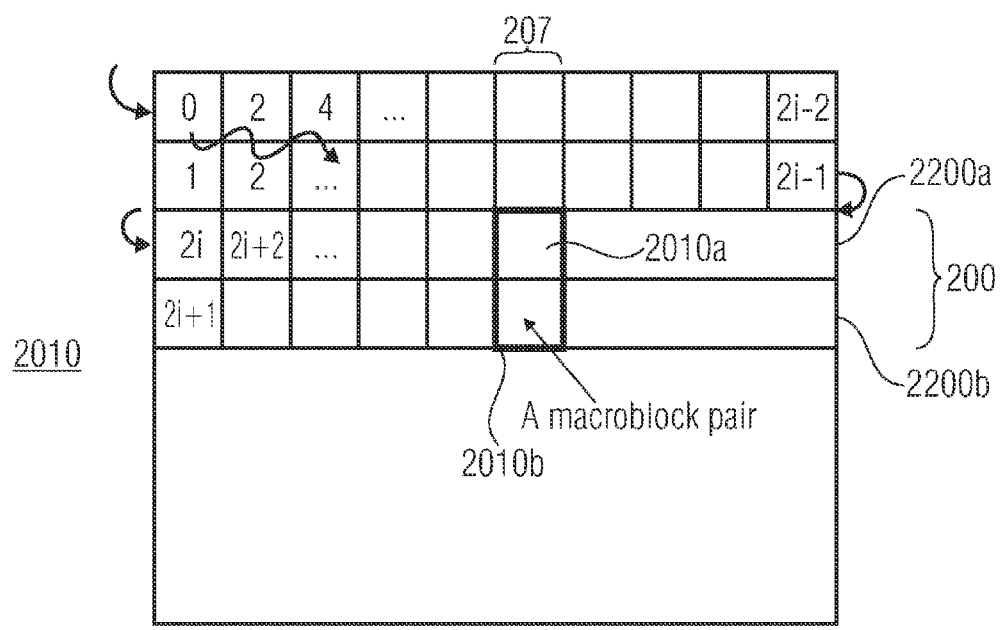
FIG. 30 shows a schematic diagram illustrating the spatial subdivision of a picture or video frame into macroblock pairs n.

FIG. 30 shows a picture or decoded video frame 2010. The video frame 2010 is spatially partitioned into macroblock pairs 10*b*. The macroblock pairs are arranged in an array of rows 2200 and columns 2202. Each macroblock pair consists of two macroblocks 2010*a*.

In order to be able to address each macroblock 10*a*, a sequence is defined with respect to macroblocks 2010*a*. In order to do so, in each macroblock pair, one macroblock is designated the top macroblock whereas the other macroblock in the macroblock pair is designated the bottom macroblock, the meaning of top and bottom macroblock depending on the mode by which a macroblock pair is coded by precoder 2012 (FIG. 28) as will be described with respect to FIGS. 31*a* and 31*b*. Thus, each macroblock pair row 2200 consists of two macroblock rows, i.e., an top macroblock row 2200*a* consisting of the top macroblocks in the macroblock pairs of the macroblock pair line 2200 and a bottom macroblock row 200*b* comprising the bottom macroblocks of the macroblock pairs.

In accordance with the present example, the top macroblock of the top left macroblock pair resides at address zero. The next address, i.e. address 1, is assigned to the bottom macroblock of the top left macroblock pair. The addresses of the top macroblocks of the macroblock pairs in the same, i.e., top macroblock row 2200*a*, are 2, 4, . . . , 2i−2, with the addresses rising from left to right, and with i expressing the picture width in units of macroblocks or macroblock pairs.

The addresses 1, 3, . . . , 2i−1 are assigned to the bottom macroblocks of the macroblock pairs in the top macroblock pair row 2200, the addresses rising from left to right. The next 2i-addresses from 2i to 4i−1 are assigned to the macroblocks of the macroblock pairs in the next macroblock pair row from the top and so on, as illustrated in FIG. 30 by the numbers written into the boxes representing the macroblocks 2010*a* and by the arched rows.

It is emphasized that FIG. 30 does show the spatial subdivision of picture 2010 in units of macroblock pairs rather than in macroblocks. Each macroblock pair 2010*b* represents a spatial rectangular region of the pictures. All picture samples or pixels (not shown) of picture 2010 lying in the spatial rectangular region of a specific macroblock pair 2010*b* belong to this macroblock pair. If a specific pixel or picture sample belongs to the top or the bottom macroblock of a macroblock pair depends on the mode by which precoder 2012 has coded the macroblocks in that macroblock pair as it is described in more detail below.

Figure 31A:
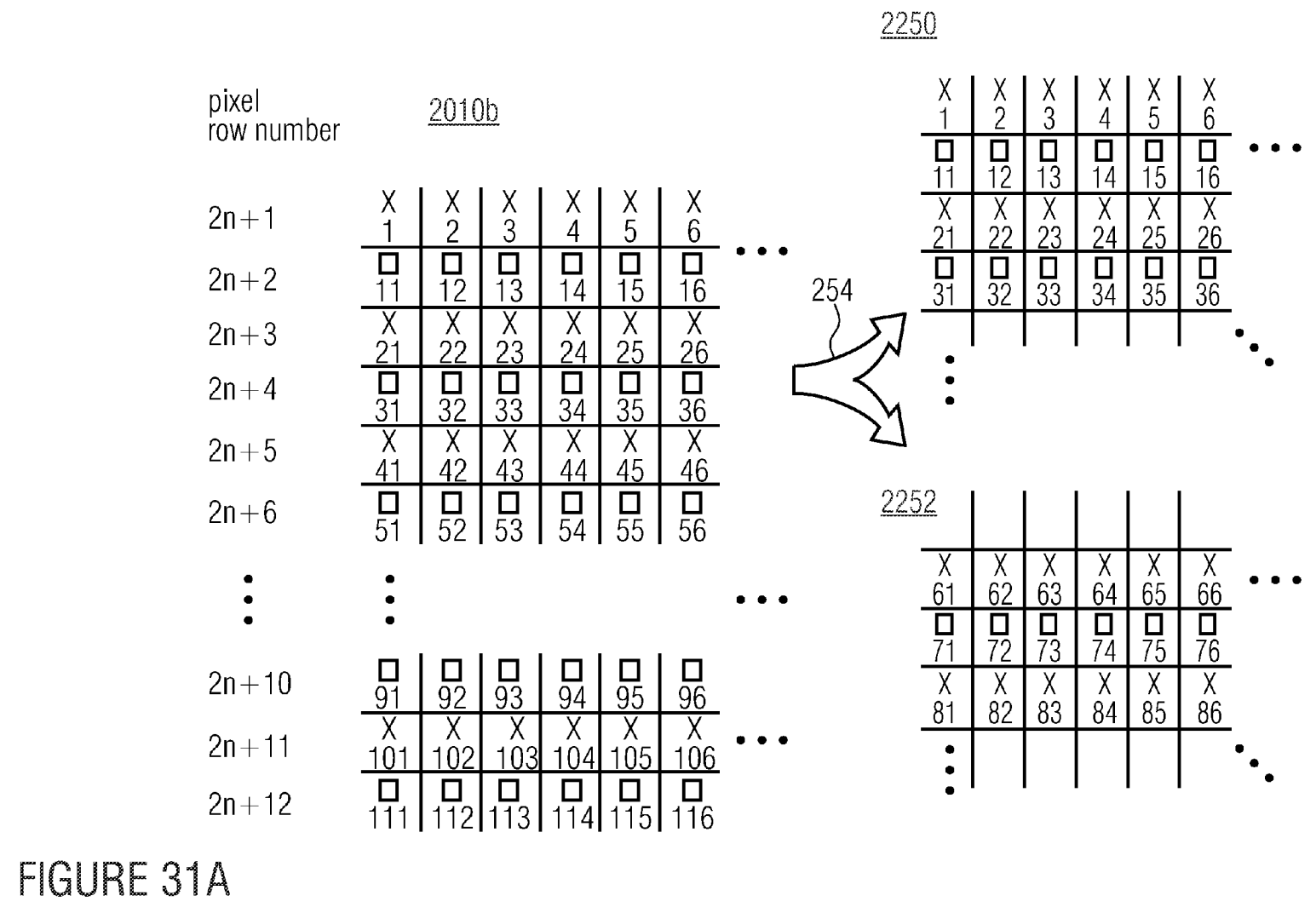

FIG. 31*a* shows on the left hand side the arrangement of pixels or picture samples belonging to a macroblock pair 2010*b*. As can be seen, the pixels are arranged in an array of rows and columns. Each pixel shown is indicated by a number in order to ease the following description of FIG. 31*a*. As can be seen in FIG. 31*a*, some of the pixels are marked by an "x" while the others are marked "Y". All pixels marked with "x" belong to a first field of the picture while the other pixels marked with "Y" belong to a second field of the picture. Pixels belonging to the same field are arranged in alternate rows of the picture. The picture or video frame can be considered to contain two interleaved fields, a top and a bottom field. The top field comprises the pixels marked with "Y" and contains even-numbered rows 2n+2, 2n+4, 2n+6, . . . with 2n being the number of rows of one picture or video frame and n being an integer greater than or equal to 0. The bottom field contains the odd-numbered rows starting with the second line of the frame.

It is assumed that the video frame to which macroblock pair 2010*b* belongs, is an interlaced frame where the two fields were captured at different time instants, for example the top field before the bottom field. It is now that the pixels or picture samples of a macroblock pair are differently assigned to the top or bottom macroblock of the macroblock pair, depending on the mode by which the respective macroblock pair is precoded by precoder 2012 (FIG. 28). The reason for this being the following.

As described above with respect to FIG. 28, the picture samples of a macroblock, which may be luminance or luma and chrominance or chroma samples, may be either spatially or temporarily predicted by precoder 2012, and the resulting prediction residual is encoded using transform coding in order to yield the residual data syntax elements. It is now that in interlaced frames (and it is assumed that the present video frame is an interlaced frame), with regions of moving objects or camera motion, two adjacent rows of pixels tend to show a reduced degree of statistical dependency when compared to progressive video frames in which both fields are captured at the same time instant. Thus, in cases of such moving objects or camera motion, the pre-coding performed by precoder 2012 which, as stated above, operates on macroblocks, may achieve merely a reduced compression efficiency when a macroblock pair is spatially sub-divided into a top macroblock representing the top half region of the macroblock pair and a bottom macroblock representing the bottom half region of the macroblock pair, since in this case, both macroblocks, the top and the bottom macroblock, comprise both top field and bottom field pixels. In this case, it may be more efficient for precoder 2012 to code each field separately, i.e., to assign top field pixels to the top macroblock and bottom field pixels to the bottom field macroblock.

Figure 31B:
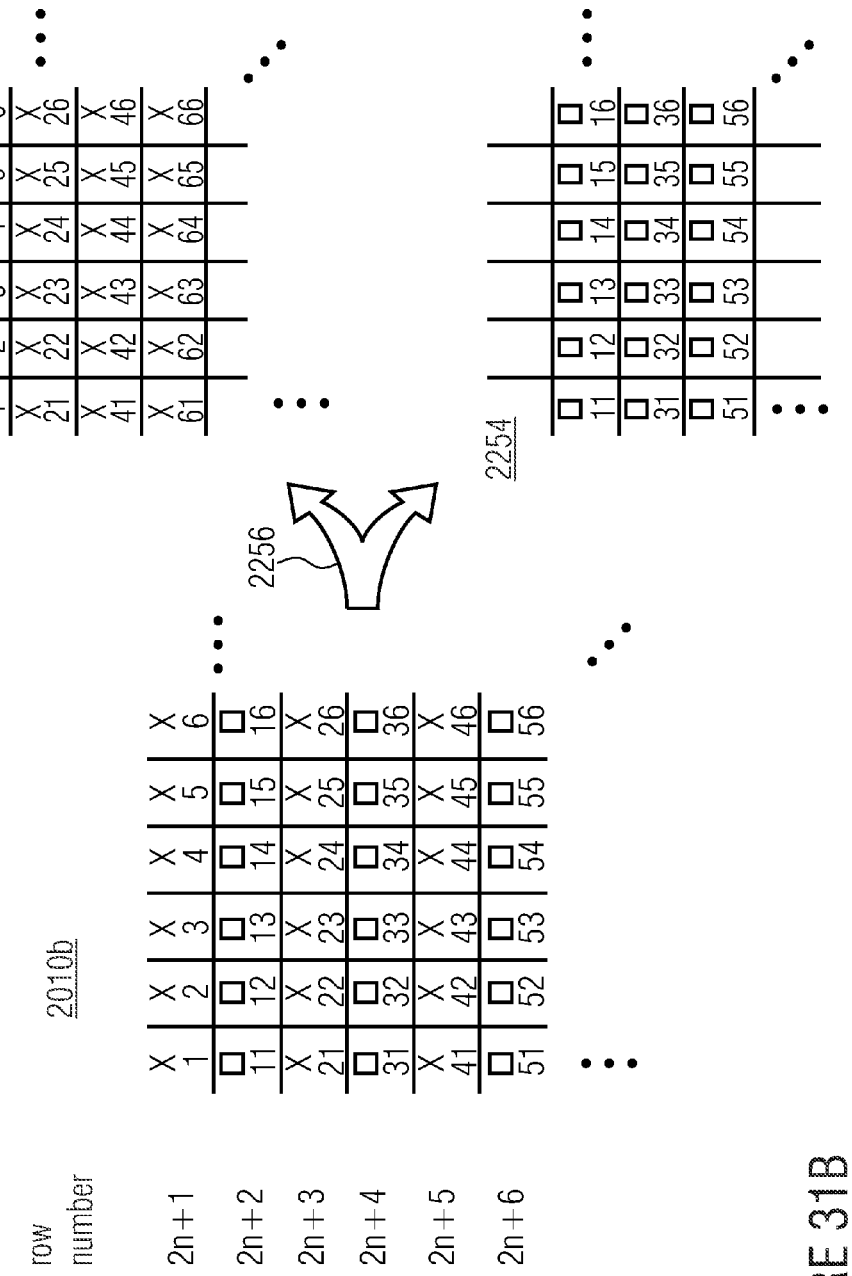
FIG. 31b shows a schematic diagram illustrating the field mode, in accordance with an embodiment of the present invention.

In order to illustrate as to how the pixels of a macroblock pair are assigned to the top and bottom macroblock of the, FIGS. 31a and 31b show on the right hand side the resulting top and bottom macroblock in accordance with the frame and field mode, respectively.

FIG. 31a represents the frame mode, i.e., where each macroblock pair is spatially subdivided in a top and a bottom half macroblock. FIG. 31a shows at 2250 the top macroblock and at 2252 the bottom macroblock as defined when they are coded in the frame mode, the frame mode being represented by double-headed arrow 2254. As can be seen, the top macroblock 250 comprises one half of the pixel samples of the macroblock pair 2010b while the other picture samples are assigned to the bottom macroblock 2252. To be more specific, the picture samples of the top half rows numbered 2n+1 to 2n+6 belong to the top macroblock 2250, whereas the picture samples 91 to 96, 01 to 06, 11 to 16 of the bottom half comprising rows 2n+7 to 2n+12 of the macroblock pair 10b belong to the bottom macroblock 2252. Thus, when coded in frame mode, both macroblocks 2250 and 2252 comprise both, picture elements of the first field marked with "x" and captured at a first time instant and picture samples of the second field marked with "Y" and captured at a second, different time instant.

The assignment of pixels as they are output by a camera or the like, to top or bottom macroblocks is slightly different in field mode. When coded in field mode, as is indicated by double headed arrow 2256 in FIG. 31b, the top macroblock 2252 of the macroblock pair 2010b contains all picture samples of the top field, marked with "x", while the bottom macroblock 2254 comprises all picture samples of the bottom field, marked with "Y". Thus, when coded in accordance with field mode 2256, each macroblock in a macroblock pair does merely contain either picture samples of the top field or picture samples of the bottom field rather than a mix of picture samples of the top and bottom field.

Now, after having described the spatial sub-division of a picture into macroblock pairs and the assignment of picture samples in a macroblock pair to either the top or the bottom macroblock of the macroblock pair, the assignment depending on the mode by which the macroblock pair or the macroblocks of the macroblock pair are coded by precoder 2012, reference is again made to FIG. 28 in order to explain the function and meaning of the syntax element mb_field_decoding_flag contained in the precoded video signal output by precoder 2012, and, concurrently, in order to explain the advantages of MBAFF coded frames over just field or frame coded frames.

When the precoder 2012 receives a video signal representing an interlaced video frame, precoder 2012 is free to make the following decisions when coding the video frame 2010:

It can combine the two fields together to code them as one single coded frame, so that each macroblock pair and each macroblock would be coded in frame mode.

Alternatively, it could combine the two fields and code them as separate coded fields, so that each macroblock pair and each macroblock would be coded in field mode.

As a last option, it could combine the two fields together and compress them as a single frame, but when coding the frame it splits the macroblock pairs into either pairs of two field macroblocks or pairs of two frame macroblocks before coding them.

The choice between the three options can be made adaptively for each frame in a sequence. The choice between the first two options is referred to as picture adaptive frame/field (PAFF) coding. When a frame is coded as two fields, each field is partitioned into macroblocks and is coded in a manner very similar to a frame.

If a frame consists of mixed regions where some regions are moving and others are not, it is typically more efficient to code the non-moving regions in frame mode and the moving regions in the field mode. Therefore, the frames/field encoding decision can be made independently for each vertical pair of macroblocks in a frame. This is the third coding option of the above-listed options. This coding option is referred to as macroblock adaptive frame/field (MBAFF) coding. It is assumed in the following that precoder 2012 decides to use just this option. As described above, MBAFF coding allows the precoder to better adapt the coding mode type (filed or frame mode) to the respective areas of scenes. For example, precoder 2012 codes macroblock pairs located at stationary areas of a video scene in frame mode, while coding macroblock pairs lying in areas of a scene showing fast movements in field mode.

As mentioned above, for a macroblock pair that is coded in frame mode, each macroblock contains frame lines. For a macroblock pair that is coded in field mode, the top macroblock contains top field lines and the bottom macroblock contains bottom field lines. The frame/field decision for each macroblock pair is made at the macroblock pair level by precoder 2012, i.e. if the top macroblock is field coded same applies for the bottom macroblock within same macroblock pair. By this measure, the basic macroblock processing structure is kept intact, and motion compensation areas are permitted to be as large as the size of a macroblock.

Each macroblock of a field macroblock pair is processed very similarly to a macroblock within a field in PAFF coding. However, since a mixture of field and frame macroblock pairs may occur within an MBAFF frame, some stages of the pre-coding procedure in precoder 2012, such as the prediction of motion vectors, the prediction of intra prediction modes, intra frame sample prediction, deblocking filtering and context modeling in entropy coding and the zig-zag scanning of transform coefficients are modified when compared to the PAFF coding in order to account for this mixture.

To summarize, the pre-coded video signal output by precoder 2012 depends on the type of coding precoder 2012 has decided to use. In case of MBAFF coding, as it is assumed herein, the pre-coded video signal contains a flag mb_field_decoding_flag for each non-skipped macroblock pair. The flag mb_field_decoding_flag indicates for each macroblock pair it belongs to whether the corresponding macroblocks are coded in frame or field coding mode. On decoder side, this flag is necessitated in order to correctly decode the precoded video signal. In case, the macroblocks of a macroblock pair are coded in frame mode, the flag mb_field_decoding_flag is zero, whereas the flag is one in the other case.

Figure 32:
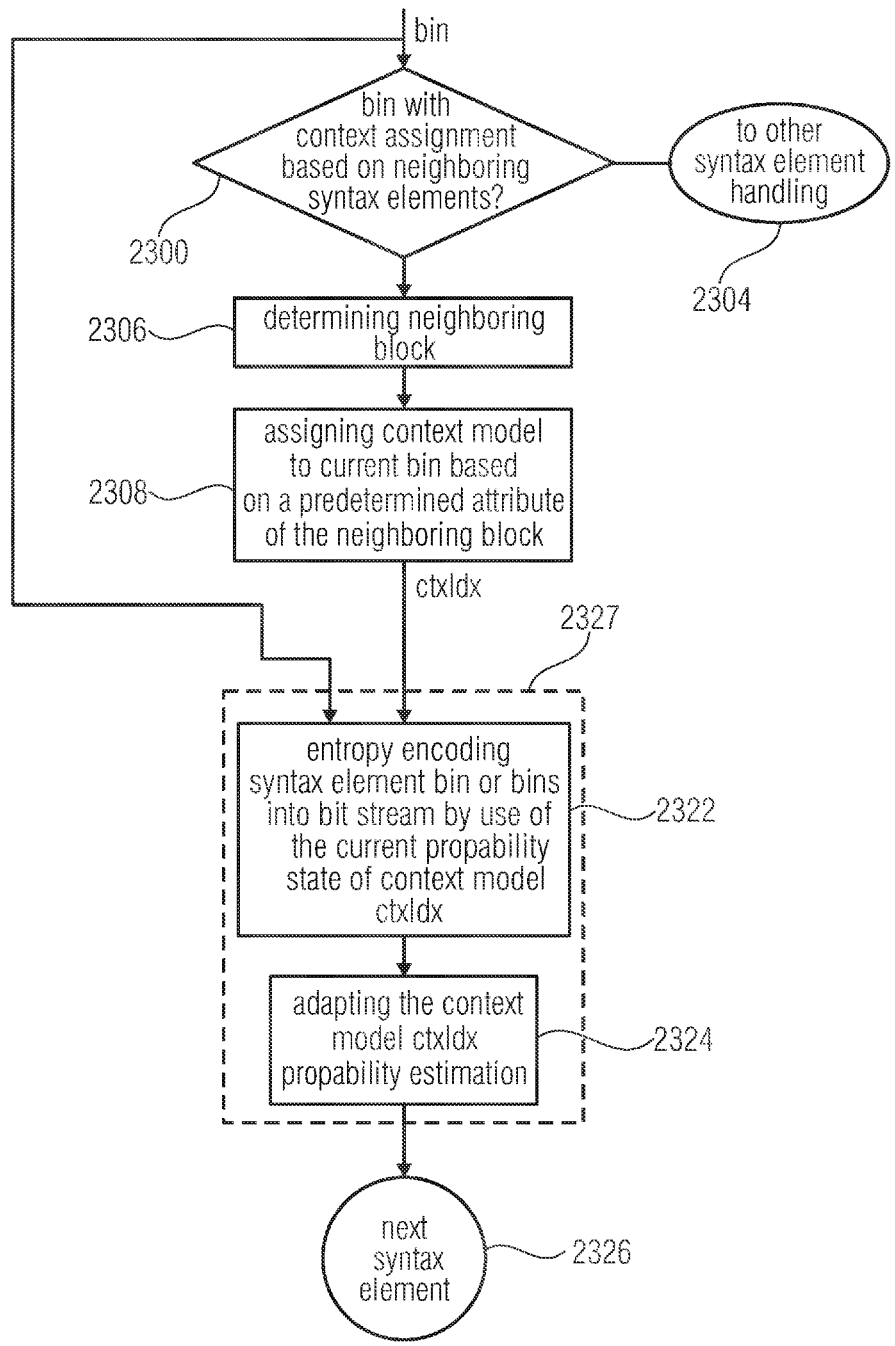
FIG. 32 shows a flow diagram illustrating the encoding of syntax elements with context assignments based on neighboring syntax elements in accordance with an embodiment of the present invention.

Now, while the general mode of operation of the original decoder arrangement of FIG. 29 has been described without referring to a special bin, with respect to FIG. 32, the functionality of this arrangement is now described with respect to the binary entropy coding of the bin strings of exemplary syntax elements for which the spatial relationship between the syntax element of neighboring blocks is used while MBAFF coding mode is active.

The process shown in FIG. 32 starts at the arrival of a bin value of a syntax element at the input of context modeler 2112. That is, eventually, the syntax element had to be binarized in binarizer 2102 if needed, i.e. unless the syntax element is already a binary value. In a first step 2300, context modeler 2112 determines as to whether the incoming bin is a bin dedicated to a context assignment based on neighboring syntax elements, i.e. syntax elements in neighboring blocks. It is recalled that the description of FIG. 32 assumes that MBAFF coding is active. If the determination in step 2300 results in the incoming bin not being dedicated to context assignment based on neighboring syntax elements, another syntax element handling is performed in step 2304. In the second case, context modeler 2112 determines a neighboring block of the current block to which the syntax element of the incoming bin relates. The determination process of step 2306 is described in more detail below with respect to exemplary syntax elements and their bins, respectively. In any case, the determination in step 2306 depends on the current macroblock to which the syntax element of the current bin relates being frame or field coded, as long as the neighboring block in question is external to the macroblock containing the current block.

Next, in step 2308, the context modeler 2112 assigns a context model to the bin based on a predetermined attribute of the neighboring block. The step of assigning 2308 results in a context index ctxIdx pointing to the respective entry in a table assigning each context index a probability model, to be used for binary entropy coding of the current bin of the current syntax element.

After the determination of ctxIdx, context modeler 2112 passes the variable ctxIdx or the probability estimation status indexed by ctxIdx along with the current bin itself to regular coding engine 2118. Based on these inputs, the regular coding engine 2118 entropy encodes, in step 2322, the bin by using the current probability state of the context model as indexed by ctxIdx. In particular, the index is used to select the respective partial bitstream 2012, for example.

Thereafter, regular coding engine 2118 passes the bin value via path 2117 back to context modeler 2112, whereupon context modeler 2112 adapts, in step 2324, the context model indexed by ctxIdx with respect to its probability estimation state. Thereafter, the process of coding the syntax element into the bit stream at the output 2124 ends at 2326.

It is emphasized that the bin string into which the syntax element may be binarized before step 2310 may be composed of both, bins that are encoded, i.e. assigned to the respective partial bitstream 2012 and subsequently coded, by use of the current probability state of context model ctxIdx in step 2322 and bins encoded in bypass coding engine 2120 by use of an equi-probable probability estimation although this is not shown in FIG. 32. Rather, FIG. 32 merely concerns the exemplary encoding of one bin of a syntax element.

The steps 2322 and 2324, encompassed by dotted line 2327 in FIG. 32, are explained in more detail below with respect to FIG. 33.

Figure 33:
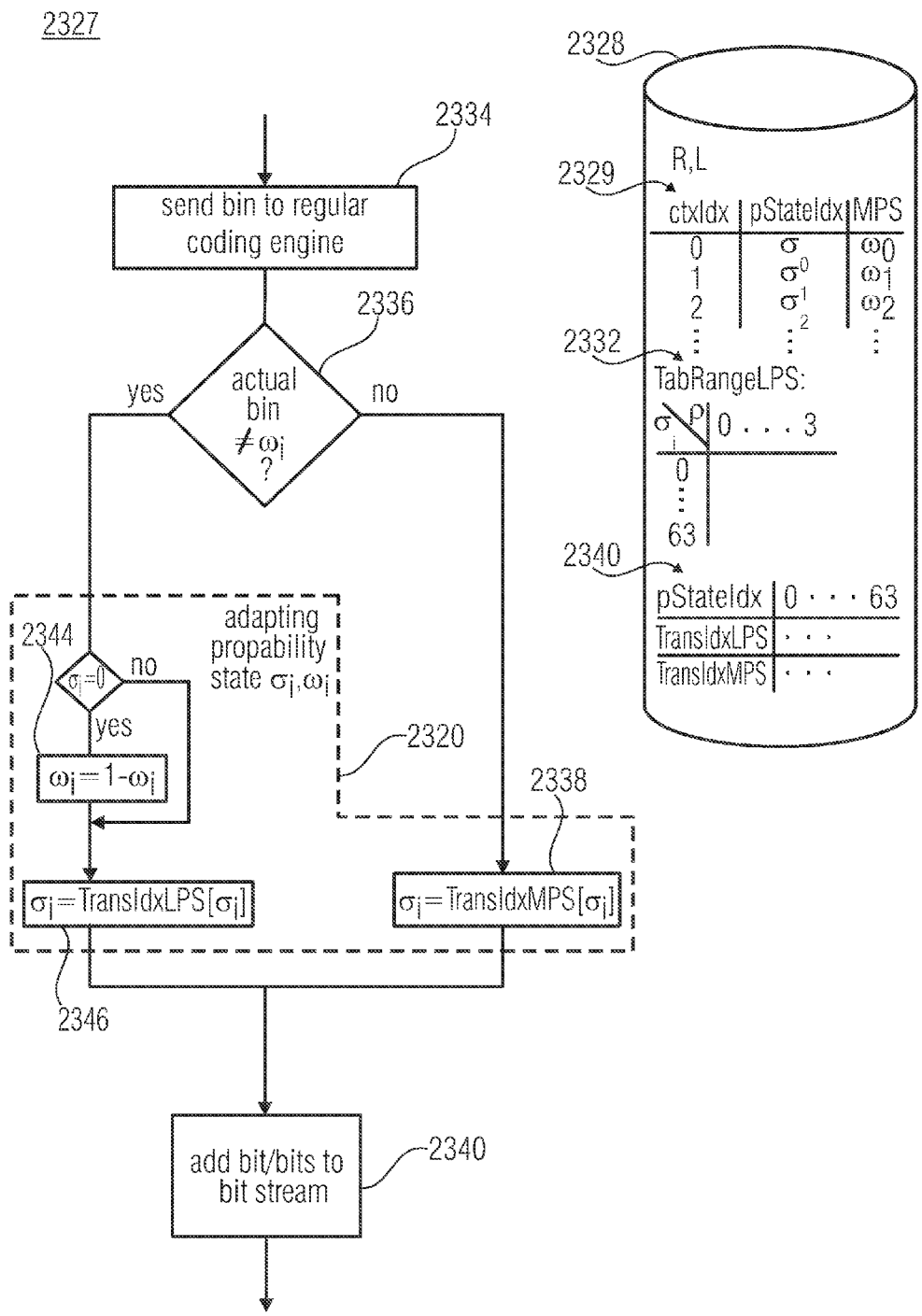
FIG. 33 shows a flow diagram illustrating the binary entropy coding of the syntax elements based on the context model to which it is assigned in accordance with an embodiment of the present invention.

FIG. 33 shows, on the left hand side, a flow diagram of the process 2327. On the right hand side, FIG. 33 shows a memory 2328 to which both, the context modeler 2112 and the regular coding engine 2118, have access in order to load, write, and update specific variables. These variables comprise R and L, which define the current state or current probability interval of the binary entropy coder 2100c.

Memory 2328 contains a table 2329, which associates each possible value of ctxIdx, e.g. 0-2398, a pair of a probability state index $\sigma$ and an MPS value $\omega$, both defining the current probability estimation state of the respective context model indexed by the respective context index ctxIdx. The probability state $\sigma$ is an index that uniquely identifies one of a set of possible probability values $p_\sigma$. The probability values $p_\sigma$ are an estimation for the probability of the next bin of that context model to be a least probable symbol (LPS). Which of the possible bin values, i.e., a null or one, is meant by the LPS, is indicated by the value of MPS $\omega$. If $\omega$ is 1, LPS is 0 and vice-versa. Thus, the state index and MPS together uniquely define the actual probability state or probability estimation of the respective context model.

In step 2334, the actual bin value is sent to the regular coding engine 2118.

In step 2336, the regular coding engine 2118 checks as to whether the value of the actual bin, i.e. either the already binary syntax element or one bin of a bin string obtained from the current syntax element, is equal to the most probable symbol as indicated by $\omega_i$ or not. If the current bin is the MPS, context modeler 2112 updates the probability estimation state of the current context model by updating $\sigma_i$. In particular, context modeler 2112 uses a table 2340 which associates each probability state index $\sigma$ with an updated probability state index in case the actual symbol or bin was the most probable symbol, i.e., $\sigma$ becomes transIdxMPS($\sigma_i$).

After step 2338, the process ends at 2340 where the bin sent to the regular coding engine 2118 is forwarded by the selector thereof, to the respective partial bitstream encoder.

If in step 2336 it is determined that the current bin is the least probable symbol LPS, it is determined if $\sigma_i$ is equal to 0, i.e. if the probability state index indicates equal probability for both, 1 and 0, in step 2344. Then, the value MPS is updated by computing $\omega_i = 1 - \omega_i$.

Thereafter, in step 2346, the probability state index is actualized by use of table 2340, which also associates each current probability state index with an updated probability state index in case the actual bin value is the least probable symbol, i.e., amending $\sigma_i$ to become transIdxLPS($\sigma_i$). After the probability state index $\sigma_i$ and $\omega_i$ has been adapted in steps 2344 and 2346, the process steps to step 2340 which has already been described.

After having described the encoding process of syntax elements by exploiting the spatial relationship between syntax element of neighboring blocks for context model assignment, the context model assignment and the definition of the neighborhood between a current and a neighboring block is described in more detail below with respect to the following syntax elements contained in the precoded video signal as output by precoder 2012. These syntax elements are listed below.

| Name of the syntax element | Meaning of the syntax element |
|---|---|
| Mb_skip_flag | This flag relates to a certain macroblock of a certain slice of a video frame. Mb_skip_flag equal to 1 specifies that the current macroblock is to be skipped when performing a decoding process on the precoded video signal. Mb_skip_flag equal to 0 specifies that the current macroblock is not skipped. In particular, in the H.264/AVC standard, Mb_skip_flag equal to 1 specifies that for the current macroblock, when decoding a P or SP slice, Mb_type is inferred to be p_skip and the macroblock type is collectively referred to as P macroblock type, and when decoding a B slice, Mb_type is inferred to be B_skip and the macroblock type is collectively referred to as B macroblock type. |
| Mb_field_decoding_flag | Mb_field_decoding_flag equal to 0 specifies that the current macroblock pair is a frame macroblock pair and Mb_field_decoding_flag equal to 0 specifies that the macroblock pair is a field macroblock pair. Both macroblocks of a frame macroblock pair are referred to in the present description as frame macroblocks, whereas both macroblocks of a field macroblock pair are referred to in this text as field macroblocks. |

-continued

| Name of the syntax element | Meaning of the syntax element |
|---|---|
| Mb_type | Mb_type specifies the macroblock type. For example, the semantics of Mb_type in the H.264/AVC standard depends on the slice type. Depending on the slice type, Mb_type can assume values in the range of 0 to 25, 0 to 30, 0 to 48 or 0-26, depending on the slice type. |
| Coded_block_pattern | Coded_block_pattern specifies which of a sub-part of the current macroblock contains non-zero transform coefficients. Transform coefficients are the scalar quantities, considered to be in a frequency domain, that are associated with a particular one-dimensional or two-dimensional frequency index in an inverse transform part of the decoding process. To be more specific, each macroblock 2010a - irrespective of the macroblock being a frame coded macroblock (FIG. 31a) or a field coded macroblock (FIG. 31b), is partitioned into smaller sub-parts, the sub-parts being arrays of size 8 × 8 pixel samples. Briefly referring to FIG. 31a, the pixels 1 to 8, 11 to 18, 21 to 28, . . . , 71 to 78 could form the upper left block of luma pixel samples in the top macroblock 2250 of macroblock pair 2010b. This top macroblock 2250 would comprise another three of such blocks, all four blocks arranged in a 2 × 2 array. The same applies for the bottom macroblock 2252 and also applies for field coded macroblocks as shown in FIG. 4b, where, for example, pixels 1 to 8, 21 to 28, 41 to 48, . . . , 141 to 148 would form the upper left block of the top macroblock. Thus, for each macroblock coded, the precoded video signal output by precoder 12 would comprise one or several syntax elements coded_block_pattern. The transformation from spatial domain to frequency domain, could be performed on these 8 × 8 sub-parts or on some smaller units, for example, 4 × 4 sub-arrays, wherein each 8 × 8 sub-part comprises 4 smaller 4 × 4 partitions. The present description mainly concerns luma pixel samples. Nevertheless, the same could also apply accordingly for chroma pixel samples. |
| ref_Idx_l0/ ref_Idx_l1 | This syntax element concerns the prediction of the pixel samples of a macroblock during encoding and decoding. In particular, ref_Idx_l0, when present in the precoded video signal output by precoder 12, specifies an index in a list 0 of a reference picture to be used for prediction. The same applies for ref_Idx_l1 but with respect to another list of the reference picture. |
| mvd_l0/mvd_l1 | mvd_l0 specifies the difference between a vector component to be used for motion prediction and the prediction of the vector component. The same applies for mvd_l1, the only difference being, that same are applied to different reference picture lists. ref_Idx_l0, ref_Idx_l1, mvd_l0 and mvd_l1 all relate to a particular macroblock partition. The partitioning of the macroblock is specified by Mb_type. |
| intra_chroma_pred_mode | Intra_chroma_pred_mode specifies the type of spatial prediction used for chroma whenever any part of the luma macroblock is intra-coded. In intra prediction, a prediction is derived from the decoded samples of the same decoded picture or frame. Intra prediction is contrary to inter prediction where a prediction is derived from decoded samples of reference pictures other than the current decoded picture. |
| coded_block_flag | coded_block_flag relates to blocks of the size of 4 × 4 picture samples. If coded_block_flag is equal to 0, the block contains no non-zero transform coefficients. If coded_block_flag is equal to 1, the block contains at least one non-zero transform coefficient. |

Figure 36:
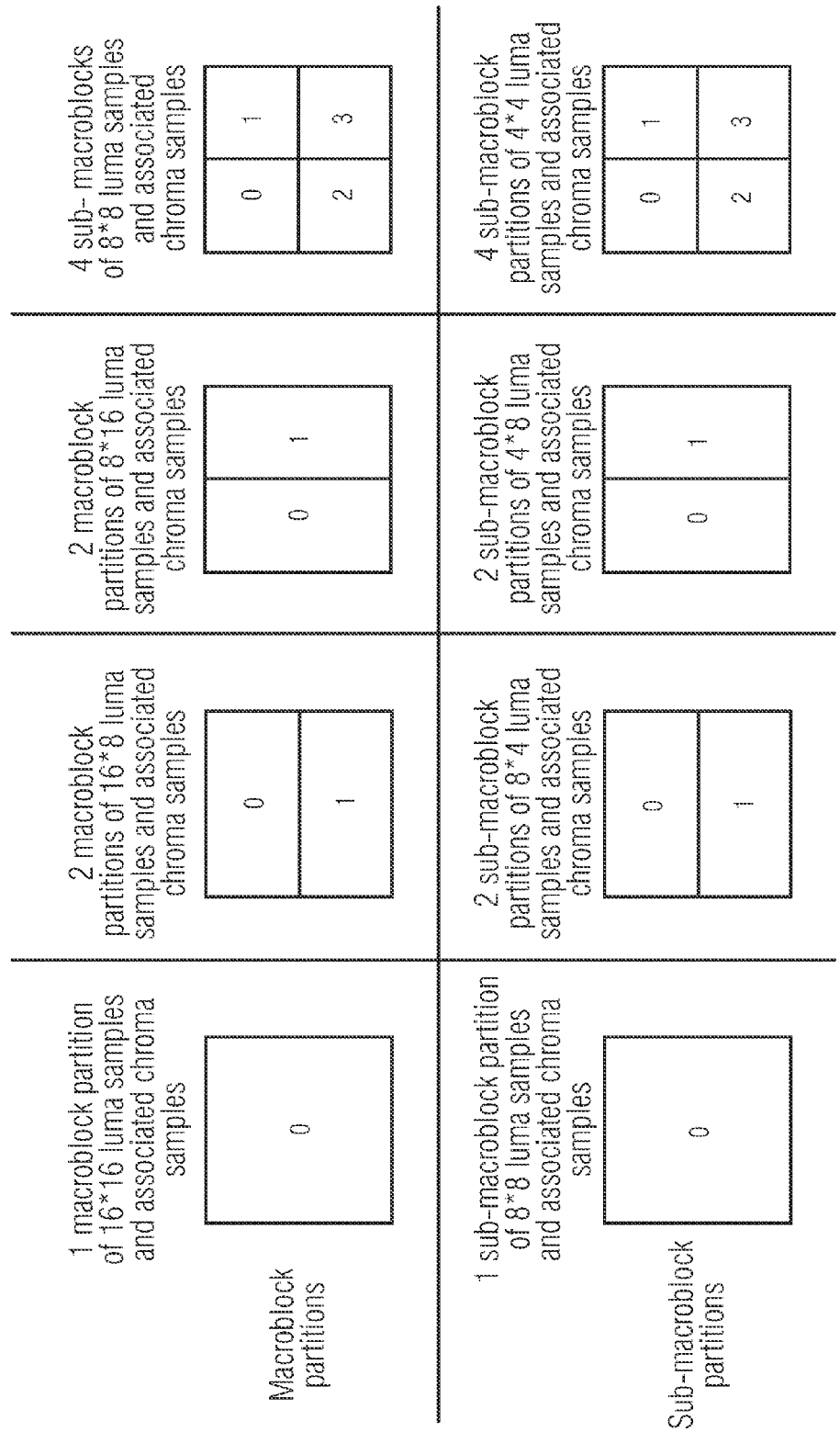
FIG. 36 shows a schematic illustrating macroblock partitions, sub-macroblock partitions, macroblock partitions scans, and sub-macroblock partition scans.

As can be gathered from the above table, some of these syntax elements relate to a current macroblock in the whole, whereas others relate to sub-parts, i.e., sub-macroblocks or partitions thereof, of a current macroblock. In a similar way, the assignment of a context model to these syntax elements is dependent on syntax elements of either neighboring macroblocks, neighboring sub-macroblocks or neighboring partitions thereof. FIG. 36 illustrates the partition of macroblocks (upper row) and sub-macroblocks (lower row). The partitions are scanned for inter prediction as shown in FIG. 36. The outer rectangles in FIG. 36 refer to the samples in a macroblock or sub-macroblock, respectively. The inner rectangles refer to the partitions. The number in each inner rectangle specifies the index of the inverse macroblock partition scan or inverse sub-macroblock partition scan.

Figure 34:
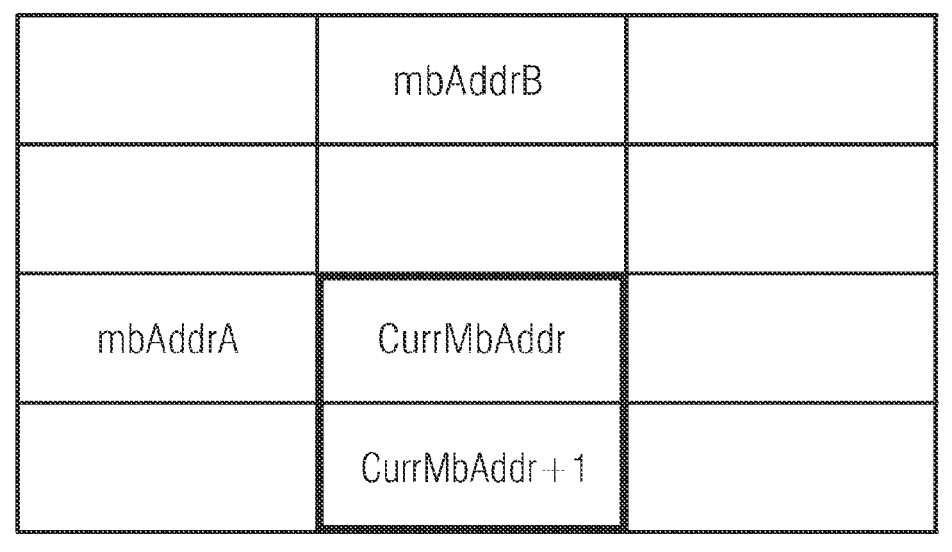

Before describing in detail the dependency of the context model assignment on the syntax element of neighboring blocks, with respect to FIG. 34, it is described, how the addresses of the top macroblock of the macroblock pair to the left and above the current macroblock pair may be computed, since these are the possible candidates, which comprise the syntax element in the block to the left of and above the current block containing the current syntax element to be encoded. In order to illustrate the spatial relationships, in FIG. 34, a portion of six macroblock pairs of a video frame is shown, wherein each rectangle region in FIG. 34 corresponds to one macroblock and the first and the second two vertically adjacent macroblocks in each column form a macroblock pair.

In FIG. 34, CurrMbAddr denotes the macroblock address of the top macroblock of the current macroblock pair, the current syntax element is associated with or relates to. The current macroblock pair is encompassed by bold lines. In other words, they form the border of a macroblock pair. mbAddrA and mbAddrB denote the addresses of the top macroblocks of the macroblock pairs to the left and above the current macroblock pair, respectively.

In order to compute the addresses of the top macroblock of the neighboring macroblock pair to the left and above the current macroblock pair, context modeler 2112 computes $$MbAddrA = 2 \cdot (CurrMbAddr/2 - 1)$$

$$MbAddrB = 2 \cdot (CurrMbAddr/2 - PicWidthInMbs)$$

where PicWidthInMbs specifies the picture within units of macroblocks. The equations given above can be understood by looking at FIG. 30. It is noted that in FIG. 30 the picture width in units of macroblocks has been denoted i. It is further noted that the equations given above are also true when the current macroblock address CurrMbAddress is interchanged with the odd numbered macroblock address of the bottom macroblock of the current macroblock pair, i.e., CurrMbAddress+1, because in the equation above, "/" denotes an integer division with transaction of the result towards zero. For example, 7/4 and −7/−4 are truncated to 1 and −7/4 and 7/−1 are truncated to −1.

Now, after having described how to compute neighboring macroblocks, it is briefly recalled that each macroblock contains 16×16 luma samples. These luma samples are divided up into four 8×8 luma blocks. These luma blocks may be further subdivided into 4×4 luma blocks. Furthermore, for the following description, each macroblock further comprises 8×8 luma samples, i.e., the pixel width of the chroma samples being doubled compared to luma samples. These 8×8 chroma samples of a macroblock are divided up into four 4×4 luma blocks. The blocks of a macroblock are numbered. Accordingly, the four 8×8 luma blocks each have a respective block address uniquely indicating each 8×8 block in the macroblock. Next, each pixel sample in a macroblock belongs to a position (x, y) wherein (x, y) denotes the luma or chroma location of the upper-left sample of the current block in relation to the upper-left luma or chroma sample of the macroblock. For example, with respect to luma samples, the pixel 2023 in top macroblock 2252 in FIG. 31b would have the pixel position (2, 1), i.e., third column, second row.

After having described this, the derivation process of ctxIdx for at least some of the bins of syntax elements listed in the above table is described.

With respect to the syntax element mb_skip_flag, the context modeler assignment depends on syntax elements relating to neighboring macroblocks. Thus, in order to determine the context index ctxIdx the addresses mbAddrA and mbAddrB are determined as described above. Then, let condTermN (with N being either A or B) be a variable that is set as follows:
If mbAddrN is not available or mb_skip_flag for the macroblock mbAddrN is equal to 1, conTermN is set to 0
Otherwise, condTermN is set to 1.
ctxIdx is derived based on an context index incrementor ctxIdxInc=conTermA+condTermB.

For the syntax element mb_field_decoding_flag, ctxIdx is determined as follows:
Let condTermN (with N being either A or B) be a variable that is set as follows.
If any of the following conditions is true, then condTermN is set to 0,
mbAddrN is not available
the macroblock mbAddrN is a frame macroblock.
Otherwise, condTermN is set to 1.
ctxIdx is derived based on an context index incrementor ctxIdxInc=condTermA+condTermB
wherein mbaddrN is not available, if
((((CurrMbAddr/2)/%(PicWidthInMbs))==0).

For the syntax element Mb_type, ctxIdx is determined dependent on the availability of macroblocks mbAddrN (with N being either A or B), and the syntax element Mb_type of this neighboring macroblocks.

With respect to the other syntax element listed in the above table, the dependency of the context modeler assignment is defined accordingly, wherein for syntax elements, which relate to blocks smaller than a macroblock, the assignment is also dependent on syntax element relating to such smaller blocks being smaller than macroblocks. For example, for the syntax element coded_block_pattern, the context index assignment is dependent not only on the availability of macroblock MbAddrN and the syntax element Mb_type of the macroblock MbAddrN but also on the syntax element Coded block_pattern of the neighboring block. Further, it is worth noting that the syntax elements listed above are all dependent on the respective syntax element of the neighboring block. Differing thereto, the context model assignment of syntax elements mvd_l0, mvd_l1, ref_idx_l0 and ref_idx_l1 is not dependent on the respective syntax elements of the neighboring block. The context modeler assignment for intra_chroma_pred_mode is dependent on mbAddrN availability, macroblock mbAddrN being coded in inter prediction mode or not, Mb_type for the macroblock mbAddrN and the syntax element intra_chroma_pred_mode for the macroblock MbAddrN. The syntax element coded_block_flag context model assignment is dependent on the availability of MbAddrN, the current macroblock being coded in inter prediction mode, Mb_type for the macroblock mbAddrN and the syntax element coded_block_flag of the neighboring block.

In the following, it is described, how a neighboring block is determined. In particular, this involves computing mbAddrN and the block index indexing the sub-part of the macroblock MbAddrN, this sub-part being the neighboring block of the current block.

The neighborhood for slices using macroblock adaptive frames/field coding as described in the following in accordance with an embodiment of the present invention is defined in a way that guarantees that the areas covered by neighboring blocks used for context modeling in context adaptive binary entropy coding inside an MBAFF-frame adjoin to the area covered by the current block. This generally improves the coding efficiency of a context adaptive entropy coding scheme as it is used here in connection with the coding of MBAFF-slices in comparison to considering each macroblock pair as frame macroblock pair for the purpose of context modeling as described in the introductory portion of the specification, since the conditional probabilities estimated during the coding process are more reliable.

The general concept of defining the neighborhood between a current and a reference block is described in the following section 1.1. In section 1.2, a detailed description, which specifies how the neighboring blocks, macroblocks, or partitions to the left of and above the current block, macroblock, or partition are obtained for the purpose of context modeling in context adaptive binary entropy coding, is given.

1.1. General Concept Neighborhood Definition

Let (x, y) denote the luma or chroma location of the upper-left sample of the current block in relation to the upper-left luma or chroma sample of the picture CurrPic. The variable CurrPic specifies the current frame, which is obtained by interleaving the top and the bottom field, if the current block is part of a macroblock pair coded in frame mode (mb_field_decoding_flag is equal to 0). If the current block is or is part of a top field macroblock, CurrPic specifies the top field of the current frame; and if the current block is or is part of a bottom field macroblock, CurrPic specifies the bottom field of the current frame.

Let (xA, yA) and (xB, yB) denote the luma or chroma location to the left of and above the location (x, y), respectively, inside the picture CurrPic. The locations (xA, yA) and (xB, yB) are specified by $$(xA, yA) = (x-1, y)$$

$$(xB, yB) = (x, y-1)$$

The block to the left of the current block is defined as the block that contains the luma or chroma sample at location (xA, yA) relative to the upper-left luma or chroma sample of the picture CurrPic and the block above the current block is defined as the block that contains the luma or chroma sample at location (xB, yB) relative to the upper-left luma or chroma sample of the picture CurrPic. If (xA, yA) or (xB, yB) specify a location outside the current slice, the corresponding block is marked as not available.

1.2. Detailed Description of Neighborhood Definition

The algorithm described in Sec. 1.2.1 specifies a general concept for MBAFF-slices that describes how a luma sample location expressed in relation to the upper-left luma sample of the current macroblock is mapped onto a macroblock address, which specifies the macroblock that covers the corresponding luma sample, and a luma sample location expressed in relation to the upper-left luma sample of that macroblock. This concept is used in the following Sec. 1.2.2-1.2.6.

The Sec. 1.2.2-1.2.6 describe how the neighboring macroblocks, 8×8 luma blocks, 4×4 luma blocks, 4×4 chroma block, and partitions to the left of and above a current macroblock, 8×8 luma block, 4×4 luma block, 4×4 chroma block, or partition are specified. These neighboring macroblock, block, or partitions are needed for the context modeling of CABAC for the following syntax elements: mb_skip_flag, mb_type, coded_block_pattern, intra_chroma_pred_mode, coded_block_flag, ref_idx_l0, ref_idx_l1, mvd_l0, mvd_l1.

1.2.1 Specification of Neighboring Sample Locations

Let (xN, yN) denote a given luma sample location expressed in relation to the upper-left luma sample of the current macroblock with the macroblock address CurrMbAddr. It is recalled that in accordance with the present embodiment each macroblock comprises 16×16 luma samples. xN and yN lie within −1 . . . 16. Let mbAddrN be the macroblock address of the macroblock that contains (xN, yN), and let (xW,yW) be the, location (xN, yN) expressed in relation to the upper-left luma sample of the macroblock mbAddrN (rather than relative to the upper-left luma sample of the current macroblock).

Let mbAddrA and mbAddrB specify the macroblock address of the top macroblock of the macroblock pair to the left of the current macroblock pair and the top macroblock of the macroblock pair above the current macroblock pair, respectively. Let PicWidthInMbs be a variable that specifies the picture width in units of macroblocks. mbAddrA and mbAddrB are specified as follows.

$$mbAddrA = 2*(CurrMbAddr/2 - 1)$$

If mbAddrA is less than 0, or if (CurrMbAddr/2) % PicWidthInMbs is equal to 0, or if the macroblock with address mbAddrA belongs to a different slice than the current slice, mbAddrA is marked as not available.

$$mbAddrB = 2*(CurrMbAddr/2 - PicWidthInMbs)$$

If mbAddrB is less than 0, or if the macroblock with address mbAddrB belongs to a different slice than the current slice, mbAddrB is marked as not available.

The Table in FIG. 35 specifies the macroblock address mbAddrN and a variable yM in the following two ordered steps:

1. Specification of a macroblock address mbAddrX (fifth column) depending on (xN, yN) (first and second column) and the following variables:
   The variable currMbFrameFlag (third column) is set to 1, if the current macroblock with address CurrMbAddr is a part of a frame macroblock pair; otherwise it is set to 0.
   The variable mb1sTopMbFlag (forth column) is set to 1, if CurrMbAddr %2 is equal to 0; otherwise it is set to 0.
2. Depending on the availability of mbAddrX (fifth column), the following applies:
   If mbAddrX (which can be either mbAddrA or mbAddrB) is marked as not available, mbAddrN is marked as not available.
   Otherwise (mbAddrX is available), mbAddrN is marked as available and Table 1-specifies mbAddrN and yM depending on (xN, yN) (first and second column), currMbFrameFlag (third column), mbIsTopMbFlag (forth column), and the variable mbAddrXFrameFlag (sixth column), which is derived as follows:
   mbAddrXFrameFlag is set to 1, if the macroblock mbAddrX is a frame macroblock; otherwise it is set to 0.

Unspecified values of the above flags in Table 1 indicate that the value of the corresponding flags is not relevant for the current table rows.

To summarize: in the first four columns, the input values xN, yN, currMbFrameFlag and MblsTopMbFlag are entered. In particular, the possible input values for parameters xN and yN are −1 to 16, inclusive. These parameters determine mbAddrX listed in the fifth column, i.e. the macroblock pair containing the wanted luma sample. The next two columns, i.e., the sixth and the seventh column, are needed to obtain the final output mbAddrN and yN. These further input parameters are MbAddrXFrameFlag indicating as to whether a macroblock pair indicated by mbAddrX is frame or field coded, and some additional conditions concerning as to whether yN is even or odd numbered or is greater than or equal to 8 or not.

As can be seen, when xN and yN are both positive or zero, i.e., the wanted pixel sample lies within the current macroblock relative to which xN and yN are defined, the output macroblock address does not change, i.e., it is equal to CurrMbAddr. Moreover, yM is equal yM. This changes when the input xM and yM indicates a pixel sample lying outside the current macroblock, i.e., to the left (xN<0) all to the top of the current macroblock (yN<0).

Outgoing from the result of the table of FIG. 35, the neighboring luma location (xW, yW) relative to the upper-left luma sample of the macroblock-mbAddrN is specified as $$xW = (xN+16)\%16$$

$$yW = (yM+16)\%16.$$

It is emphasized that the aforementioned considerations pertained for illustrative purposes merely luma samples. The considerations are slightly different when considering chroma samples since a macroblock contains merely 8×8 chroma samples.

1.2.2 Specification of Neighboring Macroblocks

The specification of the neighboring macroblocks to the left of and above the current macroblock is used for the context modeling of CABAC for the following syntax elements: mb_skip_flag, mb_type, coded_block_pattern, intra_chrome_prediction_mode, and coded_block_flag.

Let mbAddrA be the macroblock address of the macroblock to the left of the current macroblock, and mbAddrB be the macroblock address of the macroblock above the current macroblock.

mbAddrA, mbAddrB, and their availability statuses are obtained as follows:
   mbAddrA and its availability status are obtained as described in Sec. 1.2.1 given the luma location (xN, yN)=(−1, 0).
   mbAddrB and its availability status are obtained as described in Sec. 1.2.1 given the luma location (xN, yN)=(0, −1).

1.2.3 Specification of Neighboring 8×8 Luma Blocks

The specification of the neighboring 8×8 luma blocks to the left of and above the current 8×8 luma block is used for the context modeling of CABAC for the syntax element coded_block_pattern.

Let luma8×8BlkIdx be the index of the current 8×8 luma block inside the current macroblock CurrMbAddr. An embodiment of the assignment of block index luma 8×8BlkIdx to the respective blocks within a macroblock is shown in FIG. 9 (upper-right corner).

Let mbAddrA be the macroblock address of the macroblock that contains the 8×8 luma block to the left of the current 8×8 luma block, and let mbAddrB be the macroblock address of the macroblock that contains the 8×8 luma block above the current 8×8 luma block. Further, let luma8×8BlkIdxA be the 8×8 luma block index (inside the macroblock mbAddrA) of the 8×8 luma block to the left of the current 8×8 luma block, and let luma8×8BlkIdXB be the 8×8 luma block index (inside the macroblock mbAddrB) of the 8×8 luma block above the current 8×8 luma block.

mbAddrA, mbAddrB, luma8×8BlkIdxA, luma8×8BlkIdxB, and their availability statuses are obtained as follows:

- Let (xC, yC) be the luma location of the upper-left sample of the current 8×8 luma block relative to the upper-left luma sample of the current macroblock.
- mbAddrA, its availability status, and the luma location (xW, yW) are obtained as described in Sec. 1.2.1 given the luma location (xN, yN)=(xC−1, yC). If mbAddrA is available, then luma8×8BlkIdxA is set in a way that it refers to the 8×8 luma block inside the macroblock mbAddrA that covers the luma location (xW, yW); otherwise, luma8×8BlkIdA is marked as not available.
- mbAddrB, its availability status, and the luma location (xW, yW) are obtained as described in Sec. 1.2.1 given the luma location (xN, yN)=(xC, yC−1). If mbAddrB is available, then luma8×8BlkIdxB is set in a way that it refers to the 8×8 luma block inside the macroblock mbAddrB that covers the luma location (xW, yW); otherwise, luma8×8BlkIdxB is marked as not available.

1.2.4 Specification of Neighboring 4×4 Luma Blocks

The specification of the neighboring 4×4 luma blocks to the left of and above the current 4×4 luma block is used for the context modeling of CABAC for the syntax element coded_block_flag.

Let luma4×4BlkIdx be the index (in decoding order) of the current 4×4 luma block inside the current macroblock CurrMbAddr. For example, luma4×4BlkIdx could be defined as luma8×8BlkIdx of the 8×8 block containing the 4×4 block multiplied by 4 plus the partition number as shown in the bottom-right corner of FIG. 9.

Let mbAddrA be the macroblock address of the macroblock that contains the 4×4 luma block to the left of the current 4×4 luma block, and let mbAddrB be the macroblock address of the macroblock that contains the 4×4 luma block above the current 4×4 luma block. Further, let luma4×4BlkIdxA be the 4×4 luma block index (inside the macroblock mbAddrA) of the 4×4 luma block to the left of the current 4×4 luma block, and let luma4×4BlkIdxB be the 4×4 luma block index (inside the macroblock mbAddrB) of the 4×4 luma block above the current 4×4 luma block.

mbAddrA, mbAddrB, luma4×4BlkIdxA, luma4×4BlkIdxB, and their availability statuses are obtained as follows:

- Let (xC, yC) be the luma location of the upper-left sample of the current 4×4 luma block relative to the upper-left luma sample of the current macroblock.
- mbAddrA, its availability status, and the luma location (xW, yW) are obtained as described in Sec. 1.2.1 given the luma location (xN, yN)=(xC−1, yC). If mbAddrA is available, then luma4×4BlkIdxA is set in a way that it refers to the 4×4 luma block inside the macroblock mbAddrA that covers the luma location (xW, yW); otherwise, luma4×4BlkIdxA is marked as not available.
- mbAddrB, its availability status, and the luma location (xW, yW) are obtained as described in Sec. 1.2.1 given the luma location (xN, yN)=(xC, yC−1). If mbAddrB is available, then luma4×4BlkIdxB is set in a way that it refers to the 4×4 luma block inside the macroblock mbAddrB that covers the luma location (xW, yW); otherwise, luma4×4BlkIdxB is marked as not available.

1.2.5 Specification of Neighboring 4×4 Chroma Blocks

The specification of the neighboring 4×4 chroma blocks to the left of and above the current 4×4 chroma block is used for the context modeling of CABAC for the syntax element coded_block_flag.

Let chroma4×4BlkIdx be the index (in decoding order) of the current 4×4 chroma block inside the current macroblock CurrMbAddr.

Let mbAddrA be the macroblock address of the macroblock that contains the 4×4 chroma block to the left of the current 4×4 chroma block, and let mbAddrB be the macroblock address of the macroblock that contains the 4×4 chroma block above the current 4×4 chroma block. Further, let chroma4×4BlkIdxA be the 4×4 chroma block index (inside the macroblock mbAddrA) of the 4×4 chroma block to the left of the current 4×4 chroma block, and let chroma4×4BlkIdxB be the 4×4 chroma block index (inside the macroblock mbAddrB) of the 4×4 chroma block above the current 4×4 chroma block.

mbAddrA, mbAddrB, chroma4×4BlkIdxA, chroma4×4BlkIdxB, and their availability statuses are obtained as follows:

- Given luma8×8BlkIdx=chroma4×4BlkIdx, the variables mbAddrA, mbAddrB, luma8×8BlkIdxA, luma8×8BlkIdxB, and their availability statuses are obtained as described in Sec. 1.2.3.
- If luma8×8BlkIdxA is available, chroma4×4BlkIdxA is set equal to luma8×8BlkIdxA; otherwise chroma4×4BlkIdxA is marked as not available.
- If luma8×8BlkIdxB is available, chroma4×4BlkIdxB is set equal to luma8×8BlkIdxB; otherwise chroma4×4BlkIdxB is marked as not available.

1.2.6 Specification of Neighboring Partitions

The specification of the neighboring partitions to the left of and above the current partition is used for the context modeling of CABAC for the following syntax elements: ref_idx_l0, ref_idx_l1, mvd_l0, mvd_l1.

Let mbPartIdx and subMbPartIdx be the macroblock partition and sub-macroblock partition indices that specify the current partition inside the current macroblock CurrMbAddr. An example for such partition indices is shown in FIG. 36.

Let mbAddrA be the macroblock address of the macroblock that contains the partition to the left of the current partition, and let mbAddrB be the macroblock address of the macroblock that contains the partition above the current partition. Further, let mbPartIdxA and subMbPartIdxA be the macroblock partition and sub-macroblock partition indices (inside the macroblock mbAddrA) of the partition to the left of the current partition, and let mbPartIdxB and subMbPartIdxB be the macroblock partition and sub-macroblock partition indices (inside the macroblock mbAddrB) of the partition above the current partition.

mbAddrA, mbAddrB, mbPartIdxA, subMbPartIdxA, mbPartIdxB, subMbPartIdxB, and their availability statuses are obtained as follows:

- Let (xC, yC) be the luma location of the upper-left sample of the current partition given by mbPartIdx and subMbPartIdx relative to the upper-left luma sample of the current macroblock.
- mbAddrA, its availability status, and the luma location (xW, yW) are obtained as described in Sec. 1.2.1 given the luma location (xN,yN)=(xC−1, yC). If mbAddrA is not available, mbPartIdxA and subMbPartIdxA are marked as not available; otherwise mbPartIdxA is set in a way that it refers to the macroblock partition inside the macroblock mbAddrA that covers the luma location (xW, yW), and subMbPartIdxA is set in a way that it refers to the sub-macroblock partition inside the macroblock partition mbPartIdxA (inside the macroblock mbAddrA) that covers the luma location (xW, yW).
- mbAddrB, its availability status, and the luma location (xW, yW) are obtained as described in Sec. 1.2.1 given the luma location (xN, yN)=(xC, yC−1). If mbAddrB is not available, mbPartIdxB and subMbPartIdxB are marked as not available; otherwise mbPartIdxB is set in a way that it refers to the macroblock partition inside the macroblock mbAddrB that covers the luma location (xW, yW), and subMbPartIdxB is set in a way that it refers to the sub-macroblock partition inside the macroblock partition mbPartIdxB (inside the macroblock mbAddrB) that covers the luma location (xW, yW).

Figure 37:
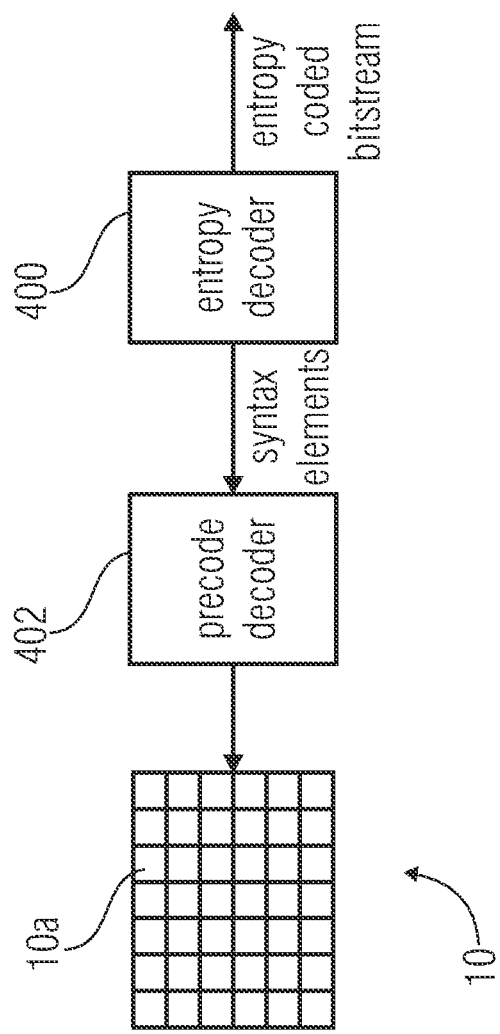
FIG. 37 shows a high-level block diagram of a decoding environment in which the present invention may be employed.
Figure 38:
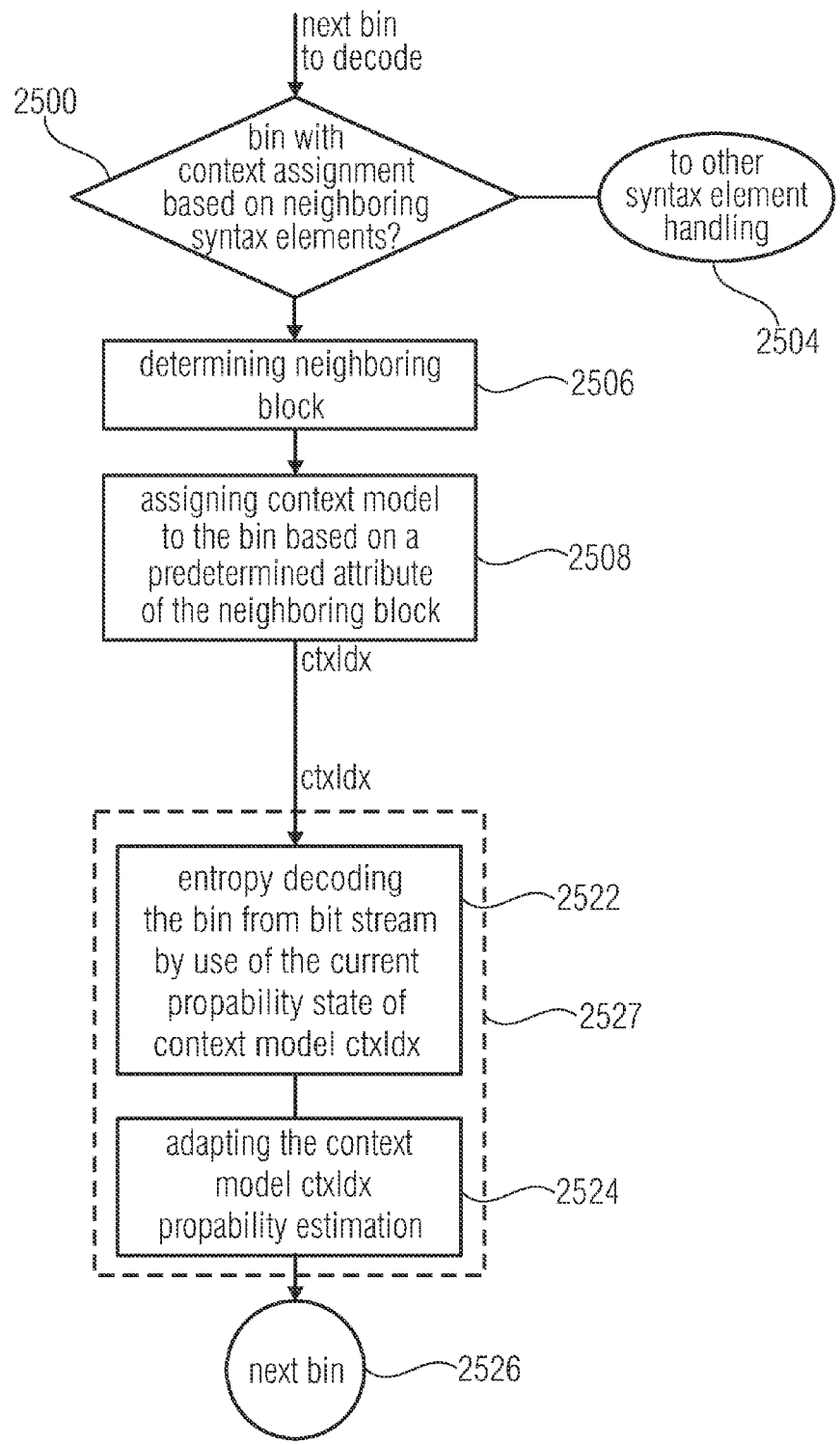
FIG. 38 shows a flow diagram illustrating the decoding of the syntax elements coded as shown in FIGS. 32 and 33 from the coded bit stream.
Figure 39:
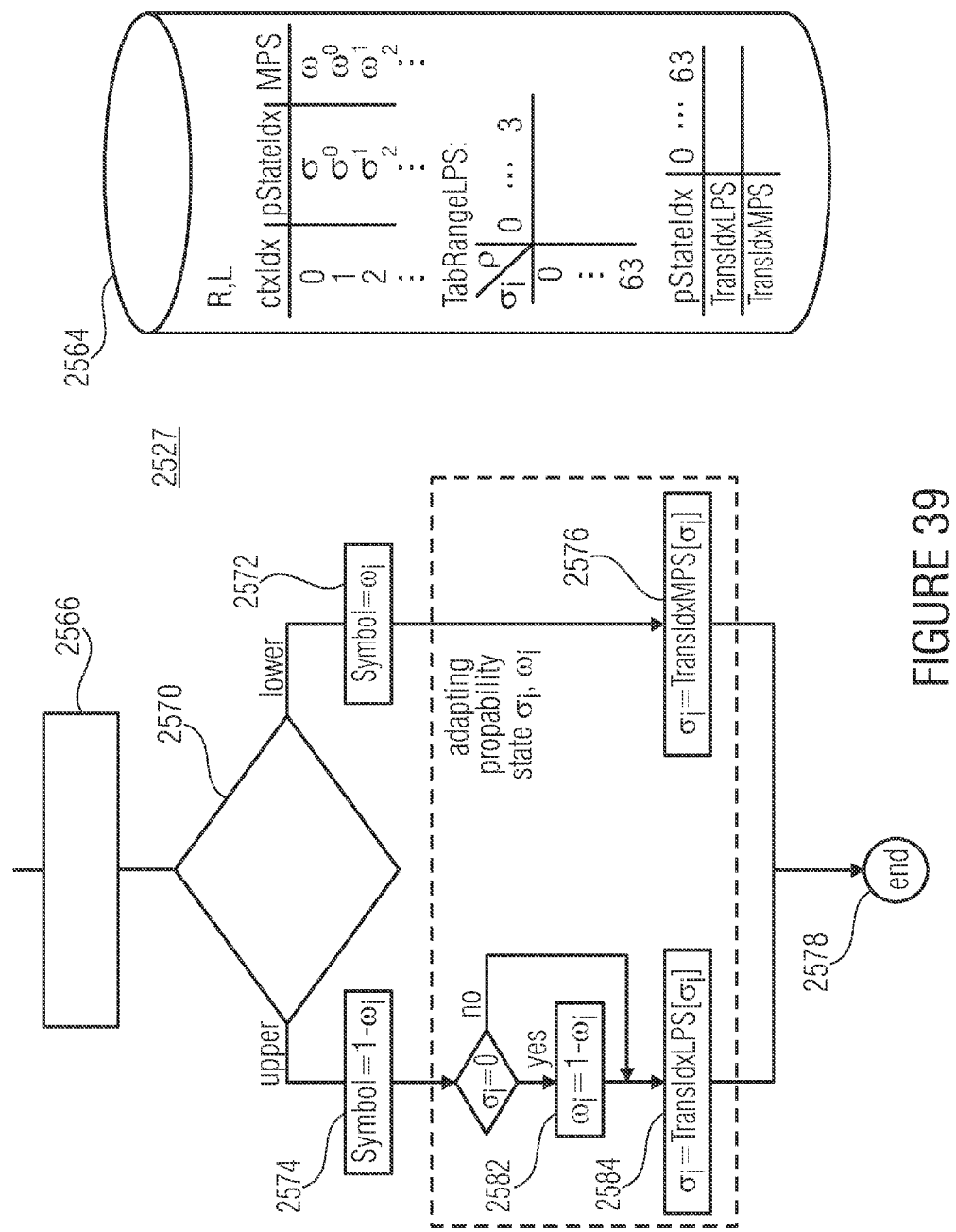
FIG. 39 shows a flow diagram illustrating the entropydecoding process and the decoding process of FIG. 3.

After having described how to encode the above syntax elements or the bin strings or part of their bins into an entropy coded bit stream, the decoding of said bit stream and the retrieval of the bins is described with respect to FIGS. 37 to 39

FIG. 37 shows a general view of a video decoder environment to which the present invention could be applied. An entropy decoder 400 receives the entropy coded bit stream as described above and treats it as will be described in more detail below with respect to FIGS. 38-39. In particular, the entropy decoder 2400 decodes the entropy coded bit stream by binary entropy decoding in order to obtain the precoded video signal and, in particular, syntax elements contained therein and passes same to a precode decoder 2402. The precode decoder 2402 uses the syntax elements, such as motion vector components and flags, such as the above listed syntax elements, in order to retrieve, macroblock by macroblock and then slice after slice, the picture samples of pixels of the video frames 2010.

FIG. 38 now shows the decoding process performed by the entropy decoder 2400 each time a bin is to be decoded. Which bin is to be decoded depends on the syntax element which is currently expected by entropy decoder 2400. This knowledge results from respective parsing regulations.

In the decoding process, first, in step 2500, the decoder 2400 checks as to whether the next bin to decode is a bin of a syntax element of the type corresponding to context model assignment based on neighboring syntax elements. If this is not the case, decoder 2400 proceeds to another syntax element handling in step 2504. However, if the check result in step 2500 is positive, decoder 2400 performs in steps 2506 and 2508 a determination of the neighboring block of the current block which the current bin to decode belongs to and an assignment of a context model to the bin based on a predetermined attribute of the neighboring block determined in step 2506, wherein steps 2506 and 2508 correspond to steps 2306 and 2308 of encoding process of FIG. 32. The result of these steps is the context index ctxIdx. Accordingly, the determination of ctxIdx is performed in steps 2506 and 2508 in the same way as in the encoding process of FIG. 32 in steps 2306 and 2308 in order to determine the context model to be used in the following entropy decoding.

Then, in step 2522, the entropy decoder 2400 entropy decodes the actual bin, from the entropy coded bit stream by use of the actual probability state of the context module as indexed by ctxIdx obtained in steps 2510 to 2520. That is, the entropy decoder 2400 comprises a regular decoding engine that corresponds to any of the above-described entropy decoders having a plurality of entropy decoders inside, each associated with a respective partial bitstream. In step 2522 the bin is requested from that partial bitstream which is indexed by the probability index or, at least, depending therefrom. The result of this step is the value for the actual bin.

Thereafter, in step 2524, the ctxIdx probability state is adapted or updated, as it was the case in step 2224. Thereafter, the process ends at step 2526.

Of course, the individual bins that are obtained by the process shown in FIG. 38 represent the syntax element value merely in case the syntax element is of a binary type. Otherwise, a step corresponding to the binarization has to be performed in reverse manner in order to obtain from the bin strings the actual value of the syntax element.

FIG. 39 shows the steps 2522 and 2524 being encompassed by dotted line 1527 in more detail on the left hand side. On the right hand side, indicated with 2564, FIG. 38 shows a memory and its content to which entropy decoder 2400 has access in order to load, store and update variables. As can be seen, entropy decoder manipulates or manages the same variables as entropy coder 2014 since entropy decoder 2400 emulates the encoding process as will be described in the following.

In a first step 2566, decoder 2400 obtains the value of the current bin from the partial bitstream indexed by the probability index associated with the respective context.

However, the value is yet indicated in relative terms with respect the values MPS and LPS. Therefore, in step 2570 decoder 2400 checks as to whether the value of the entropy coding codeword in the entropy coded bit stream was the most probable symbol as indicated by $\omega_i$, in which case decoder 2400 accordingly sets the bin value to the value of $\omega_i$, in step 2572. In the other case, decoder 2400 sets the symbol to be 1−$\omega_i$ in step 2574.

After step 2572, in step 2576, the decoder 2400 adapts or updates the probability state of the current context model i as defined by $\omega_i$ and $\omega_i$ by transitioning the probability state index $\omega_i$ as was described with respect to step 2338 in FIG. 36. Thereafter, the process 2527 ends at step 2578.

After step 2574, decoder 2400 adapts or updates the probability state in steps 2582 and 2584 by computing $\omega_i$=1−$\omega_i$ in step 2582, if $\omega_i$ is equal to 0, and transitioning the probability state index $\omega_i$ to a new probability state index in the same way as described with respect to step 2346 in FIG. 36. Thereafter, the process ends at step 2578.

After having described specific embodiments, it is noted that same are not restricted to these embodiments. In particular, the assignment in accordance with steps 2308 and 2408 does not have to be dependent on syntax elements of neighboring blocks, i.e., syntax elements contained in the precoded video signal output by precoder 2012. Rather, the assignment may be dependent on other attributes of the neighboring blocks. Moreover, the definition of neighborhoods between neighboring blocks is described with respect to the table of FIG. 35 may be varied. Further, the pixel samples of the two interlaced fields could be arranged in another way than described above.

Moreover, other block sizes than 4×4 blocks could be used as a basis for the transformation, and, although in the above embodiment the transformation was applied to picture sample differences to a prediction, the transformation could be as well applied to the picture sample itself without performing a prediction. Furthermore, the type of transformation is not critical.

DCT could be used as well as a FFT or wavelet transformation. Furthermore, the example outlined is not restricted to binary entropy encoding/decoding. Rather, same can be applied to multi-symbol entropy encoding as well. Additionally, the sub-divisions of the video frame into slices, macroblock pairs, macroblocks, picture elements etc. was for illustrating purposes only, and this is not to restrict the scope of the examples.

Figure 40:
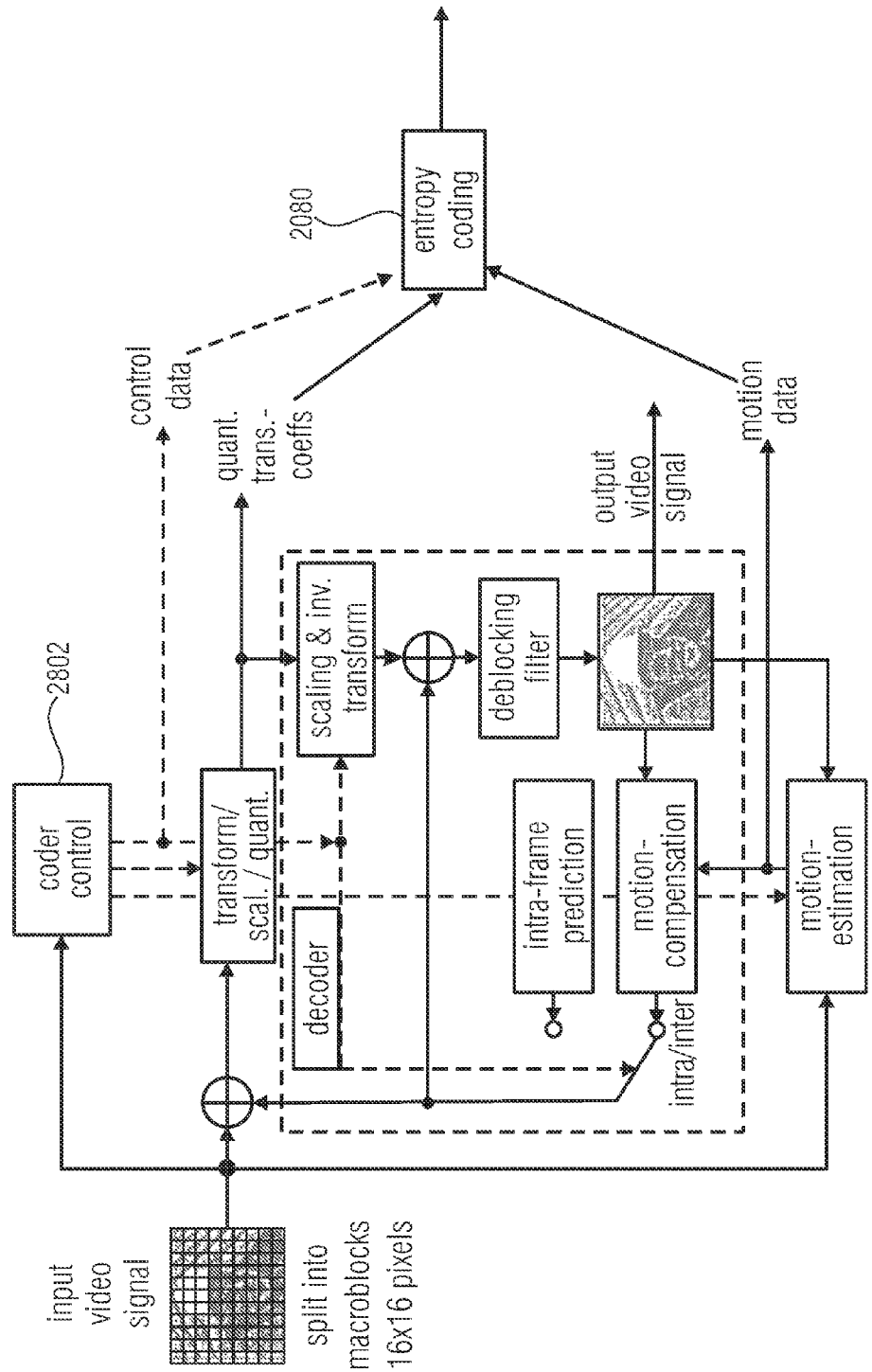
FIG. 40 shows a basic coding structure for the emerging H.264/AVC video encoder for a macroblock.

In the following, reference is made to FIG. 40 to show, in more detail than in FIG. 28, the complete setup of a video encoder engine including an entropy-encoder as it is shown in FIG. 40 in block 2800 in which the aforementioned entropy coding of syntax elements by use of a context assignment based on neighboring syntax elements is used. In particular, FIG. 40 shows the basic coding structure for the emerging H.264/AVC standard for a macroblock. The input video signal is, split into macroblocks, each macroblock having 16×16 luma pixels. Then, the association of macroblocks to slice groups and slices is selected, and, then, each macroblock of each slice is processed by the network of operating blocks in FIG. 40. It is to be noted here that an efficient parallel processing of macroblocks is possible, when there are various slices in the picture. The association of macroblocks to slice groups and slices is performed by means of a block called coder control 2802 in FIG. 40. There exist several slices, which are defined as follows:

I slice: A slice in which all macroblocks of the slice are coded using intra prediction.

P slice: In addition, to the coding types of the I slice, some macroblocks of the P slice can also be coded using inter prediction with at most one motion-compensated prediction signal per prediction block.

B slice: In addition, to the coding types available in a P slice, some macroblocks of the B slice can also be coded using inter prediction with two motion-compensated prediction signals per prediction block.

The above three coding types are very similar to those in previous standards with the exception of the use of reference pictures as described below. The following two coding types for slices are new:

SP slice: A so-called switching P slice that is coded such that efficient switching between different precoded pictures becomes possible.

SI slice: A so-called switching I slice that allows an exact match of a macroblock in an SP slice for random access and error recovery purposes.

Figure 42:
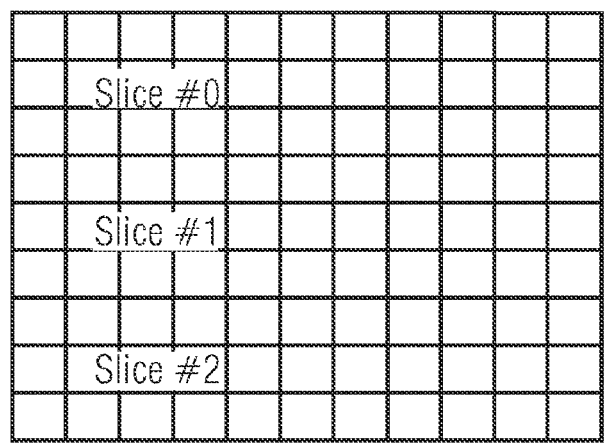
FIG. 42 shows an illustration of the subdivision of a picture into slices.

Slices are a sequence of macroblocks, which are processed in the order of a raster scan when not using flexible macroblock ordering (FMO). A picture may be split into one or several slices as shown in FIG. 42. A picture is therefore a collection of one or more slices. Slices are self-contained in the sense that given the active sequence and picture parameter sets, their syntax elements can be parsed from the bit stream and the values of the samples in the area of the picture that the slice represents can be correctly decoded without use of data from other slices provided that utilized reference pictures are identical at encoder and decoder. Some information from other slices maybe needed to apply the deblocking filter across slice boundaries.

FMO modifies the way how pictures are partitioned into slices and macroblocks by utilizing the concept of slice groups. Each slice group is a set of macroblocks defined by a macroblock to slice group map, which is specified by the content of the picture parameter set and some information from slice headers. The macroblock to slice group map consists of a slice group identification number for each macroblock in the picture, specifying which slice group the associated macroblock belongs to. Each slice group can be partitioned into one or more slices, such that a slice is a sequence of macroblocks within the same slice group that is processed in the order of a raster scan within the set of macroblocks of a particular slice group. (The case when FMO is not in use can be viewed as the simple special case of FMO in which the whole picture consists of a single slice group.)

Using FMO, a picture can be split into many macroblock-scanning patterns such as interleaved slices, a dispersed macroblock allocation, one or more "foreground" slice groups and a "leftover" slice group, or a checker-board type of mapping.

Each macroblock can be transmitted in one of several coding types depending on the slice-coding type. In all slice-coding types, the following types of intra coding are supported, which are denoted as Intra_4×4 or Intra_16×16 together with chroma prediction and I_PCM prediction modes.

The Intra_4×4 mode is based on predicting each 4×4 luma block separately and is well suited for coding of parts of a picture with significant detail. The Intra_16×16 mode, on the other hand, does prediction of the whole 16×16 luma block and is more suited for coding very smooth areas of a picture.

In addition, to these two types of luma prediction, a separate chroma prediction is conducted. As an alternative to Intra_4×4 and Intra_16×16, the I_PCM coding type allows the encoder to simply bypass the prediction and transform coding processes and instead directly send the values of the encoded samples. The I_PCM mode serves the following purposes:
1. It allows the encoder to precisely represent the values of the samples
2. It provides a way to accurately represent the values of anomalous picture content without significant data expansion
3. It enables placing a hard limit on the number of bits a decoder must handle for a macroblock without harm to coding efficiency.

In contrast to some previous video coding standards (namely H.263+ and MPEG-4 Visual), where intra prediction has been conducted in the transform domain, intra prediction in H.264/AVC is conducted in the spatial domain, by referring to the bins of neighboring samples of previously coded blocks which are to the left and/or above the block to be predicted. This may incur error propagation in environments with transmission errors that propagate due to motion compensation into inter-coded macroblocks. Therefore, a constrained intra coding mode can be signaled that allows prediction only from intra-coded neighboring macroblocks.

Figure 41:
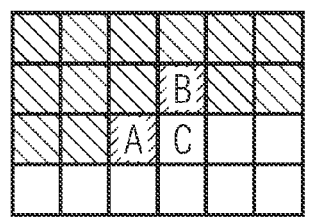
FIG. 41 illustrates a context template consisting of two neighboring syntax elements A and B to the left and on the top of the current syntax element C.

When using the Intra_4×4 mode, each 4×4 block is predicted from spatially neighboring samples as illustrated on the left-hand side of FIG. 43. The 16 samples of the 4×4 block, which are labeled as a-p, are predicted using prior decoded samples in adjacent blocks labeled as A-Q. For each 4×4 block one of nine prediction modes can be utilized. In addition, to "DC" prediction (where one value is used to predict the entire 4×4 block), eight directional prediction modes are specified as illustrated on the right-hand side of FIG. 41. Those modes are suitable to predict directional structures in a picture such as edges at various angles.

In addition, to the intra macroblock coding types, various predictive or motion-compensated coding types are specified as p macroblock types. Each p macroblock type corresponds to a specific partition of the macroblock into the block shapes used for motion-compensated prediction. Partitions with luma block sizes of 16×16, 16×8, 8×16, and 8×8 samples are supported by the syntax. In case partitions with 8×8 samples are chosen, one additional syntax element for each 8×8 partition is transmitted. This syntax element specifies whether the corresponding 8×8 partition is further partitioned into partitions of 8×4, 4×8, or 4×4 luma samples and corresponding chroma samples.

The prediction signal for each predictive-coded M×N luma block is obtained by displacing an area of the corresponding reference picture, which is specified by a translational motion vector and a picture reference index. Thus, if the macroblock is coded using four 8×8 partitions and each 8×8 partition is further split into four 4×4 partitions, a maximum of sixteen motion vectors may be transmitted for a single p macroblock.

The quantization parameter SliceQP is used for determining the quantization of transform coefficients in H.264/AVC. The parameter can take 52 values. These values are arranged so that an increase of 1 in quantization parameter means an increase of quantization step size by approximately 12% (an increase of 6 means an increase of quantization step size by exactly a factor of 2). It can be noticed that a change of step size by approximately 12% also means roughly a reduction of bit rate by approximately 12%.

The quantized transform coefficients of a block generally are scanned in a zig-zag fashion and transmitted using entropy coding methods. The 2×2 DC coefficients of the chroma component are scanned in raster-scan order. All inverse transform operations in H.264/AVC can be implemented using only additions and bit-shifting operations of 16-bit integer values. Similarly, only 16-bit memory accesses are needed for a good implementation of the forward transform and quantization process in the encoder.

The entropy encoder 2800 in FIG. 40 in accordance with a coding arrangement described above with respect to FIG. 29. A context modeler feeds a context model, i.e., a probability information, to an entropy encoder, which is also referred to as the regular coding engine. The to be encoded bit, i.e. a bin, is forwarded from the context modeler to the regular coding engine. This bin value is also fed back to the context modeler so that a context model update can be obtained. A bypass branch is provided, which includes an entropy encoder, which is also called the bypass coding engine. The bypass coding engine is operative to entropy encode the input bin values. Contrary to the regular coding engine, the bypass coding engine is not an adaptive coding engine but works advantageously with a fixed probability model without any context adaption. A selection of the two branches can be obtained by means of switches. The binarizer device is operative to binarize non-binary valued syntax elements for obtaining a bin string, i.e., a string of binary values. In case the syntax element is already a binary value syntax element, the binarizer is bypassed.

In the co-called regular coding mode, prior to the actual entropy coding process the given binary decision, which, in the sequel, we will refer to as a bin, enters the context modeling stage, where a probability model is selected such that the corresponding choice may depend on previously encoded syntax elements or bins. Then, after the assignment of a context model the bin value along with its associated model is passed to the regular coding engine, where the final stage of entropy encoding together with a subsequent model updating takes place (see FIG. 29).

Alternatively, the bypass coding mode is chosen for selected bins in order to allow a speedup of the whole encoding (and decoding) process by means of a simplified coding engine without the usage of an explicitly assigned model. This mode is especially effective when coding the bins of the primary suffix of those syntax elements, concerning components of differences of motion vectors and transform coefficient levels.

In the following, the three main functional building blocks, which are binarization, context modeling, and binary entropy coding in the encoder of FIG. 40, along with their Example 5

In this example, example 4 is further extended and FIGS. 34, 35, 46-49. In accordance with the present example, binarizing a data value is performed by binarizing the minimum of the data value and a predetermined cut-off value in accordance with a first binarization scheme, in order to yield a primary prefix, and, if the data value is greater than the cut-off value, binarizing a difference of the data value minus the predetermined cut-off value in accordance with a second binarization scheme to obtain a binary suffix, the first binarization scheme being different from the second binarization scheme, and appending the primary suffix to the primary prefix.

A data value is recovered from a binarized representation of the data value, the binarized representation of the data value being a codeword having a primary prefix, which is a binarization of the minimum of the data value and a predetermined cut-off value in accordance with a first binarization scheme and, if the data value is greater than the predetermined cut-off value, a primary suffix appended to the primary prefix, the primary suffix being a binarization of the difference of the data value minus the predetermined cut-off value in accordance with a second binarization scheme, the method comprising extracting, from the primary prefix, the minimum, and, if the minimum is equal to the cut-off value, extracting, from the primary suffix, the difference from the data value minus the predetermined cut-off value. Then, the predetermined cut-off value is added to the difference, to obtain the data value, and, if the minimum is smaller than the cut-off value, the minimum is regarded as the data value.

A coding of a data value into a coded bit stream comprises binarizing the minimum of the data value and a predetermined cut-off value in accordance with a first binarization scheme, in order to yield a primary prefix, and, if the data value is greater than the cut-off value, binarizing a difference of the data value minus the predetermined cut-off value in accordance with a second binarization scheme to obtain a binary suffix, the first binarization scheme being different from the second binarization scheme, and appending the primary suffix to the primary prefix. Then, for each bit in the codeword, if the bit of the code word is part of the primary prefix, binary entropy coding the bit by means of a adaptively varying bit value probability estimation, is performed according to any of the above embodiments with probability estimation dependent partial bitstream selection, or, if the bit of the code word is part of the primary suffix, binary coding the bit by means of a static bit value probability estimation, is performed, thereby obtaining the coded bit stream.

Decoding a coded bit stream which represents a binarized representation of the data value is described, the binarized representation of the data value being a codeword having a primary prefix, which is a binarization of the minimum of the data value and a predetermined cut-off value in accordance with a first binarization scheme and, if the data value is greater than the predetermined cut-off value, a primary suffix appended to the primary prefix, the primary suffix being a binarization of the difference of the data value minus the predetermined cut-off value in accordance with a second binarization scheme, the method comprising, for each bit in the codeword, if the bit of the codeword is part of the primary prefix, determining the bit by binary entropy decoding the coded bit stream by means of a adaptively varying bit value probability estimation, namely by retrieving the bit via the partial bitstream associated with the probability estimation, and, if the bit of the codeword is part of the primary suffix, determining the bit by binary decoding the bit by means of a static bit value probability estimation, thereby obtaining the codeword. Then, the minimum is extracted from the primary prefix. If the minimum is equal to the cut-off value, the difference from the data value minus the predetermined cut-off value is extracted from the primary suffix and the predetermined cut-off value is added to the difference, to obtain the data value. If the minimum is smaller than the cut-off value, the minimum is regarded as the data value.

A very effective compression of data values, and, in particular, of components of motion vector differences or transform coefficient level values, forming syntax elements in a video signal, is achieved by using a binarization scheme for preparing the syntax elements for the entropy coding, the binarization scheme substantially being a combination of two different binarization schemes, and by using binary entropy coding instead of m-ary entropy coding for coding the binarized syntax elements.

The advantage of using a binary entropy coding engine instead of a m-ary entropy coder operating on an original m-ary source alphabet is that the complexity of the probability estimation is reduced since the determination of the probabilities for the two possible bit values can be defined by just one probability estimation value. Adaptive m-ary entropy coding, for m>2, would be in general a computationally complex operation necessitating a number of fairly complex operations to perform the update of the probability estimation.

In accordance with a specific embodiment, a concatenation of a truncated unary binarization scheme and a $k^{th}$ order exponential Golomb binarization scheme is used. This concatenated scheme, which is referred to as unary/$k^{th}$ order Exp-Golomb (UEGk) binarization, is applied to motion vector differences and absolute values of transform coefficient levels. The design of these concatenated binarization schemes is motivated by the following observations. First, the unary code is the simplest prefix-free code in terms of implementation cost. Secondly, it permits a fast adaptation of the individual symbol probabilities in a subsequent context modeling stage, since the arrangement of the nodes in the corresponding tree is typically such that with increasing distance of the internal nodes from the root node the corresponding binary probabilities are less skewed. These observations are accurate for small values of the absolute motion vector differences and transform coefficient levels. For larger values, there is not much use of an adaptive modeling having led to the idea of concatenating an adapted truncated unary tree as a prefix and a static Exp-Golomb code tree as a suffix. Typically, for larger values, the EGk suffix part represents already a fairly good fit to the observed probability distribution, as already mentioned above.

Figure 44:
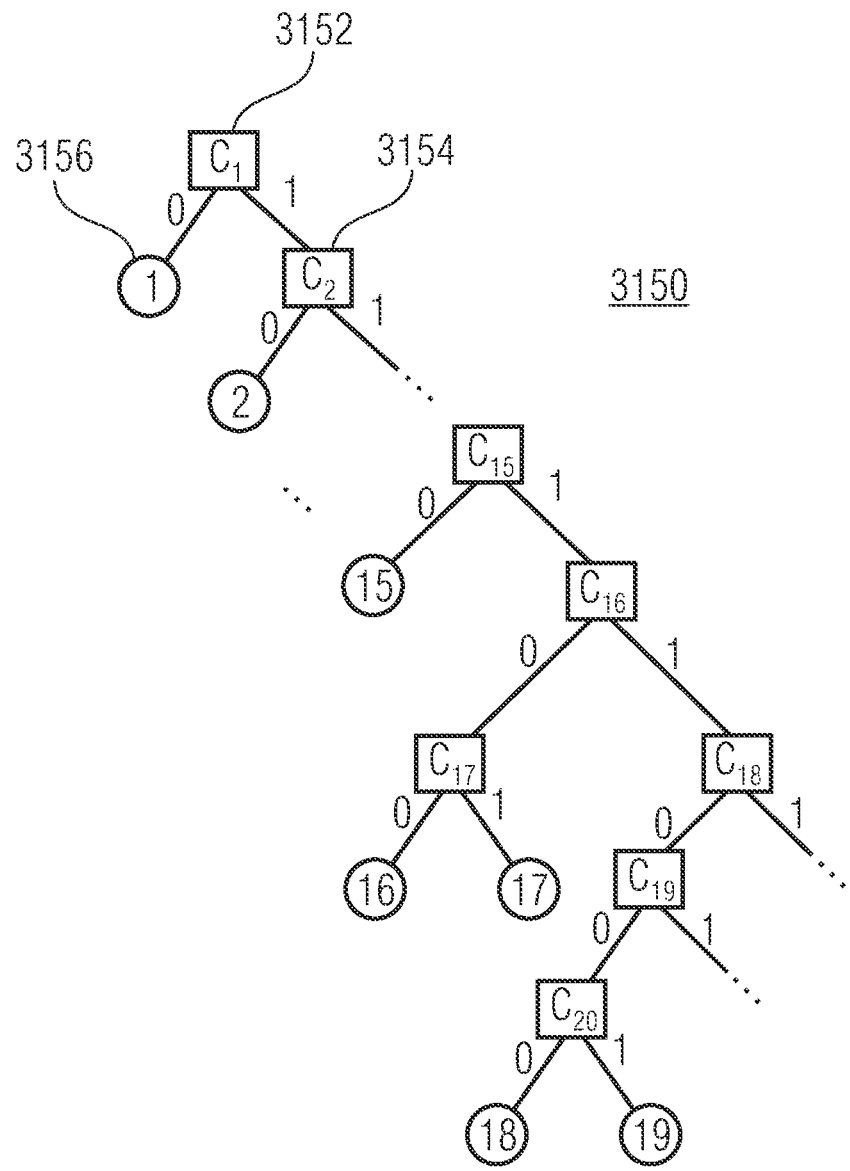
FIG. 44 a part of the binarization coding tree related to the binarization scheme FIG. 46.

In order to illustrate the relation between "bits" or bins of the codewords to which binarizer 2102 maps the syntax elements, on the one hand, and "bins", on the other hand, FIG. 44 shows a binary code tree corresponding to the binarization scheme later described with respect to FIG. 46. The code tree, generally indicated with reference number 3150 comprises a root node 3152 and several internal nodes 3154, the root node 3152 and the internal nodes 3154 being designated by $C_i$, with the index i being an integer associated with a corresponding node. Each of these nodes defines a conditional branch or binary decision called a "bin", with a left branch corresponding to the bin value 0 and the right branch corresponding to the bin value 1.

The tree 3150 also includes terminal nodes 3156. The numbers assigned to the terminal nodes 3156 in FIG. 44 correspond to the data value of the syntax element, which, in accordance with the binarization scheme of FIG. 46, corresponds to the codeword or bit string resulting form the bits or bin values when following the path from root node 3152 to the respective terminal node 3156. For example, the data value 17 corresponds, as shown in FIG. 46, to the codeword bit string 11111111111111101. The path comprises root node 3152 and the internal nodes 3154 $C_2$ to $C_{17}$. Each node 3152 or 3154 may be seen as a binary decision called "bin". The concatenation of the binary decision for traversing the tree 3150 from the root node 3152 to the respective terminal node 3156 represents the "bin string" of the corresponding symbol value or syntax element value.

Each binary decision has an actual probability distribution indicating the probability as to whether the decision yields a binary zero (left branch in FIG. 44) and a binary one (right branch in FIG. 44). In other words, the actual probability distribution of a binary decision defines the probability that the syntax element path takes the zero or one branch at this binary decision. Accordingly, the actual probability for the syntax element to assume a certain data value is equal to the product of the respective probabilities at the nodes arranged along the path from root node 3152 to the respective terminal node 3156.

For binary entropy coding, each binary decision or node 3152, 3154 of tree 3150, i.e. each bin, is associated with a bit value probability estimation or a context model, i.e. C. As is described in more detail below, not all of the nodes or bins is associated with adaptive probability estimation models but may be associated with a static probability estimation, thereby reducing the context modeling overhead, i.e. the management for adapting the estimation according to past bins in order to increase the compression ratio.

Figure 45:
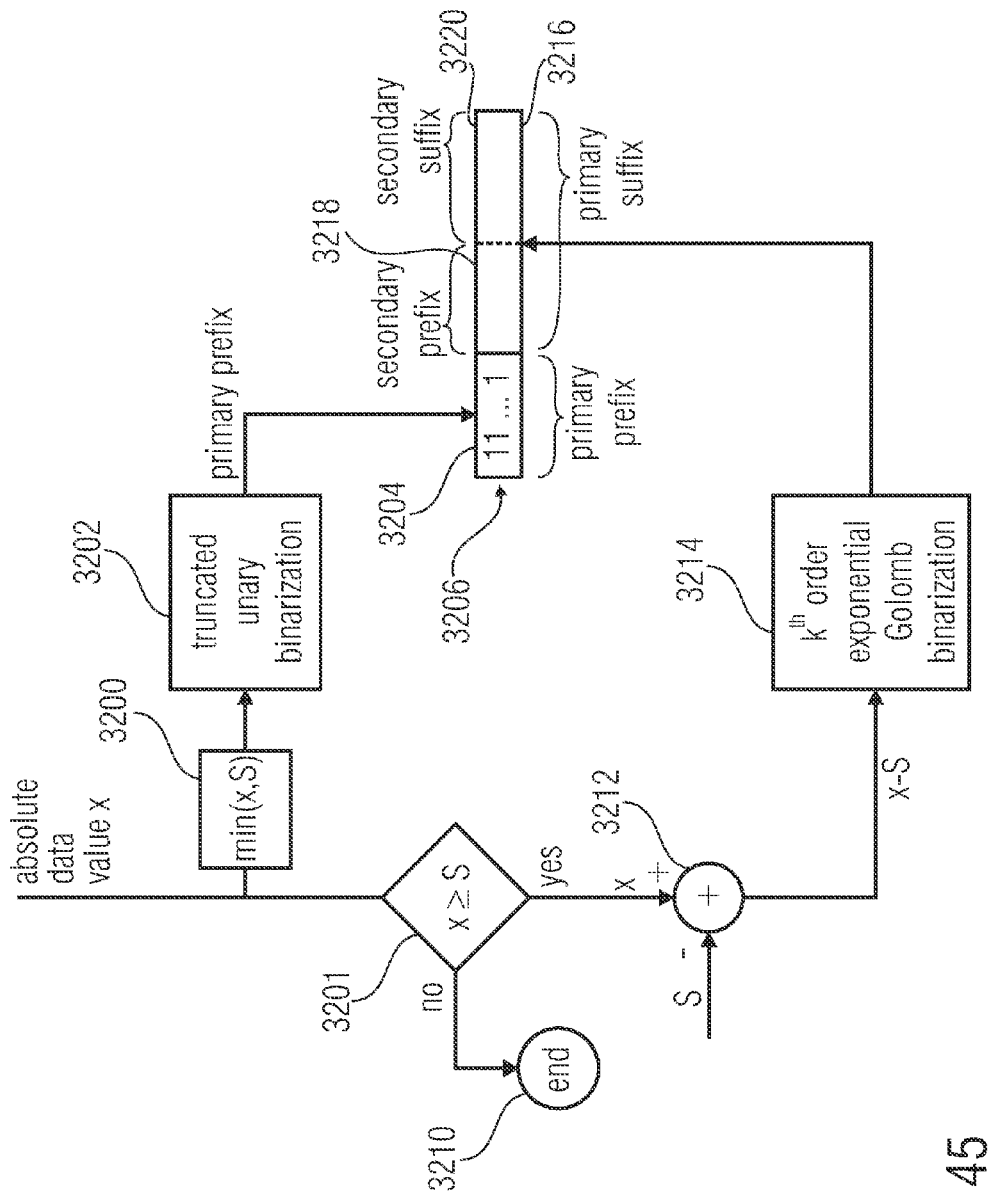
FIG. 45 a schematic diagram illustrating the binarization of an absolute data value.

Next, with respect to FIG. 45, an embodiment of a binarization scheme in accordance with an embodiment of the present invention is described. FIG. 45 shows schematically the steps binarizer 3102 performs on the non-binary valued syntax elements. In particular, FIG. 45 is an embodiment for binarizing the absolute values of transform coefficient levels, i.e., an integer quantity representing the value associated with a particular two-dimensional frequency index in the decoding process prior to scaling for computation of a transform coefficient value.

The binarization scheme of FIG. 45 is a concatenation of a truncated unary binarization scheme, on the one hand, and a $k^{th}$ order Exp-Golomb binarization scheme, on the other hand. A truncated unary binarization scheme is based a unary binarization scheme. In accordance with a unary binarization scheme, for each unsigned integer valued symbol x greater than or equal to zero the unary codeword to which x is mapped consists of x "1" bits plus a terminating "0" bit. Differing from the unary binarization scheme, a truncated unary (TU) code is only defined for x with $0 \leq x \leq S$, where for x<S the code is given by the unary code, whereas for x=S the terminating "0" bit is neglected such that the TU code of x=S is given by a codeword consisting of x "1" bits only, i.e. without a terminating bit of "0". In accordance with the exponential Golomb binarization scheme, generally, a data value x is mapped to a codeword consisting of a prefix and a suffix. Mere precisely, in accordance with the $k^{th}$ order Exp-Golomb binarization scheme, data values are mapped to code words having at least a prefix and, depending on the data value, a suffix. The prefix part of the EGk code word consists of a unary code corresponding to the value l(x), with $l(x)=\lfloor \log_2(x/2^k+1) \rfloor$, k indicating the order of the code and $\lfloor r \rfloor$ being maximum integer smaller than or equal to real value r. The EGk suffix part is computed as the binary representation of $x+2^k(1-2^{l(x)})$ using $k+l(x)$ significant bits.

As can be seen from FIG. 45, the absolute data value x to be binarized is compared to the cut-off value S at 3200 to determine the minimum of x and S. S is the cut-off value defining for which absolute data values x the truncated unary code is to be used exclusively, i.e. without using the Golomb binarization scheme for the residual. In other words, for all absolute data values x less than the cut-off values S the truncated unary binarization is used exclusively in order to map the absolute data value x to a codeword, the codeword accordingly merely consisting of a primary prefix. If the absolute data value x is greater than or equal to S, a primary suffix is appended to the primary prefix, the primary suffix being created in accordance with a zero order Exp-Golomb binarization scheme from x−S, as will be described further below.

The minimum between x and S is binarized in accordance with the truncated unary binarization scheme at 3202. The result is a primary prefix 204, which forms at least a part of the final codeword 3206 to which x is mapped to. The primary prefix thus consists of a unary binarization of the value of Min(S, Abs(x)), where Min(a,b) denotes the minimum of values a and b, and where Abs(x) denotes the absolute value of x. In other words, primary prefix consists of S ones if x is greater than or equal to S, and consists of x leading ones followed by a terminating zero if x is less than S.

The absolute data value x is compared at 3208 to the cut-off value S. If a comparison yields that x is smaller than S, the binarization ends at 3210 and, therefore, the codeword 3206, the absolute data value x is mapped to in accordance with the binarization scheme of FIG. 45, just consists of the primary prefix 3204. Otherwise, i.e., if x is equal to or greater than S, the cut-off value S is subtracted from the absolute data value x at 3212. The resulting difference x minus S, sometimes called a residual, is processed at 3214 in accordance with a $k^{th}$ order Exp-Golomb binarization scheme, with k equal to zero. The $k^{th}$ order Exp-Golomb binarization scheme will later be described in more detail with respect to FIG. 48.

The result of the binarization 3214 of the difference "x minus S" is appended to the primary prefix 3204 as the primary suffix 3208. Therefore, if the absolute data value x is greater than or equal to the cut-off value S the resulting codeword 206 consists of a primary prefix 3204 followed by a primary suffix 3208, wherein the primary suffix 3208 is a $k^{th}$ order Exp-Golomb binarization of x−S. As will be apparent from the further description, the primary suffix 3208 itself consists of a prefix and a suffix, hereinafter called a secondary prefix 3218 and a secondary suffix 3220.

Experimental studies have shown, that for absolute values of transform coefficient levels, S=14 and k=0 yield relatively good compression ratios when passing such binarized transform coefficient level values to a binary entropy coder even if just the bits of the codewords 3206 being part of the primary prefix are entropy coded using an adaptive probability model, thereby reducing the coding overhead.

FIG. 46 shows a table in which absolute values of transform coefficient levels in the left column 3215 are listed with their corresponding codewords in accordance with the binarization if FIG. 45 to the right at 3252, when S=14 and k=0. It is noted that the binarization and subsequent coding process is applied to the syntax element "transform coefficient level values minus 1", since zero valued, i.e. non-significant, transform coefficient levels are encoded using the aforementioned significances map. Therefore, with respect to FIG. 45, in the table of FIG. 46 at 3250 the values of x plus 1 is listed. The table of FIG. 46 shows the result of the binarization scheme of FIG. 45 for the values S=14 and k=0.

As can be seen, the codeword or bin string, an absolute value is mapped to, comprises at least a TU prefix, the TU prefix part of the codewords or bin strings being highlighted in FIG. 46 at 3254. As can be seen, absolute values below 15 (=x+1) do not have an EG0 suffix as shown in 3256. Further, as shown by dotted line 3258 each EG0 suffix 3256 comprises a secondary prefix which is on the left side of dotted line 3258, and all EG0 suffixes 3256, except the one of codeword belonging to absolute value 15, comprise a secondary suffix arranged to the right side of dotted line 3258.

In the same way as FIG. 46, FIG. 47 shows a table of pairs of absolute values and bin strings as they are obtained in accordance with the binarization scheme of FIG. 45 with k=3 and S=9. The elements of the table of FIG. 47 being equal to those of FIG. 46 are indicated by the same reference numbers as in FIG. 46, and a repetitive description of these elements is omitted. The sign bit is not shown in table FIG. 47.

The values for k and S according to the binarization scheme in accordance with FIG. 47 has shown good compression effectiveness when applied to absolute components of motion vector differences. For motion vector differences UEGk binarization as shown in FIG. 47 is constructed as follows. Let us assume the value mvd of a motion vector component is given. For the prefix part of the UEGk bin string, a TU binarization (3202 in FIG. 45) is invoked using the absolute value of mvd with a cut-off value of S=9. If mvd is equal to zero, the bin string consists only of the prefix code word "0", 270. If the condition |mvd|≥9 holds (3208 in FIG. 45), the suffix is constructed (3214 in FIG. 45) as an EG3 codeword for the value of |mvd|−9, to which the sign of mvd is appended using the sign bit "1" (not shown) for a negative mvd and the sign bit "0" (not shown) otherwise. For mvd values with 0<|mvd|<9, the suffix consists only of the sign bit.

Assuming that the components of a motion vector difference represents the prediction error at quarter-sample accuracy, the prefix part corresponds to a maximum error component of +/−2 samples. With the choice of the Exp-Golomb parameter k=3, the suffix code words are given such that a geometrical increase of the prediction error in units of 2 samples is captured by a linear increase in the corresponding suffix code word length.

Figure 48:
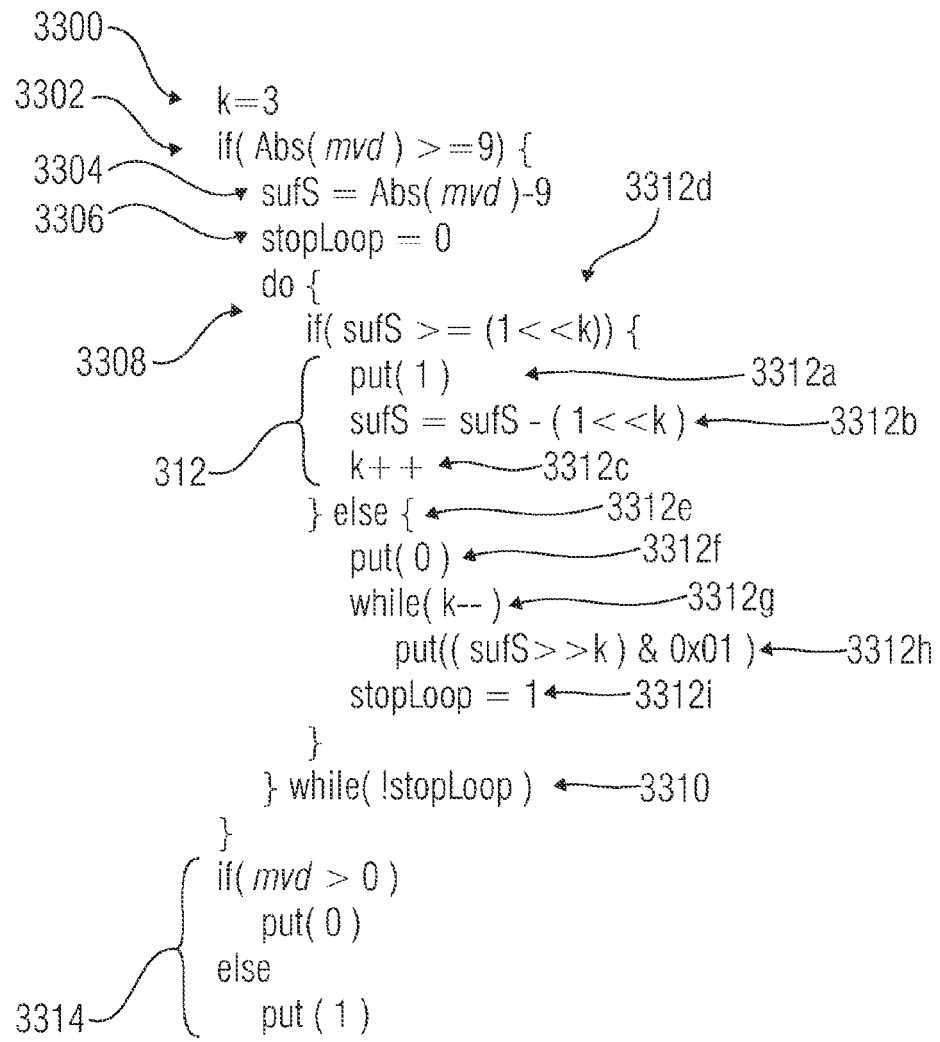
FIG. 48 shows a pseudo-C code for performing a binarization.

After having described the functionality of binarizer 3102 in FIG. 29 with respect to FIGS. 45 to 47 in a rather coarse way, a possible implementation for the $k^{th}$ order Exp-Golomb binarization 3214 in FIG. 45 is described with respect to FIG. 48 in more detail. FIG. 48 shows a pseudo-C code illustrating the process of constructing the primary suffix part of the code word representing the binarization of absolute data value x in accordance with the binarization scheme of FIG. 45. First, at 3300 an auxiliary parameter k is initialised to the order of the Exp-Golomb binarization used. In case of binarization of components of motion vector differences in accordance with FIG. 47, for example, k is initialized in step 3300 to the value of 3.

If a comparison in line 3302 between the absolute value of the motion vector difference (mvd) and the cut-off value, here 9, reveals that the absolute value of mvd is greater than or equal to 9, in a step 3304, the cut-off value S=9 is subtracted from the absolute value of mvd to obtain sufS. Furthermore, a parameter stopLoop is initialized in step 3306 to the value of zero. Next, in 3308, a conditional if-operation is performed as long as the stopLoop-parameter has not changed his value to a positive value greater than 0, as is checked in line 310. If the conditional if-operation reveals that sufS is greater than or equal to the $k^{th}$ power of 2 (3312d), at 3312a bit having the bit value 1 is output (3312a), the $k^{th}$ power of 2 is subtracted from sufS (3312b), and k is incremented (3312c). Otherwise, if sufS is smaller than the $k^{th}$ power of 2 (3312e), a bit having the bit value of zero is output (3312f), a binary representation of sufS using a number of bits equal to the actual value of k (3312g) is output (3312h), and the parameter stopLoop is set to a value of 1 (3312e) thereby resulting in stopping the iterative execution of the if-operation 3308.

All steps 3304 to 3312 are performed if the comparison in step 3302 reveals that the absolute value of mvd is greater than or equal to 9. Irrespective of the comparison in 3302, at 3314 an a sign bit of zero is output if mvd is greater than zero and an a sign bit of 1 is output if mvd is smaller than zero, the sign bit not being shown in FIG. 47.

As becomes clear from the pseudo-C code of FIG. 48, in case of third order Exp-Golomb binarization scheme, the suffix part at least comprises four bits, one being the zero bit of 3312*f*, and the other three being the bits of the binary representation output in 3312*h*, as can be seen also in FIG. 47, neglecting the sign bit at the end of each codeword.

Figure 49:
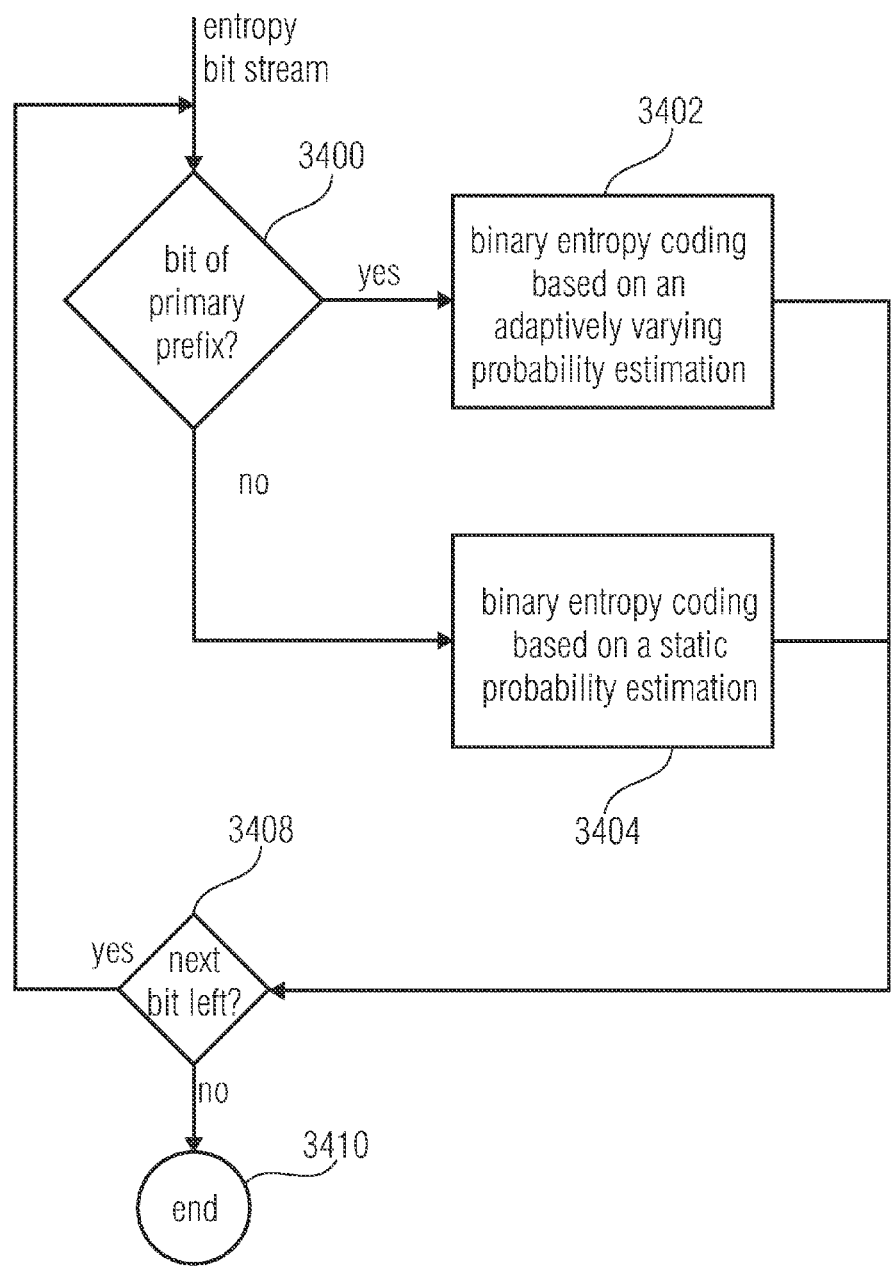
FIG. 49 shows a schematic diagram illustrating the decoding of an entropy coded bit stream into a data value.

After having described the binarization and entropy coding on the encoder side in accordance with embodiments of the present invention, FIG. 49 shows as an embodiment of the present invention, the steps performed on decoder side in order to decode the entropy coded bit stream.

Firstly, in step 3400, the decoder receiving the entropy coded bit stream determines whether the next bin or bit to be determined from the coded bit stream is a primary prefix bit or an primary suffix bit. The decoder knows from the way of the predetermined syntax of the entropy coded bit stream, as to whether the next bin or bit expected is a bit of a primary prefix or a primary suffix of a binarized syntax element.

If, in step 3400, it is determined that the expected bit is a bit of the primary prefix, the decoder determines the bit value for this bit by binary entropy decoding based on an adaptively varying probability estimation or context model. That is, the decoder selects the respective partial bit stream described above, using the respective probability estimation for selection. The decoder updates this adaptively varying probability estimation based on past decoded bins indicated by the respective context model type.

If the bit is a bit of the primary suffix, in 3404 the next bit or bin value is determined by performing entropy decoding based on a static probability model. This may involve a 1:1 mapping of codewords to bins including the actual bit.

The decoder repeats, 3408, the steps 3400 to 3404 if there are bits left to achieve the bit values for the bits of a whole codeword. If there are no bits left at step 3408, the decoding process ends at step 3410. The decoder knows when the binary representation of a syntax element ends, i.e. which decoded bit is the last of a actual syntax element, from following the respective binarization code tree, such as the code tree shown in FIG. 44 in case of the syntax element being a absolute transform coefficient level minus 1.

Figure 50:
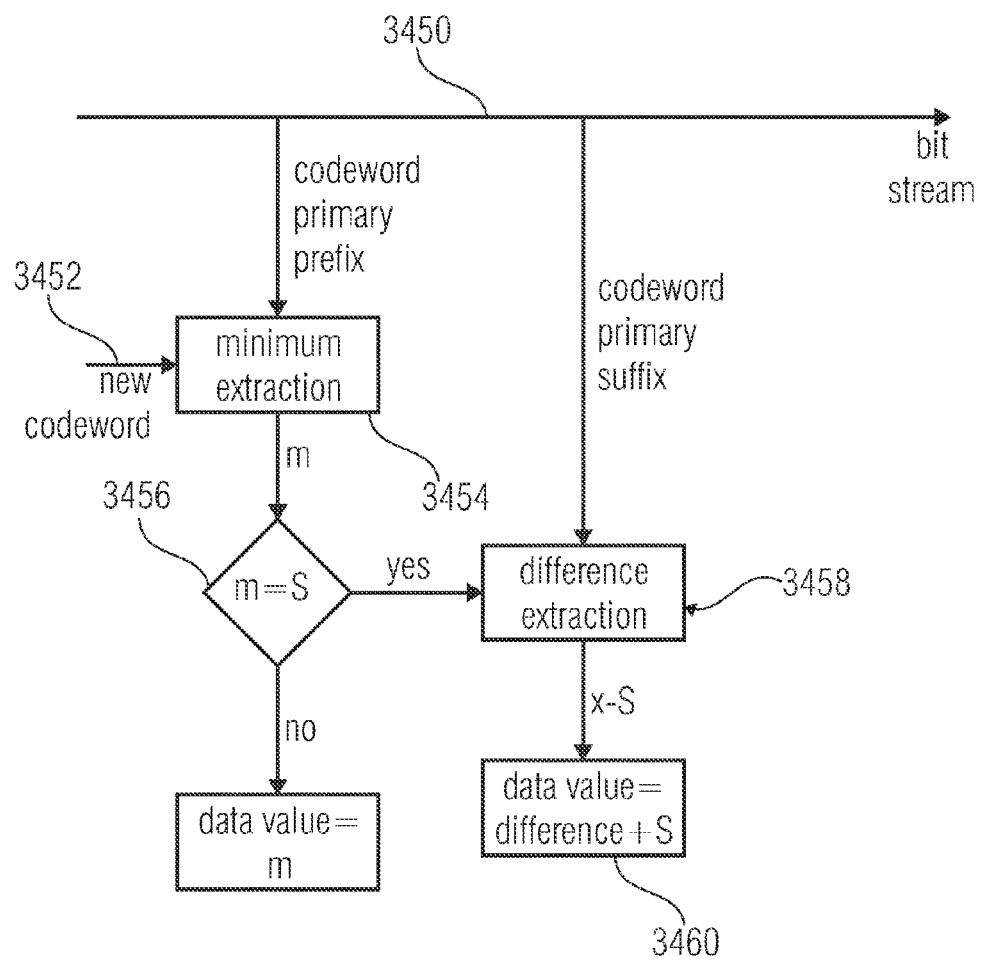
FIG. 50 shows a schematic diagram illustrating the recovering of a data value from a binarization of the data value.

FIG. 50 shows the process of recovering from the codeword as obtained by the process of FIG. 49 the data value, which has been binarized into the codeword. The bit values as obtained by the process of FIG. 49 form a bit stream 3450. The decoder knows, as described above, when a new code word is on the bit stream 3450, the instance of a new codeword being indicated by way of a signal 3452.

In a minimum extracting step 3454 then a value m is extracted from the binary code word by counting the leading ones in the primary prefix of the code word, the count being equal to m. If m is equal to S, what is checked in step 3456 (the value of S is known to the decoder because he knows which syntax element is coded by which binarization scheme), in a difference extracting step 3458 the bits following to the bits of the primary prefix from the bit stream 3450 are received, which form the primary suffix part of the code word. In the difference extracting step 3458 the difference between the data value x to be recovered and the cut-off value S is recovered from the primary suffix of the code word in the bit stream 3450.

In step 3460, S is added to the difference x-S recovered in step 3358 to obtain the value x, the value for the actually encoded syntax element.

An example for a pseudo-C code illustrating minimum extraction step 454 could be:

```
m = -1;                    /Initializing counting parameter
for (b=0;(b-1);m++) {      /Bitwise reading the leading bits of
  b=read_bits(1);          /codeword and, before each reading,
  if (m=S)                 /incrementing k, until the actually
    b=0;                   /read bit is zero or m=S
}
```

Figure 51:
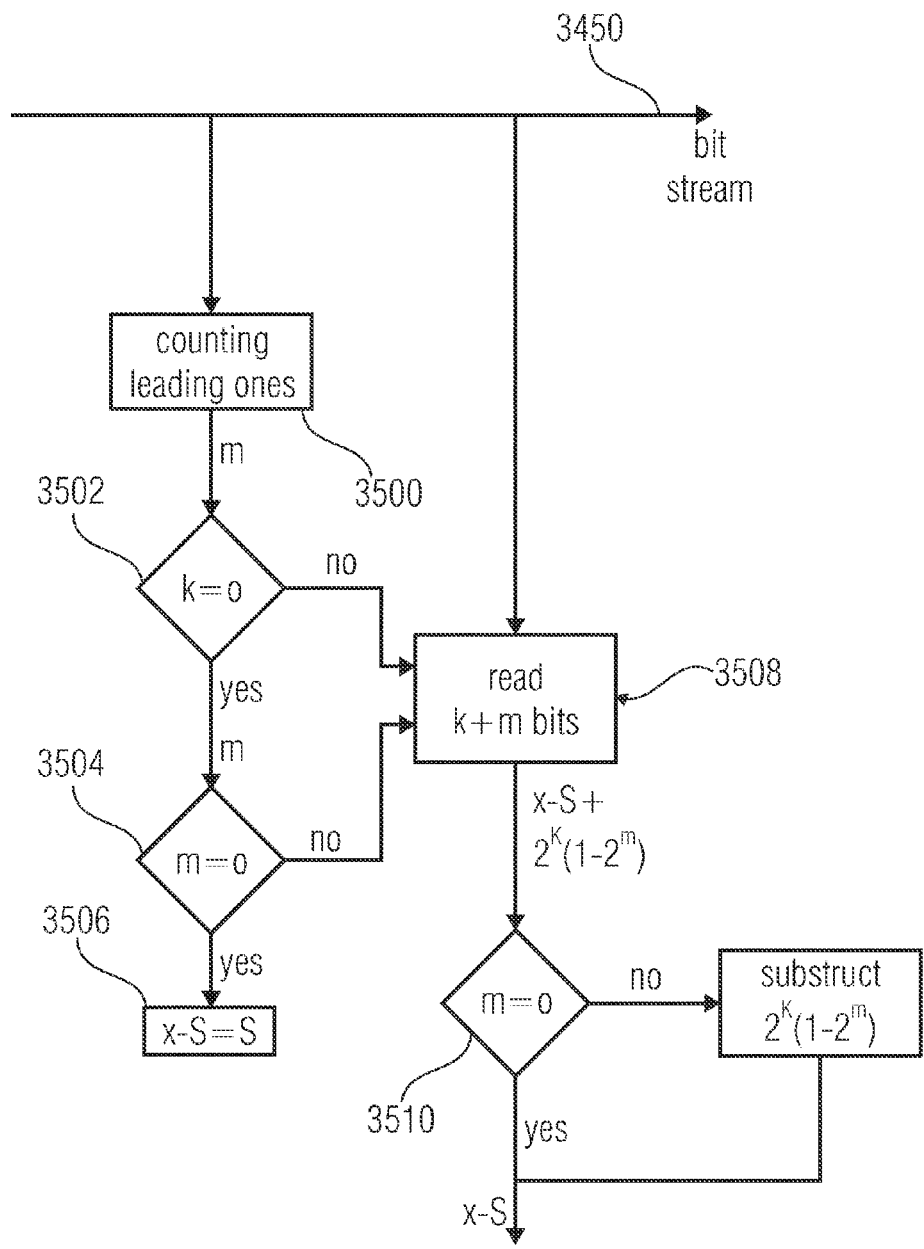
FIG. 51 shows a schematic diagram illustrating the extraction with regard to the suffix part in the process of FIG. 50.

The substeps performed by in difference extracting step 3458 are shown in FIG. 51. In a step 3500 the difference extractor counts the leading bits in the primary suffix to obtain a value m.

Next, k, which is 3 for motion vector difference and is 0 for a transform coefficient level value, is compared to zero in step 3502. If k is equal to zero, in step 3504, m is compared to zero in step 3504. If comparison yield that m=0, it is deduced in step 3506 that the data value x is equal to the cut-off value S, which is 9 in the case of motion vector differences and 14 in the case of transform coefficient levels.

If k is not equal to zero and/or m is not equal to zero, in step 3508 the next k plus m following bits are read from the bit stream 3450, i.e. the bits following the terminating bit of the secondary prefix. Thereby, a binary (k+m) bit long representation of $A=x-S+2^k(1-2^m)$ is achieved. As can easily gathered form this equation, A=x-S if m=0.

When a comparison of m with 0 in step 3510 reveals that m=0, from the binary representation A the value of $2^k(1-2^m)$ is subtracted to obtain the value of x-S.

Example 6

In this example, example 4 is further extended and FIGS. 34, 35, 36, 37*a,b*, 39, 45, 46-49 also apply. In the present example, a coding scheme for syntax elements contained in a pre-coded video signal is provided, which enables a higher compression effectiveness.

A method for encoding a syntax element contained in a precoded video signal into a coded bit stream is described, the precoded video signal representing at least one video frame, the syntax element being associated with a predetermined portion of the video frame and being indicative of as to whether the predetermined portion of the video frame is precoded in a first or a second way into the precoded video signal, the method comprising investigating as to whether a neighboring portion of the video frame neighboring the predetermined portion is precoded in the first way or the second way, in order to obtain a binary value; assigning one of at least two context models to the predetermined portion of the video frame based on the binary value, wherein each context model is associated with a different probability estimation; Finally, an encoding of a sequence of symbols take place in accordance with any of the above embodiments, with at least one symbol relating to a representation of the syntax element. The assigner is configured to determine the measure for the estimate of the probability distribution for the respective symbol based on the probability distribution estimate associated with the context assigned to the respective symbol. The selector selects the respective entropy coder accordingly.

In accordance with a second aspect of the present invention, this aspect is achieved by a method for decoding a syntax element from a coded bit stream, the syntax element being contained in a precoded video signal, the precoded video signal representing at least one video frame, the syntax element being associated with a predetermined portion of the video frame and being indicative of as to whether the predetermined portion of the video frame is precoded in a first or a second way into the precoded video signal, the method comprising investigating as to whether a neighboring portion of the video frame neighboring the predetermined portion is precoded in the first way or the second way, in order to obtain a binary value; assigning one of at least two context models to the predetermined portion of the video frame based on the binary value, wherein each context model is associated with a different probability estimation; and reconstructing a sequence of symbols among which at least one symbol relates to a representation of the syntax element in accordance with any of the above embodiments is performed. The assigner is configured to determine the measure for the estimate of the probability distribution for the respective symbol based on the probability distribution estimate associated with the context assigned to the respective symbol. The selector selects the respective entropy decoder accordingly.

The present example is based on the finding that the coding of a pre-coded video signal may be rendered more compressive, when a syntax element associated with a pre-determined portion of the video frame or picture and being indicative of as to whether the pre-determined portion of the video frame is pre-coded in a first or a second way, i.e., a control information syntax element, is assigned to one of at least two context models, the assignment being dependent on a neighbouring portion of the video frame being pre-coded in the first or second way. The syntax element may then be entropy encoded into the coded bit stream based on the probability estimation with which the one context model is associated. By this measure, the dependency of the actual or real probability distribution of the syntax element on the syntax element being of the same type but associated with neighbouring portions of the video frame is exploited and the actual probability distribution can be approximated more precisely.

Thus, it is an advantage of the present invention, that, due to the more precisely adjustable probability estimation, the compression ratio of the coded bit stream to the pre-coded video signal may be enhanced.

In other words, in accordance with an embodiment of the present invention, the syntax element of a specific type may be assigned to different ones of the at least two context models each time it occurs in the pre-coded video signal. The selection of the context model is performed each time the syntax element occurs and is dependent on as to whether the neighbouring portion of the video frame is pre-coded in the first or the second way. In effect, by this measure, all the syntax elements of this type occurring in the precoded video signal are grouped into a few context model groups, each syntax element belonging to one context model group, each context model group being assigned to a different one of the context models, and each context model being associated with a different probability estimation. Therefore, each group is entropy coded based on a different probability estimation, namely the one belonging to the context model it is assigned to.

In accordance with another embodiment of the present invention, the probability estimation of each context model is adapted to the previously coded syntax elements, the adaption being performed separately for each context model. In other words, each syntax element just having been entropy coded is used to adapt the probability estimation of the context model to which this syntax element is assigned. Hence, following syntax elements of the same type and assigned to the same context model are entropy coded by means of an adapted probability estimation. Since, by this measure, the context models are adapted or managed independently of each other, the adaptation yields a better approximation to the actual or real probability estimation and therefore results in a better compression ratio.

In accordance with a specific embodiment of the present invention, the spatially dependent context model selection is used for coding the frame/field coding mode flags in a precoded video signal. The frame/field coding mode flags indicate as to whether the respective video frame portion is coded in frame or field coding mode. To be more precisely, in accordance with this embodiment, the video frame is an interlaced frame where some of its picture samples are captured at one time instant while the other picture samples are captured at a different time instant, the first picture samples being called a first field and the second picture samples being called a second field. Moreover, the video frame is spatially subdivided into an array of macroblock pairs, each macroblock pairs consisting of two macroblocks. When coded in field mode, one macroblock of a macroblock pair merely comprises the picture samples of the first field or the picture samples of the second field within that macroblock pair, while the other macroblock of that macroblock pair contains or represents the picture samples of the other field within the macroblock pair. When coded in frame mode, the macroblock contains both, first and second field picture samples, in particular, the spatially top or bottom ones within a macroblock pair, while the other macroblock of the same macroblock pair represents the other picture samples within the macroblock pair.

As will be described in more detail with respect to the syntax element mb_field_decoding_flag, when the same bin or same syntax element occurs several times in the bins passed from stage 2100a it may be assigned to different of the context models depending on previously incoming or previously entropy coded bins.

After having described the operation of coding arrangement 2100, in the following its functioning is described in more detail with respect to the handling of the syntax element mb_field_decoding_flag in accordance with embodiments of the present invention. In order to do so, firstly, with regard to FIGS. 30 to 31b, the meaning of this flag is explained.

Now, the assignment depending on the mode by which the macroblock pair or the macroblocks of the macroblock pair are coded by precoder 2012, reference is again made to FIG. 28 in order to explain the function and meaning of the syntax element mb_field_decoding_flag contained in the precoded video signal output by precoder 4012.

When the precoder 4012 receives a video signal representing an interlaced video frame, precoder 4012 is free to make the following decisions when coding the video frame 4010:

It can combine the two fields together to code them as one single coded frame, so that each macroblock pair and each macroblock would be coded in frame mode.

Alternatively, it could combine the two fields and code them as separate coded fields, so that each macroblock pair and each macroblock would be coded in field mode.

As a last option, it could combine the two fields together and compress them as a single frame, but when coding the frame it splits the macroblock pairs into either pairs of two field macroblocks or pairs of two frame macroblocks before coding them.

The choice between the three options can be made adaptively for each frame in a sequence. The choice between the first two options is referred to as picture adaptive frame/field (PAFF) coding. When a frame is coded as two fields, each field is partitioned into macroblocks and is coded in a manner very similar to a frame.

If a frame consists of mixed regions where some regions are moving and others are not, it is typically more efficient to code the non-moving regions in frame mode and the moving regions in the field mode. Therefore, the frames/field encoding decision can be made independently for each vertical pair of macroblocks in a frame. This is the third coding option of the above-listed options. This coding option is referred to as macroblock adaptive frame/field (MBAFF) coding. It is assumed in the following that precoder 4012 decides to use just this option. As described above, MBAFF coding allows the precoder to better adapt the coding mode type (filed or frame mode) to the respective areas of scenes. For example, precoder 4012 codes macroblock pairs located at stationary areas of a video scene in frame mode, while coding macroblock pairs lying in areas of a scene showing fast movements in field mode.

As mentioned above, for a macroblock pair that is coded in frame mode, each macroblock contains frame lines. For a macroblock pair that is coded in field mode, the top macroblock contains top field lines and the bottom macroblock contains bottom field lines. The frame/field decision for each macroblock pair is made at the macroblock pair level by precoder 4012, i.e. if the top macroblock is field coded same applies for the bottom macroblock within same macroblock pair. By this measure, the basic macroblock processing structure is kept intact, and motion compensation areas are permitted to be as large as the size of a macroblock.

Each macroblock of a field macroblock pair is processed very similarly to a macroblock within a field in PAFF coding. However, since a mixture of field and frame macroblock pairs may occur within an MBAFF frame, some stages of the pre-coding procedure in precoder 4012, such as the prediction of motion vectors, the prediction of intra prediction modes, intra frame sample prediction, deblocking filtering and context modelling in entropy coding and the zick-zack scanning of transform coefficients are modified when compared to the PAFF coding in order to account for this mixture.

To summarize, the pre-coded video signal output by precoder 4012 depends on the type of coding precoder 4012 has decided to use. In case of MBAFF coding, as it is assumed herein, the pre-coded video signal contains a flag mb_field_decoding_flag for each non-skipped macroblock pair. The flag mb_field_decoding_flag indicates for each macroblock pair it belongs to whether the corresponding macroblocks are coded in frame or field coding mode. On decoder side, this flag is necessitated in order to correctly decode the precoded video signal. In case, the macroblocks of a macroblock pair are coded in frame mode, the flag mb_field_decoding_flag is zero, whereas the flag is one in the other case.

Figure 52:
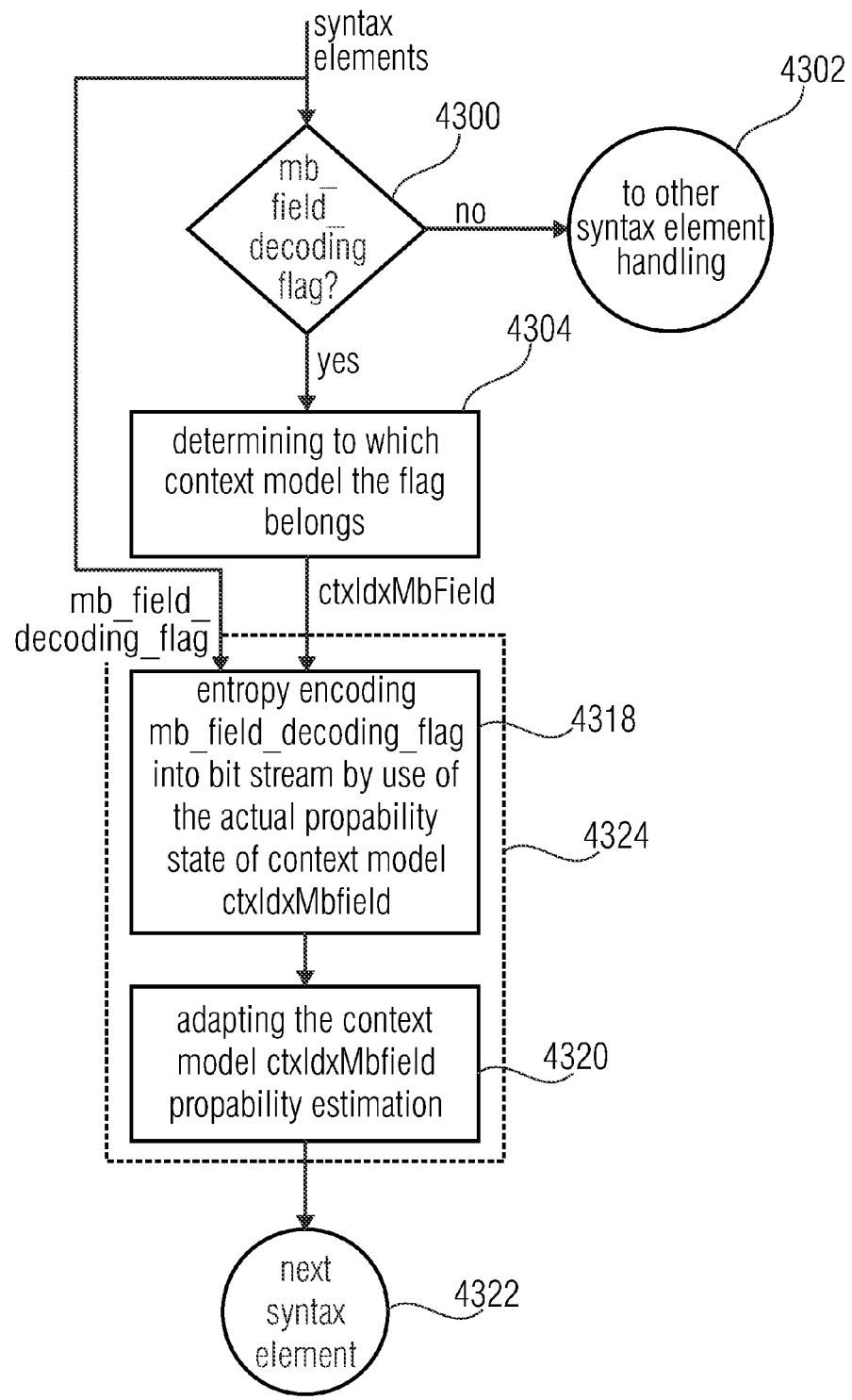
FIG. 52 shows a flow diagram illustrating the encoding of the syntax element mb_field_decoding_flag.

Now, while the general mode of operation of the original decoder arrangement of FIG. 29 has been described without referring to a special bin, with respect to FIG. 52, the functionality of this arrangement is now described with respect to the binary entropy coding of the flag mb_field_decoding_flag.

The process shown in FIG. 52 starts at the time, where the flag mb_field_decoding_flag arrives at the input of the context modeller 4112. In a first step 4300 context modeller 4112 determines as to whether the incoming syntax element or bin is the mb_field_decoding_flag. If not, context modeller 4112 switches to another syntax element handling procedure or subroutine at step 302. If the incoming bin is an mb_field_decoding_flag the context modeller 4112 determines in step 304 as to which context model the flag belongs to.

Figure 53:
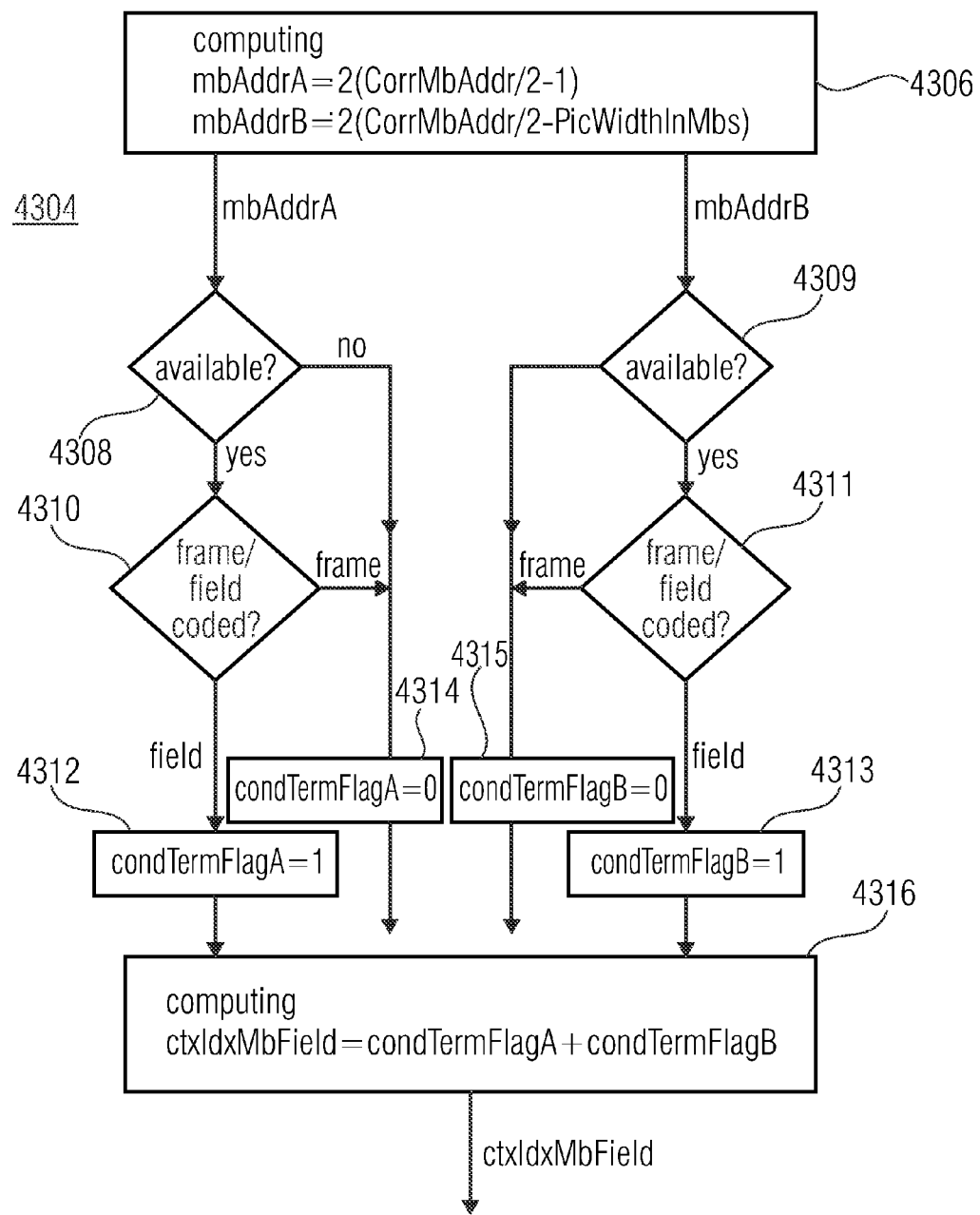
FIG. 53 flow diagram illustrating a process of assigning context models to the mb_field_decoding_flags.

Step 4304 is shown in more detail in FIG. 53. When determining the context model corresponding to the current mb_field_decoding_flag, context modeller 4112 first computes, in step 4306, the addresses of the top macroblock of the macroblock pair to the left and above the current macroblock pair.

In the next steps 4308 and 4309, context modeller 4112 determines the availability of the top macroblock of the macroblock pair to the left and above the current macroblock pair, respectively. In step 4308, the neighbouring macroblock A to the left, is marked as available, when mbAddrA is smaller than 0. The same applies for step 4309 with respect to mbAddrB. Thus, MbAddrN, with N being either A or B, are the addresses of the top macroblocks of the respective neighbouring macroblock pair in case the macroblock pair does really exist and denotes concurrently the availability status of the respective neighbouring macroblock pair A and B, respectively.

In an alternative embodiment, the macroblock A or B is only marked as available, when additionally to the above condition the following is true: The macroblock with address mbAddrN belongs to same slice as the current slice.

When in step 4308/4309 it is determined that macroblock N, with N being either A or B, is marked as available, in step 4310 and step 4311, respectively, it is determined as to whether macroblock N(N being equal to A or B) is a macroblock coded in field mode or a macroblock coded in frame mode. In case macroblock A is coded in field mode a flag condTermflagA is set to 1 in step 4312. The same applies for macroblock B so that condTermflagB is set to 1 in step 4313 if macroblock B is coded in field mode. In all other cases, i.e., when mbAddrA is smaller than 0 (4308) or macroblock A is coded in frame mode (4310), the flag condTermFlagA is set to 0 in step 4314. Accordingly, when mbAddrB is smaller than 0 (4309) or macroblock B is coded in frame mode (4311), the flag condTermFlagB is set to 0 in step 4315.

CondTermFlagA and condTermFlagB are used in step 4316 by context modeller 4112 to compute context index ctxIdxMbField indicating the probability model to be used for binary entropy coding of mb_field_decoding_flag. In particular, context modeller computes $$ctxIdxMbField = condTermFlagA + condTermFlagB,$$

the result being a number of {0,1,2}.

Referring back to FIG. 52, after the determination in step 4304, context modeller 4112 passes the variable ctxIdxMbField (context index macroblock field) or the probability estimation status indexed by ctxIdxMbField along with mb_field_decoding_flag to regular coding engine 4118 which, in turn, is constructed in accordance with any of the above described embodiments. That is, the assigner of the above embodiments steps the parameter for selecting the partial bitstream in accordance with the probability determined vie the context determined, in turn, in step 4304, whereupon the selector sends the bins of ctxIdxMbField to the respective partial bitstream path. In step 4318, the flag mb_field_is then encoded into the respective partial bitstream selected in accordance with the current probability state of the context model as indexed by ctxIdxMbField.

Thereafter, regular coding engine 4118 passes the bin value of mb_field_decoding_flag via path 4117 back to context modeller 4112, whereupon context modeller 4112 adapts, in step 4320, the context model indexed by ctxIdxMbField with respect to its probability estimation state. Thereafter the process of coding the flag mb_field_decoding_flag into the bit stream at the output 4124 ends at 4322.

Figure 54:
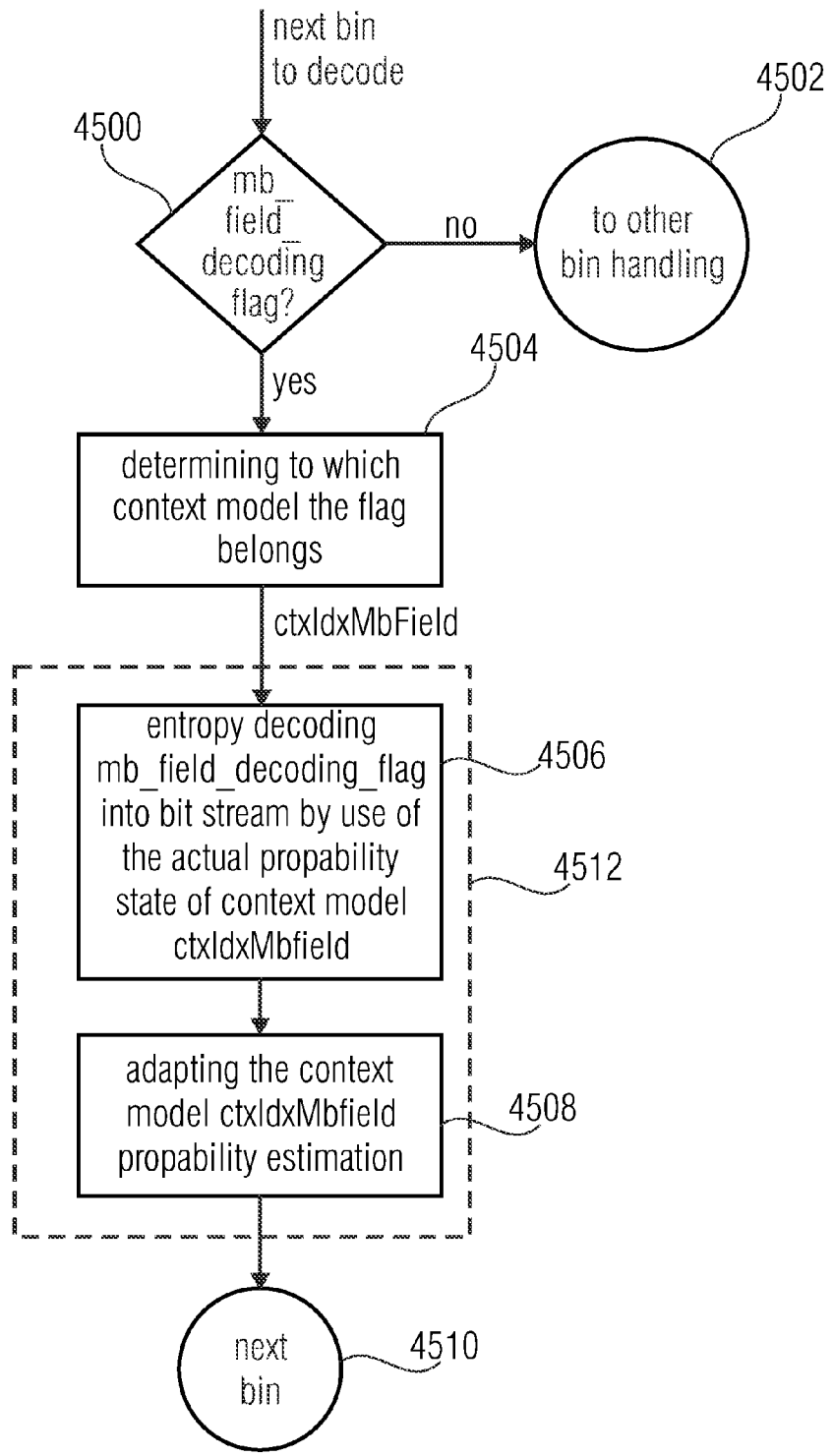
FIG. 54 shows a flow diagram illustrating the decoding of the syntax element mb_field_decoding_flag from the coded bit stream as derived by the encoding scheme of FIG. 52.

FIG. 54 shows the decoding process performed by the entropy decoder 4400 in more detail. First, in a step 4500, the decoder 4400 checks as to whether the next bin to decode is an mb_field_decoding_flag. If this is not the case, decoder 400 switches to another bin handling process (not shown) in step 4502. If yes, decoder 4400 determines in step 4504 the context model to which the flag belongs. Step 4504 is performed in the same way as step 4304 in the encoding process, or as shown in FIG. 53.

Then, in step 4506, the actual bin, i.e., mb_field_decoding_flag, is obtained from the respective partial bitstream entropy decoder by indexing using the actual probability state of the context model as indexed by ctxIdxMbField obtained in step 4504. The result of this step is the value for mb_field_decoding_flag. Thereafter, in step 4508, the ctxIdxMbField probability state is adapted or updated, as it was the case in step 4320. Thereafter, the process ends at step 4510.

The determination in step 4504 yields the same index ctxIdxMbField since the macroblocks are stepped through in the precoded video signal in an appropriate order that guarantees that the flags mb_field_decoding_flag of macroblocks A and B (FIG. 22) have already been previously precoded. Thus, the context model can be deduced in step 4504 on the basis of previously decoded flags mb_field_decoding_flag of neighbouring macroblocks as was the case on encoder side.

It is noted that the above example is not restricted to a flag indicating frame/field mode coding of a macroblock or macroblock pair. Rather, the above description could be applied to other syntax elements as well.

With respect to step 4310, the following is noted. Normally, a macroblock is coded into the precoded video signal. Nevertheless, it might be that a macroblock is not coded or skipped because, for instance, the corresponding transform coefficient levels of this macroblock are all smaller than a certain quantization threshold. Thus, for some macroblocks there is no mb_field_decoding_flag available. Thus, it might be that step 4310 cannot be performed by merely investigating the mb_field_decoding_flag of the respective neighbouring macroblock if the latter is a skipped one. When mb_field_decoding_flag is not present for either macroblock of a neighbouring macroblock pair (containing A or B in FIG. 22) (when the bottom macroblock has a mb_field_decoding_flag, this one is chosen to be mb_field_decoding_flag of A or B), the following applies (it is assumed that the macroblock pair containing A is missing):

- if there is a neighbouring macroblock pair to the left (of A) in the same slice, the value of mb_field_decoding_flag (of A) should be inferred to be equal to the value of mb_field_decoding_flag for the neighbouring macroblock pair to the left of the current macroblock pair (containing A),
- if there is no neighbouring macroblock pair to the left (of A) in the same slice, and there is a neighbouring macroblock pair above (of A) in the same slice, the value of mb_field_decoding_flag (of A) shall be inferred to be equal to the value of mb_field_decoding_flag of the neighbouring macroblock pair above the current macroblock pair (containing A),
- otherwise (if there is no neighbouring macroblock pair either on the left or above the current macroblock pair (containing A), the value of mb_field_decoding_flag (of A) shall be inferred to be equal to zero.

Of course, the above steps also apply for top macroblock B, by merely switching A to B.

Furthermore, other neighbouring relationships than those described with respect to FIGS. 22 and 34 might be used in order to determine the context model for entropy encoding the mb_field_decoding_flag.

Furthermore, as already noted, the above embodiments are also applicable to other control syntax elements or to other bins. Furthermore, the present invention is not restricted to binary entropy coding but could be applied as well to other symbol entropy coding. Additionally, the subdivisions of the video frame into slices, macroblock pairs, macroblocks, picture elements etc. was for illustrating proposes only, and is not to restrict the scope of the invention to this special case.

Example 7

In this example, example 4 is further extended and FIGS. 34, 35, 36, 37*a*,*b*, 39, 45, 46-49 also apply. In accordance with example 7, a method for encoding a video frame or picture comprises dividing up the video frame or the picture in portions of a first type and portions of a second type, wherein the portions of the first type are associated with a first scanning pattern, and the portions of the second type are associated with a second scanning pattern that is different from the first scanning pattern; transforming data corresponding to a predetermined of the portions of the video frame or picture into a two-dimensional array of transform coefficients, wherein a scanning order is defined among the transform coefficients by the scanning pattern of the predetermined portion, the scanning order assigning each transform coefficient a unique scanning position; precoding a predetermined of the transform coefficients in order to obtain a transform data unit; choosing one of a first and a second set of context models, depending on as to whether the predetermined portion is a portion of a type being associated with the first or the second scanning pattern, the first and the second set being different to each other; assigning one context model of the chosen one of the first and the second set of context models to the transform data unit based on the scanning position assigned to the predetermined transform coefficient, wherein each context model is associated with a different probability estimation; and encoding the transform data unit or a sub-unit thereof into a coded bit stream based on the probability estimation with which the assigned context model is associated using any of the above embodiments.

According to example 7, a decoding a transform data unit or a sub-unit thereof from a coded bit stream is described, the transform data unit being a precoded version of a predetermined transform coefficient of transform coefficients which are the result of a transformation of data corresponding to a predetermined portion of portions of a video frame or picture, the portions being either a portion of a first type being associated with a first scanning pattern or a portion of a second type being associated with a second scanning pattern, the method comprising choosing one of a first and a second set of context models, depending on as to whether the predetermined portion is a portion of a type being associated with the first or the second scanning pattern, the first and the second set being different to each other; assigning one context model of the chosen one of the first and the second set of context models to the transform data unit or the sub-unit thereof based on the scanning position assigned to the predetermined transform coefficient, wherein each context model is associated with a different probability estimation; and decoding the transform data unit or the sub-unit thereof from the coded bit stream based on the probability estimation with which the assigned context model is associated using any of the above embodiments.

The finding is exploited that the transform data units or sub-units thereof obtained from a video frame or picture may be coded in a more compressive way, when different sets of context models are used for coding transform data units or sub-units thereof related to portions of the video frame or picture associated with a first scanning pattern as compared to transform data units or sub-units thereof related to portions of the video frame or picture associated with a different scanning pattern. By this measure, the context models can be adapted more precisely to the actual symbol statistics, which may be different between transform data units belonging to the same scanning position due to the different scanning patterns. Since the actual probability distribution can be approximated more precisely, the compression ratio of the coded bit stream may be enhanced. Furthermore, since different context models are used for transform data units related to picture portions associated with different scanning patterns, the transform data units contributing to the update of a probability estimation of that context model show a more uniform actual probability distribution so that the updated probability estimation does more precisely approximate the actual probability distribution. Similarly, providing different context model sets enables initialising the probability estimation of the context models more precisely to the actual probability distribution. Thus, compression ratio of the coded bit stream may further be enhanced.

Figure 55:
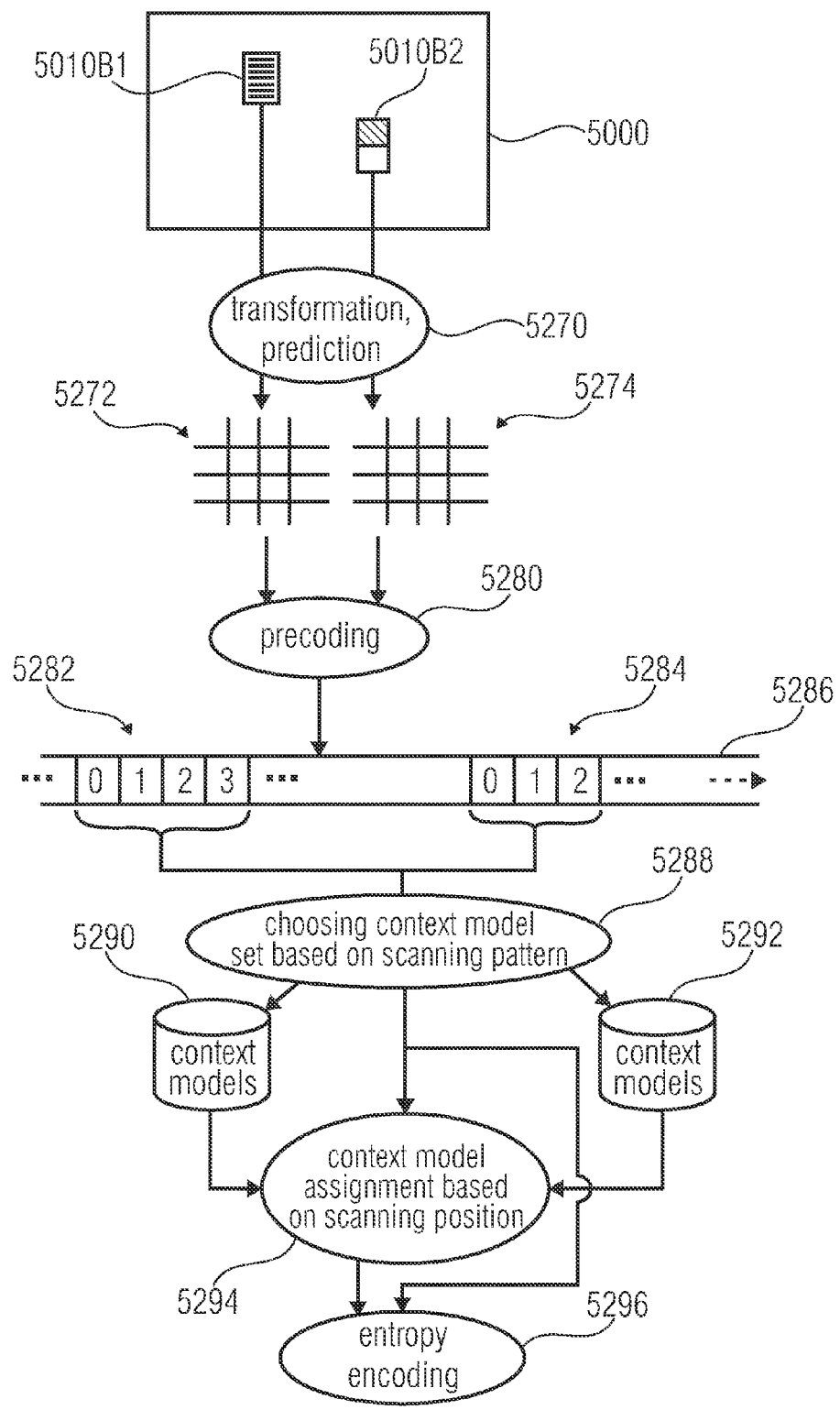
FIG. 55 shows a schematic flow diagram illustrating the encoding of a video frame or picture.

After having described the macroblock adaptive frame/field coding, the general handling of frame and field macroblocks during the coding scheme in accordance with an embodiment of the present invention is described with respect to FIG. 55. FIG. 55 shows the steps of encoding frame and field macroblocks as they are performed by precoder 2012 and entropy coder 2014 of FIG. 28.

FIG. 55 shows the process of encoding the video frame or picture 5010 which has already been divided up into macroblock pairs 5010b1 and 5010b2 as described with respect to FIG. 34. In FIG. 55 exemplarily merely two macroblock pairs 5010b1 and 5010b2 are shown. It is assumed that macroblock pair 5010b1 is field coded while macroblock pair 5010b2 is frame coded. Pixel samples belonging to the macroblock pairs 5010b1 and 5010b2 are passed to precoder 5012 where they are processed in step 5270. Step 5270 comprises subtracting from the picture samples of the macroblock pairs 5010b1 and 5010b2 predicted pixel samples and transformation the differences from a spatial domain into a spectrum domain. The results of step 5220 are several two-dimensional arrays of transform coefficients for each macroblock pair 5010b1 and 5010b2, each two-dimensional array of transformation coefficients belonging to a sub-part of a macroblock of the macroblock pairs 5010b1 and 5010b2, such as a sub-part of 4×4 pixel samples or pixel samples differences. FIG. 55 exemplarily shows one such two-dimensional array of transform coefficients as derived from macroblock 5010b1 indicated 5272 and another two-dimensional array of transform coefficients 5274 as derived from macroblock 5010b2. For example, the arrays 5272 and 5274 are 4×4 arrays. They may be obtained by a DCT applied to a 4×4 block of prediction residuals on one of the macroblocks of the macroblock pairs 5010b1 and 5010b2. For example, the macroblocks are 16×16 samples big. In this case, 16 4×4 blocks of predictional residuals would be transformed into 16 4×4 transformation coefficient arrays for each macroblock. The DCT may be a 4×4 discrete cosine transform or a separable integer transform with similar properties. Inverse-transform mismatches on decoder side may be avoided by defining the transformation matrix such that the inverse transform is defined by exact integer operations.

Now, in the following it is assumed that the 4×4 block of pixel samples resulting in the array 5272 of transform coefficients corresponds to the block of pixels 1 to 4, 21 to 24, 41 to 44 and 61 to 64 in the macroblock 2252 as shown in FIG. 31b, and that the 4×4 block of pixel samples which array 5274 is related to comprises the pixel samples 1 to 4, 11 to 14, 21 to 24 and 31 to 34 of macroblock 2250 as shown in FIG. 31a.

As can be seen, the spatial relationship between the pixels in the 4×4 blocks to which the transformation of step 5270 is applied is different in field macroblocks and frame macroblocks. In particular, the pixel pitch along the columns is doubled in case of frame macroblocks compared to field macroblocks. Therefore, two transform coefficients assuming the same array position in arrays 5272 and 5274 relate to different frequencies. Due to this, as mentioned above, different scanning patterns are used in order to define a scanning order among the transform coefficients in arrays 5272 and 5274. The reason for this is that transform coefficients of lower frequencies are more likely to be zero. Thus, different scanning orders are used in order to 'sort' the transform coefficients in accordance with their frequency they relate to.

Figures 56, 57:
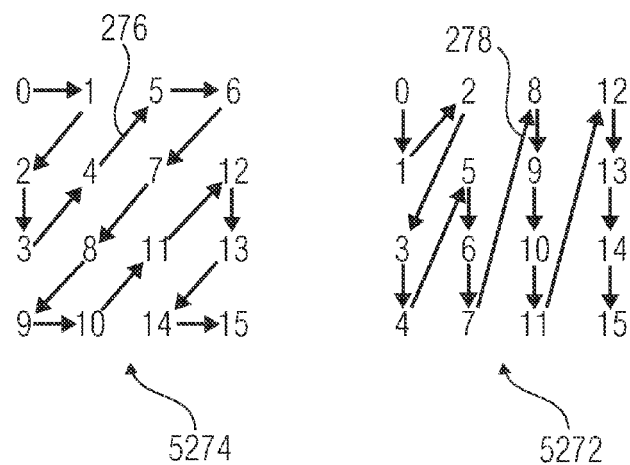
FIG. 56 illustrating the different scanning patterns used for field coded macroblocks and frame coded macroblocks.
FIG. 57 shows a table illustrating a significance map as obtained from the exemplarily chosen transform coefficient levels.

FIG. 56 shows an example for the scanning patterns used for frame and field macroblocks. At 5274, a two-dimensional array of transform coefficients is obtained from a frame macroblock as illustrated. At each array position a number from 0 to 15 is written, the number indicating the scanning position of the respective transform coefficient. The arrows 5276 represent the scanning pattern. As can be seen, the scanning pattern 5276 used to define a scanning order among the transform coefficients related to a frame coded macroblock are scanned in a zig-zag scanning starting at one corner of the array 5274 and running diagonally to the corner arranged diametrically opposite to the starting corner. It is assumed in FIG. 56 that the transform coefficient in the upper left corner of array 5274 having scanning position 0 represents the DC component in column and row direction while the transform coefficient having scanning position 5015 arranged diametrically opposite thereto represents the highest frequency part in column and row direction.

At the right side of FIG. 56, the scanning pattern for transform coefficient arrays 5272 related to field macroblocks as illustrated. Again, each array position of the 4×4 transformation coefficient array 5272 is designated by its scanning position number. The scanning pattern in case of field macroblocks is illustrated by arrows 5278. As can be seen, the scanning pattern 5278 for field coded macroblocks is different to the scanning pattern 5276 for frame coded macroblocks. Both scanning patterns 5276 and 5278 define a scanning order among the transform coefficients 0 to 15.

Referring back to FIG. 55, precoder 5012 proceeds in step 5280 with precoding the transform coefficients in arrays 5272 and 5274 into sequences 5282 and 5284 of transform data units. The step is described in more detail with respect to FIG. 57, showing a table having four rows. In the first row, the scanning positions from 0 to 8 are listed. In a second row, an example for possible transformation coefficient levels is given for the scanning positions 0 to 8. It is assumed that the transform coefficient levels at scanning positions greater than 8 are all 0.

Now, when performing the precoding of 5280 precoder 5012 steps through the transform coefficients in scanning order beginning at scanning positions 0, and performs the following steps on each transformation coefficient:

1) If the transform coefficient is not 0, i.e., the transform coefficient is significant, precoder 5012 sets significant_coeff_flag for this scanning position to 1. Otherwise, precoder 5012 sets significant_coeff_flag to zero. As can be seen, the first transform coefficient level at scanning position 0 is 9 so that, as can be seen in the third row in FIG. 57, significant_coeff_flag for this scanning position is 1.

2. For significant transform coefficients, it is proved as to whether this transform coefficient is the last significant transform coefficient among the transform coefficients in scanning order. If this is the case, a last_significant_coeff_flag for the current scanning position created and set to 1. Otherwise, last_significant_coeff_flag for the current scanning position is set to 0. As can be seen in the last row of FIG. 57, in the present example, the last transform coefficient level being significant is the transform coefficient at scanning position 8. Therefore, the last_significant_coeff_flag for this transform coefficient is set to 1, whereas the last_significant_coeff_flag for the other significant transform coefficient at scanning position 0, 2, 3, and 6 is set to 0.

3. For all significant transform coefficient, precoder 5012 creates syntax elements that specify these transform coefficients.

To summarise, precoder 5012 creates for each transform coefficient from the first scanning position to the scanning position of the last significant transform coefficient a transform data unit composed of either a significant_coeff_flag, if the respective transform coefficient is not significant, and of a significant_coeff_flag, last_significant_coeff_flag and data specifying the value of the respective transform coefficient in case of the transform coefficient being significant. All syntax elements significant_coeff_flag and last_significant_coeff_flag such obtained form the significance map indicating the scanning positions of transform coefficients being significant.

Precoder 5012 incorporates sequences 5282 and 5284 into a linear stream of syntax elements, i.e. the precoded video signal 5286. The order of the syntax elements is as follows:

In general, first, the syntax elements corresponding to the significance map are transmitted followed by the values indicating the significant transform coefficients in reverse scanning order. In particular, the first syntax element of sequences 5282 and 5284 is the significant_coeff_flag of scanning position 0. If the transform coefficient of the scanning position 0 is significant, the significant_coeff_flag of scanning position 0 is followed by a last_significant_coeff_flag for that scanning position. Thereafter, the significant_coeff_flag of the following scanning position, i.e. scanning position 1, is transmitted and so on. After having transmitted the last_significant_coeff_flag of the last scanning position having a non-zero transform coefficient, the non-binary values for the non-zero transform coefficients are transmitted in reverse scanning order. In the example of FIG. 57, the syntax elements in syntax element stream 286 are (beginning with the first syntax elements): 1, 0, 0, 1, 0, 1, 0, 0, 0, 1, 0, 0, 1, 1, 1, −1, 3, −5, 9.

The three more syntax elements 5286 is fed to entropy coder 5014 which handles the syntax elements element wise. The following description is now concentrated on the handling of significant_coeff_flag and last_significant_coeff_flag. When such a flag arrives at entropy coder 5014, it chooses at step 5288 one of two context model sets 5290 and 5292 based on the scanning pattern that was used in order to map the two-dimensional transform coefficient matrix into the sequence of transform data units, which the current syntax element last_significant_coeff_flag or significant_coeff_flag belongs to. In order to perform step 5288, entropy coder 5014 inspects the aforementioned mb_field_decoding_flag of the current macroblock, which the current syntax element belongs to, this flag indicating as to whether the current macroblock is coded in field mode in which case the scanning pattern 5278 has been used, or the current macroblock has been coded in frame mode in which case scanning pattern 5276 has been used.

In the next step, entropy coder 5014 assigns one context model of the chosen one of the context models sets 5290 and 5292 to the current syntax element to be encoded based on its scanning position. By this measure, the syntax element significant_coeff_flag for instance belonging to a scanning position 2 in sequence 5282 results in a context model of context model set 5290 that is different to the context model assigned to the significant_coeff_flag at scanning position 2 in sequence 5284. This accounts for the different probability distributions for the syntax element significant_coeff_flag at these scanning positions due to the different scanning pattern used to define the scanning positions in sequences 5282 and 5284.

Finally, in step 5296, the current syntax element is binary entropy encoded by use of the assigned context model from the chosen context model set. This is done as described in the above embodiments, i.e. be selecting the respective partial bitstream by using the probability estimate of the chosen context.

In the following, with respect to FIG. 58, step 5288, 5294 and 5296 performed by entropy coder 5014 from FIG. 55 are explained in more detail.

Figure 58:
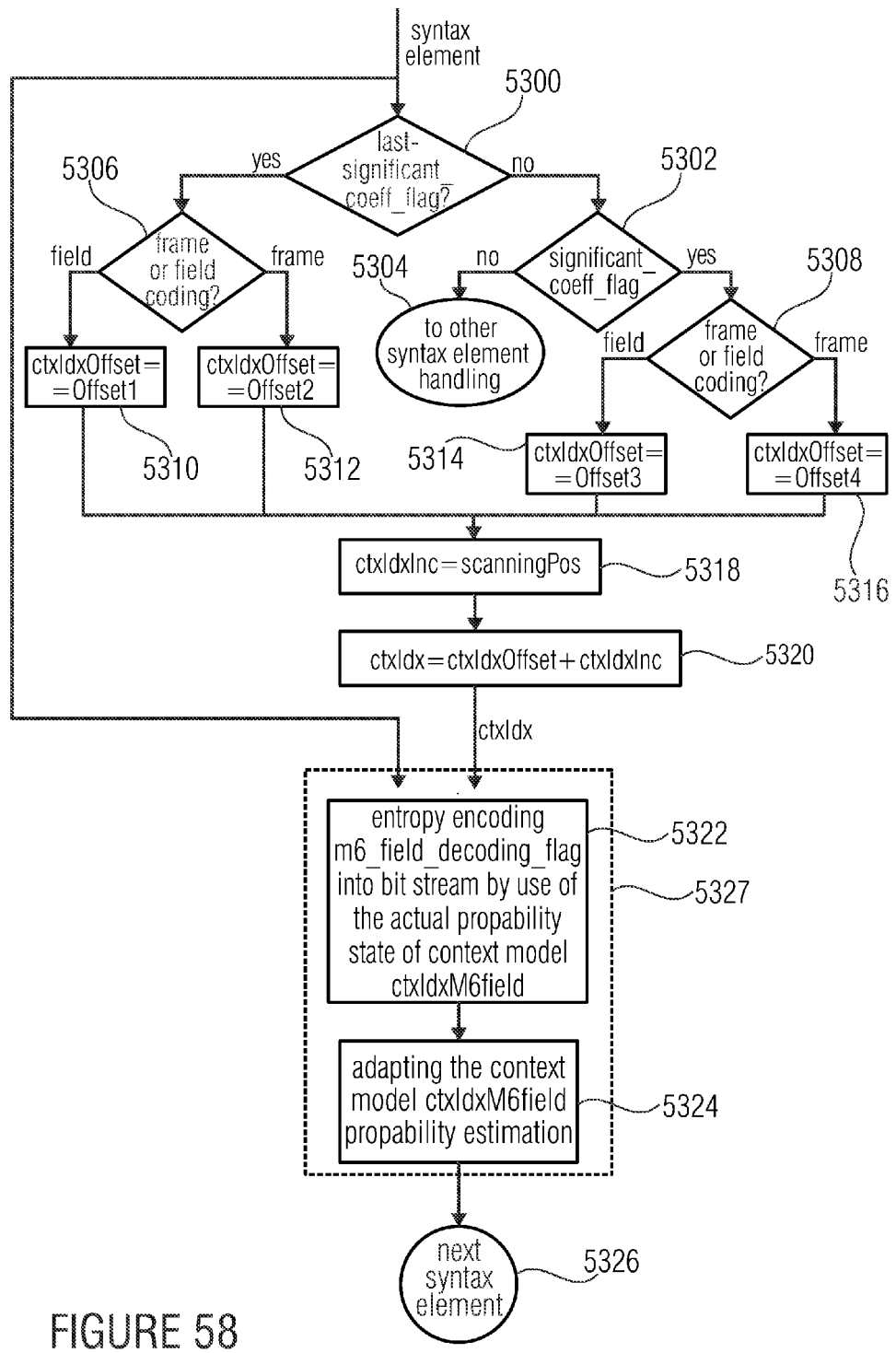
FIG. 58 shows a flow diagram illustrating the encoding of the syntax elements last_significant_coeff_flag and significant_coeff_flag in accordance with an embodiment of the present invention.

The process shown in FIG. 58 starts at the time, where a syntax element arrives at the input of context modeller 5112. In a first step 5300, context modeller 5112 determines as to whether the incoming syntax element or bin is a last_significant_coeff_flag. If not, context modeller 5112 determines as to whether the incoming syntax element or bin is a significant_coeff_flag at step 5302. If this is not the case, context modeller 5112 switches to another syntax element handling procedure or subroutine at step 5304. If the current syntax element is a last_significant_coeff_flag, it is checked as to whether this flag belongs to either a frame coded macroblock or field coded macroblock in step 5306. Step 5306 is equal to checking as to whether the scanning position of the transform coefficient to which the last_significant_coeff_flag belongs is determined by scanning pattern 5276 or scanning pattern 5278. The same check is performed in step 5308 if, in step 5302, it is determined that the syntax element is a significant_coeff_flag. Steps 5300, 5302, 5306, and 5308 restrict the possible scenarios at the arrival of a syntax element to 5 possible cases. The first case has already been mentioned and exists when the current syntax element is neither a last_significant_coeff_flag nor a significant_coeff_flag. In this case, another syntax element handling is performed in step 5304. In the second case, the syntax element is a last_significant_coeff_flag belonging to a field code macroblock in which case, a context index offset value is set to a value offset1 in step 5310. In a third case the current syntax element is a last_significant_coeff_flag belonging to a frame coded macroblock, where an index ctxIdx Offset is set to offset2 in step 5312. Similarly, in a forth and fifth case, the syntax element is a significant_coeff_flag belonging to a field coded or frame coded macroblock, where index ctxIdx Offset is set to offset3 in step 5340 and to offset4 in step 5316, respectively. The index ctxIdx Offset is for pointing into on common list of context models. The values offset1 to offset4 are different to each other.

After steps 5310 to 5316, an index incrementor ctxIdxInc (context index incrementor) is set equal to the scanning position (scanningPos) which the syntax element, i.e., the last_significant_coeff_flag or significant_coeff_flag, belongs to, in step 5318. Afterwards, in step 5320, a context index is determined by the sum of the context index offset ctxIdx Offset and the index incrementor ctxIdx Inc. The steps 5300 to 5320 are performed by context modeller 5112. The result of step 5320 is a context index ctxIdx indicating the probability model to be used for binary entropy coding of the syntax element.

After the determination of ctxIdx, context modeller 5112 passes the variable ctxIdx or the probability estimation status indexed by ctxIdx along with the syntax element itself, i.e. with last_significant_coeff_flag or significant_coeff_flag, to regular coding engine 118 which, as outlined above, is configured in accordance with any of the above embodiments. Based on these inputs, the regular coding engine 5118 entropy encodes, in step 5322, the syntax element into the bit stream 5124 by using the current probability state of the context model as indexed by ctxIdx.

Thereafter, regular coding engine 5118 passes the bin value of last_significant_coeff_flag or significant_coeff_flag, respectively, via path 117 back to context modeller 5112, whereupon context modeller 5112 adapts, in step 5324, the context model indexed by ctxIdx with respect to its probability estimation state. Thereafter, the process of coding the last_significant_coeff_flag or significant_coeff_flag into the bit stream at the output 5124 ends at 5326.

As may be clear from the above, steps 5300 to 5316 belong to step 5288 of FIG. 55, while steps 5318 and 5320 belong to step 5294 and steps 5322 and 5324 belong to step 5296.

Before explaining in more detail the actual decoding process, the parsing process is illustrated with respect to FIG. 59 which shows a pseudo-C code for the parsing process performed in entropy decoder 5400. The parsing process shown in FIG. 59 is appropriate for parsing a significance map along with its corresponding coefficient values for a macroblock provided that the significance map and the coefficient values are coded in the way explained above with respect to FIG. 57, i.e., the significance map following the scanning order and preceding the coefficient values of the significant transform coefficients which are ordered in reverse scanning order.

In FIG. 59, variables that are written in bold are read from the entropy coded bit stream arriving at entropy decoder 5400. For reading, binary entropy decoding is used. The reading process is shown in more detail for bins significant_coeff_flag and a last_significant_coeff_flag in FIG. 60. The parsing process is called residual_block_CABAC as can be seen in line 1 of the pseudo-C code of FIG. 59. The output of the process residual_block_CABAC is an one-dimensional array coeffLevel indicating the transform coefficient levels for each scanning position like shown in FIG. 57. As an input, the process residual_block_CABAC receives the variable maxNumCoeff which indicates the maximum number of coefficients in a macroblock, in our case being 16.

The process then starts in line 2 with reading a flag called coded_block_flag indicating as to whether in the current block all transform coefficient levels are zero. In this case, coded_block_flag is zero otherwise the coded_block_flag is one. In the following it is assumed that coded_block_flag is one so that at least one transform coefficient level is not zero. So, in line 4, a variable NumCoeff is set to maxNumCoeff. This means that when in the following when-do-loop no last_significant_coeff_flag being equal to one is read, the scanning position of the last significant transform coefficient is equal to the maximum number of coefficients maxNumCoeff. In line 5, a counter i is initialised to zero. In a following while-do-loop starting at line 6, firstly, one bin is read and inputted into significant_coeff_flag. With regard to FIG. 59, significant_coeff_flag is a one-dimensional array. The bin read in line 7 is put into position i of array significant_coeff_flag, i.e., significant_coeff_flag[i]. If significant_coeff_flag[i] is one (line 8), i.e., the coefficient at scanning position i is significant, the next bin is read from the bit stream, i.e., last_significant_coeff_flag[i]. If last_significant_coeff_flag[i] is one (line 10), i.e., the transform coefficient at scanning position i is the last significant transform coefficient in scanning order, the variable NumCoeff is set to i+1 in line 11 and coeffLevel also being an one-dimensional array is set to zero at all positions greater than or equal to i+1 (lines 12 and 13). This means that beyond the scanning position where last_significant_coeff_flag is one, the transform coefficient of all following scanning positions are zero.

After both if-clauses (lines 14 and 15) the counter i is incremented in line 16. At the end, at line 17, it is proved as to whether counter i is greater than or equal to NumCoeff-1. If this is the case, the while-do-loop is repeated once again. Thus, in lines 5 to 17, the significance map is read from the bit stream. Following, at line 18, the first significant transform coefficient level minus 1 is read, i.e., coeff_ups_level_minus1, followed by the sign flag coeff_sign_flag. To be more specific, both syntax elements coeff_abs_level_ups_minus1 and coeff_sign_flag read in lines 18 and 19 concern the last significant transform coefficient in scanning order. The actual value of this transform coefficient is computed in line 20. Then, in the for-loop from lines 21 to 28, the remaining significant transform coefficients are read from the bit stream by use of the significance map as received in lines 4 to 17. The counter of the for-loop i is initialised to NumCoeff-2, i.e., the scanning position immediately preceding the scanning position of the last significant transform coefficient. This counter is decremented after each for-loop-transition. If significant_coeff_flag[i] is one (line 22) the coefficient level of the transform coefficient at scanning position i is determined in lines 23 to 25, these lines being in effect, identical to lines 18 to 20. If significant_coeff_flag[i] is zero (line 26), the coefficient level of the scanning position is set to zero in line 27.

Figure 60:
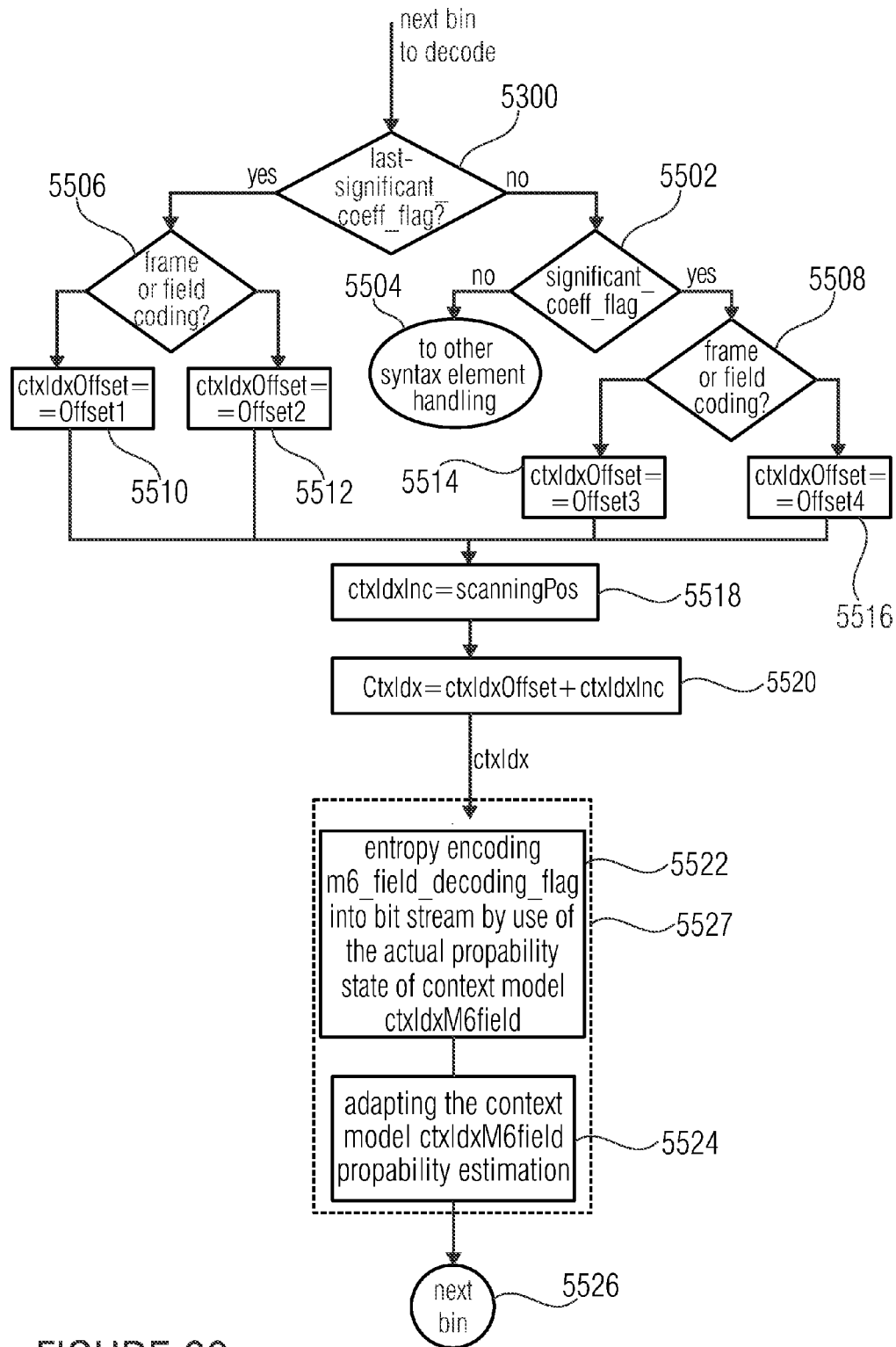
FIG. 60 shows a flow diagram illustrating the decoding of the syntax elements significant_coeff_flag and last_significant_coeff_flag from the coded bit stream as derived by the encoding scheme of FIG. 58.

FIG. 60 now shows the decoding process performed by the entropy decoder 400 each time a bin is to be decoded. Which bin is to be decoded depends on the syntax element which is currently expected by entropy decoder 5400. With regard to the significance map and the corresponding non-zero transform coefficient levels this knowledge results from the parsing process of FIG. 59.

In the decoding process, first, in step 5500, the decoder 5400 checks as to whether the next bin to decode is a last_significant_coeff_flag. If this is not the case, the checks in step 5502 as to whether the next bin to decode is a significant_coeff_flag. The next bin to decode is a significant_coeff_flag. If the next bin to decode is either a last_significant_coeff_flag or a significant_coeff_flag, decoder 5400 checks as to whether the flag belongs to a frame coded or field coded macroblock in step 5504 or 5506, respectively. If the next bin to decode is none of a last_significant_coeff_flag and significant_coeff_flag, decoder 400 proceeds to another syntax element handling in step 504. The checks of steps 5500, 5502, 5506, and 5508 correspond to steps 5300, 5302, 5306, and 5308 of the encoding process of FIG. 58, and accordingly, depending on the next bin to decode being a last_significant_coeff_flag or a significant_coeff_flag and the corresponding macroblock being frame coded or field coded, ctxIdx Offset is set to 1 of offset1, offset2, offset3, and offset4 in one of steps 5510, 5512, 5514, and 5516, respectively, with steps 5510-5516 corresponding to steps 5310 to 3516 of FIG. 58. Accordingly, ctxIdxInc and ctxIdx is determined in steps 5518 and 5520 in the same way as in the encoding process of FIG. 8 in steps 318 and 320 in order to determine the context model to be used in the following entropy decoding.

Then, in step 5522, the entropy decoder 5400 entropy decodes the actual bin, i.e., last_significant_coeff_flag or significant_coeff_flag, from the entropy coded bit stream by use of the actual probability state of the context module as indexed by ctxIdx obtained in steps 5510 to 5520. That is, the respective partial bitstream is selected based on the probability index and the bin retrieved therefrom. The result of this step is the value for the actual bin. Thereafter, in step 5524, the ctxIdx probability state is adapted or updated, as it was the case in step 5224. Thereafter, the process ends at step 5526.

Although in the above decoding process, step 5527, i.e. the decoding of mb_filed_decoding_flag, seems to have take place after the decoding of each bin, this is not the case. In fact, this step occurs, at maximum, merely for one macroblock pair.

The above description and claims below shall also be understood as encompassing methods comprising steps performed during operation of an encoder or decoder according to the respective description or claim.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The inventive encoded/compressed signals can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An encoder for encoding a sequence of symbols, comprising
    an assigner configured to assign a number of parameters to each symbol of the sequence of symbols based on information comprised within previous symbols of the sequence of symbols;
    a plurality of entropy encoders each of which is configured to convert the symbols forwarded to the respective entropy encoder into a respective bitstream; and
    a selector configured to forward each symbol to a selected one of the plurality of entropy encoders, the selection depending on the number of parameters assigned to the respective symbol,
    wherein each entropy encoder is a variable length coder configured to map symbol sequences to codewords shorter as, or as long as, a respective maximum bit length Lx,
    wherein the encoder comprises, for each entropy encoder, an individual buffer for buffering the respective bitstream of the respective entropy encoder, and a global buffer, wherein the global buffer is configured to reserve a sequence of tranche entries of respective bit length Nx for the plurality of entropy encoders in a sequential order depending on an order in which the reservations of the tranche entries for the plurality of entropy encoders are triggered;
    wherein the plurality of entropy encoders and the respective individual buffers cooperate to trigger a reservation of a tranche entry of bit length Nx for a respective one of the entropy encoders at times where the symbols of the sequence of symbols forwarded by the selector to the plurality of entropy encoders result in a beginning of a new symbol sequence to be mapped to a codeword at the respective entropy encoder, provided that at the respective time a number of bits currently reserved in the global buffer for the respective entropy encoder minus a number Mx of bits currently buffered in the individual buffer of the respective entropy encoder or the global buffer for the respective entropy encoder is not sufficient to accommodate an intended minimum number Cx of further codewords for the respective entropy encoder plus one, times the respective maximum bit length Lx, i.e. (Cx+1)·Lx, wherein the individual buffers of the plurality of entropy encoders are configured to output buffered portions of the bitstreams to fill the respective reserved tranche entries in the global buffer, and the global buffer is configured to remove filled tranche entries of the tranche entries in the sequential order to acquire a single stream of tranches of the bitstreams of the plurality of bitstreams, interspersed into the single stream of tranches in an interleaved manner.

2. The encoder according to claim 1 wherein the assigner is configured such that the number of parameters assigned to each symbol comprises, or is, a measure for an estimate of a probability distribution among the possible values the respective symbols may assume.

3. The encoder according to claim 2 wherein the sequence of symbols are of a binary alphabet, and the assigner is configured such that the estimate of the probability distribution comprises a measure for an estimate of a probability of a less probable or more probable bin value and an identifier specifying an estimate for which of the two possible bin values represents the less probable or more probable bin value.

4. The encoder according to claim 2 wherein the assigner is configured to assign a context to each symbol of the sequence of symbols based on the information comprised within previous symbols of the sequence of symbols with each context having a respective probability distribution estimate associated therewith, and to adapt the probability distribution estimate of each context to an actual symbol statistic based on symbol values of previous symbols to which the respective context is assigned, and to determine the measure for the estimate of the probability distribution for each symbol based on the probability distribution estimate associated with the context assigned to the respective symbol.

5. The encoder according to claim 4, wherein the assigner is configured to, in determining the measure for the estimate of the probability distribution for each symbol, quantize the probability distribution estimate associated with the context assigned to the respective symbol to one of a plurality of probability distribution estimate representatives in order to acquire the measure for the estimate of the probability distribution and wherein the selector is configured such that a bijective association is defined between the plurality of entropy encoders and the plurality of probability distribution estimate representatives.

6. The encoder according to claim 5, wherein the selector is configured to change a quantization mapping from a range of the probability distribution estimate to the plurality of probability distribution estimate representatives in a predetermined deterministic way depending on previous symbols of the sequence of symbols over time.

7. The encoder according to claim 6, wherein the plurality of entropy encoders is configured to adapt their way of converting symbols into bit streams responsive to a change in the quantization mapping.

8. The encoder according to claim 5 wherein the selector is configured to change the quantization mapping such that bitrates of the bit streams into which the entropy encoders convert to symbols, are rendered less dispersed.

9. The encoder according to claim 1, wherein at least one of the plurality of the entropy encoders has a symbol input buffer associated therewith, wherein the selector is configured to forward the symbols to the at least one entropy encoder via the associated symbol input buffer.

10. The encoder according to claim 1, wherein the global buffer is configured to perform the removal of the filled tranche entries of the tranche entries in the sequential order in units of tranche entries at the times of the triggering of a respective reservation by any of the plurality of entropy encoders and the respective individual buffers, from the lest recently reserved, already having been filled tranche entry, inclusively, if any, up to the least recently reserved, not yet filled tranche entry, exclusively.

11. The encoder according to claim 1, wherein the individual buffers are configured to output buffered portions of the bitstreams to fill the respective reserved tranche entries in the global buffer in units of tranche entries;

the global buffer is configured to, at the times of the triggering of a respective reservation by any of the plurality of entropy encoders and the respective individual buffers, finish the removal of the filled tranche entries of the tranche entries in the sequential order from the least recently reserved, already having been filled tranche entry, inclusively, if any, up to the least recently reserved, not yet filled tranche entry, exclusively, then check as to whether a number of bits in the global buffer covered by the reserved tranche entries plus the bit length Nx for the respective reservation-triggering entropy encoder is greater than a maximum buffer delay D, and, if not reserve a respective new tranche entry of bit length Nx for the respective reservation-triggering entropy encoder, but if so, cause the entropy encoder for which the least recently reserved, not yet filled tranche entry is reserved, to extend symbols forwarded to it by the selector, which have not yet been entropy encoded, if any, to a valid symbol sequence, and map the valid symbol sequence to a codeword so as to be buffered by the corresponding individual buffer, and then check as to whether the number Mx of bits currently buffered in the individual buffer of the entropy encoder for which the least recently reserved, not yet filled tranche entry is reserved, is smaller than the bit length Nx for this entropy encoder, and if so, append Nx-Mx bits to the Mx bits currently buffered, and then output Nx buffered bits out of the individual buffer of the entropy encoder for which the least recently reserved, not yet filled tranche entry is reserved, into the least recently reserved, not yet filled tranche entry in order to fill same, with leaving potentially additionally buffered bits beyond the Nx buffered bits output, in the individual buffer.

12. The encoder according to claim 1, wherein the encoder further comprises a fragmentizer configured to fragmentize the single stream of tranches into chunks with accompanying each chunk with information as to how the tranches of the plurality of entropy encoders are distributed over the respective chunk so as to acquire a sequence of chunks.

13. The encoder according to claim 1, wherein the plurality of entropy encoders and the global buffer are configured to intermittently extend currently forwarded but not yet mapped symbols to valid symbol sequences by don't-care symbols comprising the currently forwarded but not yet mapped symbols as prefix, map the thus extended symbol sequences into codewords, enter the thus acquired codewords into the reserved tranche entries and flush the tranche entries.

14. The encoder according to claim 1, wherein the plurality of entropy encoders and the global buffer are configured to perform the intermittently extending, entering and flushing at events where a number of reserved tranche entries plus a number of tranche entries having codewords entered therein fulfils a predetermined criterion.

15. The encoder according to claim 1, wherein Cx>0.

16. A method for encoding a sequence of symbols, comprising
assigning a number of parameters to each symbol of the sequence of symbols based on information comprised within previous symbols of the sequence of symbols; and
forwarding each symbol to a selected one of a plurality of entropy encoders, the selection depending on the number of parameters assigned to the respective symbol, and each of the plurality of entropy encoders being configured to convert symbols forwarded to the respective entropy encoder into a respective bitstream, wherein each entropy encoder is a variable length coder configured to map symbol sequences to codewords shorter as, or as long as, a respective maximum bit length Lx,
wherein the method further comprises,
for each entropy encoder, buffering the respective bitstream of the respective entropy encoder in a respective individual buffer,
reserving a sequence of tranche entries of respective bit length Nx for the plurality of entropy encoders in a global buffer in a sequential order depending on an order in which the reservations of the tranche entries for the plurality of entropy encoders are triggered;
triggering a reservation of a tranche entry of bit length Nx for a respective one of the entropy encoders at times where the symbols of the sequence of symbols forwarded by the selector to the plurality of entropy encoders result in a beginning of a new symbol sequence to be mapped to a codeword at the respective entropy encoder, provided that at the respective time a number of bits currently reserved in the global buffer for the respective entropy encoder minus a number Mx of bits currently buffered in the individual buffer of the respective entropy encoder or the global buffer for the respective entropy encoder is not sufficient to accommodate an intended minimum number Cx of further codeword for the respective entropy encoder plus one, times the respective maximum bit length Lx, i.e. (Cx+1)·Lx,
outputting buffered portions of the bitstreams from the codeword buffers to fill the respective reserved tranche entries in the global buffer, and
removing filled tranche entries of the tranche entries in the sequential order to acquire a single stream of tranches of the bitstreams of the plurality of bitstreams, interspersed into the single stream of tranches in an interleaved manner.

17. A decoder for reconstructing a sequence of symbols, comprising:
a plurality of entropy decoders, each of which is configured to convert a respective bitstream into symbols;
an assigner configured to assign a number of parameters to each symbol of a sequence of symbols to be reconstructed based on information comprised within previously reconstructed symbols of the sequence of symbols; and
a selector configured to retrieve each symbol of the sequence of symbols to be reconstructed from a selected one of the plurality of entropy decoders, the selection depending on the number of parameters defined to the respective symbol,
wherein each entropy decoder is a variable length decoder configured to map codewords shorter as, or as long as, a respective maximum bit length Lx, to symbol sequences,
wherein the decoder further comprises global buffer configured to receive a single stream of tranches of the bitstreams of the plurality of bitstreams, interspersed into the single stream of tranches in an interleaved manner, wherein the global buffer is configured to sequentially distribute the tranches from the global buffer to the plurality of entropy decoders depending on an order in which requests for the tranches occur,
wherein each of the plurality of entropy decoders is configured to trigger a respective request for a tranche of respective bit length Nx of the respective bitstream from the global buffer at times where, among the symbols of the sequence of symbols to be reconstructed as retrieved by the selector from the plurality of entropy decoders, a symbol is encountered which forms a beginning of a new symbol sequence to be mapped from a new codeword within the respective bitstream by the respective entropy decoder, provided that at the respective time a number Mx of bits of the respective bitstream having been distributed to the respective entropy decoder by the global buffer, but not yet having been entropy decoded by the entropy decoder so far, including the new codeword, is less than an intended minimum number Cx of further codewords for the respective entropy decoder plus one, times the respective maximum bit length Lx, i.e. (Cx+1)·Lx.

18. The decoder according to claim 17, wherein the decoder is configured to
log, for each entropy decoder, a number of bits distributed from the global buffer to the plurality of entropy decoders up to the distribution of a least recently distributed tranche distributed from the global buffer to the respective entropy decoder,
determine, each time a respective request for a tranche of a respective bit length Nx is triggered, as to whether a difference between a global number of bits distributed from the global buffer to the plurality of entropy decoders up to the respective request on the one hand, and a minimum logged number of bits on the other hand, is greater than a maximum buffer delay D, and, if so,
discard the least recently distributed tranche distributed from the global buffer to the entropy decoder for which the minimum logged number has been logged, and any symbols not yet having been retrieved from the entropy decoder for which the minimum logged number has been logged by the selector.

19. The decoder according to claim 17, further comprising a defragmentizer configured to defragmentize the single stream of tranches from a sequence of chunks where each chunk has accompanied therewith information as to how the tranches of the plurality of entropy encoders are distributed over the respective chunk.

20. The decoder according to claim 17, wherein the assigner is configured such that the number of parameters assigned to each symbol comprises, or is, a measure for an estimate of a probability of distribution among the possible symbol values a respective symbol may assume.

21. The decoder according to claim 20, wherein the sequence of symbols to be reconstructed is of a binary alphabet and the assigner is configured such that the estimate of the probability distribution comprises a measure for an estimate of a probability of a less probable or more probable bin value of the two possible bin values of the binary alphabet and an identifier specifying an estimate for which of the two possible bin values represents the less probable or more probable bin value.

22. The decoder according to claim 20, wherein the assigner is configured to internally assign a context to each symbol of the sequence of symbols to be reconstructed based on the information comprised within previously reconstructed symbols of the sequence of symbols to be reconstructed with each context having a respective probability distribution estimate associated therewith, and to adapt the probability distribution estimate for each context to an actual symbol statistic based on symbol values of previously reconstructed symbols to which the respective context is assigned, and to determine the measure for the estimate of the probability distribution for each symbol based on the probability distribution estimate associated with the context assigned to the respective symbol.

23. The decoder according to claim 22, wherein the assigner is configured to, in determining the measure for the estimate of the probability distribution for each symbol, quantize the probability distribution estimate associated with the context assigned with the respective symbol to one of a plurality of probability distribution estimate representatives in order to acquire the measure for the estimate of the probability distribution and wherein the selector is configured such that a bijective association is defined between the plurality of entropy encoders and the plurality of probability distribution estimate representatives.

24. The decoder according to claim 23, wherein the selector is configured to change a quantization mapping from a range of the probability distribution estimates to the plurality of probability distribution estimate representatives in a predetermined deterministic way depending on previously reconstructed symbols of the sequence of symbols, over time.

25. The decoder according to claim 24, wherein the plurality of entropy decoders is configured to adapt their way of converting symbols into bit streams responsive to a change in the quantization mapping.

26. The decoder according to claim 24, wherein the selector is configured to change the quantization mapping such that rates by which the symbols are retrieved from the plurality of entropy decoders, are made less dispersed.

27. The decoder according to claim 17, wherein at least one entropy decoder has a symbol output buffer associated therewith, wherein the selector is configured to retrieve the symbols from the at least one entropy decoder via the associated symbol output buffer.

28. The decoder according to claim 17, wherein the plurality of entropy decoders and the selector are configured to intermittently discard suffixes of symbol sequences so as to not participate in forming the sequence of symbols to be reconstructed.

29. The decoder according to claim 28, wherein the plurality of entropy decoders and the selectors are configured to perform the intermittently discarding at events where a number of codewords having been retrieved from the tranche entry by the plurality of entropy decoders between two consecutive codeword retrievals of a respective entropy decoder from the tranche entry, fulfils a predetermined criterion.

30. The decoder according to claim 17, wherein Cx>0.

31. A method for reconstructing a sequence of symbols, comprising:
assigning a number of parameters to each symbol of a sequence of symbols to be reconstructed based on information comprised within previously reconstructed symbols of the sequence of symbols; and
retrieving each symbol of the sequence of symbols to be reconstructed from a selected one of a plurality of entropy decoders, the selection depending on the number of parameters defined to the respective symbol, and each of the plurality of entropy decoders being configured to convert a respective bitstream into symbols, wherein each entropy decoder is a variable length decoder configured to map codewords shorter as, or as long as, a respective maximum bit length Lx, to symbol sequences,
wherein the method further comprises
receiving a single stream of tranches of the bitstreams of the plurality of bitstreams, interspersed into the single stream of tranches in an interleaved manner, in a global buffer;
sequentially distributing the tranches from the global buffer to the plurality of entropy decoders depending on an order in which requests for the tranches occur,
for each of the plurality of entropy decoders, triggering a respective request for a tranche of respective bit length Nx of the respective bitstream from the global buffer at times where, among the symbols of the sequence of symbols to be reconstructed as retrieved by the selector from the plurality of entropy decoders, a symbol is encountered which forms a beginning of a new symbol sequence to be mapped from a new codeword within the respective bitstream by the respective entropy decoder, provided that at the respective time a number Mx of bits of the respective bitstream having been distributed to the respective entropy decoder by the global buffer, but not yet having been entropy decoded by the entropy decoder so far, including the new codeword is less than an intended minimum number Cx of further codewords for the respective entropy decoder plus one, times the respective maximum bit length Lx, i.e. (Cx+1)·Lx.

32. A non-transitory computer readable medium having stored thereon a computer program comprising a program code for performing, when running on a computer, a method according to claim 31.

33. An encoder for encoding a sequence of symbols, comprising
an assigner configured to assign a number of parameters to each symbol of the sequence of symbols based on information comprised within previous symbols of the sequence of symbols;
a plurality of entropy encoders each of which is configured to convert the symbols forwarded to the respective entropy encoder into a respective bitstream; and
a selector configured to forward each symbol to a selected one of the plurality of entropy encoders, the selection depending on the number of parameters assigned to the respective symbol,
wherein each entropy encoder is a variable length coder configured to map symbol sequences to codewords.
wherein the encoder comprises, for each entropy encoder, an individual buffer for buffering the respective bitstream of the respective entropy encoder, and a global buffer, wherein the global buffer is configured to reserve a sequence of tranche entries for the plurality of entropy encoders in a sequential order depending on an order in which the reservations of the tranche entries for the plurality of entropy encoders are triggered;
wherein the plurality of entropy encoders and the respective individual buffers cooperate to trigger a reservation of a tranche entry of bit length Nx for a respective one of the entropy encoders at times where the symbols of the sequence of symbols forwarded by the selector to the plurality of entropy encoders result in a beginning of a new symbol sequence to be mapped to a codeword at the respective entropy encoder, provided that at the respective time a difference between a number of bits currently reserved in the global buffer for the respective entropy encoder and a number Mx of bits currently buffered in the individual buffer of the respective entropy encoder or the global buffer for the respective entropy encoder does not fulfill a predetermined criterion, wherein the individual buffers of the plurality of entropy encoders are configured to output buffered portions of the bitstreams to fill the respective reserved tranche entries in the global buffer, and the global buffer is configured to remove filled tranche entries of the tranche entries in the sequential order to acquire a single stream of tranches of the bitstreams of the plurality of bitstreams, interspersed into the single stream of tranches in an interleaved manner, wherein the individual buffers are configured to output buffered portions of the bitstreams to fill the respective reserved tranche entries in the global buffer in units of tranche entries;

the global buffer is configured to, at the times of the triggering of a respective reservation by any of the plurality of entropy encoders and the respective individual buffers, finish the removal of the filled tranche entries of the tranche entries in the sequential order from the least recently reserved, already having been filled tranche entry, inclusively, if any, up to the least recently reserved, not yet filled tranche entry, exclusively, then check as to whether a number of bits in the global buffer covered by the reserved tranche entries plus a bit length Nx of the requested tranche entry for the respective reservation-triggering entropy encoder is greater than a maximum buffer delay D, and, if not reserve a respective new tranche entry of bit length Nx for the respective reservation-triggering entropy encoder, but if so, cause the entropy encoder for which the least recently reserved, not yet filled tranche entry is reserved, to extend symbols forwarded to it by the selector, which have not yet been entropy encoded, if any, to a valid symbol sequence, and map the valid symbol sequence to a codeword so as to be buffered by the corresponding individual buffer, and then check as to whether the number Mx of bits currently buffered in the individual buffer of the entropy encoder for which the least recently reserved, not yet filled tranche entry is reserved, is smaller than the bit length Nx for this entropy encoder, and if so, append Nx-Mx bits to the Mx bits currently buffered, and then output Nx buffered bits out of the individual buffer of the entropy encoder for which the least recently reserved, not yet filled tranche entry is reserved, into the least recently reserved, not yet filled tranche entry in order to fill same, with leaving potentially additionally buffered bits beyond the Nx buffered bits output, in the individual buffer.

34. The encoder according to claim 33, wherein, among the plurality of entropy encoders, a predetermined one is expected to be a more frequently selected entropy encoder, the predetermined entropy encoder being configured to merely support codewords of a length of 1 bit, wherein the encoder is configured to, if the respective reservation-triggering entropy encoder is the predetermined entropy encoder, and instead of checking as to whether the number of bits in the global buffer covered by the reserved tranche entries plus the bit length Nx of the requested tranche entry for the predetermined entropy encoder is greater than the maximum buffer delay D, check as to whether the number of bits in the global buffer covered by the reserved tranche entries plus the bit length Nx of the requested tranche entry for the predetermined entropy encoder is greater than a predefined threshold D2<D, if greater than the predefined threshold D2, determine an entropy encoder least recently having triggered a reservation of any of reserved, but not yet completely filled tranche entries;

cause the determined entropy encoder to extend symbols forwarded to it by the selector, which have not yet been entropy encoded, if any, to a valid symbol sequence, and map the valid symbol sequence to a codeword so as to be buffered by the individual buffer of the determined entropy encoder;

displace the bits currently buffered in the individual buffer of the determined entropy encoder to the individual buffer of the predetermined entropy encoder;

change a reservation of the not yet completely filled tranche entry the from the determined entropy encoder to the predetermined entropy encoder.

35. A decoder for reconstructing a sequence of symbols, comprising:

a plurality of entropy decoders, each of which is configured to convert a respective bitstream into symbols;

an assigner configured to assign a number of parameters to each symbol of a sequence of symbols to be reconstructed based on information comprised within previously reconstructed symbols of the sequence of symbols; and a selector configured to retrieve each symbol of the sequence of symbols to be reconstructed from a selected one of the plurality of entropy decoders, the selection depending on the number of parameters defined to the respective symbol, wherein each entropy decoder is a variable length decoder configured to map codewords to symbol sequences, wherein the decoder further comprises global buffer configured to receive a single stream of tranches of the bitstreams of the plurality of bitstreams, interspersed into the single stream of tranches in an interleaved manner, wherein the global buffer is configured to sequentially distribute the tranches from the global buffer to the plurality of entropy decoders depending on an order in which requests for the tranches occur, wherein each of the plurality of entropy decoders is configured to trigger a respective request for a tranche of the respective bitstream from the global buffer at times where, among the symbols of the sequence of symbols to be reconstructed as retrieved by the selector from the plurality of entropy decoders, a symbol is encountered which forms a beginning of a new symbol sequence to be mapped from a new codeword within the respective bitstream by the respective entropy decoder, provided that at the respective time a number Mx of bits of the respective bitstream having been distributed to the respective entropy decoder by the global buffer, but not yet having been entropy decoded by the entropy decoder so far, including the new codeword, is less than a predetermined number,
wherein the decoder is configured to
log, for each entropy decoder, a number of bits distributed from the global buffer to the plurality of entropy decoders up to the distribution of a least recently distributed tranche distributed from the global buffer to the respective entropy decoder,
determine, each time a respective request for a tranche of a respective bit length Nx is triggered, as to whether a difference between a global number of bits distributed from the global buffer to the plurality of entropy decoders up to the respective request on the one hand, and a minimum logged number of bits on the other hand, is greater than a maximum buffer delay D, and, if so,
discard the least recently distributed tranche distributed from the global buffer to the entropy decoder for which the minimum logged number has been logged, and any symbols not yet having been retrieved from the entropy decoder for which the minimum logged number has been logged by the selector.

36. The decoder according to claim 34, wherein, among the plurality of entropy decoders, a predetermined one is expected to be a more frequently selected entropy decoder, the predetermined entropy decoder being configured to merely support codewords of a length of 1 bit, wherein the decoder is configured to, if the respective request stems from the predetermined entropy decoder, and instead of determining as to whether the difference between the global number of bits distributed from the global buffer to the plurality of entropy decoders up to the respective request on the one hand, and the minimum logged number of bits on the other hand, is greater than the maximum buffer delay D,
check as to whether a difference between the global number of bits distributed from the global buffer to the plurality of entropy decoders up to the respective request on the one hand, and the minimum logged number of bits on the other hand, is greater than a predefined threshold D2<D, and,
if greater than the predefined threshold D2,
discard any symbols not yet having been retrieved from the entropy decoder for which the minimum logged number has been logged by the selector, and
redirecting any non-decoded portion of tranches distributed from the global buffer to the entropy decoder for which the minimum logged number has been logged, so as to be decoded by the predetermined entropy decoder.

37. An encoder for encoding a sequence of symbols, comprising
an assigner configured to assign a number of parameters to each symbol of the sequence of symbols based on information comprised within previous symbols of the sequence of symbols;
a plurality of entropy encoders each of which is configured to convert the symbols forwarded to the respective entropy encoder into a respective bitstream; and
a selector configured to forward each symbol to a selected one of the plurality of entropy encoders, the selection depending on the number of parameters assigned to the respective symbol,
wherein each entropy encoder is a variable length coder configured to map symbol sequences to codewords.
wherein the encoder comprises, for each entropy encoder, an individual buffer for buffering the respective bitstream of the respective entropy encoder, and a global buffer, wherein the global buffer is configured to reserve a sequence of tranche entries for the plurality of entropy encoders in a sequential order depending on an order in which the reservations of the tranche entries for the plurality of entropy encoders are triggered;
wherein the plurality of entropy encoders and the respective individual buffers cooperate to trigger a reservation of a tranche entry of bit length Nx for a respective one of the entropy encoders at times where the symbols of the sequence of symbols forwarded by the selector to the plurality of entropy encoders result in a beginning of a new symbol sequence to be mapped to a codeword at the respective entropy encoder, provided that at the respective time a difference between a number of bits currently reserved in the global buffer for the respective entropy encoder and a number Mx of bits currently buffered in the individual buffer of the respective entropy encoder or the global buffer for the respective entropy encoder does not fulfill a predetermined criterion,
wherein the individual buffers of the plurality of entropy encoders are configured to output buffered portions of the bitstreams to fill the respective reserved tranche entries in the global buffer, and the global buffer is configured to remove filled tranche entries of the tranche entries in the sequential order to acquire a single stream of tranches of the bitstreams of the plurality of bitstreams, interspersed into the single stream of tranches in an interleaved manner,
the encoder further comprising a fragmentizer configured to fragmentize the single stream of tranches into chunks with accompanying each chunk with information as to how the tranches of the plurality of entropy encoders are distributed over the respective chunk so as to acquire a sequence of chunks.

38. The encoder according to claim 37, wherein the fragmentizer configured to, in fragmentizing the single stream of tranches into chunks, permute an original order of the tranches of the respective chunk within the single stream of tranches into an wanted order which is indicated by the information accompanying the respective chunk.

39. A decoder for reconstructing a sequence of symbols, comprising:
a plurality of entropy decoders, each of which is configured to convert a respective bitstream into symbols;
an assigner configured to assign a number of parameters to each symbol of a sequence of symbols to be reconstructed based on information comprised within previously reconstructed symbols of the sequence of symbols; and
a selector configured to retrieve each symbol of the sequence of symbols to be reconstructed from a selected one of the plurality of entropy decoders, the selection depending on the number of parameters defined to the respective symbol,
wherein each entropy decoder is a variable length decoder configured to map codewords to symbol sequences,
wherein the decoder further comprises
a defragmentizer configured to defragmentize and distribute tranches of the bitstreams to the entropy decoders from a sequence of chunks where each chunk has accompanied therewith information as to how the tranches of the bitstreams for the plurality of entropy decoders are distributed over the respective chunk.

40. A method for encoding a sequence of symbols, comprising assigning a number of parameters to each symbol of the sequence of symbols based on information comprised within previous symbols of the sequence of symbols;

forwarding each symbol to a selected one of a plurality of entropy encoders, the selection depending on the number of parameters assigned to the respective symbol, each of the plurality of entropy encoders being configured to convert the symbols forwarded to the respective entropy encoder into a respective bitstream, wherein each entropy encoder is a variable length coder configured to map symbol sequences to codewords.

for each entropy encoder, buffering the respective bitstream of the respective entropy encoder in an individual buffer, and reserving a sequence of tranche entries for the plurality of entropy encoders in a global buffer in a sequential order depending on an order in which the reservations of the tranche entries for the plurality of entropy encoders are triggered;

triggering a reservation of a tranche entry of bit length Nx for a respective one of the entropy encoders at times where the symbols of the sequence of symbols forwarded by the selector to the plurality of entropy encoders result in a beginning of a new symbol sequence to be mapped to a codeword at the respective entropy encoder, provided that at the respective time a difference between a number of bits currently reserved in the global buffer for the respective entropy encoder and a number Mx of bits currently buffered in the individual buffer of the respective entropy encoder or the global buffer for the respective entropy encoder does not fulfill a predetermined criterion, output buffered portions of the bitstreams from the individual buffers of the plurality of entropy encoders to fill the respective reserved tranche entries in the global buffer, removing filled tranche entries of the tranche entries in the sequential order from the global buffer to acquire a single stream of tranches of the bitstreams of the plurality of bitstreams, interspersed into the single stream of tranches in an interleaved manner, wherein output buffered portions of the bitstreams from the individual buffers to fill the respective reserved tranche entries in the global buffer in units of tranche entries;

at the times of the triggering of a respective reservation by any of the plurality of entropy encoders and the respective individual buffers, finishing the removal of the filled tranche entries of the tranche entries in the sequential order from the least recently reserved, already having been filled tranche entry, inclusively, if any, up to the least recently reserved, not yet filled tranche entry, exclusively, then checking as to whether a number of bits in the global buffer covered by the reserved tranche entries plus a bit length Nx of the requested tranche entry for the respective reservation-triggering entropy encoder is greater than a maximum buffer delay D, and, if not reserving a respective new tranche entry of bit length Nx for the respective reservation-triggering entropy encoder, but if so, causing the entropy encoder for which the least recently reserved, not yet filled tranche entry is reserved, to extend symbols forwarded to it by the selector, which have not yet been entropy encoded, if any, to a valid symbol sequence, and map the valid symbol sequence to a codeword so as to be buffered by the corresponding individual buffer, and then checking as to whether the number Mx of bits currently buffered in the individual buffer of the entropy encoder for which the least recently reserved, not yet filled tranche entry is reserved, is smaller than the bit length Nx for this entropy encoder, and if so, appending Nx-Mx bits to the Mx bits currently buffered, and then outputting Nx buffered bits out of the individual buffer of the entropy encoder for which the least recently reserved, not yet filled tranche entry is reserved, into the least recently reserved, not yet filled tranche entry in order to fill same, with leaving potentially additionally buffered bits beyond the Nx buffered bits output, in the individual buffer.

41. A method for reconstructing a sequence of symbols using a plurality of entropy decoders, each of which is configured to convert a respective bitstream into symbols, the method comprising:

assigning a number of parameters to each symbol of a sequence of symbols to be reconstructed based on information comprised within previously reconstructed symbols of the sequence of symbols; and retrieving each symbol of the sequence of symbols to be reconstructed from a selected one of the plurality of entropy decoders, the selection depending on the number of parameters defined to the respective symbol, wherein each entropy decoder is a variable length decoder configured to map codewords to symbol sequences, wherein the method further comprises receiving a single stream of tranches of the bitstreams of the plurality of bitstreams, interspersed into the single stream of tranches in an interleaved manner, in a global buffer, sequentially distributing the tranches from the global buffer to the plurality of entropy decoders depending on an order in which requests for the tranches occur, for each of the plurality of entropy decoders, triggering a respective request for a tranche of the respective bitstream from the global buffer at times where, among the symbols of the sequence of symbols to be reconstructed as retrieved by the selector from the plurality of entropy decoders, a symbol is encountered which forms a beginning of a new symbol sequence to be mapped from a new codeword within the respective bitstream by the respective entropy decoder, provided that at the respective time a number Mx of bits of the respective bitstream having been distributed to the respective entropy decoder by the global buffer, but not yet having been entropy decoded by the entropy decoder so far, including the new codeword, is less than a predetermined number, wherein the method further comprises logging, for each entropy decoder, a number of bits distributed from the global buffer to the plurality of entropy decoders up to the distribution of a least recently distributed tranche distributed from the global buffer to the respective entropy decoder, determining, each time a respective request for a tranche of a respective bit length Nx is triggered, as to whether a difference between a global number of bits distributed from the global buffer to the plurality of entropy decoders up to the respective request on the one hand, and a minimum logged number of bits on the other hand, is greater than a maximum buffer delay D, and, if so, discarding the least recently distributed tranche distributed from the global buffer to the entropy decoder for which the minimum logged number has been logged, and any symbols not yet having been retrieved from the entropy decoder for which the minimum logged number has been logged by the selector.

42. A non-transitory computer readable medium having stored thereon a computer program comprising a program code for performing, when running on a computer, a method according to claim 41.

43. A method for encoding a sequence of symbols, comprising assigning a number of parameters to each symbol of the sequence of symbols based on information comprised within previous symbols of the sequence of symbols;

forwarding each symbol to a selected one of a plurality of entropy encoders, the selection depending on the number of parameters assigned to the respective symbol, wherein each of the plurality of entropy encoders is configured to convert the symbols forwarded to the respective entropy encoder into a respective bitstream;

wherein each entropy encoder is a variable length coder configured to map symbol sequences to codewords.

wherein the method comprises for each entropy encoder, buffering the respective bitstream of the respective entropy encoder in an individual buffer, and reserving a sequence of tranche entries for the plurality of entropy encoders in a global buffer in a sequential order depending on an order in which the reservations of the tranche entries for the plurality of entropy encoders are triggered;

triggering a reservation of a tranche entry of bit length $N_x$ for a respective one of the entropy encoders at times where the symbols of the sequence of symbols forwarded by the selector to the plurality of entropy encoders result in a beginning of a new symbol sequence to be mapped to a codeword at the respective entropy encoder, provided that at the respective time a difference between a number of bits currently reserved in the global buffer for the respective entropy encoder and a number $M_x$ of bits currently buffered in the individual buffer of the respective entropy encoder or the global buffer for the respective entropy encoder does not fulfill a predetermined criterion, outputting buffered portions of the bitstreams from the individual buffers of the plurality of entropy encoders to fill the respective reserved tranche entries in the global buffer, with removing filled tranche entries of the tranche entries in the sequential order from the global buffer to acquire a single stream of tranches of the bitstreams of the plurality of bitstreams, interspersed into the single stream of tranches in an interleaved manner, the method further comprising fragmentizing the single stream of tranches into chunks with accompanying each chunk with information as to how the tranches of the plurality of entropy encoders are distributed over the respective chunk so as to acquire a sequence of chunks.

44. A method for reconstructing a sequence of symbols by a plurality of entropy decoders, each of which is configured to convert a respective bitstream into symbols, the method comprising assigning a number of parameters to each symbol of a sequence of symbols to be reconstructed based on information comprised within previously reconstructed symbols of the sequence of symbols; and retrieving each symbol of the sequence of symbols to be reconstructed from a selected one of the plurality of entropy decoders, the selection depending on the number of parameters defined to the respective symbol, wherein each entropy decoder is a variable length decoder configured to map codewords to symbol sequences, wherein the method further comprises defragmentizing and distributing tranches of the bitstreams to the entropy decoders from a sequence of chunks where each chunk has accompanied therewith information as to how the tranches of the bitstreams for the plurality of entropy decoders are distributed over the respective chunk.

45. A non-transitory computer readable medium having stored thereon a computer program comprising a program code for performing, when running on a computer, a method according to claim 44.

* * * * *

UNITED STATES PATENT AND TRADEMARK OFFICE
CERTIFICATE OF CORRECTION

| | |
|---|---|
| PATENT NO. | : 8,947,273 B2 |
| APPLICATION NO. | : 14/230183 |
| DATED | : February 3, 2015 |
| INVENTOR(S) | : Christian Bartnik et al. |

It is certified that error appears in the above-identified patent and that said Letters Patent is hereby corrected as shown below:

Claims

The following should be corrected in Claim 36, column 133, line 23 as follows:

"…The decoder according to claim 35…"

Signed and Sealed this
Sixth Day of October, 2015

Michelle K. Lee
*Director of the United States Patent and Trademark Office*